United States Patent

Rathmann

[11] Patent Number: 5,955,869
[45] Date of Patent: Sep. 21, 1999

[54] BATTERY PACK AND A METHOD FOR MONITORING REMAINING CAPACITY OF A BATTERY PACK

[76] Inventor: Roland Rathmann, Raiffeisenweg 3, B-85375 Neufahrn, Germany

[21] Appl. No.: 09/087,306

[22] Filed: May 29, 1998

Related U.S. Application Data

[62] Division of application No. 08/890,665, Jul. 9, 1997, Pat. No. 5,794,592
[60] Provisional application No. 60/021,905, Jul. 17, 1996, and provisional application No. 60/034,320, Dec. 20, 1996.

[51] Int. Cl.$^6$ ...................................................... H02J 7/00
[52] U.S. Cl. .......................... 320/132; 320/136; 320/157; 324/427; 324/428
[58] Field of Search ...................................... 320/136, 157, 320/132; 324/427, 428

[56] References Cited

U.S. PATENT DOCUMENTS

| | | |
|---|---|---|
| 4,040,247 | 8/1977 | Haydon . |
| 4,122,359 | 10/1978 | Breikss . |
| 4,238,839 | 12/1980 | Redfern et al. . |
| 4,289,836 | 9/1981 | Lemelson . |
| 4,354,148 | 10/1982 | Tada et al. . |
| 4,380,726 | 4/1983 | Sado et al. . |
| 4,392,101 | 7/1983 | Saar et al. . |
| 4,433,278 | 2/1984 | Lowndes et al. . |
| 4,455,523 | 6/1984 | Koenck . |
| 4,553,081 | 11/1985 | Koenck . |
| 4,709,202 | 11/1987 | Koenck et al. . |
| 4,746,854 | 5/1988 | Baker et al. . |
| 4,803,416 | 2/1989 | Abiven et al. . |
| 4,885,523 | 12/1989 | Koenck . |
| 4,918,368 | 4/1990 | Baker et al. . |
| 4,947,123 | 8/1990 | Minezawa . |
| 4,961,043 | 10/1990 | Koenck . |
| 4,965,738 | 10/1990 | Bauer et al. . |
| 5,043,651 | 8/1991 | Tamura . |
| 5,136,246 | 8/1992 | Sakamoto . |
| 5,180,961 | 1/1993 | Tsujino . |
| 5,198,743 | 3/1993 | McClure et al. . |
| 5,200,689 | 4/1993 | Interiano et al. . |
| 5,206,097 | 4/1993 | Burns et al. . |
| 5,248,929 | 9/1993 | Burke . |
| 5,254,928 | 10/1993 | Young et al. . |
| 5,278,487 | 1/1994 | Koenck . |
| 5,284,719 | 2/1994 | Landau et al. . |
| 5,287,286 | 2/1994 | Ninomiya . |
| 5,295,078 | 3/1994 | Stich et al. . |
| 5,315,228 | 5/1994 | Hess et al. . |
| 5,321,627 | 6/1994 | Reher . |
| 5,325,041 | 6/1994 | Briggs . |
| 5,341,084 | 8/1994 | Gotoh et al. . |
| 5,349,282 | 9/1994 | McClure . |
| 5,349,535 | 9/1994 | Gupta . |
| 5,350,993 | 9/1994 | Toya et al. . |
| 5,350,996 | 9/1994 | Tauchi . |
| 5,455,499 | 10/1995 | Uskali et al. . |
| 5,541,489 | 7/1996 | Dunstan . |
| 5,549,671 | 8/1996 | Duley . |
| 5,565,759 | 10/1996 | Dunstan . |
| 5,606,242 | 2/1997 | Hull et al. ............................... 320/106 |
| 5,614,804 | 3/1997 | Kayano et al. . |
| 5,617,324 | 4/1997 | Arai . |
| 5,633,573 | 5/1997 | Van Phouc et al. ..................... 320/128 |

*Primary Examiner*—Peter S. Wong
*Assistant Examiner*—Gregory J. Toatley, Jr.
*Attorney, Agent, or Firm*—Scully, Scott, Murphy & Presser

[57] ABSTRACT

A battery pack and a method of monitoring remaining capacity of a battery pack. With this method, two different procedures are used to estimate that remaining capacity. In a first procedure, data generated on the battery pack is used to estimate remaining battery capacity; and in the second procedure, data transmitted to the battery pack from a host device is used to estimate remaining battery capacity. The battery pack switches between these two procedures under defined conditions; and for example, with the preferred embodiment described in detail in the present specification, the battery pack switches from the first procedure to the second procedure when the battery current falls below a threshold value.

8 Claims, 58 Drawing Sheets

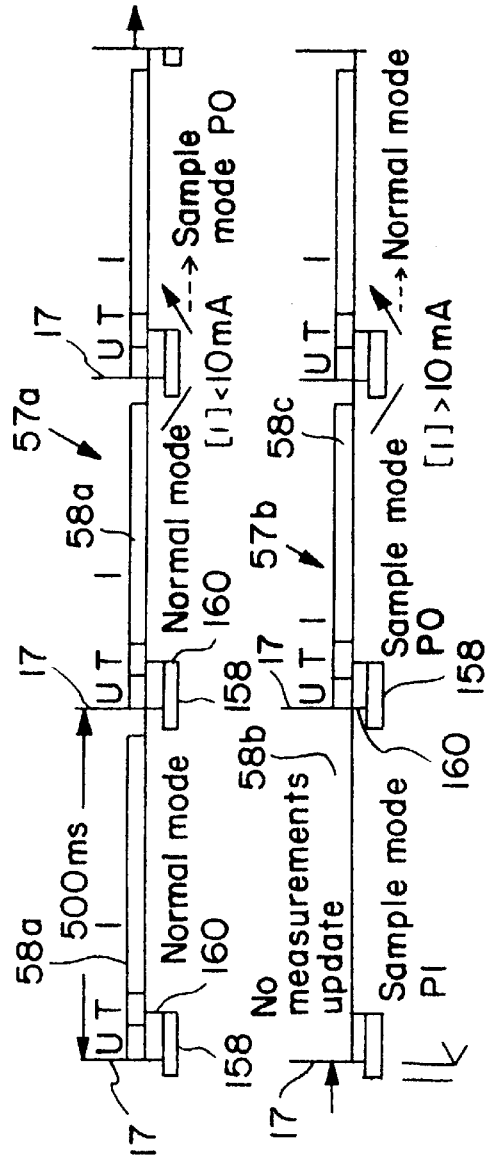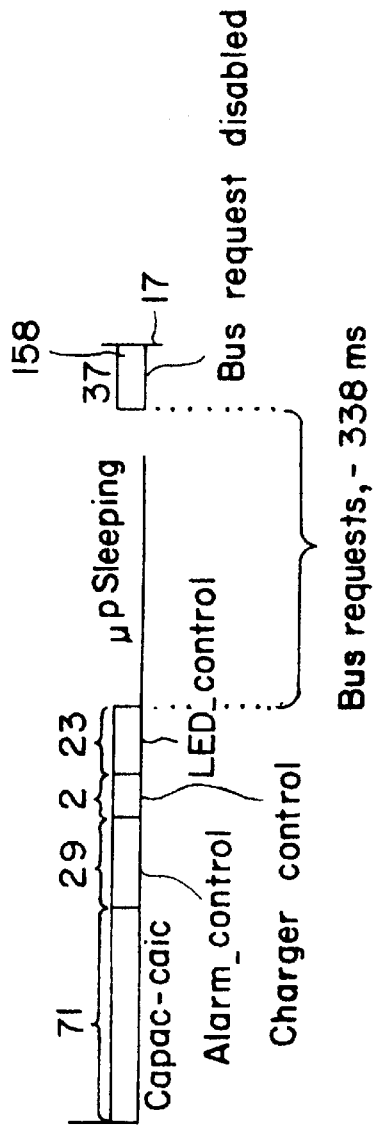

1.554 + 0.816 = 2.370Ah 2.307 + 0.078 = 2.385 Ah

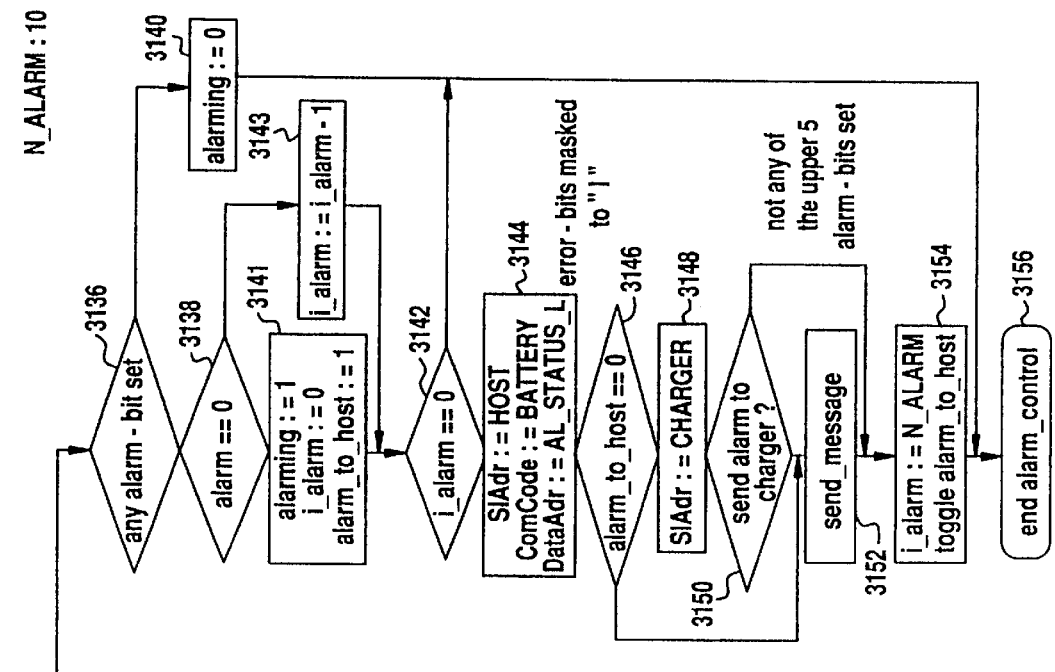
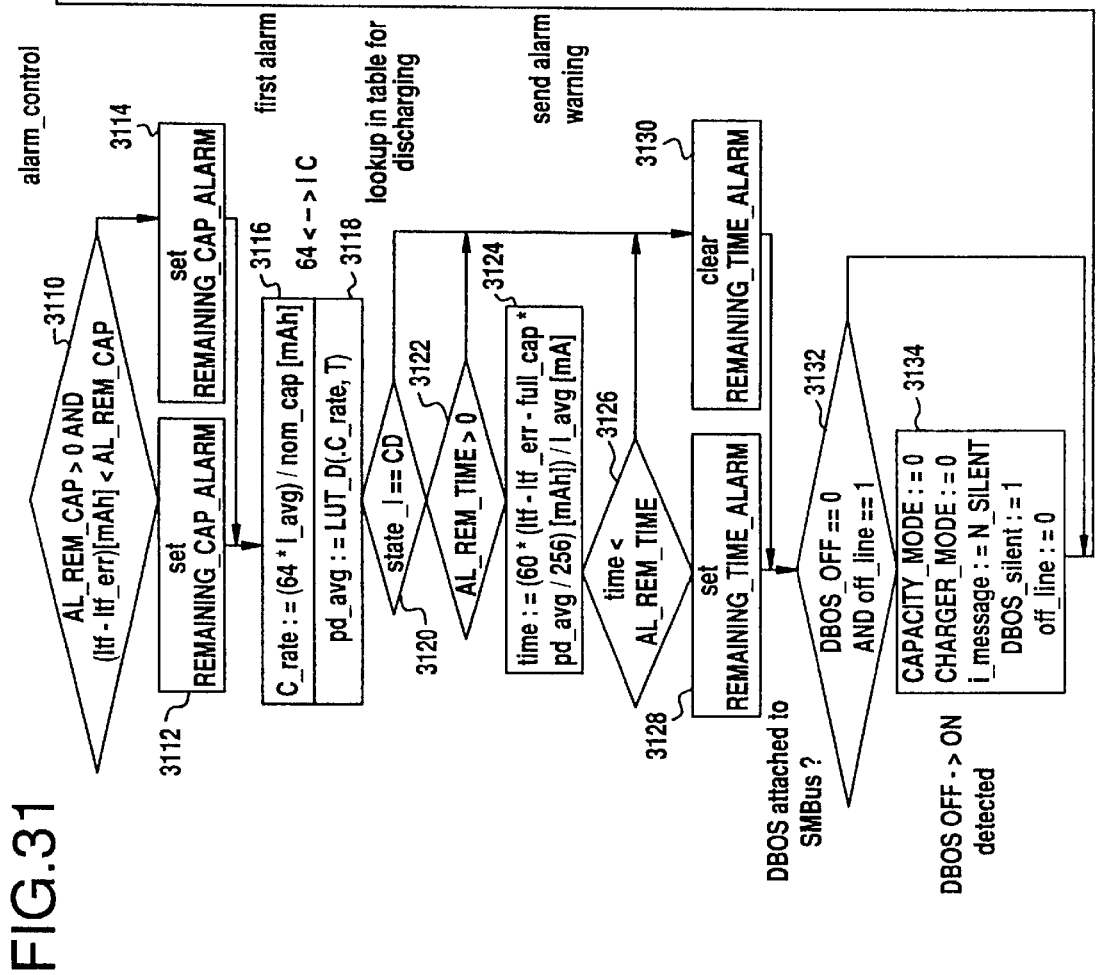
FIG. 31

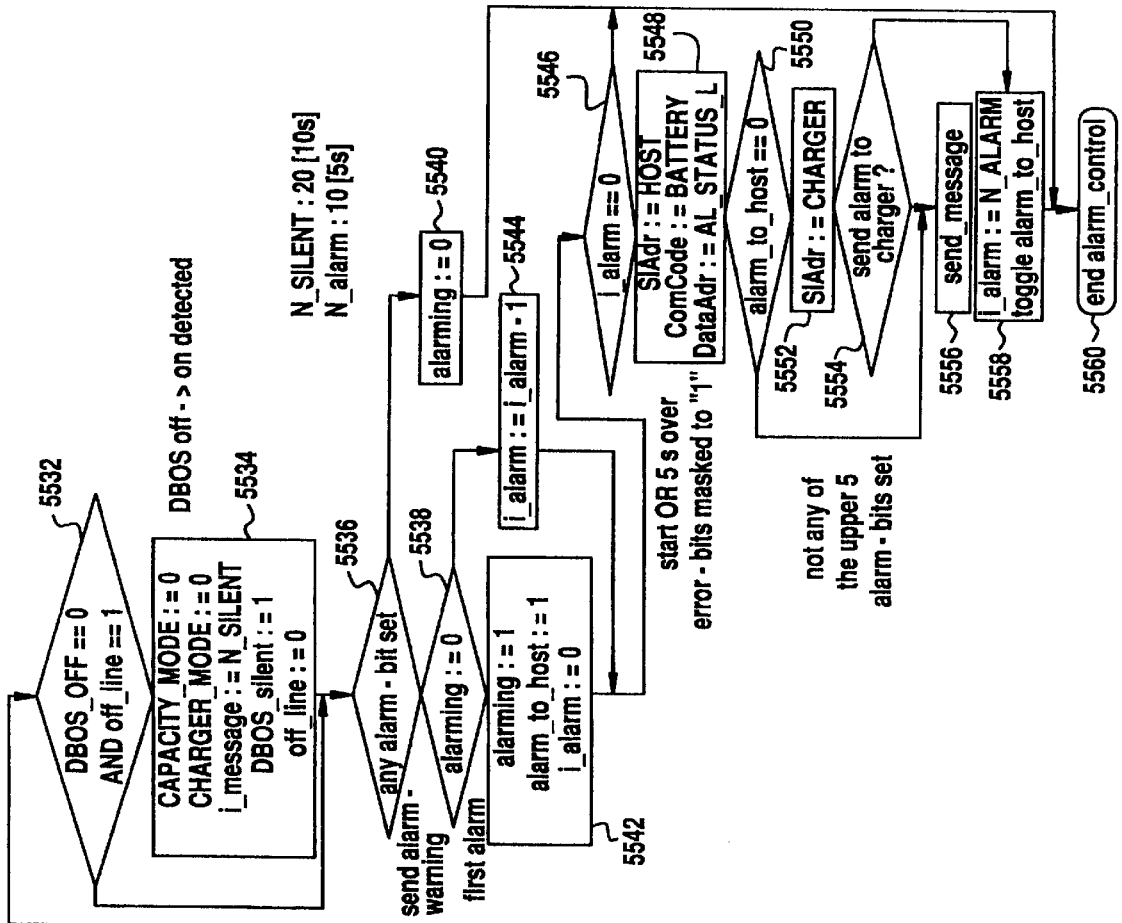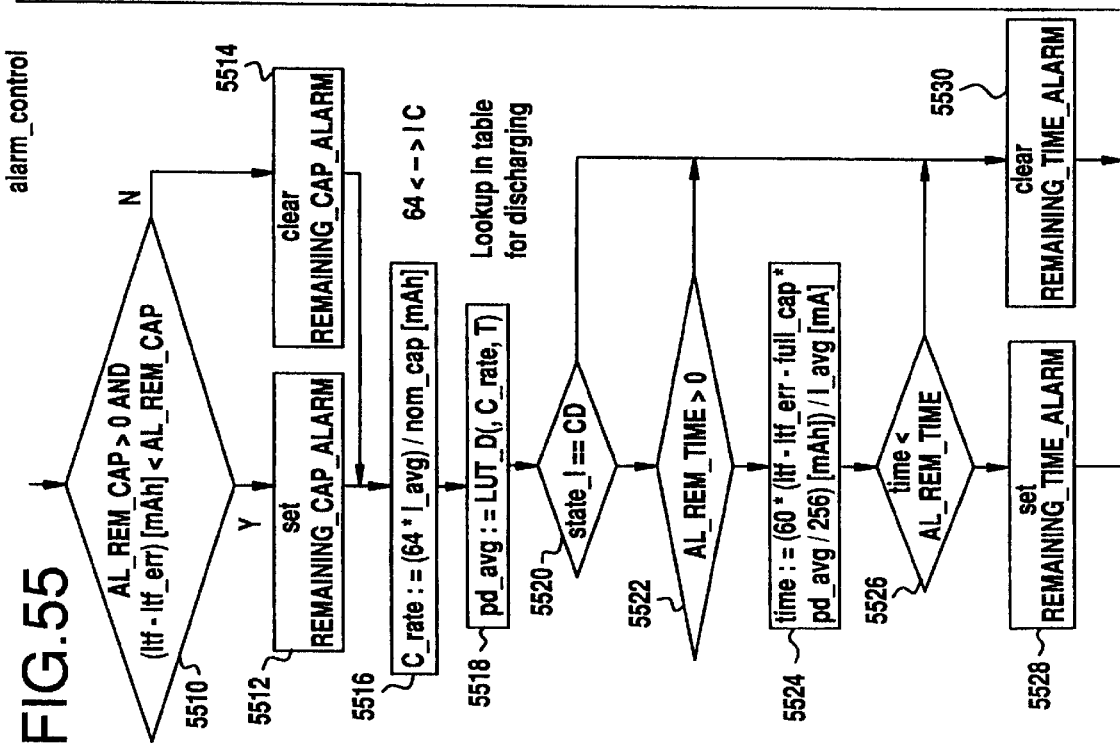
FIG. 55

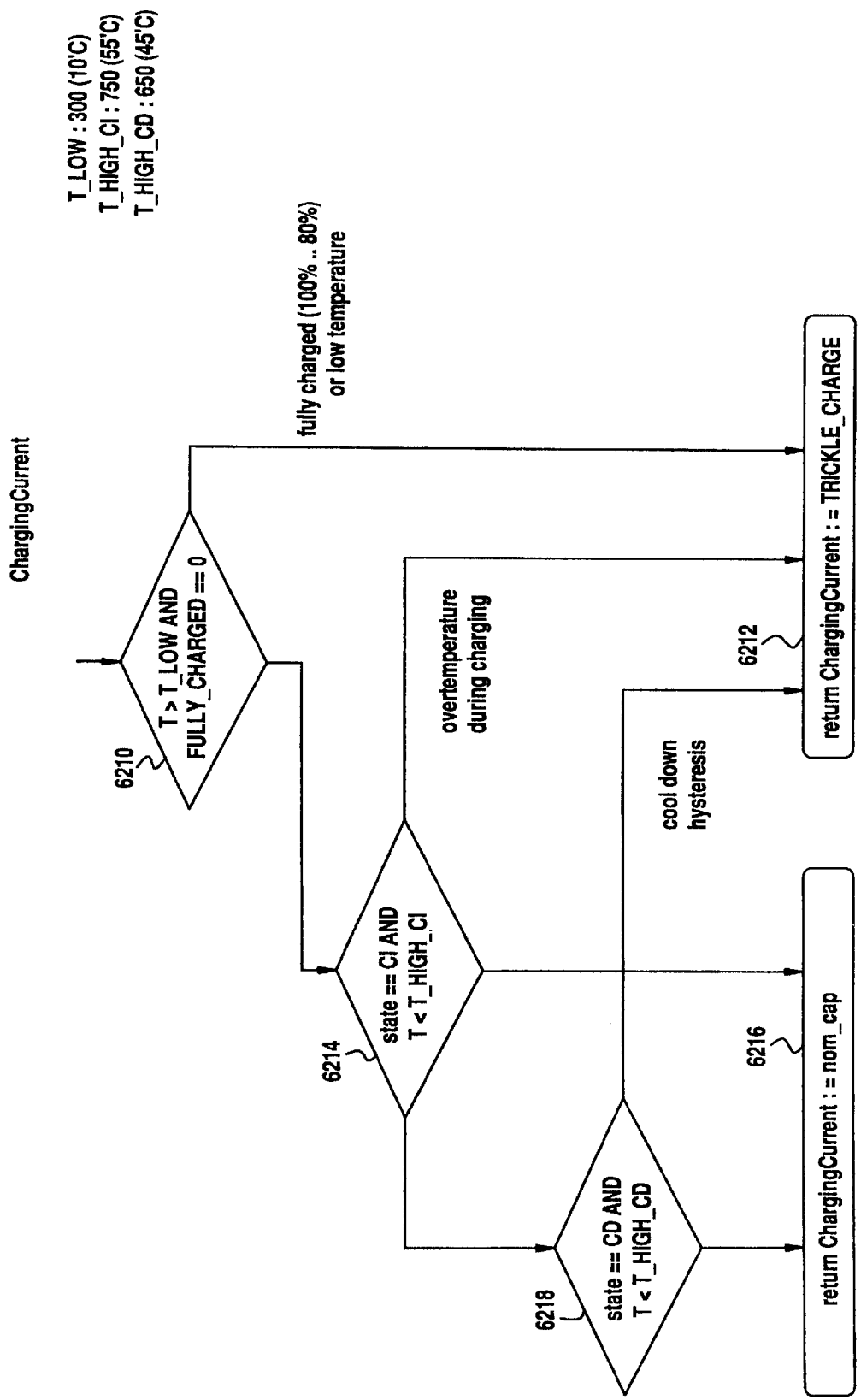

BATTERY PACK AND A METHOD FOR MONITORING REMAINING CAPACITY OF A BATTERY PACK

This application is a divisional of application Ser. No. 08/890,665, filed Jul. 9, 1997 now U.S. Pat. No. 5,794,592. This application claims benefit of Provisional Application Ser. No. 60/021,905 filed Jul. 17, 1996 and Provisional Application Ser. No. 60/034,320 filed Dec. 20, 1996.

FIELD OF THE INVENTION

The present invention relates generally to the art of rechargeable batteries and more specifically to a smart battery for use in an intelligent device having power management capabilities. The invention is a smart battery apparatus for controlling the operation of rechargeable Lithium Ion (LiIon), Nickel Metal Hydride (NiMH), or Nickel Cadmium (NiCad) batteries, and the like, to enable the reporting of accurate information to the intelligent device for power management and charge control specific to the battery's state of charge and chemistry.

DESCRIPTION OF THE PRIOR ART

The advent of intelligent portable electronic devices such as notebook computers, video cameras, cellular phones has enabled the development of smart rechargeable batteries that can communicate with the intelligent device to provide accurate information on the battery's present state of charge, and how best to recharge the battery to maintain maximum battery life, thus enabling the highest number of charge-discharge cycles. A user of such intelligent portable devices utilizing such smart batteries will not only know how much charge is left in the battery, but battery run time at various rates of power consumption. This enables the user to select a mode of operation that will enable maximum service life on the remaining state of charge and, how long the device will continue to operate.

Prior art rechargeable battery units have been provided with means for generating some desired information to their users, including for instance, a charge monitor and fuel gauge such as that disclosed in U.S. Pat. No. 5,315,228 which discloses a method for calculating state of charge and reporting run time to empty to the host computer system.

However, there is a need for a rechargeable power unit that will accurately maintain its own state of charge information even when nominally fully discharged such that a user will have instantaneous access thereof. Moreover, there is also a need for an intelligent rechargeable battery that can provide the user with an accurate prediction of its remaining operating time at various levels of power consumption. The user of such an intelligent device, such as a portable computer, can thus elect to power down a hard disk drive to extend the operation of the portable computer for a longer period of time than would have been possible at the higher rate of power consumption.

SUMMARY OF THE INVENTION

Accordingly, it is an object of the present invention to provide a smart battery device for use with a rechargeable battery to be installed in a host computer that will optimize the performance of the rechargeable battery throughout its life cycle.

It is another object of the instant invention to provide a smart battery device that includes a microprocessor for controlling a rechargeable battery that performs battery capacity calculations for communication to a host computer device or a smart battery charge device.

It is still another object of the instant invention to provide a smart battery device that includes a microprocessor for controlling a rechargeable battery and that provides intelligence in the form of present state of charge and battery charge parameters to a host device for communication to a smart charger.

It is yet still a further object of the instant invention to provide a smart battery device that includes a microprocessor for controlling a rechargeable battery that monitors battery operating parameters such as voltage, current, and temperature to thereby enable either a rapid charging rate or an optimal charging rate from any charged state.

Still yet another object of the instant invention is to provide a smart battery device that includes a microprocessor for controlling a rechargeable battery that calculates predictive data such as the battery's remaining life at the current rate of drain and at alternate rates of drain.

It is still a further object of the instant invention to provide a smart battery device that is an application specific integrated circuit (ASIC) having analog and digital components.

Furthermore, another object of the present invention is to provide a smart battery device that includes an analog to digital (A/D) converter for measuring battery charge parameters such as voltage, current, and temperature.

Yet still another object of the present invention is to provide a smart battery device having an A/D converter with a single positive power supply that is capable of bipolar operation for converting both positive and negative analog signals representing battery charge and discharge currents, respectively.

Another object of the instant invention is to provide a smart battery device as above wherein the analog and digital components of the ASIC comprise CMOS semiconductor technology designed for improved accuracy, and high A/D converter resolution with minimal power consumption.

Still another object of the present invention is to provide a smart battery device having a microprocessor such that, when nominally discharged, will place itself in a sleep mode with virtually no power consumption.

Yet a further object of the present invention is to provide a smart battery device that includes a microprocessor with RAM memory, and comprises means for retaining RAM memory contents when the device is in sleep mode.

Yet still a further object of the invention is to provide a smart battery device that comprises short circuit protection means for preserving RAM memory contents when the battery is temporarily short circuited.

Another object of the instant invention is to provide a smart battery device that includes a ROM memory that is manufactured by a process that facilitates the programming of ROM in an upper or respectively later produced layers.

Yet furthermore, an object of the instant invention is to provide a smart battery device that includes a ROM memory device whereby the programming of ROM is effected in a metal mask.

Furthermore, an object of the instant invention is to provide a smart battery device having incorporated therein an error treatment algorithm, for taking into account measurement errors, interpolation from look-up tables, etc., wherein the errors are considered to be a function of time. It is contemplated that if a total error is larger than a predetermined value, certain operating modes are disabled, and, in particular, variables are substituted by default values to result in a smaller error. In case of displayed information, such as LED battery pack display, the error can be additionally taken into account, for e.g., a quantity of: capacity—total error in capacity, may be displayed. If an error that is too big is produced, the end criterion for determining end of charge condition may be changed, for e.g., using −dU instead of the error influenced criterion.

These and other objects of the present invention are attained with a smart battery device which provides electrical power and which reports predefined battery parameters to an external device having a power management system, wherein the battery includes:

(a) at least one rechargeable cell connected to a pair of terminals to provide electrical power to an external device during a discharge mode and to receive electrical power during a charge mode, as provided or determined by said remote device, (b) a data bus for reporting predefined battery identification and charge parameters to the external device, (c) an analog means for generating analog signals representative of battery voltage and current at said terminals, and an analog signal representative of battery temperature at said cell, (d) a hybrid integrated circuit (IC) having a microprocessor for receiving the analog signals and converting them to digital signals representative of battery voltage, current and temperature, and calculating actual charge parameters over time from said digital signals, said calculations including one calculation according to the following algorithm;

$$CAP_{rem} = CAP_{FC} - \Sigma I_d \Delta t_d - \Sigma I_s \Delta t + \Sigma \epsilon_c I_c \Delta t_c$$

wherein $\epsilon_c$ is 1 for a LiIon battery, and for a NiMH battery is a function of battery current, temperature, and $CAP_{rem}$; and $I_s$ is a function of battery temperature and $CAP_{FC}$, the capacity at full charge, for a LiIon battery, and for a NiMH battery is a function of battery temperature and $CAP_{rem}$.

(e) a data memory defined within said hybrid IC for storing said predefined battery identification and actual charge parameters, even when nominally fully discharged, said charge parameters including at least full charge capacity and remaining capacity, (f) a bus controller defined within said hybrid IC for sending battery messages to said remote device over said data bus, said messages including said predefined battery identification and said actual charge parameters.

Superimposed on this equation is reset logic, to be explained below, that self corrects the value of $CAP_{FC}$ with a capacity calculation at each full charge (EOC) and each end of full discharge.

Further benefits and advantages of the invention will become apparent from a consideration of the following detailed description given with reference to the accompanying drawings, which specify and illustrate preferred embodiments of the invention.

BRIEF DESCRIPTION OF THE DRAWINGS

FIG. 8 illustrates the timing of the operating cycles under normal and sample mode operating conditions.

FIG. 9 illustrates the approximate time durations for the various measurements per operating cycle.

FIGS. 17 through 39 illustrate respectively the following logic flow diagrams or routines for a LiIon battery (with the exception of FIG. 21 a which is for a NiMH battery), main_chart, duty_cycle, initialization, RC_Oscillator_ adjust, learn_cells, capacity_calculation, IUT_calculation, U_calculation, V_control, selfdischarge, integration, Itf$_{13}$ Limits, end_conditionsCI, end_conditionsCD, alarm_ control, Charge_control, send_message, LED_display, handle_request, Read_Block, Write_Block, fetch_ADC_ values, and set_cell dep_val.

FIG. 55 shows a procedure for monitoring and generating alarms relating to various conditions of the battery pack.

FIG. 62 is a flow chart illustrating a routine for identifying a charging current being applied to the battery pack.

DETAILED DESCRIPTION OF THE PREFERRED EMBODIMENT

Figure 1:
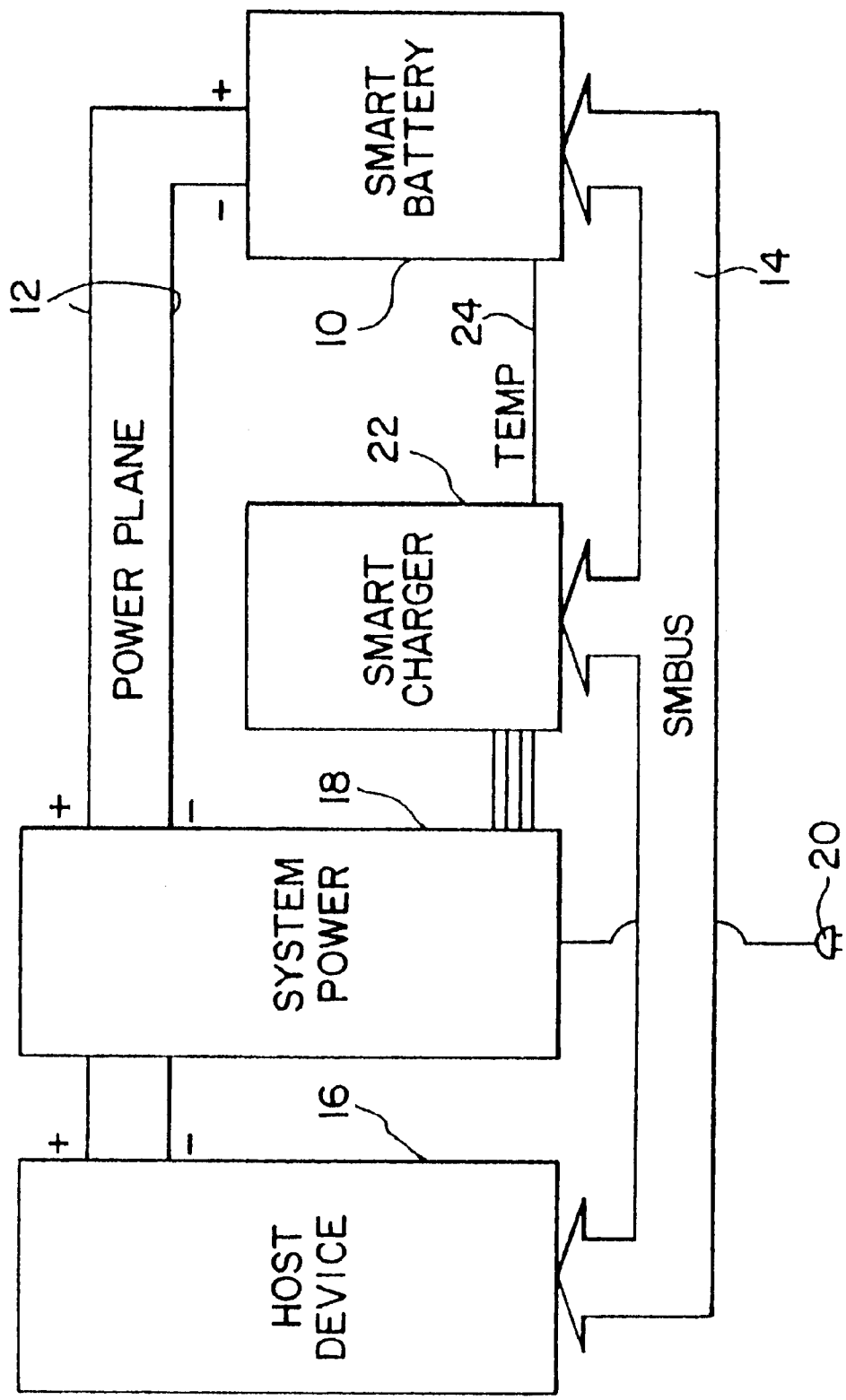
FIG. 1 is a diagrammatic block diagram of a smart battery device connected to a host computer and battery charging device.

The smart battery device of the present invention, referred to as a Duracell Battery Operating System (DBOS), is initially described in the following overview which includes the following sequential topics, ASIC Hardware, Architecture, CPU, A/D Converter, Current Measurement, Temperature Measurement, Pack Voltage Measurement, Cell Voltage Measurements, ROM, RAM, RAM Data Backup Circuit, 12C/SMBus Interface, Clock generation circuit, Wake-up comparator circuit, LED Drivers, Interface circuits, Hardware Modes of Operation, Run Mode: Entry/Exit, Sample Mode: Entry/Exit and Sleep Mode: Entry/Exit.

ASIC Hardware

Architecture

The ASIC (Application Specific Integrated Circuit) is composed of five basic blocks: processor core (CPU), analog to digital converter (A/D), program memory and look-up tables (ROM), data memory (RAM), and the I2C/SMBus communications interface. The primary goal of these components is to measure, calculate, and communicate the status of the Smart Battery.

Each of the above blocks includes additional hardware and software components required to perform the specific task. Some of these components are shared between components, such as the internal clock oscillator which is used by the CPU and the A/D.

CPU

The Central Processing Unit, or processor core, of the ASCI is an 8-bit microcontroller processor. It is considered a Reduced-Instruction-Set-CPU (RISC) since it lacks complex instructions such as multiply and divide. It is a low-power design, optimized for both reasonable speed and very low power consumption.

The CPU requires a 4-phase clock which is derived from the internal RC oscillator. Each cycle of the clock is approximately 8.8 usec in duration.

The CPU executes the program software which includes everything from operation of the A/D to capacity calculations to I2C/SMBus communications. A more complete description of the software is included in Chapter 3—DBOS Algorithm. Portions are also discussed in Chapter 2—SBData and SMBus.

The CPU uses a Harvard architecture which separates the data and program memory accesses so the CPU can operate more efficiently. A traditional architecture uses a single data program memory space but this delays operation since a program instruction must wait for data read/writes and vice versa. The separate data and program memories require addition space but are faster in operation.

The CPU uses a 12-bit instruction word even though it is an 8-bit processor core. This allows a more efficient coding since the instructions can by combined with 8-bit data as well.

The CPU includes an Arithmetic Logic Unit (ALU), a standard stack and program counter, a bi-directional data bus, and a watch-dog timer. The ALU performs computions and executes program instructions. The data bus transfers program instructions and data values, and the watch-dog timer monitors the software execution.

The watch-dog timer is a common device within the CPUs. It helps prevent unwanted software execution or hang-ups. The watch-dog requires that a particular register must be written regularly. If it is not written, then the watch-dog has 'timed out' and will reset the CPU. This reset will clear the hang-up and re-start the CPU at a known state.

The CPU uses a paged-memory access procedure since its address mechanism cannot reach the whole 4K program ROM space. Instead, the memory is addressed and executed on in smaller pages of 128. This requires additional CPU overhead to track and correctly jump and switch the program instruction pages. This procedure was due to the continued growth in the size of the program code during the development of the DBOS. Due to time schedules it was easier to implement a paged-memory mechanism than to re-design the ASICs program memory addressing width.

A/D Converter

The A/D converter requires a 5-phase clock which is derived from the internal RC oscillator. The RC oscillator frequency is divided by 2 and then again by 5 to obtain the correct A/D clock. Each cycle of the A/D clock is approximately 22 usec in duration. The A/D is the longest (slowest) device withing the ASIC but this is due to the measurement method used in the A/D.

Analog-to-Digital conversion occurs by performing a series of comparisons to know values and then assigning a digital representation to the converted value. Speed and resolution are sometimes inversely proportional. Given enough time, very accurate measurements can occur, however, time is usually critical to system operation.

The A/D converter performs a conversion for a duration relative to the desired level of resolution, in bits. The conversion time is the period of the A/D -phase clock for $2^{n+1}$ bits. The 10-bits resolution for temperature and pack voltage conversions require $2^{11}$ clock cycles to complete while the 13-bits current conversion requires $2^{14}$ clock cycles.

The A/D converter essentially performs only voltage conversions but these voltages can represent other measurements in the system, in this case, battery temperature and current as well. The pack voltage is measured through a resistive divider circuit. The pack temperature is measured as a voltage across another resistive divider where part of the divider circuit is a thermistor, a device who resistance changes with temperature in a known way. The pack current is measured as a very small voltage drop across a very small value sense or shunt resistor. The direction of the current is determined by a polarity of the voltage across the sense resistor.

The A/D converter is an incremental delta-sigma converter, a particular type of an A/D implementation. This type of converter can perform bi-polar (both positive and negative measurements) using only a single voltage reference. The quantization error is also controlled very well by the delta-sigma design since the error is offset in both directions equally.

The A/D converter is not a sampling type implementation but instead integrates the analog input signal during the whole conversion cycle. This type of A/D/ is not sensitive to parameters such as the clocking frequency or waveform.

The A/D converter uses separate full-scale reference voltages for each type of measurement: current, voltage, and temperature. The current and temperature measurements use a 150 mV full-scale reference. The pack voltage measurements uses a 350 mV full-scale reference.

Current Measurement

The internal pack current is measured using a (shunt) resistor connected in series with the power path of the pack. The voltage across this fixed value sense resistor is measured and converted to a representation of the current flowing in the pack. Direction of current flow is also determined. The resistance of the sense/shunt resistor must not change due to temperature or other effects in order for the measurements to remain consistent and accurate.

The voltage value observed across the sense resistor is on the order of tens of microVolts (uV) or l/1,000,000 of a Volt. This is an extremely small value and is the most difficult measurement of the A/D. In order to provide accurate measurements, care is taken in the layout and routing of any part of this circuit, both internally and externally.

In order to accurate measure these very small voltages in the presence of internal and eternal noise, separate sense and ground leads are used. Each end of the sense resistor has a sense lead (Vsh− and Vsh+) and the most negative end of the sense resistor also has an additional ground reference line, Vans. The Vans and Vsh− lines being separate help improve the noise immunity of the A/D current sense circuit.

Calibration of the current measurement requires two values: a correction factor or slope adjustment, and a correction offset. The Correction factor, Cf_curr, is used to calibrate out the tolerance of the shunt sense resistor and the full-scale reference voltage. the correction offset, Co_curr, is used to re-zero the current measurement due to system offsets.

The current measurement equation is:

$$Ishunt = (Cf.curr/16384) * (I\_A/D - Co\_curr)$$

I_A/D is the raw digital conversion value of the current measurement. Ishunt is the actual current value reported in mA units.

Temperature Measurement

The internal pack temperature is measured using a temperature-varying resistance device (NTC) and a voltage divider string. The voltage across the NTC is converted into a temperature representation since the other resistance and reference voltage in the divider string are both known. The resistive voltage divider network is external to the ASIC.

To conserve power, the negative connection of the voltage divider string is connected only when a measurement is occurring. (If left connected, the resistive divider string would continually drain current, although very small amounts.)

The resistance value of the NTC decreases as the temperature increases but is nominal 10 kohms at 25° C. A look-up-table is used to convert the measured NTC voltage to actual temperature due to the slightly non-linear slope of the NTC curve. (Lower resistance=Higher temperature but not completely linearly.) Interpolation is used between look-up-table values.

Calibration of the temperature measurement requires two values: a correction factor or slope adjustment, and a correction offset. The correction factor Cf_temp, is used to calibrate out the tolerances of the resistor divider network, the NTC, and the full-scale reference voltage. The correction offset, Co_temp, is used to re-zero the temperature measurement due to system offsets. Not all versions of DBOS use both of these calibration correction values.

Due to the complications of measuring internal pack temperature during calibration, these correction values are not typically changed. The default values appear to work satisfactory, mostly since the temperature is only critical in a relative sense, not absolute. Accuracy for changes in temperature is critical, but not the absolute accuracy.

The temperature measurement equation is:

$$T\_LUT = (Cf\_temp/2048) * (T\_A/D - Co\_temp)$$

T_A/D is the raw digital conversion value of the temperature measurement. T_LUT is the value used for a Look-Up Table conversion to an actual value reported in 0.1K units. (Note: Some versions of DBOS do not use the Co_temp value.)

Pack Voltage Measurement

The internal pack voltage is measured also using a voltage divider resistances and reference voltage in the divider string are known.

In some versions of the DBOS the resistive voltage divider network is external to the ASIC, in later versions (DBOS-II) it is internal to the ASIC. The external components are 1% values to maintain matched accuracy of the ratio. The internal components are less accurate for the exact values but the ratio is more closely matched and less likely to drift. However, this requires finer calibration with the internal version due to the initial wider variance in values.

To conserve power, the negative connection of the voltage divider string is connected only when a measurement is occurring.

Calibration of the pack voltage measurement requires two values: a correction factor or slope adjustment and a correction offset. The correction factor, Cf_volt, is used to calibrate out the tolerances of the resistor divider network and the full-scale reference voltage. The correction offset, Co_volt, is used to re-zero the pack voltage measurement due to system offsets. Not all versions of DBOS use both of these calibration correction values.

The current measurement equation is:

$$Vpack=(Cf\_volt/2048)*(V\_A/D-Co\_volt)$$

V_A/D is the raw digital conversion value of the pack voltage measurement. Vpack is the actual pack voltage value reported in mV units.

(Note: Some versions of DBOS do not use the Co_volt value.)

Cell Voltage Measurements

In certain DBOS-II implementations used for LiION, individual cell voltages are measured in addition to the overall pack voltage. This is done for both safety and capacity calculation reasons. Each cell has its own voltage monitoring connection and the cell stack voltage is measured by subtracting the individual voltages from the full pack voltage.

The measurement method is the same for the cell voltages since the ASIC uses an additional 2 pins for the added cell monitoring points. Internal to the ASIC are resistive voltage divider networks to scale the cell voltage appropriately, just like the pack voltage measurement mechanism.

Due to additional components in the LiIon power path, some of the individual cell voltages, like the most negative cell, have additional correction offsets added as series resistances. These allow compensation in the calculation for voltage drops which occur due to the addition power path components.

The individual LiIon cell voltages are used for all safety and capacity calculations, while the pack voltage is only used for reporting the SBData value for Voltage when requested.

ROM

The Read-Only-Memory of the ASIC contains the program code software for the CPU instructions and the various look-up tables for self-discharge, charge efficiency, etc.

The ROM memory is 4096×12-bits in size due to the CPU's 12-bit program instruction width. This is equivalent to a 6k byte (8-bit) size memory. The ROM is encoded in the ASIC's silicon as one of the last steps in the ASIC fabrication process. This allows it to be somewhat easily changed as changes in look-up value are required.

RAM

The Random-Access-Memory of the ASIC is a read/write block of data memory which contains the many variables required to execute the DBOS algorithm. These variables and values include the learned functions such as FullChargeCapacity, and the pack-specific values such as DesignCapacity, DesignVoltage, SerialNumber, ManufactureDate, etc.

The RAM is organized as 128 bytes (8-bits per byte) some with write protection which requires password access in order to write to the RAM. A small portion of the RAM (used in the SBData ManufacturerData area) is used to calculate a checksum. This checksum produces a known result if the contents of the RAM is correct. Otherwise, the value is incorrect and indicates that the RAM contents has been altered due to RAM data loss, an ESD event, or some other cause. When the checksum is incorrect, the RAM contents are reset to power-on-reset defaults so that correct operation of the ASIC can continue.

RAM Data Back-up Circuit

Since the RAM contents are important to the operation of the ASIC, the data in the RAM is protected from accidental erasure and loss due to loss of power.

A RAM Data Back-Up circuit is used to maintain the contents of the RAM during loss of power to the ASIC, such as during a short-circuit condition, or during over-discharge.

The Data Back-Up circuit uses an external capacitor to maintain an acceptable voltage for the internal RAM. This capacitor is normally connected internally to the ASIC's power supply, called Vasic or Vddd, through a PMOS transistor (FET). When the Vasic (Vddd) voltage drops below the POR threshold (approximately 2.0 V) then the capacitor is disconnected from the Vasic (Vddd) voltage and the RAM is supplied from the capacitor alone.

The RAM typically requires only a few nano-Amps (1E-9 Amps) of operating current in its standby state (only maintaining itself, not being read or written). The external capacitor is thus able to maintain the RAM for anywhere from hours to days depending on the leakage of the capacitor, the internal FET switch, and the current consumption of the RAM itself.

When the Vasic (Vddd) voltage returns above the POR threshold (2.0 V to 2.4 V) then the FET switch re-connects the RAM to the main ASIC voltage to restore full operation. The contents of the RAM are then checked (in the POR procedure) using the checksum value and reset to defaults if the RAM data was not maintained.

Normally, RAM data is maintained since short-circuit conditions are usually only short duration events due to other pack protection devices such as PTCs and thermal fuses. 12C/SMBus Interface The 12C/SMBus interface allows the ASIC to communicate with the outside world via a standard interface protocol using defined data sets. The 12C/SMBus interface can operate as either a slave, responding to requests for data, or as a master, generating alarm and charging broadcasts to another device.

The 12C/SMBus interface is a byte-wide hardware based interface with a software link to the CPU. The first byte received is completely independent of the CPU but additional bytes are either received or the transfer aborted as controlled by the CPU.

The hardware 12C/SMBus interface monitors for Start conditions and responds to the Smart Battery address when recognized. If addressed correctly, an automatic ACKnowledge (ACK) is generated and the CPU is notified that a data request has been initiated.

The CPU then controls the transfer by informing the hardware interface to receive the next byte or terminate the transfer by generating a NOT ACKnowledge (NACK) at the end of the second byte.

Transfers continue in this manner with the hardware handling the individual input/output and the CPU controlling the overall data flow.

The hardware can respond to any 12C/SMBus clock speed but the CPU may require clock stretching between bytes during the ACK clock duration.

When a SBData request occurs, the CPU must calculate the appropriate value since there is not enough time or memory to pre-calculate all 34 SBData values. Due to long calculation times, the ACK clock is usually stretched (up to the 25 msec maximum allowed) while the CPU calculates the result requested.

The CPU can also initiate a 12C/SMBus communication when it determines that an alarm condition has been tripped (Alarm Warning) or when charging information should be sent to a Smart Charger (ChargingVoltage and ChargingCurrent).

When becoming a master device, the hardware interface notifies the CPU when the 12C/SMBus is clear and available, and then generates a Start condition and appropriate clocking. The 12C/SMBus clock (CLK) frequency is a sub-multiple of the internal RC oscillator frequency.

Misc Components

Clock generating circuit

The clock generation circuitry controls two separate oscillator devices: an internal RC oscillator which is used for all CPU, A/D, and 12C/SMBus timing; and an external crystal which is used solely for the measurement and cycle timing of the software executing on the CPU. The internal RC oscillator is variable with voltage and temperature and therefore not used for exact time measurements. The external crystal is highly stable and accurate over temperature and voltage so it is used for the critical time events, such as self-discharge estimations.

The RC oscillator normally runs at 450 to 460 kHz frequency but may vary to as low as 390 kHz or as high as 510 kHz. This frequency is divided by 4 for the internal CPU clock and by 10 for the A/D measurement clock. It is also divided by either 10 or 8 for the 12C/SMBus alarm frequency clock when the ASIC must be an 12C/SMBus master device.

The ONLY way to measure the internal RC oscillator frequency is to set a SBData RemainingTime or RemainingCapacity Alarm and then wait for an AlarmWarning message to be generated. The clock frequency of the AlarmWarning generated by the ASIC's 12C/SMBus circuit is the RC oscillator's frequency divided by 10 or 8, depending on the DBOS version.

The internal RC oscillator is shut off when the ASIC enters Sleep Mode.

The external crystal operates at a very exact 32.768 kHz and is used for all the exact timing within the ASIC. This frequency is divided down to a ½ Hz (500 msec) signal which is main cycle control interrupt used by the ASIC's software. The capacity algorithm is re-started based on this signal (depending on the mode of operation at the time, Run, Sample, or Sleep); the A/D measurements are started based on this signal; and the Wake-Up comparator is activated when in Sleep Mode based on this signal.

The external crystal is always running as long as the ASIC supply voltage is greater than the Power-on-Reset (POR) level of 2.0 to 2.4 Vasic, regardless of the mode of operation.

Wake-Up Comparator Circuit

The Wake-Up Comparator circuit is used when the ASIC is in the Sleep Mode. Once in this mode, all internal operation of the ASIC stops (except for the control of the external crystal). In order to detect an exit from the Sleep Mode into either the Run or Sample Modes, a Wake-Up Comparator must be used.

The Wake-Up Comparator is simply a voltage comparator which is turned on once every 500 msec cycle to roughly measure the full pack voltage. This is not an A/D measurement, just a rough measurement of the pack voltage using a simple resistive divider circuit. The pack voltage is then compared to the internal band-gap reference (1.25 V nominal).

If the pack voltage is greater than the preset threshold, usually just below the nominal open-circuit pack voltages of 7.2 V, 10.8 V, 12 V, 14.4 V, etc. then the Wake-Up Comparator "awakens" the rest of the ASIC. (The actual comparator voltage value varies with the silicon process but is approximately 1.17 V/cell for NiMH versions and 3.55 V/cell for LiION versions.)

To conserve power through the resistive divider circuit, this divider is only switched on for approximately 30 usec every 500 msec cycle.

LED Drivers

The LED driver circuit activates 5 LED outputs, of which only 4 are used for LEDs. The 5th LED driver output is either not used or used for other control functions (non-LED related) on some DBOS versions.

The LEDs are activated by a press of the LED switch or by invoking the LED test via a SBData command in the BatteryMode register.

A press of the switch will activate all the LEDs corresponding to the current battery State-Of-Charge (SOC) for approximately 3 to 5 seconds. The LED test using the BatteryMode value of 1000h illuminates each LED in sequence for approximately ⅓ second.

The illumination sequence (for SOC or test) starts with the LED closest to the switch, referred to as the 10% LED.

The SOC displayed is either Relative (related to FullChargeCapacity) or Absolute (related to DesignCapacity) and is determined by the value in the Kind-Of-Display (KOD) byte or bit in the ManufacturerData area. A KOD value of zero (0) indicates RelativeSOC will be displayed.

The LEDs are activated by internally connecting the cathode to the Vdss (ground) reference within the ASIC. This completes the circuit from the Vpack input, through the current limiting resistor, and the LED itself.

Instead of a continuous direct connect completing the circuit, the LEDs are switched into the complete circuit for 200 usec every 1 msec. This corresponds to a 1 kHz multiplex rate.

To achieve the effect of a continuous illumination, the LEDs are driven with a peak current of 25 to 50 mA.

Interface Circuits

There are numerous other interface circuits within the ASIC which perform additional input functions. Examples include the external crystal start-up and drive circuit which enables the operation of the external crystal. The CPU and A/D logic interface, the CPU to RAM and ROM interface, the 12C/SMBus to CPU interface, etc.

Hardware Modes of Operation:

There are three (3) basic modes of operation of the ASIC: Run, Sample and Sleep. The separate modes are included to improve the power consumption of the ASIC to limit the drain on the battery cells during operation. Basic characteristics of each mode are listed below along with entry and exit conditions.

During each of the modes of operation there are slightly different CPU and A/D processes to compensate for the differing operation. During a normal process cycle, the CPU will go to 'sleep' if no further calculations are required and no 12C/SMBus communications are requested. This internal CPU mode, also termed 'sleep' is NOT the same as the whole ASIC going into the Sleep Mode.

Run Mode: Entry/Exit

The main operational mode of the ASIC is Run Mode: all components are active at all times. Entry into this mode is from both Sample or Sleep Mode depending on measured current and pack voltage values. Measurements and capacity calculations occur during every 500 msec operation cycle.

Run Mode is exited when the measured current drops into the Sample Mode limit or when the measured voltage drops below the Sleep Mode threshold.

Sample Mode: Entry/Exit

Sample Mode is the first level of lower power consumption used by the ASIC to prevent deep discharge of the battery cells. It is primarily used for a battery at rest, being neither charged or discharged.

Sleep Mode is entered when the current measurement reports a pack current less than the Sample Mode threshold, typically +/−10 mA. This current value usually indicates a battery at rest or with only a maintenance charge or low-rate discharge.

During Sample Mode, the A/D is only started once per second (DBOS-I/IA) or once per 3 seconds (DBOS-II) to take voltage, temperature, and current measurements. All capacity calculations and 12C/SMBus communication requests still operate at their normal rate as in Run Mode. But the judicial use of the A/D, which uses more power in operation, reduces the ASIC's power consummation significantly.

All capacity calculations compensate for the reduced frequency of current measurements so long periods of time in Sample Mode do NOT affect accuracy.

Sample Mode is exited when the current measurement returns a current greater than the threshold which returns the ASIC to Run Mode. Sample Mode is also exited when entering Sleep Mode (see below).

Sleep Mode: Entry/Exit

Sleep Mode is the lowest power consuming state of the ASIC and is essentially the "off" state. The only devices in the ASIC still functioning are the external crystal drive circuits, the Wake-Up Comparator Circuit, and the RAM data back-up circuit.

Sleep Mode is entered when the voltage measurement returns a voltage less than the Sleep Mode threshold, usually 0.9 V/cell for NiMH and 2.7 to 2.4 V/cell for LiION. These voltages indicate a deeply discharge battery which should NOT be discharged further.

In DBOS-I/IA Sleep Mode is entered from either Run Mode or from Sample Mode whenever the 0.9 V/cell limit is reached. In DBOS-II Sleep Mode can only be entered from Sample Mode (unless a safety FET activation occurs). This way, the discharge must stop or slow prior to entering Sleep Mode.

During Sleep Mode, no capacity calculations or communications are preformed.

Sleep Mode is exited only via the Wake-Up Comparator Circuit which monitors the pack voltage. The smart battery device of the present invention is intended for use with an intelligent host device such as a portable computer, portable video camera or cellular telephone having a system management bus and a smart charger, or an intelligent host device having a system power manager that can receive and send data over a system management bus.

A representative example of such a system is illustrated in FIG. 1, wherein the smart battery 10 is connected to a power plane 12 to supply and receive electrical energy over the power plane, and a system management bus 14, which is a bi-directional modified I2C data bus (communication interface) that communicates with a host device 16 which may be a portable computer. The host device 16 may be powered by the smart battery 10, or by the system power supply 18 and a conventional AC source 20. A system power supply or power management system also communicates with a smart charger 22 which may be used to determine the rate and duration of charge sent to the smart battery by the power supply. Smart charger 22 also communicates with the system management bus 14, and may receive a temperature signal representative of battery cell temperature on a separate line feed 24. A detailed functional description of the system management bus 14 (bi-directional modified I2C data bus) can be found in the Intel\Duracell System Management Bus Specification, Rev 0.95, (April 1994).

The system power management system 18 may supply or draw power to/from the smart battery 10 over power plane 12, depending upon the state of charge in smart battery 10, and depending upon the presence or absence of power at AC source 20.

The smart charger 22 may periodically poll the smart battery 10 for charge characteristics, and adjust output to match a smart battery charge request. Optionally, and if selected by the user of the host device, the smart charger 22 can override the smart battery's charge rate request and charge the smart battery at a higher or quick charge rate. The user of the host device does not necessarily need to override the smart battery's request. As will be explained in greater detail below, the smart battery may periodically broadcast the desired charging current, or the smart charger 22 polls the smart battery for a charging current. The host or the charger need not comply with the smart battery's request and can provide a greater or lesser amount of power than requested.

The host device 16 may communicate with the smart battery over the system management bus 14 and request information from the battery for use in the system power management scheme, thereby providing the user of the host device with information about the battery's present state and capabilities. The host device 16 will also receive notice of critical events, including alarm conditions, remaining capacity below a user set threshold value, a remaining run time below a user set threshold value, or an end of discharge signal. The alarm conditions include but are not limited to overcharging, overtemperature, a remaining charge capacity below a predetermined or user set capacity, or, a run time below a predetermined or user set run time remaining.

As will be hereinafter explained in greater detail, the smart battery can report out an instantaneous current value being drawn from the battery, current values averaged over predetermined time intervals, present temperature and present voltage.

The smart battery may also report out a number of battery status indicators, indicating whether or not the battery is charging or discharging, that charging is complete, or, that the battery is fully discharged.

In addition, it can provide calculated values including run time remaining at a present current usage, a run time remaining at an average current use, a run time remaining at optimal current use, and a predicted run time remaining at a host device selected current level (discharge rate).

The smart battery device 10 is also provided with a read-only memory (ROM) that is manufactured to contain a set of predefined battery identification parameters which may include manufacturer data, cell chemistry, design capacity, design voltage, and a unique device identification number. The predefined battery identification parameters are available, for either the host device or the smart charger, to assist them in the selection of optimal usage and charge parameters for the smart battery.

The smart battery is also capable of recommending a desired charge current, reporting a time remaining to full charge, a battery capacity available at full charge, and the number of times the battery has been charged or discharged.

The smart battery of the present invention utilizes a hybrid integrated chip (IC) containing an embedded microprocessor and a novel analog to digital connector which receives analog signals from the battery and converts them to digital signals representative of battery voltage, current and temperature. The smart battery microprocessor then calculates actual charge parameters over time from these digital signals according to a predetermined algorithm in which $CAP_{rem}$ is the remaining capacity of the battery which is continuously assigned a new value to reflect adjustments for effective charge, discharge, and self discharge.

Figure 14:
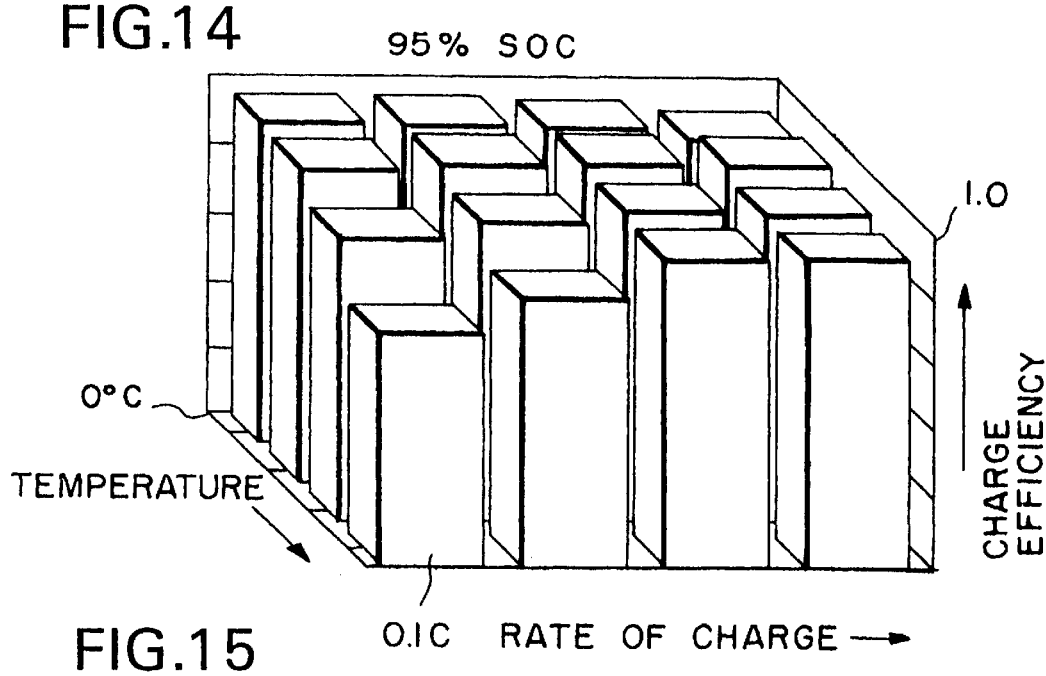
FIG. 14 is a three-dimensional graphic representation of charge efficiency look-up tables showing charge efficiency factors ($E_c$) as a function of relative state of charge, charging current, and temperature for a NiMH battery, and wherein similar look up tables are not required for a LiIon battery which has a charge efficiency of 1.
Figure 15:
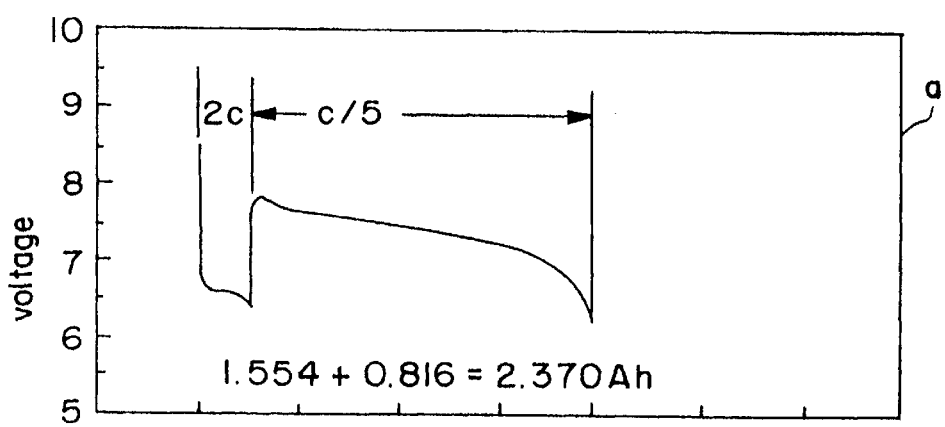
FIGS. 15 and 16 illustrate two voltage versus time graphs, a and b, comparing calculated battery capacity characteristics at various discharging current rates for a six (6) cell battery pack for a NiMH battery, and similar graphs are available for a LiIon battery.

The charge delivered to the battery is measured, and for a NiMH battery is adjusted by an efficiency factor which is a function of current, temperature, and relative state of charge. It should be mentioned that the remaining capacity, $CAP_{rem}$, and the relative state of charge, SOC, represent the same thing (remaining battery capacity) and differ in that relative state of charge is indicated as a percentage of the last full charge capacity. The charge efficiency for a NiMH battery is a value determined as a function of the above variables and may be derived from a look up table, hereinafter described with respect to FIG. 14, or calculated from a formula which provides a stepwise approximation of charge efficiency behavior, depending upon current, temperature and state of charge. It is understood that the charge efficiency factor can be obtained from a response equation or interpolation between several different values stored in memory.

Likewise, the remaining battery capacity $CAP_{rem}$ is decremented by the measured discharge rate over time. A predictive model of residual capacities determines expected $CAP_{rem}$ for a present current and temperature. This predictive model may also estimate when the battery voltage will drop to a predetermined cut-off voltage of the present rate of discharge. This residual capacity model may be calculated from a formula or obtained from a look up table, which includes values of residual capacities as a function of discharge current and temperature.

Finally, $CAP_{rem}$ is also adjusted by subtracting self discharge. For a NiMH battery self discharge is calculated as a function of temperature and state of charge, and is always subtracted from $CAP_{rem}$, regardless of whether the battery is discharging or being charged. Self discharge may be derived from a look up table of empirical models of identical cell chemistry that predict self discharge as a function of temperature and state of charge, or may be calculated by the microprocessor.

As will be hereinafter explained in greater detail, $CAP_{FC}$ is a learned value which is self correcting because of reset logic incorporated in the capacity algorithm.

The charge algorithm terminates its integration of the present discharge state when it reacts to an end of discharge (EOD) signal between 0.9 volts/cell and 1.1 volts/cell and preferably 1.02 volts per cell. At that point it resets $CAP_{rem}$ to a new learned value of residual capacity, as determined from the integration of the discharge current, as a function of discharge current and temperature.

As will be hereinafter explained in greater detail, the reset logic will reset $CAP_{FC}$ as a function of which EOD signal was acted on. Thus a new $CAP_{FC}$ value for the smart battery's actual capacity is learned after each full discharge cycle, as a function of the last fully integrated battery discharge cycle. The smart battery 10 of the present invention is thus able to self correct $CAP_{FC}$ within one full cycle to readjust its capacity at each EOD, and effectively relearn full battery capacity within a single cycle, even if all prior battery history has been extinguished by virtue of a catastrophic memory failure. The smart battery of the present invention is therefore able to accurately predict actual capacity, and typically is able to correctly predict the remaining run time to empty within a few minutes for a 2400 maH battery.

Figure 2:
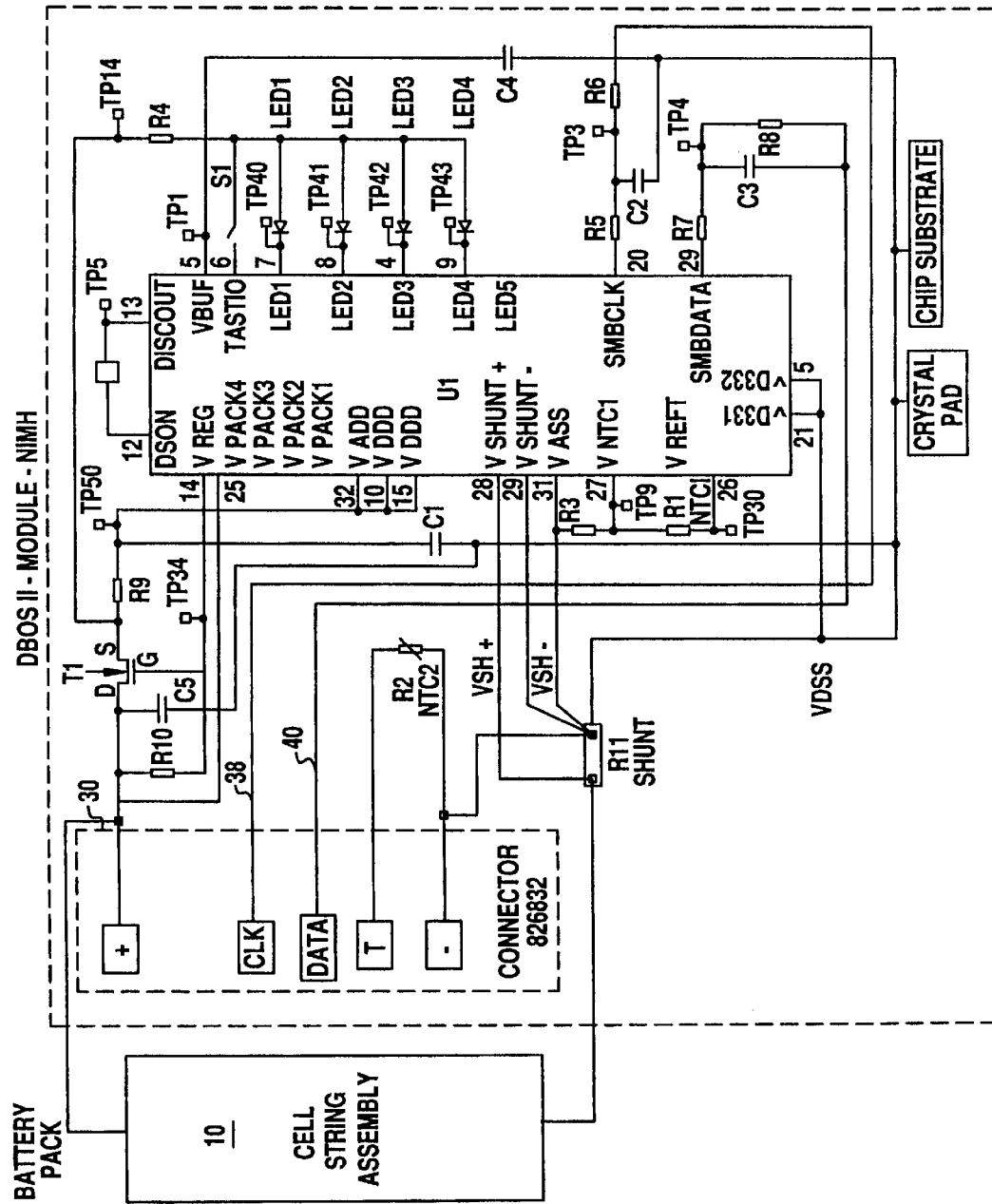
FIG. 2 is a simplified block diagram of the smart battery device and connector, including a pinout diagram of an Application Specific Integrated Circuit (hybrid IC) used in the present invention.

Smart battery 10 of the present invention is more fully illustrated in FIG. 2 which is a simplified block diagram of the smart battery, an advanced design multi-pin connector, and a battery module 28 which includes a pinout diagram of the hybrid ASIC 32 used in the present invention. As illustrated in FIG. 2, the smart battery device 10 includes a plurality of rechargeable cells generally indicated at 26 which may be Nickel Metal Hydride (NiMH) or Nickel Cadmium (NiCad) cells.

For the purposes of an illustrative but not limiting example, in the following specification, 6 NiMH cells having a nominal 2400 maH capacity, will be assumed. Such an arrangement of cells is particularly appropriate for powering a portable computer.

A suitable advanced design multi-pin battery connector 30 is used to connect the smart battery to a host device 16 or power supply 18, as previously described with respect to FIG. 1. The multi-pin connector 30 includes a positive power supply terminal 31 which is connected to the positive terminal of the first cell, and a negative power supply terminal 33 which is connected to the negative terminal of the last cell. A plurality of rechargeable cells may be connected in series therebetween as illustrated schematically in FIG. 2.

The smart battery module 28 includes a hybrid IC 32 containing a microprocessor 50 (FIG. 3) and a plurality of sensor means for generating analog signals representative of battery voltage, current and temperature. The module also includes a series of four (4) LEDS 34 driven by an LED drive circuit 53 and a manually actuable switch 35 which may be manually actuated by an end user to determine the state of charge in the battery even when the battery has been removed from the host device 16. The LEDS 34 may be used to represent a relative state of charge (SOC) in a logic scheme as follows. If the state of charge is greater than 75% (or less than 100%) then all 4 LEDS are illuminated. If the SOC is from 50% to 75%, then 3 LEDS are illuminated; if SOC is from 25% to 50%, then 2 LEDS are illuminated; if SOC is from 10% to 25%, then 1 LED is illuminated, and if SOC is less than 10%, a single LED is flashing. As mentioned above, relative SOC is remaining capacity relative to last full capacity.

Figure 3:
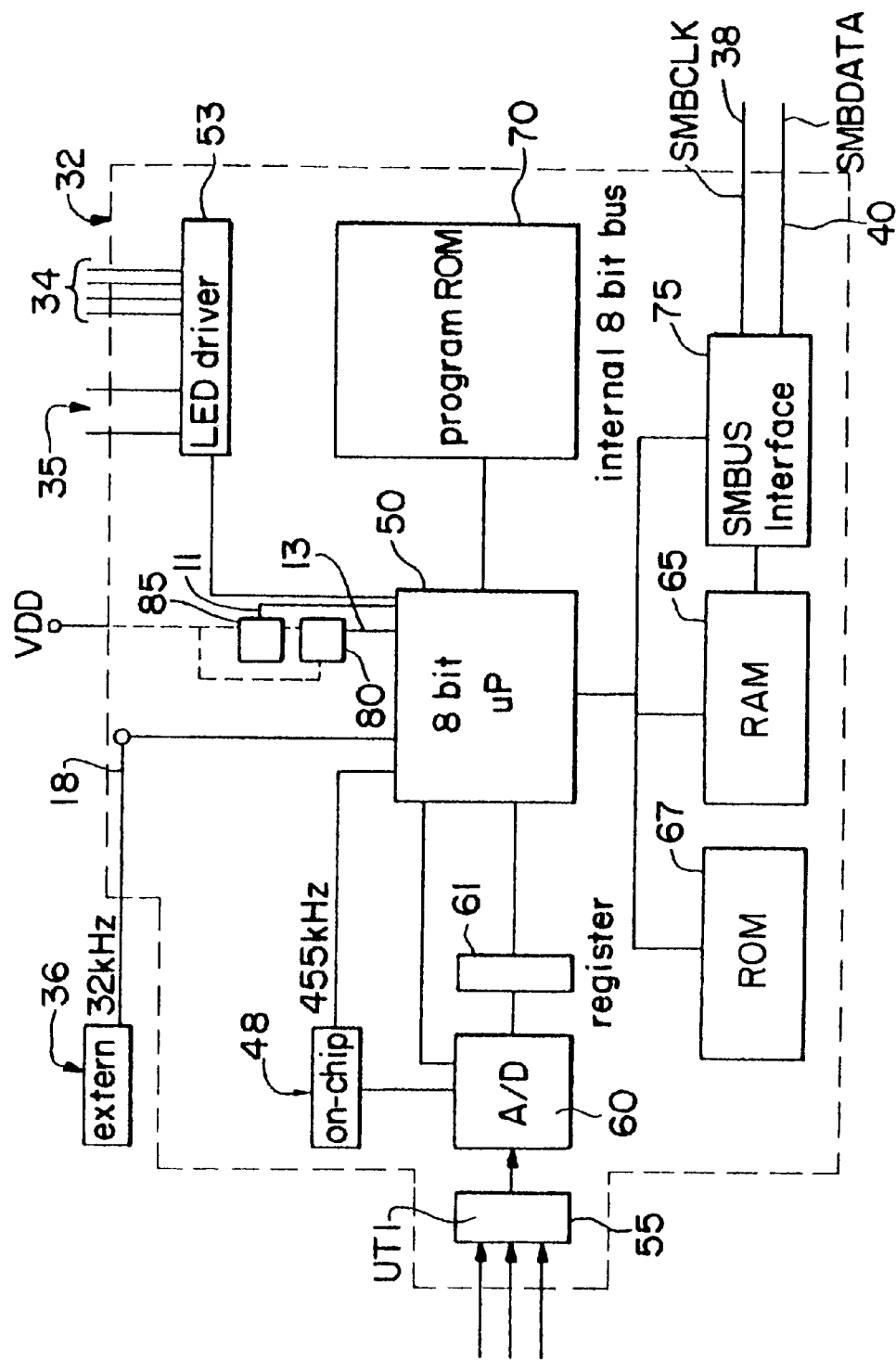
FIG. 3 illustrates a simplified block diagram of the hybrid IC 32 that includes the microcontroller of the smart battery device of the instant invention.

As shown in FIGS. 2 and 3, the hybrid ASIC 32 also includes an external crystal 36 operating at a fixed frequency which is used as a time base for integration of battery current over time, and to ensure stable start up after a prolong standby period when power is reapplied to the smart battery 10. The smart battery of the present invention utilizes two separate oscillators, a low power RC oscillator 48 formed within the hybrid IC 32 and used as an operating clock for the hybrid IC and the A/D converter 60 therein, and, the external crystal 36. As will be hereinafter described in greater detail, the external crystal 36 is used to restart the measurement period after each predetermined interval to provide for accurate measurements and integration of battery conditions, regardless of battery temperature, which can adversely affect the accuracy of the internal oscillator. The frequency value of external crystal 36 may range from 10kHz to 66 kHz and the frequency value of oscillator 48 may range from 450 kHz to 460 kHz.

The hybrid IC 32 includes a MIKRON GmbH low cost, high performance, CMOS 8 bit microcontroller ($\mu$P) 50 with an advanced RISC architecture. A reduced set of 32 instructions that are all single cycle instructions (except for program branches which are two cycles), and a Harvard architecture scheme achieves a high level of performance with minimal power drain. The microprocessor operates at a clock input anywhere from DC to 10 MHZ with 12 bit wide instructions and 8 bit wide data path. A free programmable Counter/Timer circuitry is provided as well as a free programmable Watchdogtimer. Additionally, the microprocessor is addressable in direct, indirect, and relative addressing modes. The microprocessor is commercially available from Mikron Gmbh, located at Breslauer Straβe 1-3, D-85386, Eching, Germany, and is available in the U.S.A. through MICROCHIP Technology, Inc., Chandler, Ariz., U.S.A.

The hybrid IC 32 also includes a plurality of analog circuits which are used, in combination with external analog sensors, to generate digital signals representative of battery voltage, current and temperature as will be hereinafter explained.

For example, as shown in FIG. 2 battery voltage is obtained from a voltage divider circuit which includes R1 and R2 which are internally switched by a NMOS transistor within the hybrid IC 32 to provide voltage measurement during a small portion of each measurement interval, thereby minimizing current drain on the battery cells 26.

The measurement of battery temperature is accomplished with an NTC-thermistor, illustrated as $R_{NTC1}$ in FIG. 2, which varies resistance as its temperature varies. A resistor R3 is connected in series to form a voltage divider circuit between $V_{ASS}$, (negative analog power supply voltage) $V_{TEMP}$, (the temperature voltage input) and $V_{REFT}$, which is a reference voltage applied to the thermistor/resistor string by the hybrid ASIC 32 at pin $V_{REFT}$. The temperature voltage input is measured at $V_{TEMP}$ according to the following formula:

$$\frac{V_{TEMP}}{V_{REFT}} = \frac{R3}{R3 + R_{NTC1}} \times V_{REFT}$$

wherein the NTC1 value may be 10 kohms at 25° C. and varies with temperature. If desired, a look-up table with a plurality of temperature values and a plurality of $V_{TEMP}$ values may be defined to calculate the battery temperature, and between these values, the temperature is linearly interpolated by the microprocessor within IC 32.

The measurement of battery current is measured through a shunt resistor, illustrated in FIG. 2 as $R_{shunt}$, that is connected in series with the battery cells and negative terminal 33 of cell pack 26. The shunt resistor is of small value, but may range anywhere from 1 mohm to 200 mohms depending on the number of cells and expected usage of the battery. The voltage drop across the shunt is sensed between $V_{SHUNT+}$, the shunt resistor positive input pin of ASIC 32, and $V_{ASS}$, the negative analog power supply voltage.

As shown in FIG. 3, whenever the analog signals representing battery voltage, current, and temperature are obtained, they are input into an ASIC multiplexor or switching network 55 which enables only one analog signal at a time to be input to the A/D converter 60 for digital conversion. The switching network acts in conjunction with digital logic circuitry for informing the A/D converter, via line 55', shown in FIG. 3, of the amount of integration cycles to perform depending upon the type of measurement to be converted. For instance, more integration cycles are needed when making a current measurement conversion to ensure a higher bit resolution as compared to when a voltage or temperature measurement is being converted, as will be explained in further detail below with respect to FIG. 8.

Figure 4:
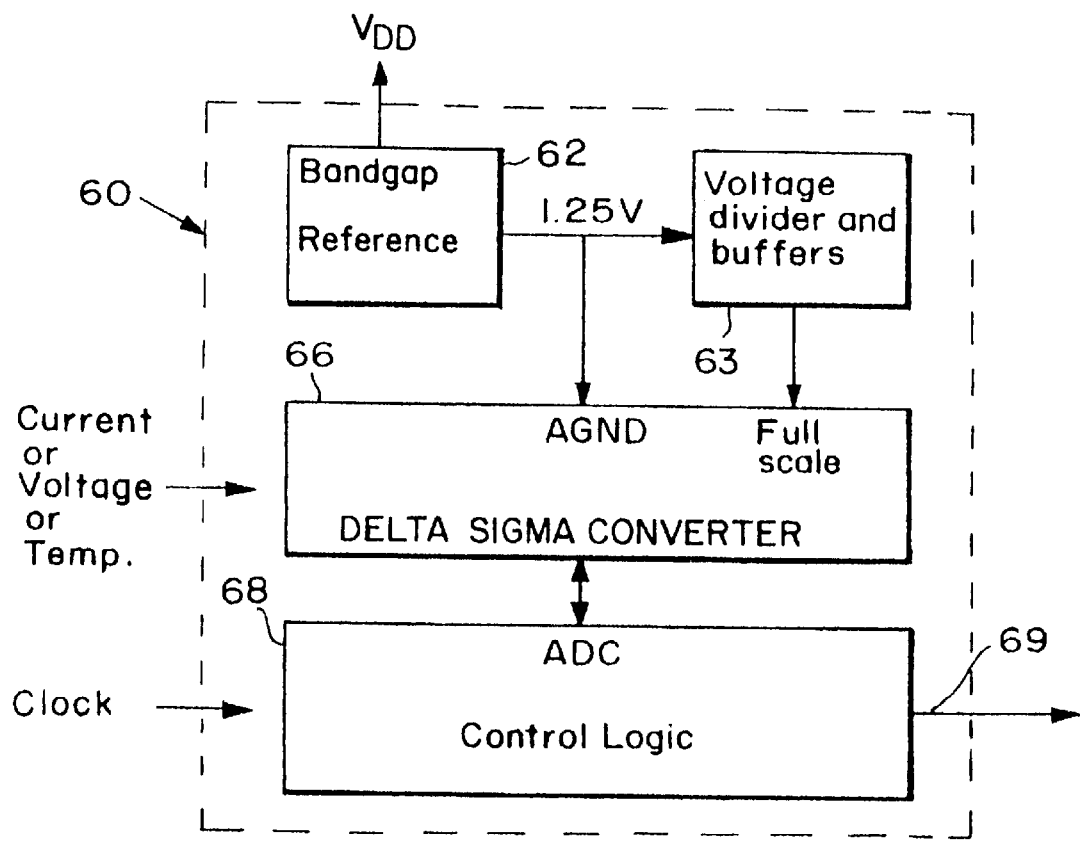
FIG. 4 illustrates a general schematic diagram of the A/D converter 60.

A general schematic diagram of the A/D converter 60 is shown in FIG. 4. In the preferred embodiment, the A/D converter 60 is a bipolar, high resolution, incremental sigma-delta converter and consists of three parts: a bandgap reference circuit 62 which provides a preset analog voltage which is used as an analog ground for the A/D; a voltage divider network 64 which divides the present voltage to the analog voltages which are used as the full-scale voltage for the A/D; and, a sigma delta circuit 66 for converting the analog signal to a digital word output at line 69. FIG. 4 also show a schematic illustration of a switch 63 which is used during an auto offset current calibration procedure pursuant to the present invention. The switch 63 is provided at an input to the A/D converter, and is closed during normal operation thereof. Periodically (e.g. every 80 seconds), the switch 63 is opened to provide a 0 input to the A/D converter. The output of the A/D converter is then measured, and if different from 0, the measured value is used as a current offset during the subsequent set of A/D conversions to provide a zeroing compensation therefor.

A/D control circuit 68 having a clock input from the IC oscillator, provides the control for the sigma delta converter which has a different degree of resolution depending on the type of measurement. For instance, in one embodiment of the invention, the A/D converter was configured as having a resolution of 13 bits and a conversion time ranging from 300 to 400 msec for current measurements, and, was configured as having a resolution of 10 bits and a conversion time ranging from 30 to 60 msec for voltage and temperature measurements. The timing diagram for the voltage, current, and temperature measurements in each operating cycle is illustrated as 58a in the timing of operating cycles diagram of FIG. 8, as explained below.

In one embodiment of the invention, the voltage divider circuit 64 of the A/D converter divides the preset bandgap reference voltage into the following full scale voltages: a 150 mV signal used as the full scale voltage for the battery current measurement; 150 mV, 250 mV, or 350 mV signals used as the full-scale voltage for the battery pack voltage measurement and dependent upon the number of battery cells; and 150 mV used as the full-scale voltage for the battery temperature measurement. These values are illustrative and may vary as battery design varies.

The A/D converter of the smart battery device utilizes a sigma-delta converter circuit 66 as explained above in view of FIGS. 4 and 6. Details of the sigma-delta converter circuit 66 capable of bipolar conversion are explained hereinbelow in view of FIGS. 5(a),5(b) and FIGS. 6 and 7 which illustrates switching capacitor network for inputting positive and negative voltage values negative into a switching capacitor network for input into an integrator circuit 88 and comparator circuit 89 for output into control and logic circuit 68. In the reference, Jacques Robert et al., (1987) "A 16-bit Low-Voltage CMOS A/D Converter", *IEEE Journal of Solid-State Circuits*, Vol. sc-22, No. 2, 157–159, an incremental (integrating) sigma-delta converter implementing 4-μm CMOS, switched capacitor technology similar to that implemented in the A/D converter of the smart battery device is disclosed. What is described in the reference is a simplified, unipolar A/D converter that is largely insensitive to variations in clock frequency and clock waveforms due to the fact that all signals are represented by charges, rather than currents, in a switched capacitor integrator that forms the core of the converter.

To measure positive and negative input voltages, a negative power supply is necessary in addition to the positive voltage supply. Thus, where it is desired to measure negative voltages (or currents) such as smart battery discharging current, external components (such as invertors) and circuitry that consume extra power are required, and the prospect of utilizing such circuitry for the low power application such as needed in the smart battery device of the instant invention, is diminished. Instead, to overcome this drawback, the A/D converter 60 of the instant invention does not utilize a negative voltage power supply, but makes use of an available on-chip A/D bandgap reference voltage "AGND" to be used as a virtual ground. The concept of utilizing a "virtual ground" is based on the fact that a voltage stored on a capacitor can be transferred to another d.c. voltage reference point using analog switches with virtually no loss of charge.

Figure 5A:
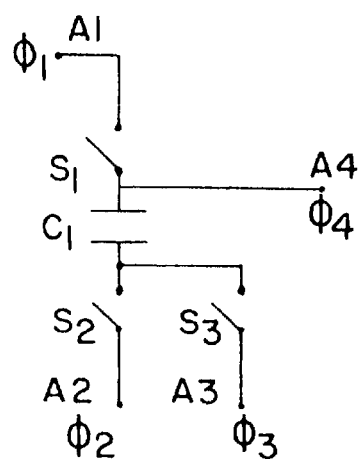
FIG. 5(a) illustrates a schematic sketch of dc voltage shifting circuit arrangement.

In FIG. 5(a) there is represented a first embodiment of the inventive circuit arrangement, consisting of three switches S1 through S3, and four connectors A1 through A4 and a capacitor C1 (with the capacitance C1). The connectors A1, through respectively A4 are at the potentials $\phi_1$ through respectively $\phi_4$, Thereby, the switches S1, respectively the parallel-connected/S2 and S3 are on one of one or respectively one other side of the capacitor C1.

In the following there is described the operation of the inventive circuit arrangement. At the beginning, the switches S1 and S2 are closed and the switch S3 is open. The capacitor charges itself up due to the voltage differential $\phi_1-\phi_2$ and stores a charge $C1\times(\phi_1-\phi_2)$.

In the next step of the inventive process, the switches S1 and S2 are opened and one pole of the capacitor is connected through switch S3 with a potential $\phi_3$. Present at the capacitor C1 is now a voltage $\phi_3+(\phi_1-\phi_2)$ which can be tapped off through connection with the connectors A3 and A4 which lie on the potentials $\phi_3$ and $\phi_4$.

Figure 5B:
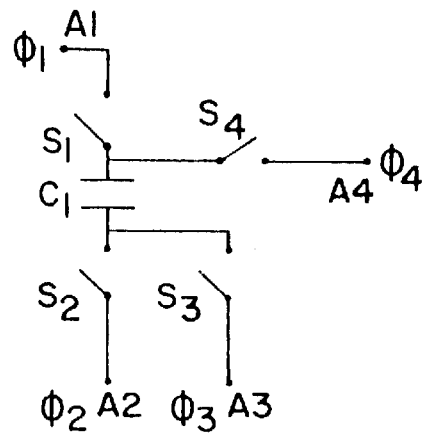
FIG. 5(b) is a second embodiment of the inventive circuit arrangement.

In FIG. 5(b) there is now represented a further embodiment of the present invention whereby an additional switch S4 is provided which prevents in the opened condition thereof that at the connector A4 after closing of the switch S1, the presence of a potential $\phi_1$ for the tapping off of the voltage $\phi_3+(\phi_1-\phi_2)$ at the connectors A3 and A4.

Figure 6:
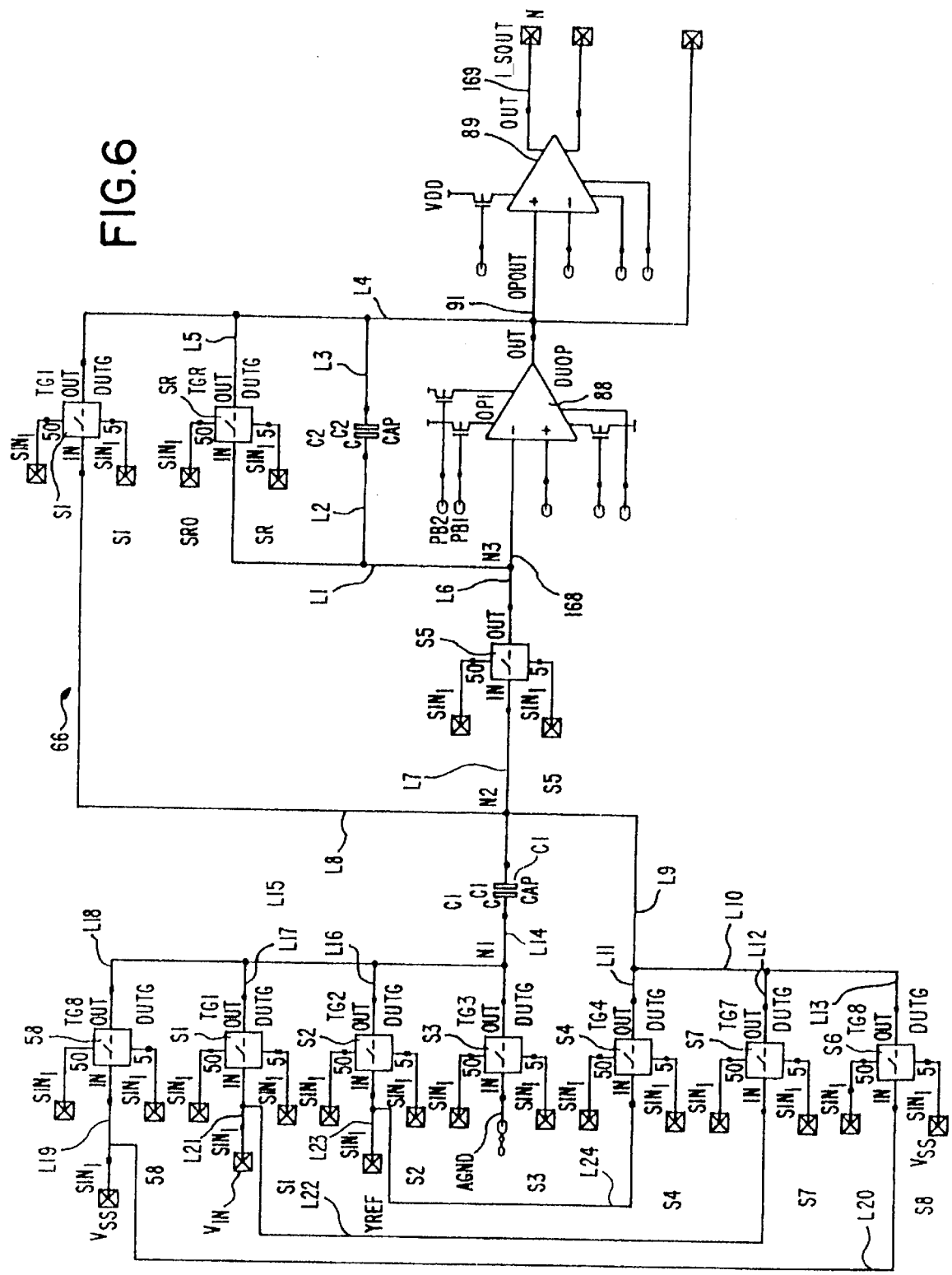
FIG. 6 is a schematic sketch of the circuit arrangement in the A/D converter 60.

In FIG. 6 there is illustrated the schematic circuit diagram of the inventive circuit arrangement in a switched capacitor A/D converter. The A/D converter 66 possesses an operational amplifier 88 which is utilized as an integrator, and an operational amplifier 89 which is utilized as a comparator. The non-inverted input of the comparator 89 by means of the line 50 stands in connection with the output of the integrator 15. The inverted input of the comparator 89 and the non-inverted input of the integrator 88, are connected with a reference potential AGND (analog ground=1.25 volt). The output of the comparator 89 is "high", in the event that the output voltage of the integrator 88 is higher than the reference voltage AGND and "low" in the event that the output voltage of the integrator 88 is lower than the reference voltage AGND. By means of the lines L1, L2, L3 and L4, the integrator 88 or, in essence, the inverted input and the output of integrator 15 have connected in parallel, therewith a capacitor C2 with a capacitance C2. The capacitor C2 has a switch SR connected in parallel therewith through lines L1 and L5, which can effectuate a discharge of the capacitor C2. Through a line 56, the inverted input of the integrator 15 stands in connection, by means of a switch S5 and a line L7, with a capacitor C1 having the capacitance C1. A line L8 connects the line L7 through a switch SI and the line L4 with the output of the integrator 88. The line L9 connects the pole of the capacitor C1 facing towards the integrator 88 in FIG. 6 with a line L10, which stands in connection through the line L11, L12 and respectively L13, with the switches S4, S7 and, respectively S6. Connected to the other pole of the capacitor C1 is a line L14, which is connected through the switch S3 with the reference voltage AGND=1.25 volt. A line L15 stands in connection with line 114 and connects through the lines L16, L17, and respectively L18, the pole of the capacitor C1, which faces away from the integrator 88 in FIG. 6, with the switches S2, S1, and respectively, S8. The internal mass of the chips $V_{ss}$=0 volt stands through the line L19 and, respectively, L20, in connection with the switches S8, respectively, S6. In this matter, through suitable opening and closing of the switches S8 and 86, the voltage $V_{ss}$ can be applied to both poles of the capacitor C1. The input voltage $V_{IN}$ which is to be digitalized stands in connection with the switches S1 and, respectively, S7 through lines L21 and, respectively, L22. In this manner, through suitable opening and closing of the switches S1 and S7 can the input voltage $V_{IN}$ be applied to presently one pole of the capacitor C1. The reference voltage $V_{REF}$ which determines the resolution of the A/D converter is connected through lines L23 and, respectively, L24 with the switch S2 and, respectively, S4. In this manner, the reference voltage $V_{REF}$, which, for example, consists of 150 milli- volt, can be applied to one of the two poles of the capacitor C1. The switches S1, . . . S8, SR and SI are preferably CMOS switches, especially CMOS transmission gates. The connection of the input voltage $V_{IN}$, the reference voltage $V_{REF}$ and the mass $V_{ss}$ with the input capacitor C1 of the A/D converter is known in the technology. Inventively there is connected through the switch S3 a reference voltage AGND=1.25 volt ( $V_{ss}$=0 volt) to the input capacitor C1. Similarly, through the inventive circuit there is facilitated that $V_{IN}$, $V_{REF}$ and AGND can be applied to both sides of the input capacitor C1, which presently causes a charging up at different polarity of the capacitor C1.

Figure 7:
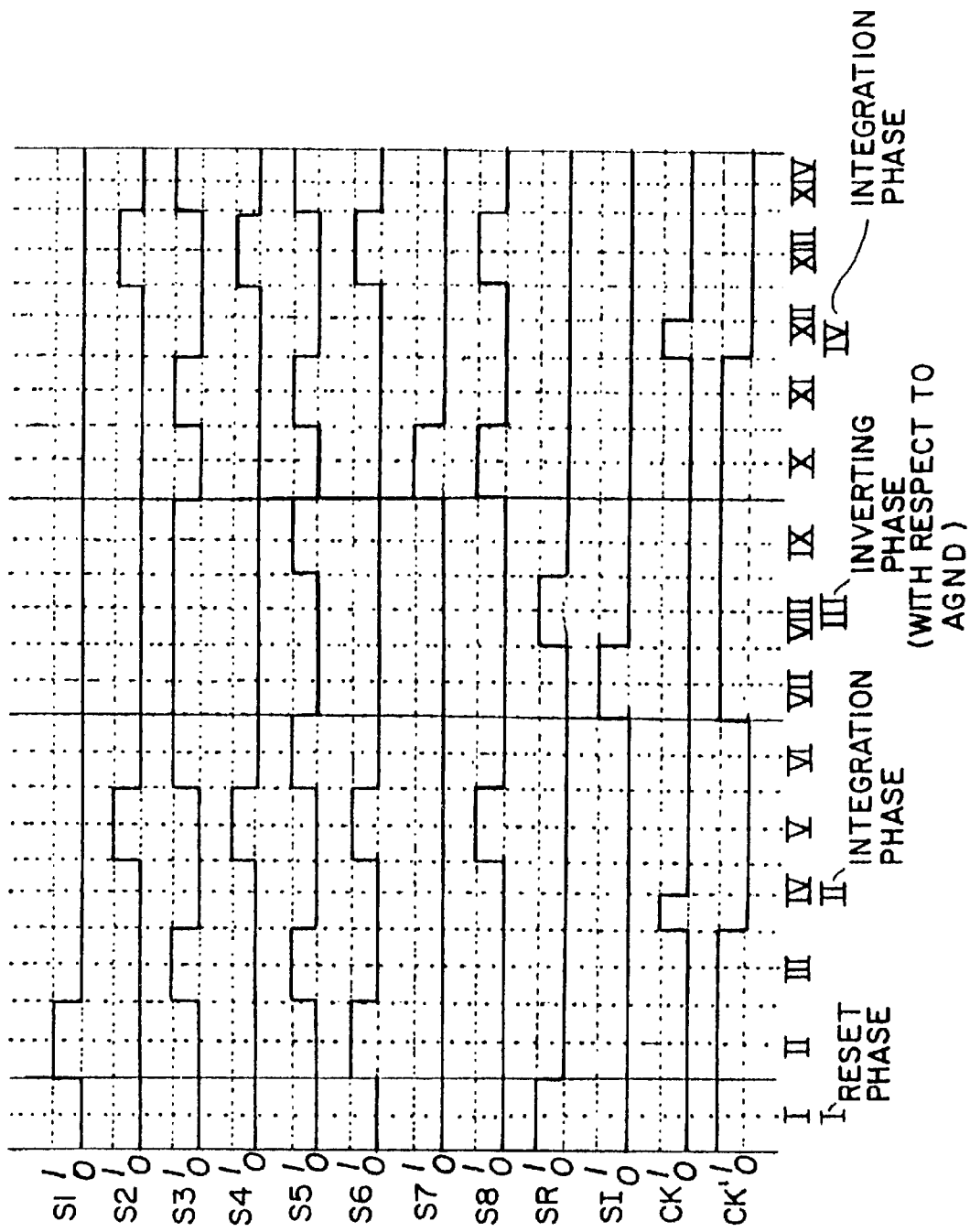
FIG. 7 is a phase diagram in the operation of the A/D converter pursuant to FIG. 6.
Figure 10:
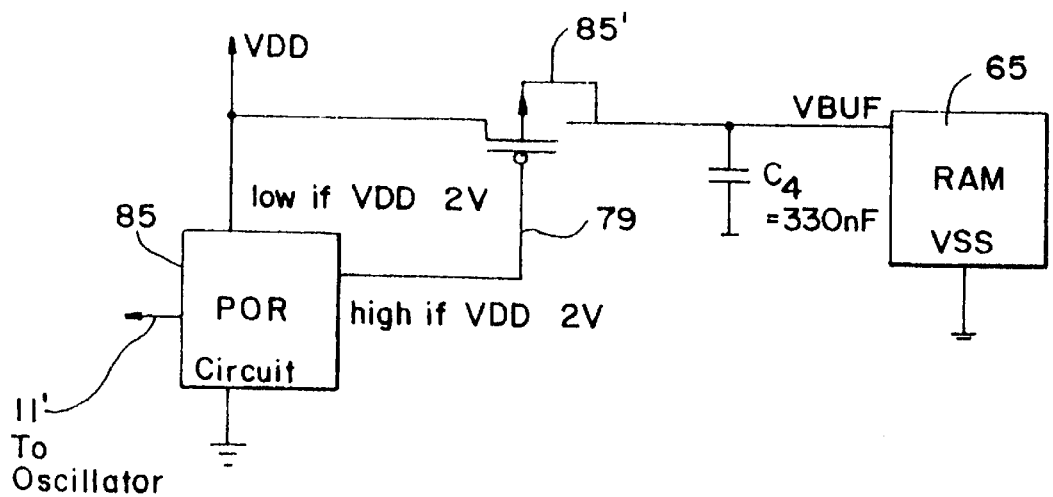
FIG. 10 is a detailed schematic of the power-on reset 85 and RAM de-latching circuit 85'.

In FIG. 7, there is illustrated the operation of the A/D converter in a phase diagram. Thereby, S1 through S8, SR and SI designate the switches of the A/D converter 66 pursuant to FIG. 6, and CK is the pulse signal of the comparator 89 in FIG. 7. CK' represents a further tapped-off pulse signal.

In the diagram, the switch conditions fluctuate between 0 and 1, whereby 1 signifies that the switch is closed, whereas 0 stands for the opened switch. The operation of the A/D converter can be divided into four phases which are designated with I, II, III and IV whereby I designates a RESET or resetting phase; II an integration phase, III and inverting phase and IV an integration phase of the input voltage of reverse polarity or sign. The cycle is more finely subdivided into steps i, . . . xiv. In step i only the switch SR is closed, whereas all other switches are opened. This causes a discharge of the capacitor C2. In step ii, the switches S1 and S6 are closed, whereas all remaining switches remain further open. This causes a charging up of the capacitor to a charge $\Delta Q=C1\times(V_{IN}-V_{ss})=CI\times V_{IN}$. In step iii, the switches S3 and S5 are closed, whereas all other switches remain open. One pole of the capacitor is now set to the potential AGND, whereas the other pole of the capacitor C1, through closing of the switch S5, stands in connection with the capacitor C2. There now takes place a charge transfer from the capacitor C1 to the capacitor C2. Inasmuch as the integrator of 15 resultingly causes the two input potentials to be equalized, there is present at the output of the integrator 15 the output voltage $V_{OUT}$ equal–$(C1/C2)\times V_{IN}$+AGND. In step iv all switches are opened and the comparator pulse CK is 1, meaning, the comparator 20 carries out a comparison between $V_{OUT}$ and AGND. Upon the result of this comparison there now depends the further cycle. The representation of the switch conditions in step v must be understood in the following manner. In step v the switches S2 through S8 are not closed, but the switches S2 and S6 are closed, and S1, S3, S4, S5, S7, SR and SI are open, in the event that the output of the comparator is 0, in effect "low", while the switches S4 and S8 are closed and S1, S2, S3, S5, S6, S7, SR and SI are open when the output of the comparator is 1, meaning, "high", and in other instances remain open. When the output of the comparator is 0, meaning the output voltage $V_{out}$ is lower than AGND, then the switches S2 and S6 are closed. At the capacitor C1 there are now present $V_{REF}$ and $V_{ss}$. In the instance in which the output of the comparator is 1, meaning, $V_{OUT}$ is higher than AGND, then the switches S4 and S8 are closed, whereby similarly $V_{ss}$ and $V_{REF}$ are present at the two poles of the capacitor C1, but with the reverse sign or polarity than in the instance in which the output of the comparator is 0. In step v, the switches S1, SR and SI are opened, and in step vi, the switches S3 and S5 are closed (compare step iii) which causes that the capacitor C1 and C2 are interconnected. Similarly, voltage AGND is applied to one pole of the capacitor C1. There again, in turn takes place a charge transfer between the capacitors C1 and C2, as result of which a voltage $-(C1/C2) \times V_{REF} + AGND$ is added to or, respectively, subtracted from that of the output voltage of the integrator 88, in accordance with the result of the comparison by the comparator in step iv. Inventively, also during the phase II there is processed an input voltage which is phase shifted with respect to AGND, with a reference voltage which is shifted relative to AGND. Similarly, at the non-inverted input of the integrator 88 and the inverted input of the comparator 89 there lies AGND, which causes that the output voltage is referenced to AGND and causes a comparison by the comparator 89 not with $V_{ss}=0$ voltage, but with AGND=1.25 volt.

In the following there is now discussed phase III consisting of steps vii to ix. In this phase, a sign or polarity reversal is implemented for the output voltage $V_{OUT}$ of the integrator 88 with reference to AGND. During the entire phase III the switch S3 is closed. The closure of the switch S3 during the phase III causes the voltage AGND to be applied to one pole of the capacitor C1, as a result of which the voltage $V_{OUT}$ is also inverted with regard to AGND and not with regard to $V_{ss}=0$, as in the known A/D converters. In step vii there is now closed the switch SI, whereas all remaining switches are open, up to switch S3. This causes that the voltage $V_{OUT}$ is temporarily in the capacitor C1, such that in step viii all switches are opened up to switch SR. The switch SR is in effect closed, which causes a discharge of the capacitor 2. In the step ix the switch S5 is closed additionally to switch S3, while all remaining switches are opened. This causes that the negative voltage which is phase shifted at AGND is present at the output of the integrator 88. The negative sign is obtained, as previously through the charge transfer from the capacitor C1 to the capacitor C2. In step x the switches S7 and S8 are closed, whereas all remaining switches are opened. Compared with the step ii the input voltage $V_{IN}$ is present with a reverse polarity at the capacitor C1. This causes a change in the sign of the integration of the input voltage, which is also well recognizable in FIG. 6 of the above mentioned publication of Jacques Robert et al. The steps xi through xiv correspond with the steps ii or respective vi, meaning, there is implemented an integration of the input voltage (only due to step x with a reverse sign of $V_{IN}$), and in accordance with the results from the comparator 20 in step xii added or, respectively, subtracted $V_{REF}$ after the integration (in case C1=C2). For a 14-bit A/D-converter, after implementation of step i there is carried out phase II [$2^{14}-2$ (for the phases I, III)]: 2=8191 times), as well as phase IV. The output of the comparator is connected to a (not shown) up/down counter, which each time, in accordance as to whether $V_{REF}$ is added or subtracted, increases or lowers its count condition by 1. The result of the counter is then a 14-bit representation of the ratio of $V_{IN}$ to $V_{REF}$. The phases III and IV are necessary since through the integration with reverse sign of $V_{IN}$ offset errors encountered in, for example the operational amplifiers, are reported or, respectively eliminated.

The multi-pin connector 30 includes two pins for the system management bus interface 75, which include a serial clock I/O line 38 and a bidirectional serial data I/O line 40. These lines are connected to the SMBCLK and SMBD data pins, respectively, of the hybrid IC 32. As explained generally above, and, in greater detail below, the smart battery module 28 communicates with the host device 16 and the smart charger 22 over the system management bus and data line 40 to communicate both stored battery parameters and calculated battery parameters.

The smart battery 10 also includes a separate thermistor $R_{NTC2}$ which is connected across the negative terminal of multi-pin connector 30 and a temperature or thermistor line 42. Thermistor $R_{NTC2}$ may be used independently by the smart charger 22 to determine battery temperature, in a manner similar to that previously described with respect to $R_{NTC1}$.

As shown in FIG. 3, the hybrid IC 32 further includes RAM memory 65 which can store up to 128 8-bit registers for communication of calculated battery parameters, and a ROM memory 67 for storing look-up table values utilized in the battery capacity calculation algorithm (explained in detail below). The exact amount of RAM, ROM, and program ROM memory is a design choice, and these values change as the ratio between calculated and preset parameters vary.

As shown in FIG. 2, the addition of capacitor C4 acts as a buffer to maintain the integrity of the RAM memory contents in the case of a battery short-circuit or temporary power loss. Preferably, the capacitor C4 is connected to the negative analog voltage supply terminal, and its value is chosen to ensure that a source of supply voltage is supplied to the embedded memory (RAM) for a time dependent upon the RAM leakage current. In the preferred embodiment, the power to RAM memory is unlatched if a temporary short circuit condition exists, However, capacitor C4 of capacity 330 nF provides a source voltage to the RAM for a period of time necessary for the PTC element to ramp to a high resistance value. The PTC element will create a high impedance between battery terminals when a short circuit across the battery pack terminals creates a high circuit drain.

The hybrid IC 32 further includes up to 4 bytes of additional ROM memory 70 for addressing and storing the various algorithms, subroutines, manufacturer data, and data constants utilized by the smart battery module for calculating the battery capacity, sending messages such as alarms and battery charger control commands etc., and handling message requests from external devices.

The programmable ROM generator is implemented by means of a metal mask (not shown) as opposed to conventional ROM generation by means of diffusion masking. In accordance with the information which was to be permanently stored, transistors were generated in a matrix arrangement through diffusion, whereby the information was coded in the plane through the distribution of the transistors in the diffusion step. Thus, the ROM generator generates in effect, a ROM matrix, whereby the presence or respective absence of an MOS transistor stands for a logic "0" respectively "1." A disadvantage of a ROM matrix with the programmable level of diffusion is that the diffusion process, which is incorporated as one of the first steps of a CMOS process, cannot be changed when there is a change in ROM contents, thus, rendering impossible the production of wafer stock for a particular type of ROM.

By contrast, the advantage of a ROM matrix programmable in a metal layer is that wafer stock with the same basic layers up to the metal may be fabricated. Thus, a microprocessor family with different ROM contents can be realized with low cost and fast turn around time. Additionally, the pre-manufacture of a portion of the ROM with the flexibility of programming in application specific information in the upper or respectively later produced layers, is possible.

The hybrid IC chip itself may comprise thirteen or fourteen layers, with the 9th or $_{10}$th layer (i.e. one of the upper layers) being a layer of metal, wherein the distribution of the metal is characteristic for the storing contents of the ROM. Thus, in the hybrid IC ROM manufacturing process, nine (9) layers are grown and the next four ROM programming layers are grown dependent upon the customer's particular needs (i.e., special properties of the battery pack).

Each of the algorithms, subroutines, manufacturer data, and data constants stored in ROM and utilized by the smart battery module for calculating the battery capacity, etc. as mentioned above, will now be explained in further detail below. Further details of the smart battery algorithm for reporting battery parameters to an external device are found in applicant's co-pending patent application U.S. Ser. No. 08/318,004 assigned to the same assignee of the instant invention and the disclosure of which is incorporated by reference herein.

FIG. 2 shows a battery pack 10 comprising a plurality of rechargeable battery cells and an operating system module shown in a dashed line block; and the module, in turn, includes a processing circuit U1, connector assembly, voltage regulator, temperature sensing means, voltage sensing means, and current sensing means. With the preferred embodiment of battery pack shown in FIG. 2, the processing module further includes an LED assembly, oscillator and capacitor. Also, the connector assembly includes positive and negative terminals, temperature terminal, clock terminal and data terminal, and the LED assembly includes a multitude of LEDs and a switch S1.

The processing circuit is illustrated in greater detail in FIG. 3; and with reference thereto, this circuit includes a microprocessor μP, oscillator 48, read only memory units 67, 70, random access memory unit 65, analog-to-digital converter 60 and switching network 55. Preferably, this processing circuit further includes LED driver 53, bus interface control circuit 75 and reset circuit. Preferably, the processing circuit is comprised of a single, hybrid integrated circuit or chip, with the microprocessor, converter and oscillator embedded in the chip.

The battery pack is used to supply power to a battery operated device, and the battery pack is well suited to be installed in the device that the battery is used to power. The battery pack is especially well suited to be installed in, and to provide operating power for, a lap top or notebook computer, and FIG. 1 schematically illustrates a typical application for the battery pack.

In this application, the host device 16 directly receives power from a system power supply 18, that in turn, receives power from either the battery pack 10 or a conventional alternating current power source 20. Moreover, in a typical application, the host device would include or be used with a battery charger 22 that can be used to recharge the battery pack. Conventionally, the battery charger would also receive power from the system power supply 20.

As shown in FIG. 1, the system power supply is connected to the host device and to the battery pack via a power plane 12; and the host device 16, the battery charger 22 and the battery pack 10 are all connected to a system data bus 14 that is used to transmit data between these devices. Various other connections may be made between these devices. Various other connections may be made between the devices shown in FIG. 1 as desired; and for example, a separate line may be used to transmit to the battery charger a signal representing battery temperature. In a standard application, the host device and charger would themselves have processors, allowing a comparatively sophisticated exchange of data between the devices and a comparatively sophisticated processing of that data.

In particular, the battery pack may transmit data to the host device and to the charger, either automatically or in response to a request for the data. The host device may use data from the battery pack for use in the host device's own power management program or scheme, and the charger 22 may use data from the battery pack to control charging of the battery pack.

As will be understood by those of ordinary skill in the art, the battery pack may be used to provide power for other devices such as portable telephones and video cameras. Also, it is not necessary to the practice of the present invention in its broadest sense that the battery pack be installed in the device that the pack is used to power, and the battery pack may be located outside of that device.

In the operation of the battery pack, the processing module is used to monitor the operation and performance of the rechargeable batteries. For example, as discussed in greater detail below, the processing module keeps track of the remaining capacity of the battery cell assembly, and determines when the cell assembly is fully charged and fully discharged. Preferably, the processing module also keeps track of various other values such as a time to full discharge at an average discharge rate, or at a ii present discharge rate. To perform these tasks, the processing module is provided with preset equations and with preset data values, and the processing module also determines values for the battery temperature, the battery voltage, and the battery current.

With reference to FIG. 2, a temperature sensing means, voltage sensing means, and current sensing are used to help obtain these values. More specifically, a temperature sensing means is provided to sense temperature and to generate an analog signal representing battery temperature. As illustrated in FIG. 2, the temperature sensing means includes a voltage dividing network and signal line, and the voltage dividing network includes a thermistor R3 and resistor $^R$NTC1. The thermistor is physically located in good heat transfer relation with the battery cell assembly, and the electrical resistance of the thermistor is a function of its, and thus the battery's, temperature.

As represented in FIG. 2, the thermistor is an NTC thermistor, and the resistance of the thermistor decreases as the thermistors temperature increases. Also, the thermistor and resistor are electrically located in series between the battery pack negative output terminal and a positive reference voltage source provided by an output terminal of processing circuit. A first end of a signal line is connected between the resistor and the thermistor, and a second end of the signal line is connected to an input terminal of processing unit. With the above-described arrangement, the voltage level at the first end of the signal line varies as a function of the battery temperature and this voltage level is applied, via the line, to the input terminal of the processing unit.

A second thermistor $R_{NTC2}$ is electrically located between the battery pack terminals and may also be used to provide an analog signal representing the battery temperature. For example, the thermistor may be used to provide a signal representing battery temperature directly to a device, such as a battery charger, that is connected to the battery pack in a manner that bypasses the processing unit.

A current sensing means is provided to sense and to generate an analog signal representing the battery current.

Preferably, the current sensing means includes shunt resistor R SHUNT that is electrically located in series between the negative terminal of the battery cell assembly and the negative cell terminal of the battery pack. The resistance of the shunt resistor may vary over a wide range, such as one million to two hundred million ohms, depending on the number of cells in the assembly and the expected use of the battery pack. Preferably, however, the shunt resistor has a comparatively small resistance such as twenty five million ohms. The voltage at the two ends of the shunt resistor are applied to two inputs of the processing unit, and in this way, the voltage difference between these two inputs to the processing unit is a measure of the battery current.

A voltage sensing means is used to sense and to generate an analog signal representing battery voltage, and the embodiment of sensing means shown in FIG. 2 includes a resistor R10 and lines electrically in parallel with each other. Both of these lines are located in series between the positive terminal of the battery pack and a respective input terminal of the processing unit, with the resistor located in the line. With this arrangement, a voltage difference is produced between the input terminals which represents the voltage level of the positive terminal of the battery pack and the battery terminal of the battery cell assembly.

With reference to FIG. 3, the voltage levels representing battery temperature, current and voltage are applied to a switching network 55. This switching network then applies these voltage levels, one at a time and in a defined sequence, to an analog-to-digital convertor A/D, and this convertor converts these analog voltage levels to raw digital data values representing battery temperature, current and voltage. These raw data values are transmitted to register 61 for temporary storage and from which the data values are available to the microprocessor. The specific lengths of time that the convertor processes the applied analog signals are under the control of clock signals transmitted to the convertor from an internal clock 48.

Any suitable specific procedures may be used to determine raw data values for current, temperature and voltages from the analog signals applied to the convertor, and suitable procedures are disclosed in copending patent applications Ser. Nos. 08/318,004 and 08/336,945, now U.S. Pat. Nos. 5,606,242 and 5,633,573 the disclosures of which are expressly incorporated by reference herein. For instance, the processor may be programmed to calculate these values using defined equations, a look up table may be used to determine these values, or these values may be determined using a combination of programmed equations and look up tables.

Read only memory units 67, 70 are provided to supply fixed programs and data to processor, and a random access memory 67 is used to store other or variable programs and data. For example, the ROM unit may contain a set of predefined battery identification parameters that may include manufacturer data, cell chemistry, design capacity, design voltage, and a unique device identification number. These predefined battery identification parameters are available to both the host device and the charger to assist the host device and the charger to select optimal use and charge parameters for the battery pack.

A bus interface unit 75 is used to control a transmission of data to and from the microprocessor via the system data bus 14, and an LED driver is used to convert signals from the microprocessor to appropriate signals to operate the LEDs in the desired manner. The switching network, analog-to-digital convertor, processor, memory units, interface unit, LED drive and isolators are described in greater detail in the above-mentioned copending patent applications Ser. Nos. 08/318,004, and 08/336,945.

FIG. 4 is a general schematic diagram of the analog-to-digital convertor 60. In a preferred embodiment, the convertor is a bipolar, high resolution, incremental delta sigma convertor and includes: (i) a band gap reference circuit 62 that provides a preset analog voltage that is used as an analog ground for the convertor; (ii) a voltage divider network 64 that divides the present voltage to the analog voltages that are used as the full-scale voltage for the converter; and (iii) a delta sigma circuit 66 for connecting the analog signal to a digital word. Also, a control circuit 68, which receives a clock signal from an internal isolator or clock provides control for the delta sigma converter.

LEDs LED 1 to LED 4 are preferably used to display relative state of charge in the following manner; if the state of charge is greater than 75%, then all four LEDs are illuminated; if the state of charge is between 50% and 75%, then three LEDs are illuminated; if the state of charge is between 25% and 50%, then two LEDs are illuminated; if the state of charge is between 10% and 25%, then one LED is illuminated; and if the state of charge is less than 10%, than a single LED is flashed.

It may be noted that the embodiment of processing module shown in FIG. 3 includes two isolators or clocks: an external crystal 36 and a second isolator 48 that is part of the hybrid integrated circuit. The external crystal is used to ensure stable startup after a prolonged standby period when power is reapplied to the battery pack, and to restart the measurement period after each predetermined interval. In this way, the external isolator may be used to provide for accurate measurements and integration of battery conditions, regardless of battery temperature, which can adversely affect the accuracy of the internal isolator. The internal isolator is used as an operating clock for the integrated circuit and the analog-to-digital convertor therein. For example, the frequency of the external isolator 36 may range from 10 kilohertz to 66 kilohertz, and is preferably 32 kilohertz, and the frequency of isolator 48 may range between 450 kilohertz to 460 kilohertz.

Preferably, the power to operate the processing circuit is obtained from the cell assembly. In particular, the positive terminal of the cell assembly is connected to one or more terminals of the processing unit, thereby applying a positive voltage to those terminals to provide power for the processing unit. The voltage regulator is preferably located in series between the cell assembly and the processing unit to apply a regulated, constant voltage thereto. The voltage regulator allows the same processing module to be used with different battery cell assemblies having different numbers of cells, and thus different voltage levels at the positive terminals of the cell assemblies.

Capacitor C4 acts as a buffer to maintain the integrity of the RAM memory contents in case of a temporary power loss. Also, in case of a short circuit across the battery terminals, the power to the RAM memory is unlatched and power is supplied to the RAM from the capacitor. Preferably, the capacitor is connected to a voltage supply terminal on the processing unit, and the value of this capacitor is chosen to ensure that a source of voltage is supplied to the RAM for a time dependent on the RAM leakage current. For instance, the value of the capacitor may be 330 nF, which provides a source voltage to the RAM for a period of time for the resistance of a PCT element to increase sufficiently to protect against a short circuit across the battery terminals.

The processing circuit is programmed to use determined values of battery temperature, voltage and current to calculate various other values. These determined and calculated other values include:

(i) remaining battery capacity, Cap,
(ii) relative state of charge, Soc,
(iii) full charge capacity Cap,
(iv) time to full discharge at the present discharge rate,
(v) time to full discharge at an average discharge rate, and
(vi) a value representing an uncertainty in the determined remaining battery capacity.

Remaining battery capacity, Cap, is calculated according to the equation:

$$CAP_{rem} := CAP_{rem} \Sigma \epsilon_c I_c \Delta t_c - \Sigma I \Delta t_d - \Sigma I_s \Delta t_s$$

Where $CAP_{rem}$ is the present value for the full charge capacity, $sigma_d$ is the amount of charge discharged for the battery since Cap was last reset, $sigma_s$ is the amount of charge internally discharge by the battery since Cap was last reset, and $sigma_c$ is the amount of charge added to the battery since Cap was last reset.

The relative state of charge, Soc, of the battery, is, simply, Cap expressed as a percentage of Cap, as explained with reference to block 2714.

The full capacity value, represents the present full capacity of the battery, which changes over time and depends upon the way the battery is used. This full capacity value is normally reset or recalculated when the battery is considered fully discharged.

When the full capacity value is reset, the processor does so according to the equation explained with reference to block 3034.

The time to full discharge at the present discharge rate is calculated by dividing the remaining capacity of the battery offset by the correction factor Pd, by the present discharge rate. Analogously, the time to full discharge at the average discharge rate is calculated by dividing the remaining battery capacity offset by the correction factor Pd, by an average discharge rate. This average discharge rate may be the rate at which the battery has discharged current or power over a given amount of time, such as the thirty or sixty seconds preceding the calculation. Preferably, the processor is able to perform both of the above-described calculations when the discharge rate is expressed either in terms of the discharge current or in terms of the rate at which the battery is discharging power.

During discharge, the processing unit also monitors the voltage for the end of discharge condition, and the processor generates an end of discharge signal when this condition is detected. As will be understood by those of ordinary skill in the art, a number of specific events may be chosen to indicate the end of discharge. With a preferred embodiment of battery pack, the processor signals an end of discharge when the battery voltage falls below a predefined level that is based on the number of cells in the battery pack. For example, the end of discharge voltage may be between 0.9 and 1.1 volt/cell, and preferably is approximately 1.02 volts/cell for a NiMH battery. The end of discharge voltage may be between 2.4 and 3.0 volts/cell, preferably approximately 2.8 volts/cell, for a LiIon battery.

The processor also calculates a value referred to as an uncertainty value that represents an uncertainty in the $CAP_{rem}$ value. Generally, this uncertainty value is reset to 0 when predefined conditions occur. These predefined conditions are referred to as end of charge and end of discharge conditions and are discussed in greater detail below. At other times, the uncertainty value is calculated according to the equation explained with reference to block 2746.

In addition, during charging the processor monitors for the occurrence of end of charge conditions; and if one of these conditions is detected, then the processor sends a signal, referred to as an end of charge signal to the battery charger. More specifically, these end-of-charge conditions for a NiMH battery are:

(i) the battery voltage decreases by a given amount, $^-\Delta v$, after that voltage reaches a peak value, (ii) the battery temperature increases by more than a given amount, $\char`^t$, over a given increment of time, $\char`^t$ and (iii) the calculated battery capacity is more than a given percentage, such as 150% of the full battery capacity.

For a LiIon battery, the end-of-charge conditions are explained with reference to blocks 2924 and 2936.

To monitor for the first of these end-of-charge conditions, the processing module, using the battery voltage sensing means and the analog-to-digital convertor, determines a digital value representing battery voltage, and the processing module then compares that newly determined digital value to a battery voltage data value currently stored in the processor memory. On the one hand, if this new data value is larger than that stored data value, then that currently stored data value is replaced in the processor memory with the new data value. On the other hand, if the new data value is less than the currently stored battery voltage data value, then the difference between these two data values is compared to $\char`^V$. If that difference is greater than $\char`^v$, then the processing unit generates a signal and transmits that signal to a data terminal indicating that an end-of-charge condition has been detected.

To monitor for the second of the above-mentioned end-of-charge conditions, the processing module, using the battery temperature sensing means and the analog-to-digital convertor, determines a digital value representing battery temperature. The processing module then compares that newly determined digital value to a previously determined digital value representing battery temperature and that was determined a $\char`^t$ length of time earlier. If the newly determined temperature value exceeds that most recently and previously determined temperature value by more than $\char`^t$, then the processor generates and transmits the end-of-charge signal to the data terminal.

Likewise, to monitor for the third end-of-charge condition, the processing unit periodically calculates battery capacity and compares that calculated battery capacity to a stored value representing full battery capacity. If the calculated battery capacity is more than a given percentage of the full battery capacity, then the end of charge signal is generated and transmitted to data terminal.

The processor determines values for battery temperature, current and voltage and makes the above, and other, calculations during the course of an operating or measuring cycle or program, described in detail below. Preferably, the frequency of these operating cycles may be varied. More specifically, the processing unit has a normal mode of operation in which the operating cycles occur at a first frequency, a power saving mode, referred to as a sample mode, in which the operating cycles occur at a second, lower frequency. The processor has third and fourth modes, referred to as low power sleep and shelf sleep modes, respectively, in which the operating cycles are not performed. During the low power sleep and shelf sleep modes, no measurements, no calculations, and no system bus communications occur. All RAM data values are maintained, however, as long as the supply voltage remains above a threshold level. For example, for NIMH batteries, this threshold level is 0.8v-cell, and for LIION batteries, this threshold level is 2.4v-cell. Shelf sleep mode is identical to sleep mode but may be initiated only during manufacturing of the battery pack. The low power sleep and shelf sleep modes are different from the operational sleep mode, i.e. block 1714.

Generally, in the operational sleep mode, the processor is not operating the operating program, and the processor is not determining values for battery parameters and is not performing any calculations. The processor is able to receive data messages transmitted to the processor over the bus line, and the processor receives clock signals from the external clock or oscillator.

The processor is awakened from the sleep mode upon receipt of a power on reset signal, a clock signal from the oscillator, or a data message over the bus line. If the processor is awakened from the sleep mode by a data message over the bus line, then the processor responds to that message and then returns to the sleep mode. If the processor is awakened from the sleep mode by receipt of a power on signal or the clock signal, referred to as the wake up signal, from the oscillator, then the processor begins its operating program.

Early in that program, the processor determines whether or not it is in the sample mode; and, for example, the processor may be considered to be in the sample mode when the battery current is determined to be below a threshold level such as 10 milliamps. If the processor is not in the sample mode, then the processor is in the normal or run mode, and the processor continues the operating program. If the processor is in a sample mode, the frequency of the A/D conversions is decreased, the program continues to make calculations every cycle, but uses the results of the most recent A/D conversions in every cycle rather than calculating new A/D conversions in every cycle. This provides for a way to reduce the power consumption of the ASIC. The frequency with which the analog section of the ASIC continues the operating program when the processor is in the sample mode—that is, the above-mentioned given number—may be determined by the battery manufacturer and stored in ROM. Alternatively, this given number may be varied by the user or operator. For example, this given number may be 6.

During the operating program, the processor determines, among other matters, whether it should switch into a low power sleep mode, in which the processor and the A/D converter are essentially off. When the processor is in this mode, however, the external oscillator remains activated and a wake up circuit, in response to a clock signal from that oscillator determines whether the processor should remain in that low power sleep mode, as explained with reference to the section above entitled Wake-Up Comparator Circuit.

The shelf sleep mode, as mentioned above, is substantially identical to the sleep mode, except that the processor is not awakened from the shelf sleep mode by a clock signal from the external oscillator, and instead is awakened from the sleep mode by manual activation of a switch on the battery pack. For example, the processor may be placed in the shelf sleep mode by the manufacturer, and then awakened from that mode when the user or consumer is ready to use the battery pack. This shelf sleep mode allows the battery pack to be stored or transported for extended periods of time with very little use of the battery power to operate and maintain the electronics.

FIGS. 8 and 9 illustrate the timing of the operation of the processor. The external crystal clock delivers a trigger or wake up signal approximately every 500 milliseconds; and upon receipt of the signal, the operating program is begun. In the normal mode, as shown in FIG. 8, the A/D converter is used to determine values for battery temperature, current and voltage and the operating program makes various capacity calculations. After the operating program is completed, the processor returns to the sleep mode.

In the sample mode, however, as shown in FIG. 9, the A/D conversions are completed only once every given number of times, such as once every six times that the wake up signal is received. The timing of the various operations of the operating program is discussed in greater detail in the above-mentioned copending application Ser. Nos. 08/318,004 and 08/336,945.

Figure 11:
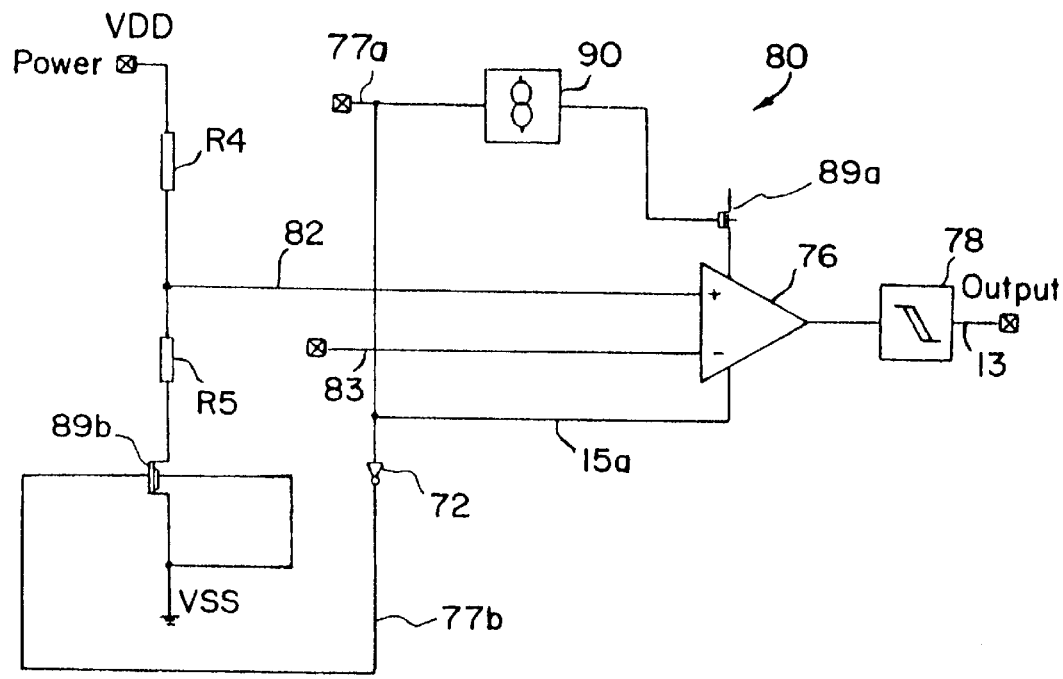
FIG. 11 illustrates a detailed schematic diagram of the comparator wake-up circuit 80.

FIG. 11 shows a circuit 80 for monitoring the battery pack when the processor is in the standby mode, and for waking the processor from that mode when it is determined that this should be done. Generally, circuit 80 includes comparator 76, a voltage dividing network, power source, and switching transistors 89a and 89b. Generally, this circuit further includes a reference line, enable line and comparator output line. The comparator includes first and second inputs, enable input, and the power input and network includes resistors R4 and R5.

Resistors R4 and R5 are connected to a positive voltage terminal of the processing unit to develop and to supply a voltage representing the battery voltage to a first input of the comparator. Transistor 89a is connected between resistor R5 and ground to control the application of voltage to the comparator. Normally transistor 89b is turned off in the sleep mode to prevent drain of battery current to ground; and when this transistor is turned on, the voltage of the network is applied to the comparator input. Reference line 83 is connected to a second input of the comparator to apply a reference voltage thereto, and the enable line is connected to an enable input of the comparator to apply enabling signals thereto. The power source, which preferable is a low current power source derived from the battery from external circuitry, is connected to a power input of the comparator via transistor 89a.

Normally, transistors 89a and 89b are off in the sleep mode, and once every 500 milliseconds these transistors are turned on by a trigger signal 77a. In particular, transistor 89b is turned on by a signal 77b, which is output from inverter 72, to develop a path to ground to enable the voltage of the network to appear at the first comparator input. In addition, the enable line 15a receives signal 77a to simultaneously enable the comparator to compare the voltages applied to the comparator inputs.

When the battery voltage is below a predefined level, the comparator output is low; and when the battery voltage is above that predefined level, the comparator output is high. This high output signal is then used to switch the processor from the standby mode. Preferably, circuit 80 also includes a Schmitt trigger 78 connected to the comparator output. This trigger is a bistable device that is provided to prevent spurious oscillations appearing at the comparator output that might be due to comparator switching characteristics or amplifier noise.

FIG. 11 schematically shows a power on reset circuit 85 that is used to generate a reset impulse signal to initiate operation of the processor when power is applied to the processing module. The circuit includes a transistor network comprising N-and P- channel transistors that are electrically connected to a positive voltage supply terminal on the processing module. Each time the voltage of the terminal rises above a threshold level, circuit 85 generates a reset impulse signal, and this signal is used to activate the external crystal oscillator and to reset the system. This external oscillator then provides the precise triggering of the internal oscillator that, in turn, provides the time base for the components of the integrated circuit.

The circuit is also used to delatch the RAM from the positive voltage supply terminal of the processing module in the event of a short circuit across the battery terminals. More specifically, when circuit 85 senses that the battery voltage becomes 0—which happens in case of a short circuit across the battery terminals—the transistor of circuit 85 generates a RAM delatching current or signal. This signal is transmitted to a switching device, which preferably is a PMOS transistor deactivating, or turning off, that switching device. This electrically disconnects, or delatches, the RAM from the positive voltage supply. As mentioned above, the buffer capacitor C4 provides the power needed to maintain the RAM contents for a period of time depending on the RAM leakage current.

Figure 16:
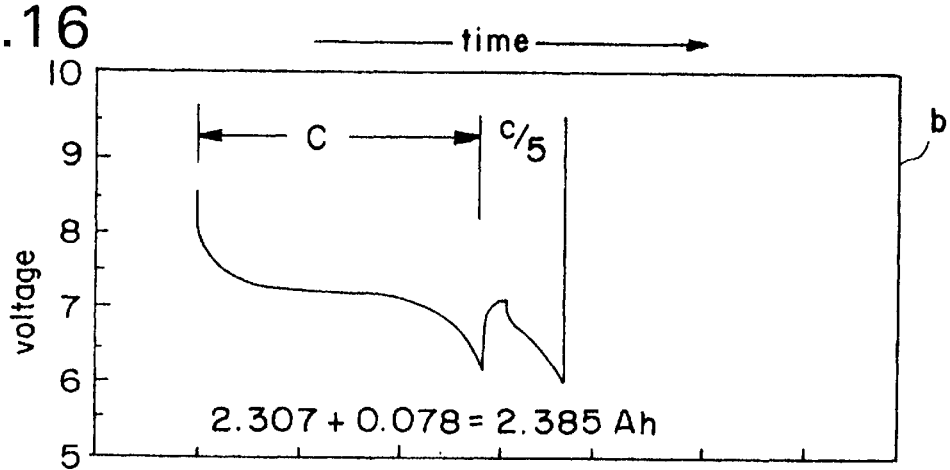
Figure 16A:
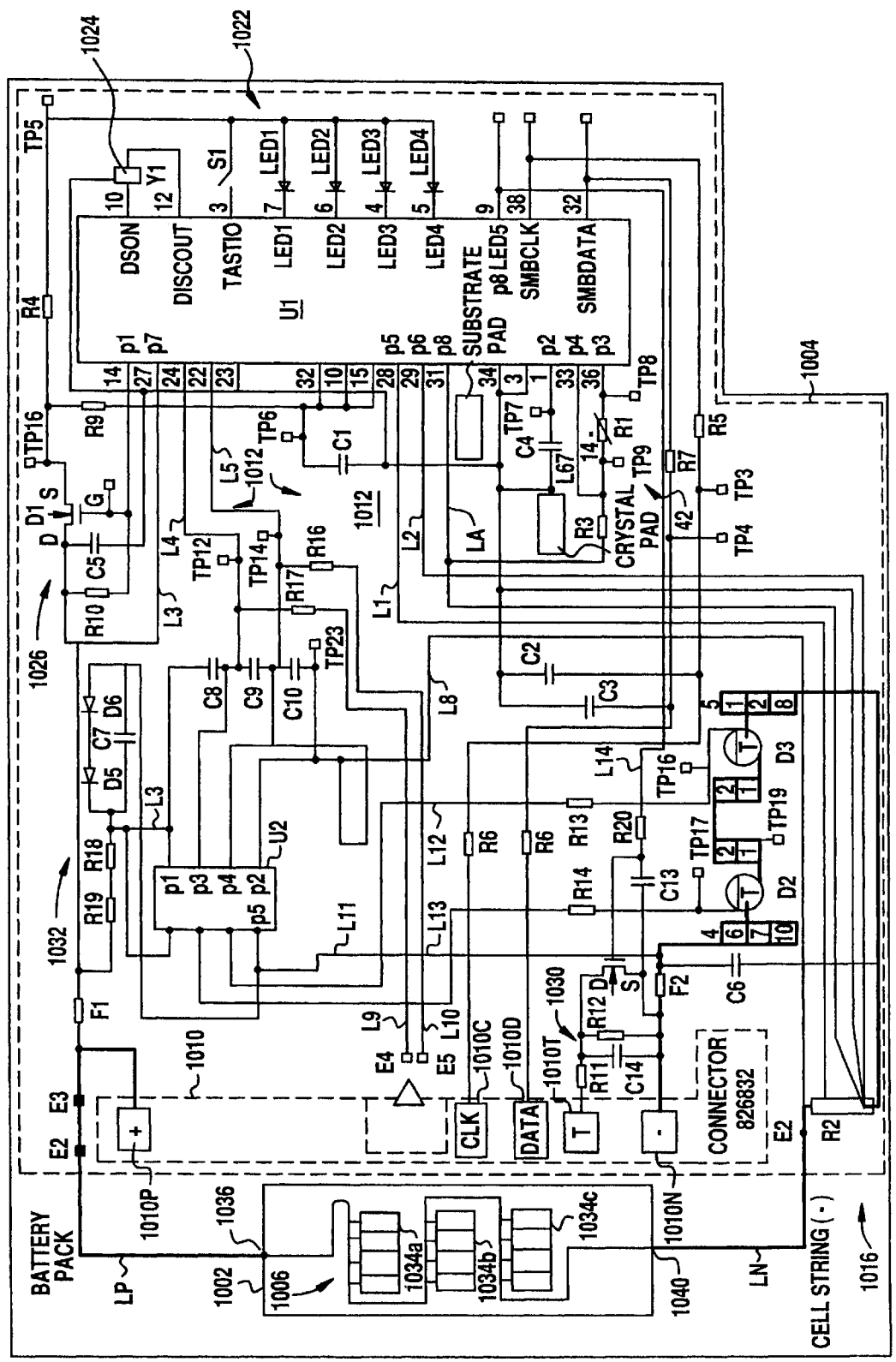
FIG. 16A is a schematic diagram of a battery pack especially well suited for use with lithium ion battery cells.

FIG. 16A shows battery pack 1000 comprising battery cell assembly 1002 and operating module 1004. Cell assembly 1002 includes a plurality of rechargeable battery cells 1006; and operating module 1004 includes processing unit U1, connector assembly 1010 and module circuit 1012. Module circuit 1012, in turn, includes temperature sensing means 1014, current sensing means 1016, voltage sensing means 1020, LED assembly 1022, oscillator 1024 and capacitor C4. Preferably, this module circuit 1012 further includes supply voltage regulator 1026, safety processor U2, safety switches Q2 and Q3, an overcharging protection subcircuit 1030 and an overvoltage protection subcircuit 1032.

More specifically, with the embodiment of battery pack 1000 shown in FIG. 16A, connector assembly 1010 includes positive and negative terminals 1010P and 1010N, clock terminal 1010C, data terminal 1010D and T-terminal 1010T. Temperature sensing means 1014 includes thermistor R1, current sensing means includes shunt resistor R2 and lines L1 and L2, and voltage sensing means includes lines LA and L3–L5. In addition, supply voltage regulator 1026 includes transistor Q1, resistor R10, and capacitor C5, overcharging protection subcircuit 1030 includes transistor Q5, capacitors C13 and C14 and resistors R11, R12 and R20, and overvoltage protection subcircuit 1032 includes resistors R18 and R19 and diodes D5 and D6.

Generally, cell assembly 1002 provides a source of battery power. Processing unit U1 monitors the operation and performance of the cell assembly, calculates various values relating to the operation of the cell assembly, and communicates with the user of the battery pack and with the charger used to recharge the battery cells 106. Module circuit 1012 interconnects cell assembly 1002, processing unit U1 and connector assembly 1010, and this circuit also provides analog signals to processing unit U1 and performs other operational, sensing and safety functions.

Battery pack 1000 is specifically designed for use with lithium ion battery cells, and thus preferably the battery cells 1006 in assembly 1002 are lithium ion cells. In assembly 1002, the battery cells are arranged in three groups 1034a, 1034b and 1034c of four cells each. The cell groups 1034a, 1034b and 1034c are located in series, while the battery cells in each group are located in parallel. The electrically positive end of group 1034a forms the positive terminal 1036 of the battery, and the electrically negative end of group 1034c forms the negative terminal 1040 of the battery. The positive terminal 1010P of the connector assembly—which is the positive terminal of the battery pack 1000—is connected to the positive terminal 1036 of the battery via line LP. The negative terminal 1010N of the connector assembly—which is the negative terminal of the battery pack 1000—is connected to the negative terminal 1040 of the battery, and to module components R2, Q2, Q3 and F2, via line LN.

Processing unit U1, as mentioned above, monitors the operation and performance of the cell assembly 1002. For example, the processing unit keeps track of the remaining capacity of the battery and determines when the cells of the assembly have reached fully charged and fully discharged conditions. Preferably, the processing unit U1 also keeps track of various other values such as a time to full discharge at an average discharge rate, or at a present discharge rate. To perform these tasks, the processing module is provided with preset equations, with preset data values, and, in operation, with analog signals representing the battery temperature, the battery current and the battery cell voltages.

One of the functions performed by the processing unit U1 is to determine the relative state of charge of the battery, and LED assembly 1022 is used to provide a visual display showing that determined relative state of charge. As shown in FIG. 16A, this assembly includes four LEDs designated as LED1, LED2, LED3 and LED4. Four, three, two and one of these LEDs are illuminated if the state of charge of the battery is, respectively, greater than 75%, between 50% and 75%, between 25% and 50%, and between 10% and 25%. If the state of charge is less than 10%, then a single LED is flashed.

Preferably, the electrical power to operate the processing unit U1 is obtained from cell assembly 1002 itself. In particular, the positive terminal 1036 of the cell assembly is connected to one or more terminals, or pins, such as pin 1 of the processing unit U1 to apply a positive voltage to that terminal or those terminals, thereby providing the necessary power for the processing unit.

Supply voltage regulator 1026, which preferably comprises transistor Q1, resistor R10, and capacitor C5, is connected in series between the positive terminal 1036 of the cell assembly 1002 and processing unit U1, and this voltage regulator is used to provide a constant, regulated voltage to the processing unit. The voltage regulator allows the same processing unit U1, and the same operating module 1004, to be used with different battery cell assemblies having different numbers of cells and, thus, different voltage levels at the positive terminals of the cell assemblies. Also, with regulator 1026, a constant voltage may be applied to processing unit U1 despite changes in the voltage of the cell assembly 1002.

Capacitor C4 acts as a buffer to maintain the integrity of RAM contents of processing unit U1 in case of a temporary loss of the power from the cell assembly 1002. In addition, in case of a short circuit across the terminals of the cell assembly or the battery pack, the power to the RAM of the processing unit U1 is unlatched and power is supplied to the RAM from capacitor C4. Preferably, the capacitor C4 is connected to a terminal p2 on the processing unit U1, and the capacitance of C4 is chosen to ensure that a source of voltage is supplied to the RAM for a time dependent on the RAM leakage current. For instance, the value of the capacitor may be 330 nf, which provides a source of voltage to the RAM for a period of time sufficient to protect against a short circuit across the battery terminals.

As mentioned above, processing unit U1 is provided with analog signals representing the battery temperature, the battery current and the battery cell voltages. Temperature sensing means 1014, current sensing means 1016 and voltage sensing means 1020 of module circuit 1012 are used to provide the processing unit U1 with these analog signals.

With the embodiment of module circuit shown in FIG. 16A, the temperature sensing means 1014 includes a voltage dividing network 1042 and a signal line L6, and this voltage dividing network includes a thermistor R1 and a resistor R3. The thermistor R1 is physically located in good heat transfer relation with the battery cell assembly 1002, and the electrical resistance of the thermistor is a function of its, and thus of the battery's, temperature.

As represented in FIG. 16A, the thermistor R1 is an NTC thermistor, and the resistance of the thermistor decreases as the temperature of the thermistor increases. Further, the thermistor R1 and resistor R3 are electrically located in series between the negative terminal of the cell assembly 1002 and a positive reference voltage source provided by a terminal or pin P3 of processing unit U1. A first end of signal line L6 is connected between the resistor R3 and the thermistor R1 and a second end of this line L6 is connected to an input terminal or pin P4 of the processing unit U1. With the above-described arrangement, the voltage level at the first end of the signal line L6 varies as a function of the battery temperature, and this voltage level is applied, via the line L6, to the input terminal P4 of the processing unit U1.

Current sensing means 1016 is provided to sense and to generate an analog signal representing the current of the battery. Preferably, the current sensing means includes shunt resistor R2 that is electrically located in series between the negative terminal 1040 of the battery cell assembly 1002 and the negative terminal 1010N of the battery pack 1000. The resistance of the shunt resistor R2 may vary over a wide range, such as 1 milliohm to 200 milliohms, depending on the number of cells in the assembly 102 and the expected use of the battery pack 100. Preferably, however, the shunt resistor R2 has a comparatively small resistance such as 25 milliohms. The voltages at the two ends of the shunt resistor R2 are applied to two inputs P5 and P6 of the processing unit U1 via lines L1 and L2. In this way, the voltage difference between these two inputs P5 and P6 of the processing unit U1 is a measure of the voltage drop across resistor R2, and from this the processor unit U1 can determine the current passing through resistor R2 and, thus, the current passing through line LN.

Voltage sensing means 1020 is used to sense and to generate a signal representing the voltage of the battery, and the embodiment of sensing means 1020 shown in FIG. 16A includes lines LA L3, L4 and L5. Line LA is located in series between the negative terminal 1010N of battery pack 1000 and an input terminal P9 of the processing unit U1, while line L3 is located in series between the positive terminal 1000P of the battery pack 1000 and an input P7 of the processing unit. With this arrangement, the voltage difference between the input terminals P9 and P7 represents the voltage of the battery cell assembly 1002 and, thus, of the battery pack 1000.

Safety processor U2 and safety switches Q2 and Q3 are provided to protect cell assembly 1002 from excessive voltages and currents. Generally, processor U2 monitors the voltages of the cells 1006, or of each group 1034a, 1034b, 1034c of parallel cells in assembly 1002, and the current applied to or discharged by that cell assembly; and if a voltage or a current above a respective threshold level is detected, processor U2 causes one or both of the switches Q2 and Q3 to open to prevent that voltage or current from being applied to or by the cell assembly 1002.

With the embodiment of battery pack 1000 shown in FIG. 16A, input terminals or pins p1 and p2 of processor unit U2 are connected to the positive and negative battery terminals 1036 and 1042 via lines L7 and L8 respectively, and the input terminals p3 and p4 of the processor U2 are connected to the cells of groups 1036a and 1036b via lines L9 and L10 respectively. With these connections, the voltage difference between processor input terminals pi and p3 is equal to the voltage of cell group 1036a, the voltage difference between processor input terminals p3 and p4 is equal to the voltage of cell group 1036b, and the voltage difference between processor terminals p4 and p2 is equal to the voltage of cell group 1036c. In addition, input terminals p2 and p5 of processor unit U2 are connected to opposite sides of shunt resistor R2, via lines L8 and L11, so that the voltage difference between terminals p2 and p5 is equal to the voltage drop across that resistor R2; and from this voltage difference, the processor unit U2 can determine the current through the resistor R2 and through battery terminal 1010N.

At the same time, switches Q2 and Q3, which preferably are transistor switches, are located in series with each other in line LN, between the negative terminal 1040 of the battery 1002 and the negative terminal 1010N of the battery pack 1000. Each of the switches Q2 and Q3 has a closed, conductive state and an open, semi-conductive state. Hence, in order for current to be conducted in both directions through line LN, between terminals 1040 and 1010N, both switches Q2 and Q3 must be closed; while if both of these switches Q2 and Q3 are open, current is not conducted through line LN and terminal 1040 is electrically disconnected from terminal 1010N.

Normally, both switches Q2 and Q3 are closed, allowing current to be conducted through line LN and so that the voltage at terminal 1010N is applied to the terminal 1040 and vice versa. However, under defined conditions, processor unit U2 causes one or both of switches Q2 and Q3 to open, electrically disconnecting terminals 1010N and 1040 from each other. More particularly, during charging, if processor unit U2 determines that the voltage of any of the cell groups 1036a, 1036b and 1036c becomes greater than a predetermined level, that processor unit generates a signal that is applied to switch Q3, via line L12, to open that switch. Also, during discharging, if processor unit U2 determines that the voltage of any of the cell groups 1036a, 1036b and 1036c falls below a preset value, the processor unit generates signals that are applied to switches Q2 and Q3, via lines 112 and L13, to open both of these switches. In addition, during both charging and discharging, if processor unit U2 determines that the current in line LN exceeds a preset current level, the processor unit generates signals that are applied to switches Q2 and Q3, via lines 112 and L13, to open those switches, discontinuing the flow of current through line LN.

Preferably, after processor unit U2 opens one of the switches Q2 or Q3, the processor unit maintains the switch open for a predetermined length of time; and after that length of time expires, the switch closes. However, if at that time, the condition that caused the processor unit U2 to first open the switch still exists, then the processor unit will reopen the switch.

Voltage protection subcircuit 1032, which as discussed above, is formed by resistors R18 and R19 and diodes D5 and D6, is provided to protect both processor units U1 and U2 from an excessive voltage up to about 22 volts. Any voltage between about 18 and 22 volts that is applied to subcircuit 1032 is reduced by that subcircuit to about 18 volts.

With the embodiment of operating module 1004 shown in FIG. 16A, T-terminal of connector assembly 1010, processing unit U2 and overcharge protection subcircuit 1030 of module circuit 1012 are used to prevent overcharging of the battery cells 1006. In articular, if an overcharging condition develops, then protection subcircuit 1030, which preferably comprises resistors R11 and R12 and transistor switch Q5, changes the resistance at terminal T to signify the presence of that overcharging condition.

More specifically, normally transistor switch Q5 is closed and the resistance at terminal T is determined by the resistance of resistor R11. However, when processor unit U1 detects an overcharging condition, the voltage level at processor unit terminal p8 changes, and this voltage change is applied to switch Q5 via line L14, opening that switch. This places resistor R12 in series with resistor R11, and the resistance at terminal T changes from the resistance of R11 to the sum of the resistances of the resistors R11 and R12. This, in turn, is a signal to the battery charger to stop charging of the battery.

As will be understood by those of ordinary skill in the art, module 1004 may be provided with additional components. For instance, preferably, capacitors C6, C7, C8, C9 and C10 and resistors R16 and R17 are included in the module to protect the module from electrostatic discharge. A fuse F1 is located in series between the positive battery terminal 1010P and the positive voltage terminal of U2 and pin p1 of processor unit U1, and this fuse opens in case a current above a given level is being drawn from either processor unit. Fuse F2 is a backup safety fuse located in negative terminal line LN; and this fuse opens in case a current above a given level is being conducted through line LN and, for some reason, neither of the transistor switches Q2 and Q3 opens. In addition, a resistor R4 is located in series with the LED pins of processor unit U1 to limit the current applied to those pins.

Logic Flow Diagrams in the following section of this specification are directed to the detailed descriptions of the following logic flow diagrams or routines as are illustrated respectively in FIGS. 17 through 39. In those Figures, a step is illustrated by a rectangular block, a decisional step is illustrated by a diamond shaped block, and a routine (which is described in detail in another Figure) is illustrated by a rectangular block having a shaded bottom and right side. In the following logic flow diagrams, the notes and values given in the logic flow diagrams outside of the blocks often further explain and define both the functions and the values of selected symbols variables and constants.

FIGS. 17 through 39 illustrate respectively the following logic flow diagrams or routines which are particularly well suited for battery packs having lithium ion battery cells (with the exeception of FIG. 21a which is for a NiMH battery), main_chart, duty_cycle, initialization, RC_Oscillator_adjust, learn_cells, capacity_calculation, IUT_calculation, U_calculation, V_control, selfdischarge, integration, Itf_Limits, end_conditionsCI, end_conditionsCD, alarm_control, charger_control, send_message, LED_display, handle_request, Read_Block, Write_Block, fetch_ADC_values, and set_cell_dep_val.

Figure 17:
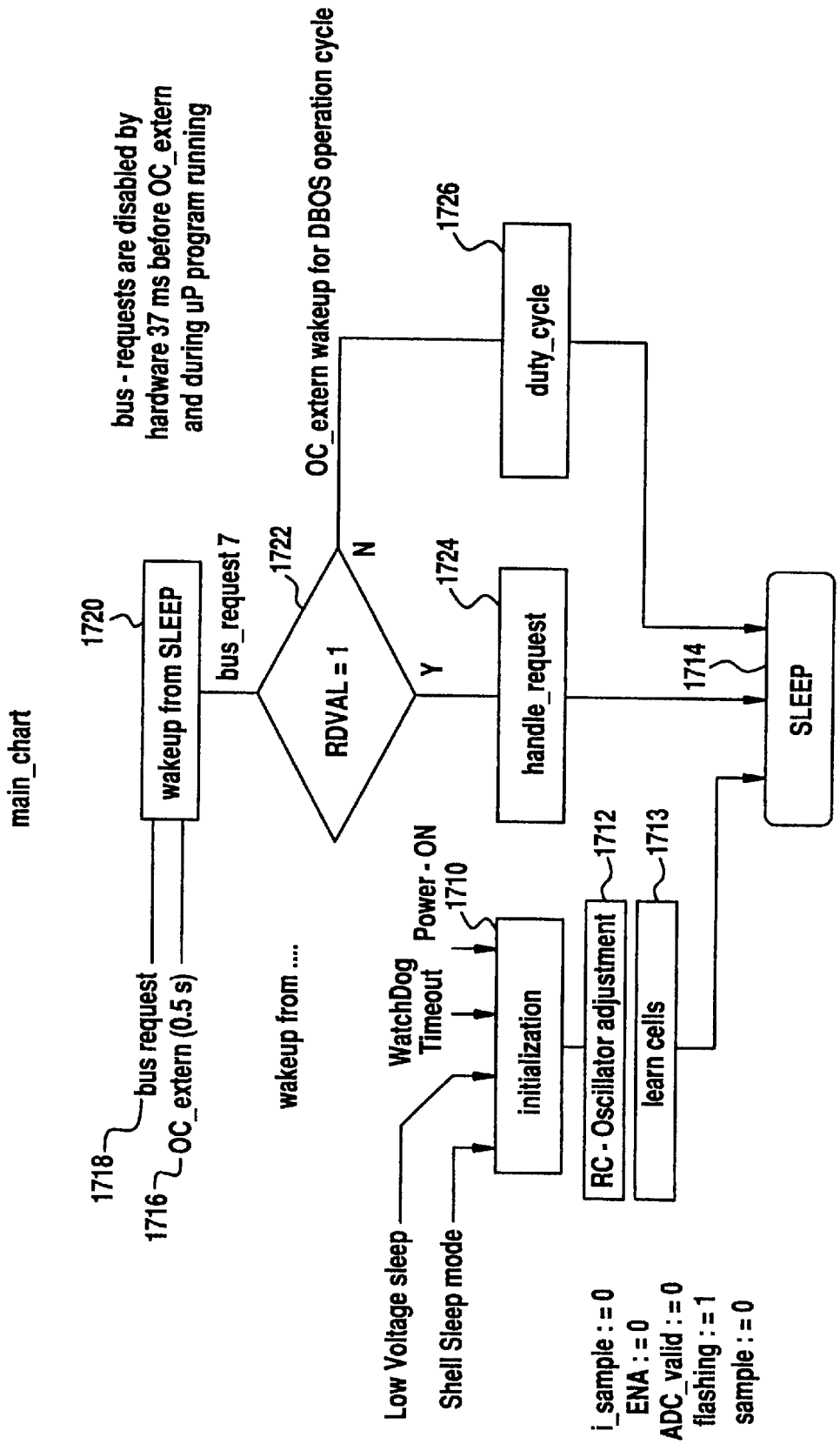

With reference to FIG. 17, which illustrates the main-chart operating program of the battery operating system of the present invention, the first step therein is an initialization routine 1710. During this routine, discussed in greater detail below particularly with respect to FIG. 19, a number of variables and bits are set to initial or default values. This initialization routine is itself initiated by the occurrence of any one of a number of signals including a signal from a shelf sleep mode, a signal from a low voltage sleep, a watchdog timeout signal, or a power on reset signal. After the initialization routine 1710 is completed, a clock or a oscillator adjustment routine 1712, also discussed below, is performed, and a learn cells routine 1713, also discussed below, is performed, and then the processor enters the sleep mode at 1714. The processor stays in this sleep mode until either the processor receives a wake up signal from the external oscillator at 1716, which is normally transmitted to the processor every 500 milliseconds, or the processor receives a bus request signal at 1718.

As represented by step 1720 of FIG. 17, the processor wakes up from the sleep mode upon receipt of either of these signals. After waking up, the processor determines which of these signals was received; and this is done by determining, at step 1722, whether a bus request bit RDVAL is set equal to 1. If this bit is set, then the received signal was a bus request signal; however, if the bus request bit is not set, then the received signal is a wake up signal. If the bus request bit is set, the processor responds to this request by the following-request routine at step 1724. The specific manner in which this is done is discussed in more detail below; and after the processor has responded to the request, the processor reenters the sleep mode at 1714. If at step 1722, the bus request bit is not set, which indicates that the received signal was a wake up signal, then the processor proceeds to start a regular operating duty-cycle routine 1726, as illustrated in FIG. 18.

Figure 18:
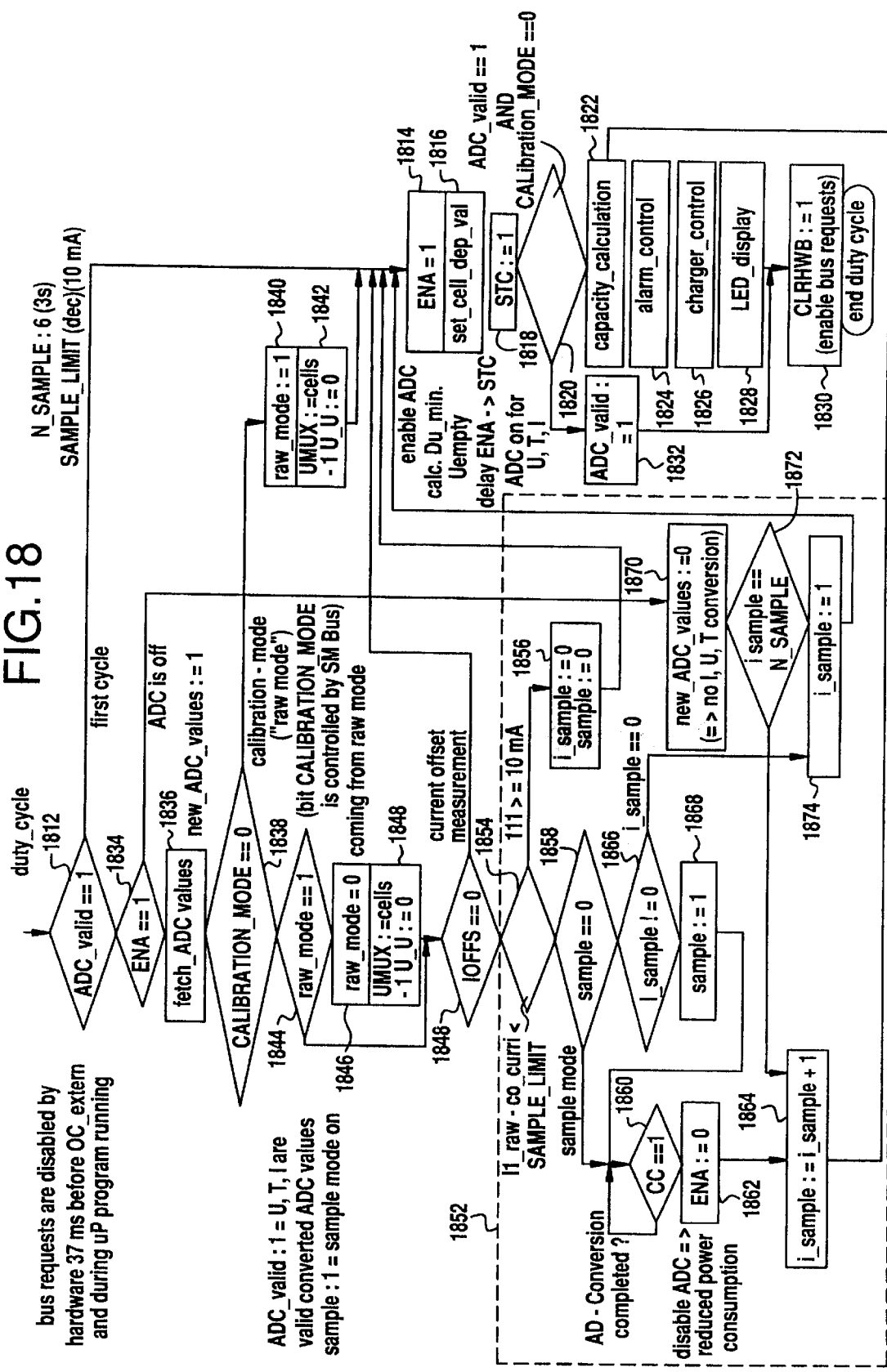

Referring to the duty-cycle routine in FIG. 18, at step 1812, the processor checks to determine if this is the first cycle since completion of the initialization routine; and in particular, the processor does this by checking to determine if a bit, referred to as ADC_valid is set equal to 1. If this bit is not equal to 1, then the present cycle is the first cycle since initialization was completed; and if this bit is equal to 1, then the present cycle is not the first cycle since the initialization was completed.

If ADC_valid is not equal to 1, then the program proceeds to step 1814, at which a bit referred to as ENA is set equal to 1. As explained in greater detail below, when ENA is set equal to 1, the analog-to-digital converter is enabled, allowing the processor to obtain temperature, current and voltage measurements from the A/D converter. After ENA is set equal to 1, a set-cell-dep-val routine 1816, discussed below, is invoked to set various cell dependent values. After this, a bit STC is set equal to 1 at step 1818, and this is done to start an analog-to-digital conversion.

Then, at step 1820, the processor determines, first, whether the bit ADC_valid is set equal to 1, and secondly, whether a CALIBRATION_MODE bit is set equal to 0, indicating that the processor is not in a calibration mode. If both of these conditions are true, then the processor proceeds sequentially through a capacity_calculation routine 1822, an alarm_control routine 1824, a charge_control routine 1826, and an LED_display routine 1828. These four routines are discussed in further detail below.

After these four routines are completed, a bit entitled CLRHWB is set equal to 1 at step 1830, which enables the processor to handle, or respond to, bus requests that are transmitted to the processor over the bus request line. After step 1830, the processor exits the duty_cycle routine and reenters the sleep mode at block 1714.

If, at step 1820, one, or both, of the tested conditions is not true, then the processor skips the routines 1822 to 1828 and proceeds to step 1832, at which the bit ADC_valid is set equal to 1. The processor then skips to step 1830, sets bit CLRHWB equal to 1, and then reenters the sleep mode.

If, at step 1812, the bit ADC_valid is set equal to 1—which means that the present cycle is not the first cycle after the initialization routine is completed—then the program proceeds to step 1834. At this step, the processor tests to determine whether the analog-to-digital converter is enabled; and specifically, the processor does this by testing to determine if the ENA bit is equal to 1. If this bit is set equal to 1—indicating that the A/D converter is on—the processor proceeds to step 1836, and a routine fetch_ADC_values, discussed in detail below, is performed to transfer various values from the A/D converter to the processor.

After this is done, the processor, at step 1838, tests to determine whether the processor is in the calibration mode by checking that the CALIBRATION_MODE bit is equal to 0. If the processor is in the calibration mode, the processor proceeds to step 1840 and sets the bit raw_mode equal to 1, and then proceeds to step 1842 to set the variable UMUX (which determines the input to the multiplexer equal to the number of cells minus 1, and set the bit U_U to 0, and then proceeds to step 1814 and proceeds as described hereinabove. If, however, at step 1838, the processor is not in the calibration mode, the processor proceeds to step 1844 to determine if the bit raw_mode is set equal to 1. If so, the processor sets the bit raw_mode equal to 0 at step 1846, and to set the variable UMUX equal to the number of cells minus 1, and the bit U_U to 0, at step 1848.

If in step 1844, the bit raw_mode is determined to be not equal to one, or proceeding from step 1848, at step 1850, the processor tests to determine if a bit flag, referred to as IOFFS and representing a current offset measurement enablement, is equal to 0. If this bit is not equal to 0, the program is in a current offset measurement mode and skips to step 1814 and proceeds from there as described hereinabove; while if the IOFFS bit is equal to 0, the program moves to step 1854.

The steps in block 1852 are performed for Sample Mode Control. When the current is <10 ma, charge or discharge, the rate at which at A/D converter converts new samples is slowed to one per three seconds to conserve battery power. Step 1854, and the subsequent steps in block 1852, are performed to determine whether the A/D converter is operated at a regular frequency—that is, the A/D conversions are performed once every 500 milliseconds—or at a lower frequency. As discussed above, the A/D converter operates at the regular or the lower frequency when the battery current is, respectively, above or below a predefined level. This predefined current level is represented by the variable SAMPLE_LIMIT, and in a preferred embodiment of the invention, is 10 milliamps.

More specifically, at step 1854, the processor determines whether the absolute value of the variable I_raw-co_curr is less than a SAMPLE_LIMIT. If I_raw_co_curr is not less than the sample_limit, then the processor operates at the regular frequency. Specifically, two bits i_sample and sample are set to 0, at step 1856; and the processor then moves to step 1814 and proceeds from there as described hereinabove.

If, however, at step 1854, the variable is less than SAMPLE_LIMIT, then the processor proceeds to step 1858. At this step, the processor determines whether the bit sample is equal to 0.

If the bit sample is not equal to 0, the processor is already in the sample mode. At step 1860, the processor tests to determine whether a bit, CC, is equal to 1. As explained in greater detail below, this bit will be set to 1 when the analog-to-digital converter completes the conversion of one set of analog signals to digital data; and step 1860 is repeated until the bit CC becomes equal to 1. When this happens, the processor, first, sets ENA to 0, thereby disabling the analog-to-digital converter to reduce power consumption, and secondly, increases the variable i_sample by 1 at block 1864. From step 1864, the processor moves on to step 1822 and proceeds from there.

If, at step 1858, sample is equal to 0, the processor proceeds to step 1866, and the processor tests to determine whether i_sample is not equal to 0. If i_sample is equal to 0, the processor sets i_sample equal to 1 at step 1868, and then moves to step 1874 and proceeds from there. If i_sample is not equal to 0 at step 1866, the processor sets sample equal to 1 at step 1868 and then proceeds to step 1860 as described above.

If, at step 1834, the analog-to-digital converter is not enabled—as indicated by ENA not being equal to 1—then the processor moves to step 1870. At this step, the processor sets a bit new_ADC_values equal to 0. As discussed below, when this variable is set to 0, the processor does not perform any current, voltage or temperature conversions. At the next step 1872, the processor tests to determine if i_sample is equal to N_SAMPLE. If these two values are equal, the processor resets i_sample to 1 at step 1874, and then proceeds to step 1814. If, in contrast, i_sample is not equal to N_SAMPLE at step 1872, then the processor proceeds to step 1864, wherein i_sample is increased by 1, and the processor then proceeds to step 1822 as described above.

With the above-described duty-cycle program, the analog-to-digital converter produces digital data values for battery current, temperature and voltage once every 500 milliseconds. However, in order to conserve battery power if the battery current falls below the predetermined threshold level, these conversions are made at a slower frequency, determined by the variable N_SAMPLE. However, under these circumstances, the processor continues to perform the capacity calculations and performs the alarm control, the charger control, and the LED display routines once every 500 milliseconds.

Figure 19:
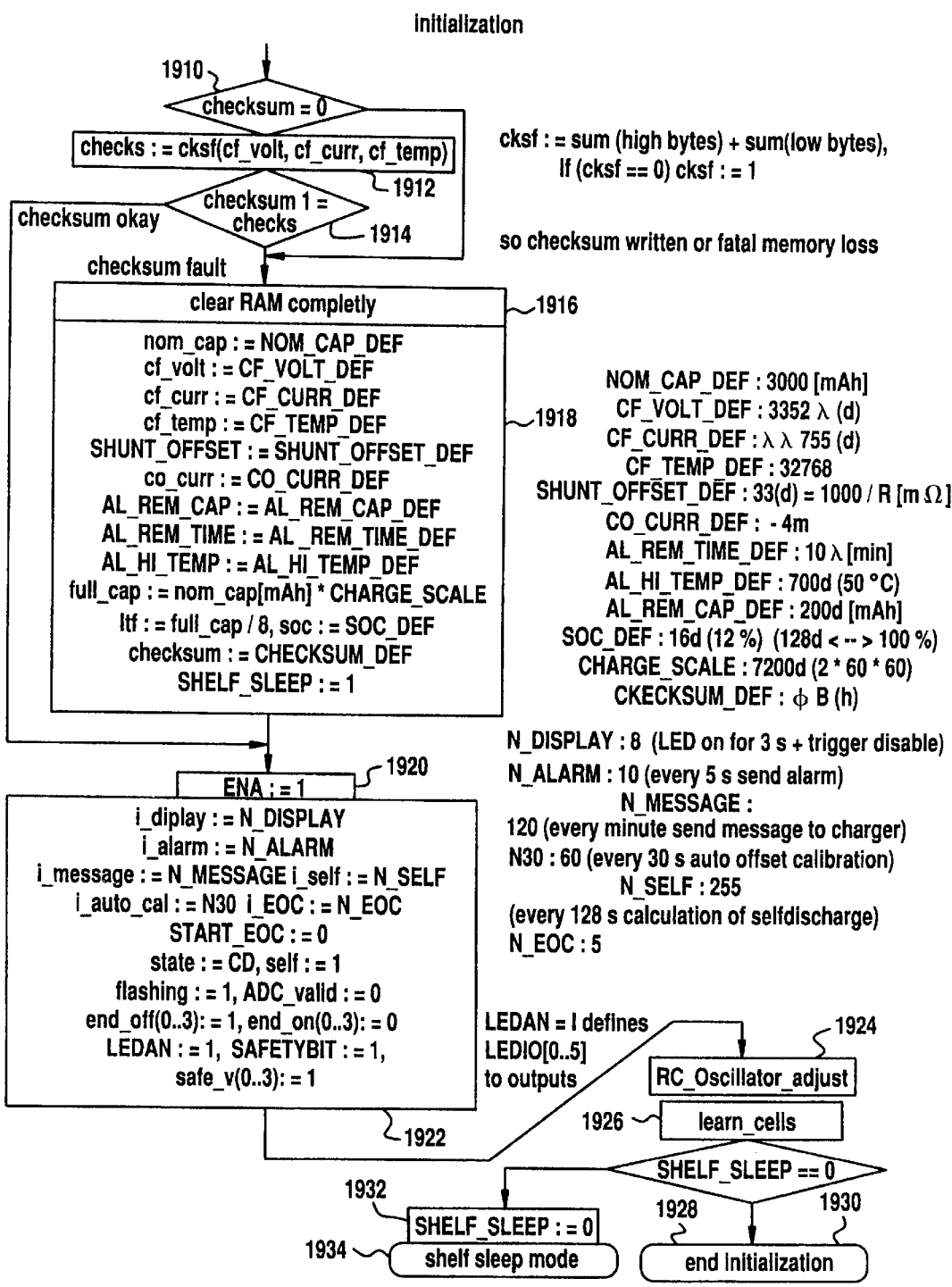

FIG. 19 generally illustrates the initialization routine. Generally, this routine is used to initialize values used in the program, timers, states, and bit flags when the device wakes up from low voltage sleep, shelf sleep, watchdog time out, or power on from an off state. In addition, the routine checks for RAM data loss, checksum=0, and in the case of data loss, reinitializes values programmed at manufacture with default values.

At step 1910, the routine determines whether a bit, referred to as checksum, is not equal 0. If checksum is not 0, the routine, at step 1912, then sets another variable, referred to as checks, equal to the byte sum of the three parameters used to calibrate the battery voltage (cf_volt), current (cf_curr) and temperature (cf_temp). Then, at step 1914, the routine compares to determine that checksum is not equal to checks. If these two values are not equal, then the routine clears the RAM at step 1916, and at step 1918 sets default values for:

i) a nominal full battery capacity,
ii) a battery voltage calibration factor,
iii) a battery current calibration factor,
iv) a battery temperature calibration factor,
v) shunt offset,
vi) battery current,
vii) the remaining capacity at which a remaining capacity alarm will be generated,
viii) an estimated remaining operating time at which a remaining time alarm will be generated,
ix) a temperature at which a high temperature alarm will be generated,
x) a full charge capacity,
xi) a remaining capacity value,
xii) a state of charge, xiii) a check sum value,
xiv) the shelf sleep bit.

If, at step 1910, the checksum is equal to 0, indicating no checksum written or fatal memory loss, then the processor proceeds directly to step 1916, clears the RAM memory and sets default values for the above-listed items. If, at step 1914, the checksum is equal to checks, then the checksum test has been passed and the routine proceeds directly to step 1920, the normal procedure. After step 1918, the processor sets the bit ENA equal to 1 at step 1920, and then proceeds to step 1922 at which the processor sets default values for an additional group of variables. In particular, at step 1922, the processor sets default values for:

i) i_display,
ii) i_alarm,
iii) i_message,
iv) i_self,
v) i_auto_cal
vi) i_EOC
vii) START_EOC
viii) state,
ix) self,
x) flashing,
xi) ADC_valid,
xii) eod_off
xiii) eod_on
xiv) LEDAN
xv) SAFETY BIT
xiv) safe After step 1922, an RC_Oscillator_adjust subroutine, discussed below, is invoked at step 1924 to calibrate the on-chip oscillator, and then the processor proceeds to a subroutine at step 1926, learn_cells, discussed below, and then proceeds to step 1928 at which the processor tests to determine if the bit SHELF-SLEEP is equal to 0. If this bit is equal to 0—indicating that the shelf-sleep mode has not been initiated—then the initialization routine is exited at 1930. If, however, the shelf-sleep bit is set—indicating that the shelf-sleep mode has been initiated—then at step 1932 the bit is cleared, or set equal to 0, and the processor enters the shelf-sleep mode at step 1934.

The Shelf-Sleep mode is a special mode of operation used to prolong the life of the battery pack during initial shipment, storage, and retail display by minimizing the power consumption of the pack electronics. The Shelf-Sleep mode is normally activated only once and is not accessible to the battery pack user. This mode, however, may occasionally be de-activated and re-enabled by a non-retail customer, such as an original equipment manufacturer, during their incoming inspection or inventory inspection procedure. In this case, the Shelf-Sleep mode is deactivated, the pack tested for quality purposes, and then re-activated and returned to inventory. In contrast, the Normal Sleep mode is activated an de-activiated normally throughout the use of the battery pack when the pack voltage is low.

The Shelf-Sleep mode and the Normal Sleep mode both maintain all the RAM data values previously programmed or learned by the ASTC. These values include all calibration information, learned capacity values, and programmed values. However, due to the nature of the use of the Shelf-Sleep mode, upon re-activation, or wake-up, the actual state-of-charge of the battery and the data contained in the RAM may not match. The Shelf-Sleep mode can be activated immediately after the pack is manufactured and tested at any state-of-charge or capacity. During many months of shipment and storage, the actual capacity of the battery cells may decrease appreciably such that upon wake-up, which preferably is done by pressing an activation switch, there will be a difference between the value in RAM and the actual value. This difference is automatically corrected at the next point of full charge or full discharge.

This is different from the Normal Sleep mode, which is only activated after the battery is virtually drained of energy. Upon wake-up from the Normal Sleep mode, the battery is still basically empty so there is no disparity in the state of the battery cells and the data representing the state of the battery. In addition, the wake-up or exit conditions for the Shelf-Sleep and Normal Sleep modes are different. Preferably, the Shelf-Sleep mode is only exited by manually actuating a switch, while the Normal Sleep mode is exited when the full pack voltage reaches a high enough level, such as a voltage equivalent to 1.19 V/cell, during charge. Preferably, the Shelf Sleep mode cannot be exited by charging the pack; only by pressing a specific switch.

The Shelf-Sleep mode is beneficial in that in may be used to prevent a battery pack in inventory (such as during shipment, while in a warehouse, or while in a retail store) form being drained significantly by the pack electronics. The Shelf-Sleep mode allows the manufacturer to turn off the pack electronics when the pack is at an appropriate state-of-charge for shipment and storage and provides a simple means, such as a button press, for a customer to re-enable the pack electronics.

Figure 20:
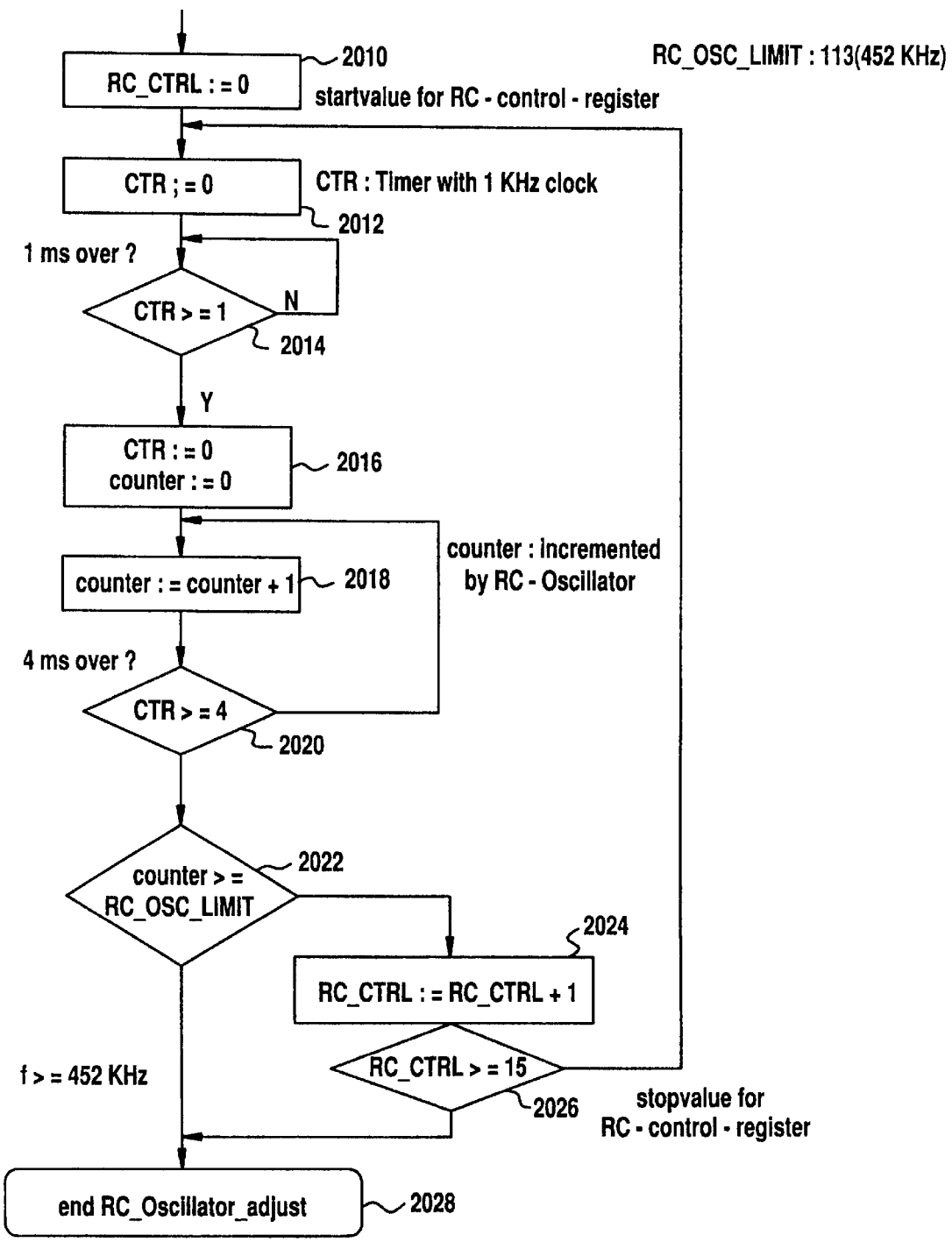

FIG. 20 generally shows the routine, RS_Oscillator_adjust, used to calibrate the oscillator. As discussed above, this oscillator is physically located on the chip, and preferably the oscillator is comprised of a resistor-capacitor network. Generally, in accordance with this routine, the processor counts the number of clock pulses generated by the oscillator during a given period of time; and if the number of counted pulses exceeds a given value, then the oscillator is adjusted to lower the frequency at which the oscillator generates these clock pulses. This test is repeated a number of times until the oscillator is adjusted, and in addition, the external oscillator is used to measure the above-mentioned given periods of time.

More specifically, at steps 2010 and 2012, two variables RC_CTRL and CTR are set to 0. The first variable is used to tune the RC-oscillator frequency, and the second variable is used to keep track of the length of each test. Each time the processor receives a signal from the external oscillator, CTR is increased by 1. At step 2014, the processor tests to determine if the CTR value indicates that more than 1 millisecond has elapsed since CTR was set to 0; and this step is repeated until 1 millisecond has elapsed. When this happens, at step 2016, CTR is reset to 0, and another variable counter is set to 0. The counter is used to count the number of clock pulses generated by the oscillator. Each time the oscillator generates a clock pulse, the counter is increased by 1, as represented by step 2018, and then the processor tests at step 2020 to determine if the CTR value indicates that more than 4 milliseconds have elapsed since CTR was reset. These steps are repeated until 4 milliseconds have elapsed; and then the processor proceeds to step 2022 in which it compares the counter to a predetermined number, represented as RC_OSC_LIMIT. If the counter is less than the RC_OCS_LIMIT—which indicates that the oscillator is generating clock signals at too slow of a frequency—then the processor moves to step 2024 and RC_CTRL is increased by 1, increasing the RC-oscillator frequency.

Next, RC_CTRL is compared at step 2026 to a given value, such as 15. If RC_CTRL is less than or equal to this given value, the routine returns to step 2012 and repeats the previously explained steps. When RC_CTRL becomes greater than the given value, then from step 2026, the routine is terminated. When during one of these test periods, the counter is equal to or greater than RC_OCS_limit—which indicates that the oscillator is generating correct clock signals—then, from step 2022, the routine terminates. Any acceptable procedure may be used to adjust the frequency at which the oscillator generates clock signals; and, for instance, the resistance, the capacitance, or both the resistance and the capacitance, may be varied to change that frequency.

Figure 21:
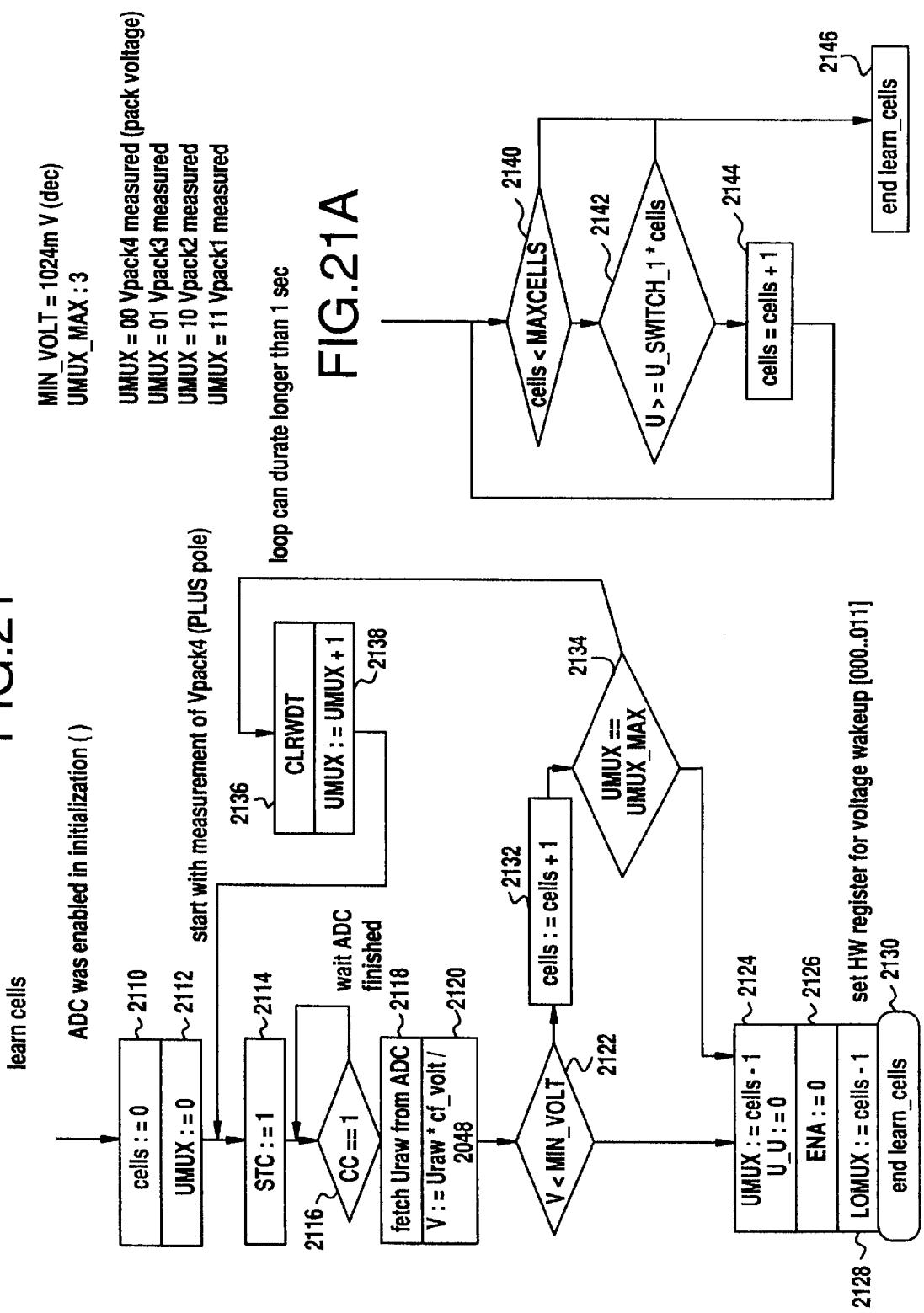

FIG. 21, learn_cells, is a routine to determine the number of cells connected in the battery pack. Generally, this routine initializes the number of cells for the battery at zero, and then compares the measured voltage at each multiplexer state (starting with 00) with a reference voltage, if the measured voltage is less than the reference voltage, it increments the assumed number of cells and the multiplexer state until the measured voltage is less than the reference voltage. The first step 2110 initializes the variable cells, which reflects the number of cells in the pack, to 0. The next step 2112 initializes the variable UMUX, which reflects the state of the input to the multiplexer, to zero (see the column in the upper right corner of FIG. 21). The next step 2114 sets the bit STC to 1, which starts the ADC converter. The next decisional block 2116 determines when the flag or bit CC, which reflects the completion of the A/D conversion, and when the ADC converter is finished that flag is set equal to 1.

In step 2118 the output voltage from the ADC converter is obtained and stored in memory as a variable designated Uraw. In step 2120 Uraw is obtained and converted to units of millivolts and stored as a variable V. Decisional step 2122 determines if the voltage V is less than a value MIN_VOLT, which is 1000 millivolts. If that condition is true, the processor proceeds to step 2124 and UMUX, which reflects the state of the multiplexer, is set to the number of cells −1, and the variable U_U is initialized to 0 to be used later in the program. In step 2126 the bit ENA is set equal to 0 which turns the A/D converter off. In step 2128 the variable LOMUX is set to the number of cells −1. Step 2130 exits the learn_cell routine and returns to the main program. In step 2122 if the condition is not true (if the voltage V is greater than 1000 millivolts) then the value of the number of cells in the pack is incremented by one in step 2132.

The variable UMUX reflects the state of the cell voltage multiplexer, as indicated in the upper right corner of FIG. 21, and UMUX MAX is the maximum state that the multiplexer can be in. In decisional step 2134, the state of the multiplexer UMUX is compared with UMUX_MAX, the maximum value(11) of UMUX. If UMUX is equal to the maximum value, the processor proceeds to step 2124 as explained hereinabove. If the condition in decisional block 2134 is false, the processor proceeds to step 2136 to execute a command CLRWDT standing for Clear Watch Dog Timer. This command allows the duration of the loop operation to be longer than the one second duration of the watch dog timer. In step 2138 the state of the multiplexer UMUX is incremented by one, and the processor proceeds to the beginning of step 2114 as explained above.

FIG. 21*a*, learn_cells, is a routine to determine the number of cells connected in a NiMH battery pack. Generally, in this cell learning routine when the maximum voltage conceivable for any string of cells is exceeded, it assumes that the string must be at least one cell more. The routine counts up incrementally in this fashion until the voltage is reasonable for the presently assumed number of cells in the string. It requires charging a battery pack to near full capacity to learn the correct number of cells. The initialization routine initializes the number of cells for the battery at 4, and then the learn_cells routine compares the measured voltage with a reference voltage (U_SWITCH_1 (a constant of 1650 mV) times the member of cells). If the measured voltage is greater than the reference voltage, it increments the assumed number of cells until the measured voltage is less than the reference voltage. The first step 2140 determines if the number of cells is less than MAXCELLS (a constant 10), and if so at step 2142 determines if the measured voltage U is greater than U_SWITCH_1 times cells, and if so at step 2144 increments the number of cells. The routine then returns to step 2140 and proceeds therethrough again until either of the conditions of steps 2140 or 2142 is false, and then exits the routine at 2142.

Figure 22:
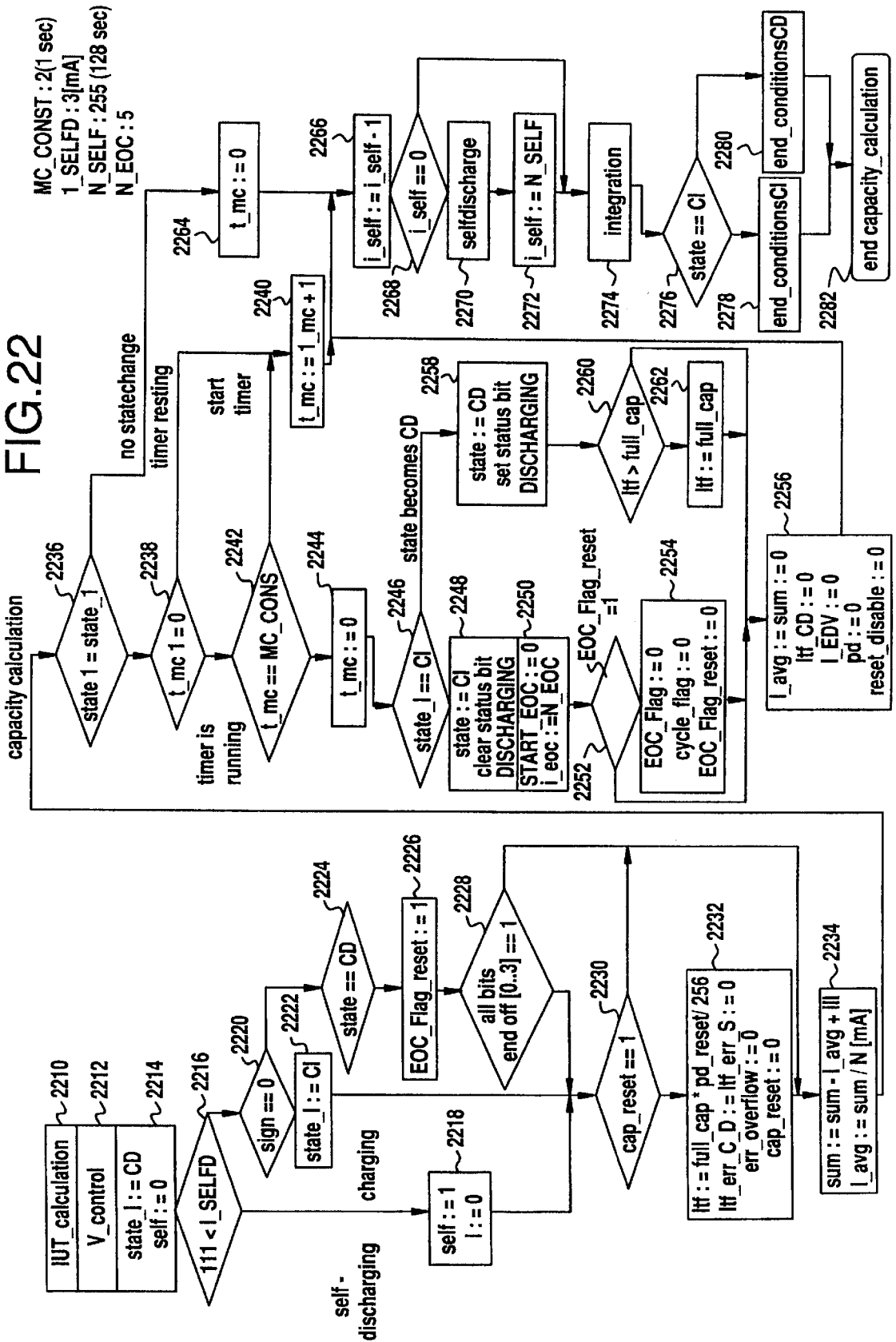

FIG. 22, capacity_calculation, shows the capacity calculation routine which monitors continuously the capacity of the rechargeable battery, preferably in accordance with the following equation:

$$CAP_{rem} := CAP_{rem} + \Sigma \epsilon_c I_c \Delta t_c - \Sigma I_d \Delta t_d - \Sigma I_s \Delta t_s$$

In this equation, $CAP_{rem}$, also referred to as ITF is the remaining capacity of the battery at any given time, expressed in milliampere hours (mah). The terms $\Sigma \epsilon_c I_c \Delta t_c$, $\Sigma I_d \Delta t_d$ and $\Sigma I_s \Delta t_s$ which are discussed in greater detail below, represent, respectively, the sum of the incremental increases in capacity as the battery is being charged, the sum of the continuous decreases in battery capacity during charging due to measurable current drain, and the sum of predicted decreases in battery capacity due to self discharge. By knowing the remaining battery capacity at all times, the processor is able to provide a host device and a battery charger with important information to help ensure safe and reliable use of the battery and to help prolong battery life.

The first step in the capacity calculation routine at 2210 is to invoke the IUT_calculation routine to calculate the present battery current, voltage and temperature. This latter routine is discussed in greater detail below. Generally, though, this routine converts the raw data values obtained from the analog-to-digital converter and representing battery current, voltage and temperature to data values that can be used in the capacity calculation routine.

Next, the processor at step 2212 invokes a routine, referred to as the V_control routine, also discussed in detail below. After the V_control routine is completed, the processor returns to the capacity calculation routine. At step 2214 thereof, the processor sets a first variable state_I to a value, represented by CD, which indicates that the battery is in a capacity decreasing mode. Also, a second variable, self, is set equal to 0.

At step 2216, the processor then determines whether the absolute value of the present battery current I is below a threshold value, represented as I_SELFD. If the absolute value of the current is below I_SELFD, I self discharge, the battery current is considered zero, and the processor only calculates loss in capacity due to self discharge. Preferably, the processor also calculates loss in capacity due to power consumed by the host device; but this latter calculation is based, not on the measured battery current, but instead on data supplied by that host device. For current drain rates below a ±3 ma detection range, the host (frequently a computer) can indicate to the battery that it is being discharged even when the battery cannot measure the discharge. The host does this by setting a bit indicating to the battery to decrement its state of charge by x (1 ma hour).

More specifically, at step 2218, the processor resets self equal to 1, and sets the present value for current, I, to 0. If at 2216 the battery is not being charged or drained greater than 3 mA, then at the step 2220, the processor determines whether the bit sign is set to 0 to determine whether the battery is charging or discharging. If sign is equal to 0, which indicates that the battery is charging, then at step 2222 the variable state_I is set to a value, referred to CI, to indicate that the battery is charging. If sign is not equal to 0, which indicates the battery is discharging, then at step 2224 the processor determines if the variable state is equal to CD. If so, then at step 2226 the variable EOC_Flag_reset is set to 1, and at step 2228, the processor determines if all of the bits (0, 1, 2, 3) of eod_off [0.3] are equal to 1. If, at step 2224, state is not equal to CD, then the processor skips step 2226 and proceeds directly to step 2228.

The program proceeds from either of steps 2218, 2222, or 2228 (statement true) to step 2230 wherein the program determines whether a variable referred to as cap_reset is equal to one. If cap_reset is equal to one, the processor, at step 2232, calculates a new value for Itf and sets a number of variables to 0. In particular, the processor calculates Itf according to the equation:

$$Itf = full\_cap \times pd\_reset / 256$$

Where full_cap is the present value for estimated full battery capacity, pd_reset is a variable obtained from a look-up table and 256 is a scaling factor. Also, the variable ItF_err_C_D, Itf_err_S, err_overflow and cap_reset are all set or reset to 0.

The processor then proceeds to step 2234 where sum and I_avg are recalculated according to the equation:

$$sum = sum - I\_avg + |t|,$$

$$I\_avg = sum/N[mA]$$

where N is a predetermined number.

If, at step 2228 and 2230 the statement is false, the processor proceeds directly to step 2234. In the next step 2236 the routine tests to determine if a state change has occurred. At step 2236, the processor determines that state is not equal to state _I. If these two values are not equal, a state change may have occurred. A state change will be considered to have occurred if state is not equal to state_I for a predetermined number, such as three, operations of the capacity calculation routine. If the condition of step 2236 is false, indicating no state change, the program proceeds to step 2264 at which a timer t_mc is set to 0.

If state is not equal to state_I at step 2236, then the processor, at step 2238, determines whether a timer t_mc is not equal to 0. If this condition is false (that is, the timer itself is resting or equal to 0), the processor, at step 2240, then increases the value of t_mc by 1. However, if, at step 2238, timer t_mc is not equal to 0, indicating the timer is running, then the processor goes to step 2242 and compares the value of this timer to a predetermined constant MC_CONST. If these two values are equal (which will be the case after state is equal to state_I, at step 2236, for the predetermined number of consecutive operations of the routine) the processor resets t_mc to 0 at step 2244.

The processor then determines at step 2246 if state_I is equal to CI. If this is the case, state is set equal to CI and the status bit DISCHARGING is cleared, and at step 2250 the variable START_EOC is set equal to 0 and the variable i_eoc is set equal to N_EOC. At the next step 2252, the processor tests to determine if the EOC_Flag_reset variable is equal to 1. If this variable is set equal to 1, the processor, at step 2254, sets or resets the variables EOC_Flag, cycle_flag, and EOC_Flag_reset to 0. Then, at step 2256, the processor sets or resets I_avg, sum, Itf_CD, I_EDV, pd, and reset _disable to 0. If, at step 2252, EOC_Flag_reset is not equal to one, then the program skips step 2254 and proceeds directly to step 2256.

Also, if at step 2246, state_I is not equal to CI—which indicates that the battery is in a discharging state—then the program proceeds to step 2258 at which the variable state is set equal to CD, and the status bit DISCHARGING is set. From step 2258, the program proceeds to step 2260, where the processor determines whether Itf is greater than full_cap. If ItF is greater than full_cap, the processor then resets Itf to be equal to full_cap, and then moves to step 2256. If, however, at step 2260, Itf is not greater than full_cap, the processor skips step 2262 and proceeds directly to step 2256.

After proceeding through the steps described above to determine if a state change has occurred, the processor then proceeds through a series of steps to determine whether the present value for the self discharge current should be updated and, and, if so updates that value. More specifically from each of steps 2237, 2240 and 2256, the processor proceeds to step 2266, where the variable i_self is decreased by one; and then, at step 2268, the processor tests to determine if i_self has reached 0. If i_self has reached 0, the self discharging routine 2270, discussed in detail below, is invoked; and after this routine is completed, I_self is reset to a predetermined number, represented by N_self. At step 2274, the processor performs an integration routine also discussed below. If, at step 2268, I_self has not reached 0, then the processor skips steps 2270 and 2272 and proceeds to step 2274, where the integration routine is invoked. Thus, with the above-described procedure, the self discharge routine is invoked once for every predetermined number of operations of the routine, with that predetermined number being determined by N_SELF.

After the integration routine is completed at step 2274, the processor invokes either a first routine to test for the end of charging conditions or a second routine to test for the end of discharging conditions, depending on whether the battery is charging or discharging. In particular, from step 2274, the program goes to step 2276, which is to determine whether the variable state equals CI. If state equals CI, which indicates that the battery is charging, then the processor invokes the routine as step 2278 to test for the end of charging conditions; and if state does not equal CI, which indicates that the battery is discharging, then the processor invokes the routine at step 2280 to test for the end of discharging conditions. Both of these routines are discussed below, and when the invoked routine is completed the capacity calculation routine is ended at 2282.

Figure 23:
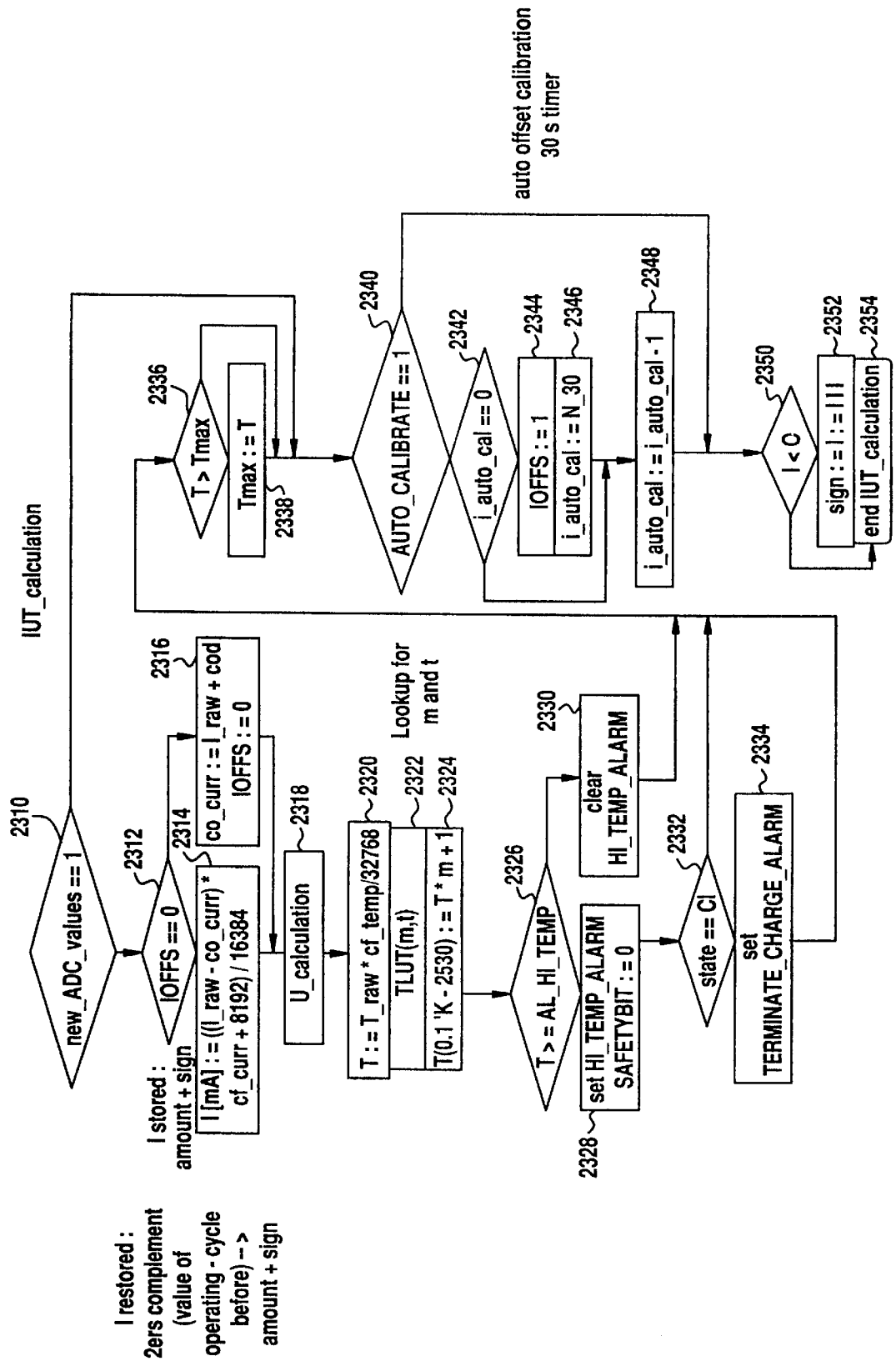

FIG. 23, IUT_calculation, converts the output of the A/D converter into correct units for current in milliamps, voltage in millivolts and temperature in degree C. This routine also determines whether the temperature alarm should be set or cleared, and whether a terminate charge alarm should be set based upon a high temperature condition. This routine also provides the auto offset calibration procedure for the current offset. The auto offset current calibration is carried out under control of the program every 30 seconds, and recalibrates an offset current which compensates for drifts due to temperature, voltage, aging, etc. This calibration procedure is also explained with reference to switch 63 in FIG. 4.

As background, the system operates in one of three (3) modes, first a run mode, second a sample mode, and third an off mode. In the run mode the ADC converter makes a conversion every 500 milliseconds. In the sample mode the ADC converter makes a conversion once every 3 minutes. However, the microprocessor still operates in a 500 millisecond cycle using the last available A/D conversion. In the off mode the microprocessor is not operating.

Decisional step 2310 determines whether a bit flag new_ADC_values is set to 1, which indicates that the A/D converter has completed a conversion and contains new values. The decisional block 2310 ensures that the ADC converter is not reconverting values that have been converted already. This decisional block 2310 is used only in the sample mode because in the run mode the condition is always true. The second decisional block 2312 determines if the bit IOFFS is set to 0, which is a determination as to whether the auto offset calibration procedure should proceed or not. This procedure occurs every 30 seconds.

When an auto offset calibration is not being performed, which is a normal condition, the processor proceeds to block 2314 in which the ADC output for current (I_raw) is converted into units of milliamps and stored as variable I. The values co_curr and cf_curr used in the calculation are stored in the manufacturers data area. When the condition in block 2312 is false, the processor proceeds to block 2316 in which I_raw is not converted into units of milliamps, but the value co_curr is updated in the manufacturers data, and the auto offset calibration is disabled by setting IOFFS equal to 0. Preferably, the auto-offset correction function performs a function, referred to as auto-zeroing, every thirty seconds when operating normally, and this function may be performed faster when the battery pack is being calibrated at time of manufacture. This auto-zeroing function checks the current offset value and compensates for any drift or other change in the current offset value stored in the manufacturer's data RAM area. This is done by disconnecting the actual current measurement signals within the ASIC and connecting the two input lines together, effectively shorting, or zeroing, the input signal. This shorted current input signal is then measured, and the result is the new current offset value, which is then used in future current measurements, until this offset correction procedure is repeated.

This process generally works very well. It may be noted, though, that the above-mentioned shorted current input signal is usually not actually zero. Due to various process related conditions within the ASIC, this shorted measurement normally has some offset of its own. Therefore, preferably, another value, Current Offset Default or COD, is added to the measured, shorted current value prior to calculating the current offset value. This COD value is preferably measured at the time of pack calibration and is stored in the manufacturer's data area RAM. This pre-correction COD value is actually the value of the zero that will be used in the Auto-Offset Correction procedure previously described.

The use of this Current Offset Default Value increases the versatility of the battery pack design, since that pack can now compensate both for constant internal errors, such as the zero offset, and for non-constant external errors, such as temperature and voltage variations. Block 2318 is the U_calculation subroutine in which the raw voltage is converted to millivolts. Block 2320 converts T_raw, which is the output from the A/D converter, to value T which is a voltage representation of the temperature. In block 2322, values of m and t are obtained from a lookup table TLUT to obtain interpolation factors for temperature.

In block 2324 T is converted into units of tenths of a degree Kelvin by using the lookup table values. In block 2326 the value of temperature T is compared with AL_HI_TEMP, the alarm limit high temperature. In the event T is higher than the alarm limit high temperature the processor proceeds to block 2328 wherein the high temperature alarm safety bit is set to 0. If the temperature is lower than the alarm temperature limit, the processor proceeds to block 2330 wherein the high temperature alarm safety bit is cleared. After step 2328, the processor proceeds to block 2332 to determine if the statement capacity increasing (CI) is true. If true, the processor proceeds to block 2334 wherein the bit flag TERMINATE CHARGE ALARM is set. If false, the processor proceeds to block 2336.

Blocks 2336 and 2338 are a routine which determine if the value T is greater than a variable Tmax, and if so Tmax is set equal to T. If T is greater than any previous Tmax, this routine continuously records the maximum temperature.

Blocks 2340 through 2348 are a timer for an auto offset calibration procedure. Block 2340 tests that the AUTO_CALIBRATE bit flag is set to 1, which enables the auto offset calibration routine. The AUTO_CALIBRATE bit is set in the manufacturers data area. If set, the processor proceeds to block 2342 which is a decision statement on a timer loop when the condition i_auto_cal equals 0. If so, the processor proceeds to block 2344 where IOFFS is set to 1 and then to the auto offset calibration in block 2346 in which the i_auto_cal function or variable is reset to the maximum timer value of 30 seconds. In block 2348 I_auto_cal is decremented by one. This timing cycle effectively enables the auto offset calibration procedure once every 30 seconds. In block 2340 if the AUTO_CALIBRATE bit has not been set in the manufacturers data this procedure is bypassed and the processor proceeds to block 2350.

The value of the current, I, can be positive or negative and in block 2350 I is tested to determine if it is negative. If the value of the current, I, is negative, then in block, 2352 that value is divided into a variable bit sign, which if 1 represents a negative current, and an absolute value of I. Block 2354 ends the IUT_calculation routine.

Figure 24:
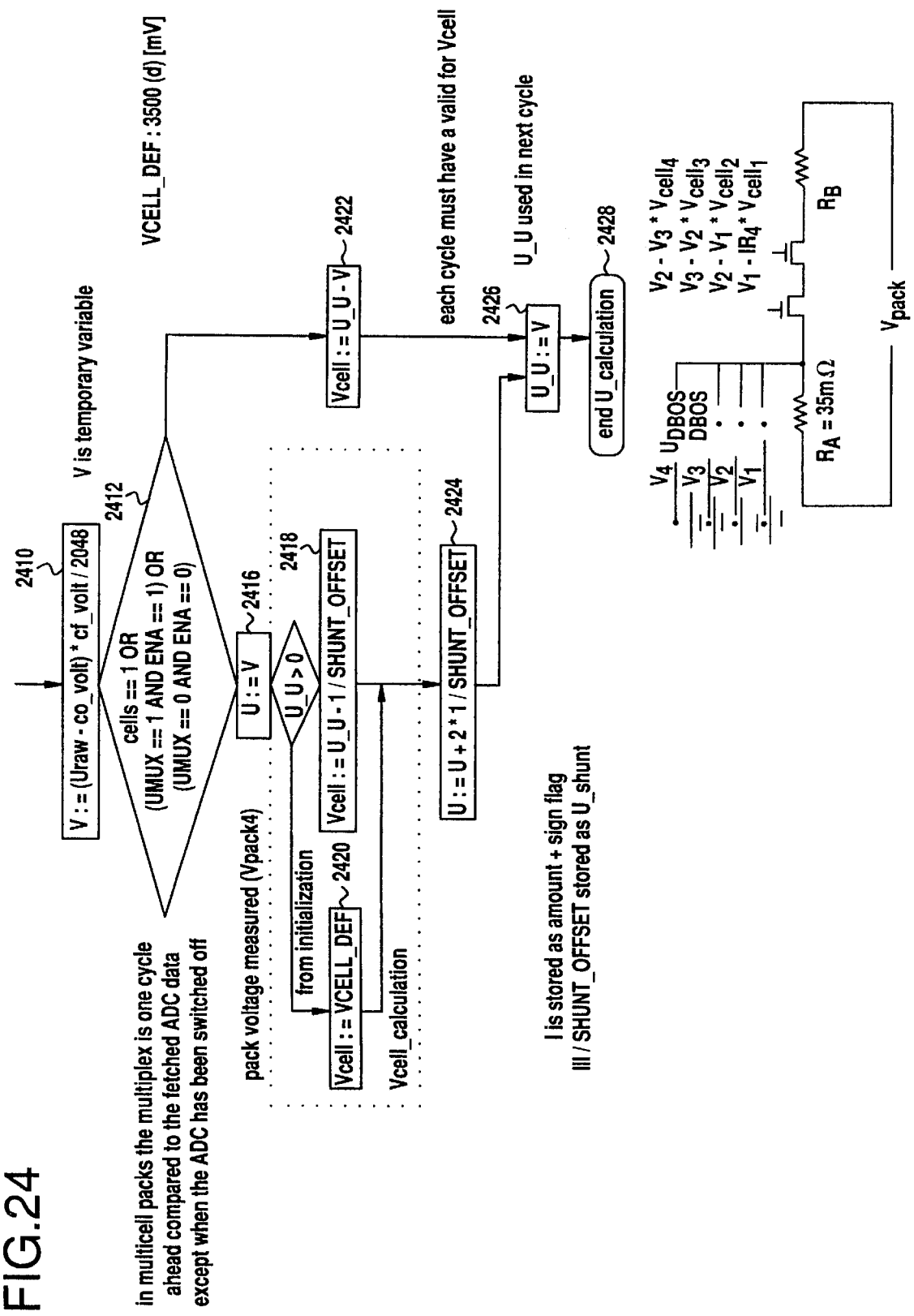

As background for FIG. 24, in every 500 millisecond cycle, there is only one voltage conversion, one current conversion, and one temperature conversion. After each cycle is completed the multiplexer is incremented to convert the next voltage for the next cycle so it takes n cycles to record all of the voltages for n cells.

FIG. 24, U_calculation, converts the value U raw which is the voltage output of the A to D converter into units of millivolts, and then determines the individual cell voltages using the present voltage measurement V and the previous voltage measurement U_U. This is represented by the diagram FIG. 24a at the bottom of FIG. 24. In block 2410 the value Uraw from the ADC converter is converted into units of millivolts and stored as the value V. The variables co_volt and cf_volt are obtained from the manufacturers data area. In multicell packs the multiplexer is one cycle ahead of the ADC raw data. In view thereof, in block 2412, the statement is true if the variable cells is set to 1, or both of the variables UMUX and ENA are set to 1, or both of the variables UMUX and ENA are set to 0. Block 2412 presents a test consideration wherein the processor looks for the number of cells in the pack to be one, or the state of the multiplexer is one and A/D converter ENA is enabled or the state of the multiplexer is 0 and the A/D is not enabled. If any of these conditions are true the value of U is set equal to V at step 2414.

At step 2416, if the value of U_U, which is the voltage from the previous conversion cycle, is greater than 0 the program proceeds to block 2418 where the cell voltage is calculated, and the value V cell is set to the value U_U minus the current I divided by the SHUNT_OFFSET, which is a resistance that is stored in the manufacturers data. The value I divided by SHUNT_OFFSET accounts for the voltage across the shunt resistor. If U_U greater than 0 is not true in block 2416, the processor proceeds to block 2420 where the value V_cell is set to V_CELL DEF, the default value thereof. From blocks 2420 and 2418 the program proceeds to 2424 wherein the value U is assigned the indicated value to account for the voltage across the shunt resistor, and then proceeds to block 2426. Returning to block 2412, if the condition is false the program proceeds to block 2422 wherein V_cell is set to U_U, which is the voltage from the previous cycle, −V the voltage from the present cycle. In block 2426 U_U is set to the value V which is the present voltage and assigned the previous voltage in the next cycle. Block 2428 exits the subroutine.

Figure 25:
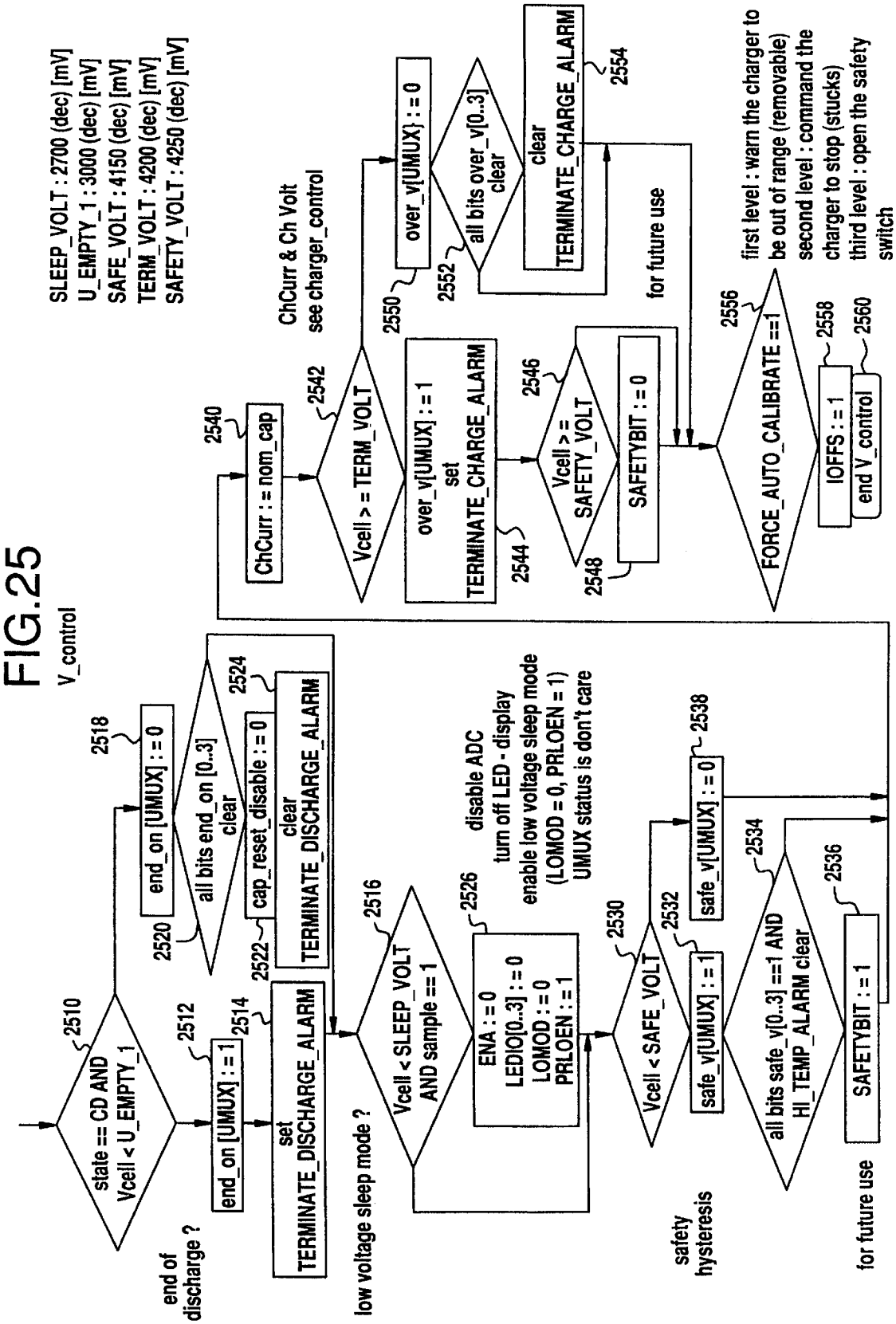

As background for FIG. 25, the routine V_control makes all of the logic decisions based upon voltage levels. For instance determining when the end of discharge is, when to enter a low voltage sleep mode, when to charge, and when to start charging. In a lithium ion battery the voltage of each cell of the string of cells must be monitored. In a typical lithium ion battery having nine (9) cells, three (3) cells in a block are connected in parallel, and then the three blocks of cells are connected in series. It is necessary to monitor the voltage of each block of three parallel cells. Since the three cells are connected in parallel, Vcell can be the voltage of a block of cells or of only one cell, and the particular block of cells or cell is incremented by the U_calculation routine (explain), such that the V_control routine of FIG. 25 is incremented to look at each cell individually under the direction and control of the U_calculation routine.

As further background for FIG. 25 and also the other remaining routines, the term [UMUX] as illustrated for example blocks 2512 and 2532 means that the word therein has multiple bits (typically 4), with each bit representing one cell, and that one bit of the word is being set to 0 or 1, all under control of the multiplexer, such that the routine is performed for one cell or bit, and then the multiplexer is incremented to perform the routine for the next cell or bit, etc.

The upper right hand corner of FIG. 25 lists five values which are referred to throughout the description of this logic flow diagram. In block 2510 the processor looks for the battery to be discharging (state to be equal to CD) and for the value of Vcell to be less than U_EMPTY_1. These conditions indicate that the battery is fully discharged. In block 2512 the variable eod_on is set equal to 1. Variable eod_on is a 4 bit word wherein each bit designates one particular cell and having values of 0, 1, 2, and 3, such that changing the value of eod_on allows this routine to sequentially look at each cell or block of cells (during a first cycle the value of eod_on is set equal to 0, during the second cycle it is set equal to 1, and etc.) Block 2514 then sets the TERMINATE_DISCHARGE_ALARM.

If any cell of the battery reaches the condition Uempty as indicated in block 2510, then at lock 2512 a bit in the four bit word eod_on is set or that cell indicating that cell has reached that condition, and the TERMINATE_DISCHARGE_ALARM is then set in block 2514. The routine will continue in this manner until the condition in block 2510 is not true. When the condition for a particular cell is not true in block 2510, then the bit for that cell is cleared in block 2518. In block 2520 the processor looks for the condition when all of the bits in eod_on are clear, which means that block 2510 is not true for any cell in the pack. At that time, in block 2522 the cap_reset_disable bit is set to 0. Then in block 2524 the TERMINATE_DISCHARGE_ALARM is cleared, and the processor proceeds to block 2516.

In block 2516 the processor is looking for Vcell to be less than the sleep voltage and for the sample bit to be equal to 1. If the conditions of block 2516 are true, the processor in step 2526 sets the variables as stated which places the system into a low voltage sleep mode. It does this by turning the power off to the ADC converter (ENA=0), turning the LED input/output drivers off (LEDI0=0), enabling the low power sleep mode (LOMOD=0), and enabling a hardware wake-up circuit (PRLOEN=1). If the statement in block 2516 is false, block 2526 is bypassed to block 2530. As background, the low voltage sleep mode is entered by software as indicated by the routine in FIG. 25, but the low voltage sleep mode is exited by the hardware wake-up circuit.

In block 2530 the processor is looking for Vcell to be less than a SAFE_VOLT limit. Blocks 2530–2538 represent a safety hysteresis routine which may be implemented in future versions. If the condition of block 2530 is true, in step 2532 the bit safe_v is set for that cell, and may be set for any one of the four cells. In block 2534 the processor is looking for the condition that all (0, 1, 2, 3) of the safe_v bits are high, and that the high temperature alarm is cleared. If the conditions of blocks 2534 are true, in block 2536 the safety bit is set high. If the condition of block 2530 is false, then in block 2538 the safe_v bit is set equal to 0. As explained above in reference to [UMUX], the variable safe_v is a four bit word and the bit for the particular cell being examined is set.

Block 2540 sets the charging current equal to the nominal capacity. In block 2542 the processor determines if Vcell is greater than the term voltage, which is the voltage at which the terminate charge alarm is set. The terminate charge alarm is set for two reasons, first that the cell is fully charged and secondly when Vcell is greater than the value of the term voltage. THE TERMINATE_CHARGE_ALARM is set because charging at voltages above the term volt is unsafe. If the condition of block 2542 is true, then in block 2544 one bit (corresponding to the cell being examined) of the word over_v is set to 1, and the terminate charge alarm is set. The routine then proceeds to block 2546 in which the processor determines if Vcell is greater than safety_VOLT, and if this condition is true the safety bit is set equal to 0 in block 2548.

If the condition of block 2542 is false, then in block 2550 the appropriate bit in the word over_v is set equal to 0. Block 2552 then looks to determine that all of the bits of the over_v word are clear, and if so, in block 2554 the terminate charge alarm is cleared. If the condition of block 2552 is false, block 2554 is bypassed and the routine proceeds to block 2556 which is in this routine basically for the auto calibration function. FORCE_AUTO_CALIBRATE is normally set to 0. However, during calibration the condition of block 2556 is true, in which case in block 2558 IOFFS is set equal to 1, and then in block 2560 the V_control routine is exited.

Figure 13A:
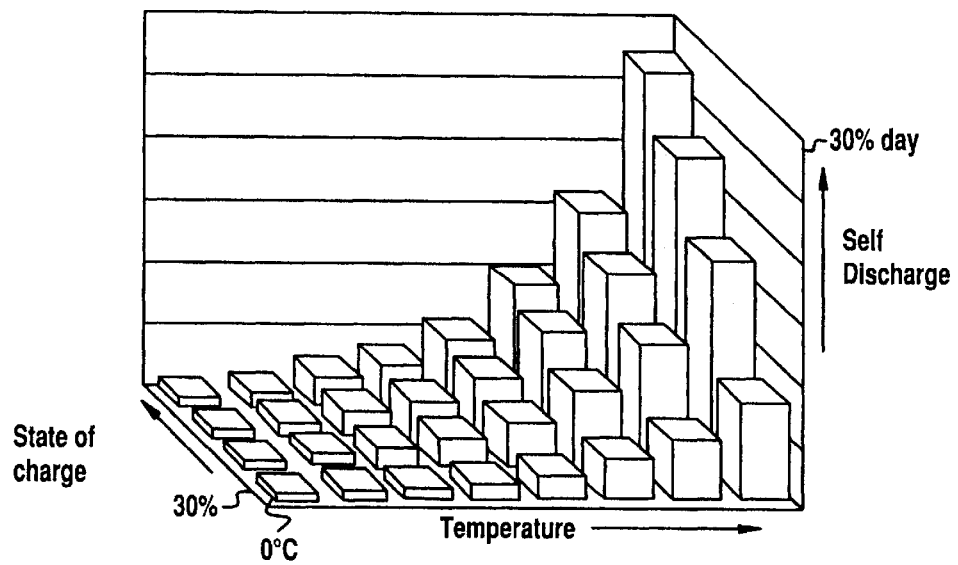
FIG. 13a is a three-dimensional graphic representation of look up tables that depict the amount of self-discharge current (vertical axis) as a function of relative battery state of charge and temperature for a NiMH battery, and similar look up tables for a LiIon battery are shown in FIG. 13b.
Figure 13B:
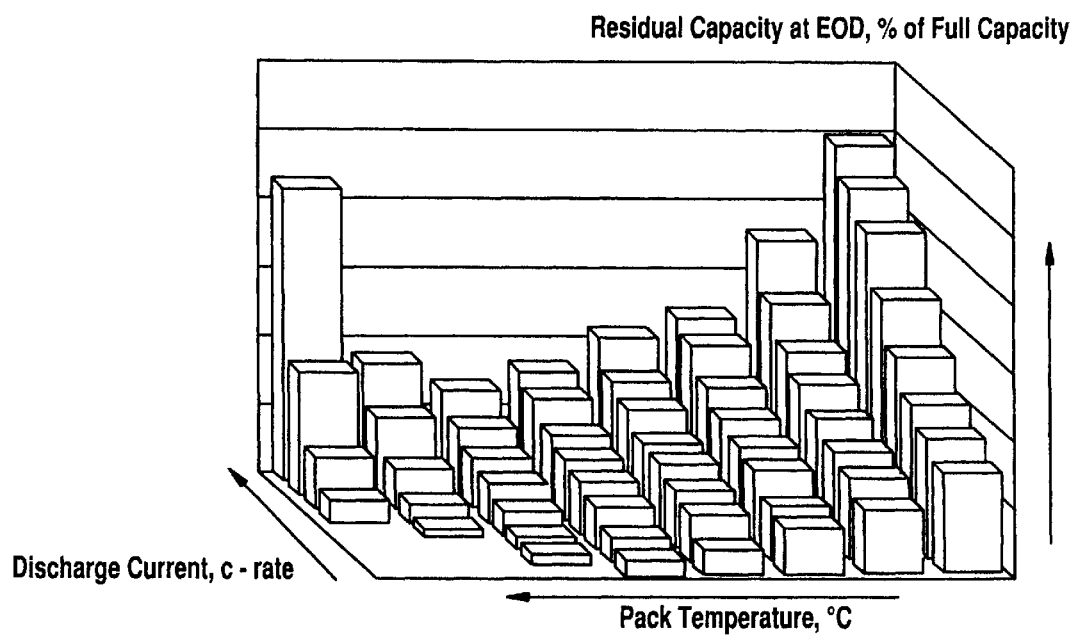
Figure 26:
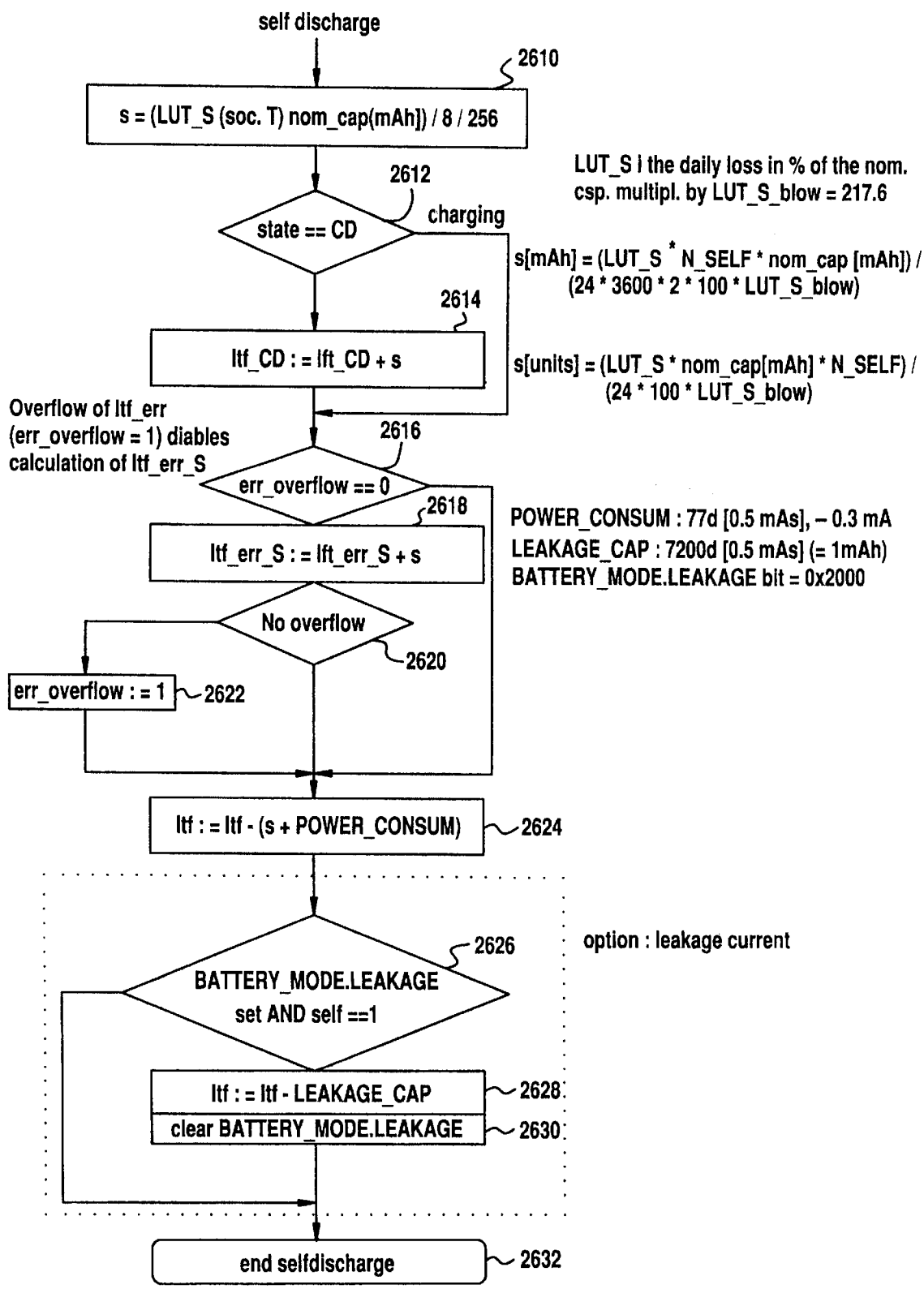

FIG. 26, self discharge, outlines the routine used to calculate the decrease in battery capacity due to self discharge. The first step 2610 in this routine is to determine a value for a variable s that represents a nominal capacity loss. This value is determined by multiplying two values. The first of these two values is obtained from a look-up table on the basis of battery state of charge and battery temperature, FIG. 13, and represents a nominal percentage loss of capacity; and the second of these two values represents the nominal capacity of the battery, as expressed in terms or units suitable for the processor.

After s is calculated, the processor tests at 2612 to determine if the battery is discharging; and, specifically, the battery tests to determine if state equals CD. If the battery is discharging, then Itf_CD is increased by the value of s at step 2614. From step 2614, or from step 2612 if the battery state is not discharging, the processor goes to step 2616 to determine if err_overflow equals 0, which means that the error overflow bit is clear. If this bit is clear—that is, equal to 0, then at step 2618 the S component of the error value, Itf_err_S is increased by s. At the next step 2620, if there is an overflow condition, the routine continues at step 2622 to set the error overflow bit to 1.

From step 2620, or from steps 2622 or 2616 if the error overflow bit is set, the processor proceeds to step 2624, where the capacity Itf is decreased by the sum of s and the present value for the variable POWER_CONSUM. After step 2624, the processor at step 2626 determines if the BATTERY_MODE. LEAKAGE bit is set, and if the variable self is equal to one. If both of these conditions are true, then the capacity value is further adjusted at step 2628, and in particular, is decreased by the value of LEAKAGE_CAP. Then, at step 2630 the BATTERY_MODE. LEAKAGE flag is cleared, and the program ends at step 2632. If the statement at step 2626 is false, the program skips steps 2628 and 2630 and proceeds directly to the end at 2632.

Figure 27:
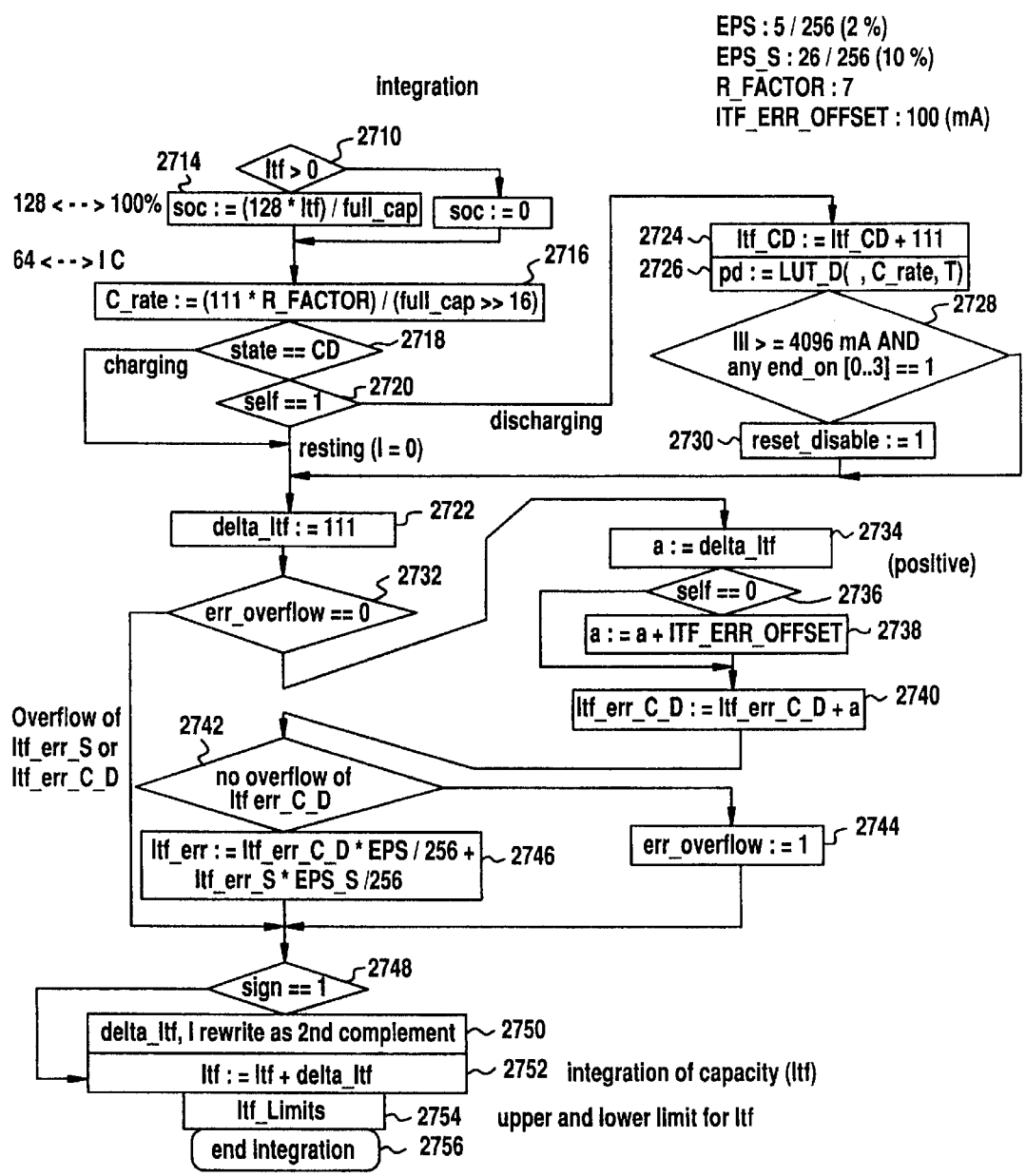

The integration routine is shown in FIG. 27. Generally, this routine is used to determine the change in the battery capacity from the measured current discharged by or conducted to the battery when the battery is, respectively, discharging or charging. This routine also takes into account other factors, such as the decrease in the battery capacity due to self discharging.

Figure 12A:
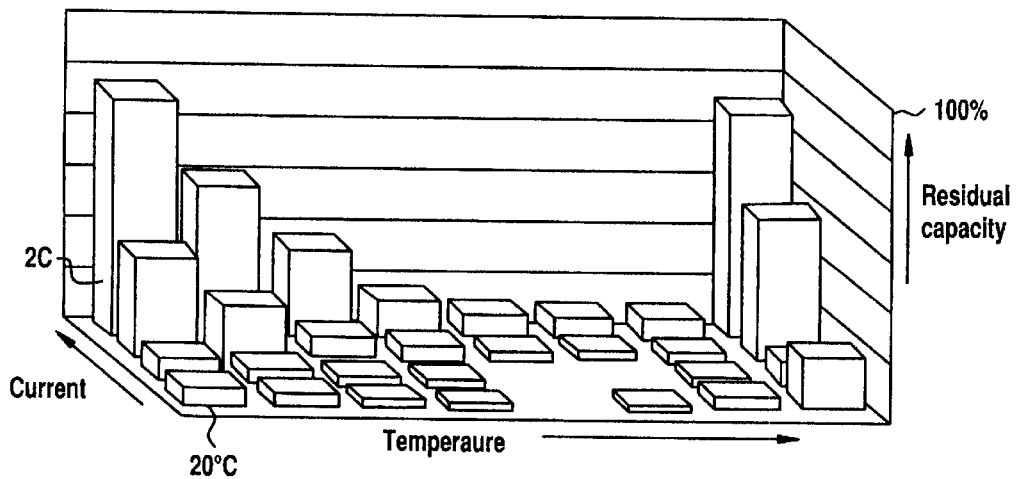
FIG. 12a is a three-dimensional graphic representation of look up tables (LUT) that depict predicted residual capacity values as a function of discharging current and temperature for a NiMH battery, and similar look up tables for a LiIon battery are shown in FIG. 12b.
Figure 12B:
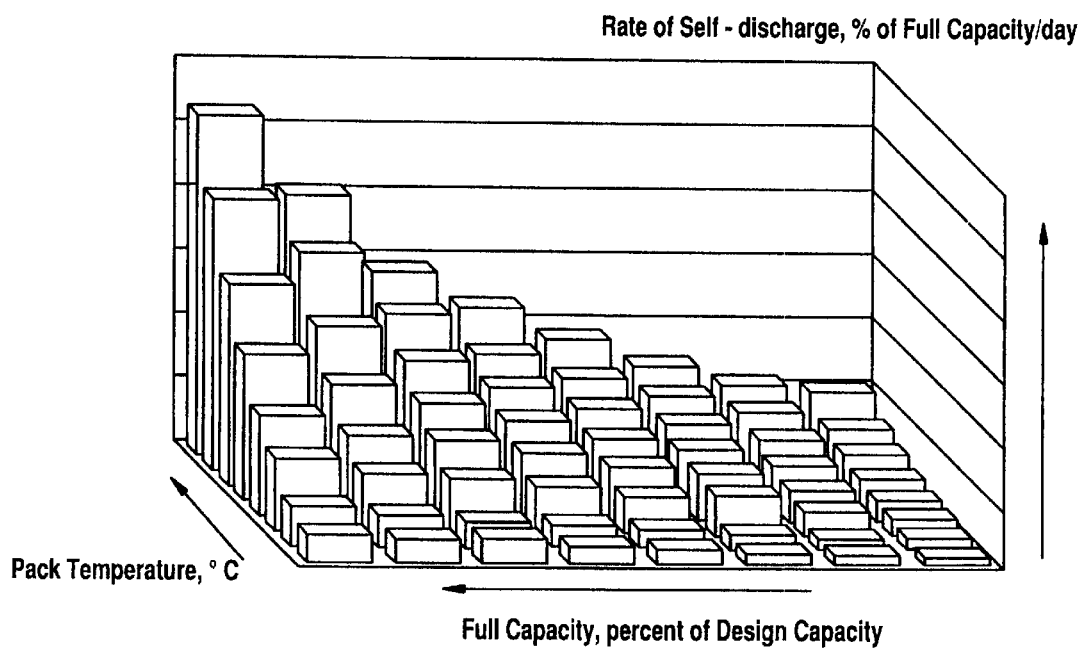

This routine uses data from two look-up tables. A first look-up table provides factors used to determine the self discharging rates (FIG. 13b); and these factors also are empirically determined and depend on the battery relative state of charge, and the battery temperature. A second look-up table (FIG. 12b) gives the residual capacity of the battery, as a fraction of full battery capacity, after the battery has reached an end of discharge condition. This residual capacity varies as a function of the battery temperature and the battery discharging current rate.

The first step in the integration routine is to determine at step 2710 whether the present value for remaining battery capacity is greater than 0. If the remaining battery capacity is less than 0, then at step 2712 the state of charge is set to 0. If the estimated remaining battery capacity is greater than 0, then the state of charge is calculated at step 2714 as a percentage of full capacity, in a scale such that a numeric value of 128 is the equivalent of 100%. At the next step 2716, the present C_rate is determined, and expressed on a scale such that a value of 64 is the equivalent of 1 C. The C_rate is defined as the rate at which it would take the battery to drain in one hour and is measured in units of reciprocal hours.

A determination is then made at step 2718 as to whether the battery is in a capacity increasing or a capacity decreasing state.

If at step 2718, it is determined that the battery capacity is decreasing, then the processor determines at step 2720 whether the self discharge flag is set or clear. If this flag is set—that is, equal to one—then the only capacity loss is due to internal battery discharging, and this value is calculated at step 2722 by setting delta_Itf equal to the absolute value for battery current. This delta_Itf term is the I Δts term in equation one.

If the self discharge flag is clear at step 2720, then the battery is discharging current to operate the host device, and the integration routine takes into account both the capacity loss due to self discharging and the capacity loss due to power used to operate the host device. Steps are performed to calculate the latter capacity loss. In particular, at step 2724, the present value for Itf_CD is increased by the absolute value of the battery current I, and then at step 2726 pd is obtained from look-up table (FIG. 13b), as a function of the C rate and the battery temperature.

Next, at step 2728 the processor determines, first, if |I| is greater than a preset value of 4096 mA, and second, if any end of discharge bit is set high. If both of these conditions are true, then the reset_disable flag is set to 1, and the program moves to step 2722. If, at step 2728, one of the tested conditions is not true, the program skips step 2730 and proceeds directly to step 2722. Likewise, if the condition of step 2718 is false, the program skips step 2720 and also proceeds directly to step 2722.

After delta_Itf is determined at step 2722, the processor checks to determine if the error overflow bit is set at step 2732. This bit is clear—that is, is set to 0—if both the self discharge error bit and the capacity decreasing error bit are clear. The error overflow bit is set, however, if either of these two error bits is set.

If the error overflow bit is clear at step 2732, the processor then sets a equal to the present value for delta_Itf, at step 2734. After this, the processor determines at step 2736 if the self discharge flag is clear. If this flag is clear, the value of a is increased at step 2738 by the value of ITF_ERR_OFFSET, and then at step 2740 the value of Itf, err_C_D is increased by this value of a. If, however, at step 2736, the self discharge flag is not set, the program skips step 2738 and then proceeds directly to step 2740.

From step 2740, the processor determines, at step 2742, whether there has been an overflow in the values for Itf_err_C_D. If there has been an overflow, then the error_overflow bit is set at step 2744. If there has not been an overflow, then Itf_err is set at step 2746 to the sum of two numbers. The first of these numbers is Itf_err_C_D, adjusted by a factor, EPS, a constant a shown in the upper right corner of FIG. 27, and divided by a scaling factor of 256. The second of these numbers is Itf_err_S, also adjusted by a factor, EPS_S, a constant as shown in the upper right corner of FIG. 25, and divided by a scaling factor of 256.

From steps 2744 or 2746, the program proceeds to step 2748. The program will also proceed to step 2748 from step 2732 if, at step 2732, the error overflow bit is set. At step 2748, the processor determines whether the battery current is positive or negative, as indicated by the condition of the sign flag. If this sign is set, or equal to one, which indicates the battery is discharging, then, at step 2750, the values for delta_Itf and I are rewritten as their respective 2's complement (a well known binary procedure). In effect, this converts delta_Itf and I to negative values. Then, at step 2752 Itf is increased by the value of delta_Itf. If the sign flag is clear, or equal to 0, at step 2748, then the program skips step 2750, and proceeds directly to step 2752.

After Itf is reset at step 2752, then an Itf_Limits routine discussed below, is invoked at step 2754 to determine whether this capacity value has reached upper lower limits. When this Itf_Limits routine is completed, the integration routine ended at 2756.

Figure 28:
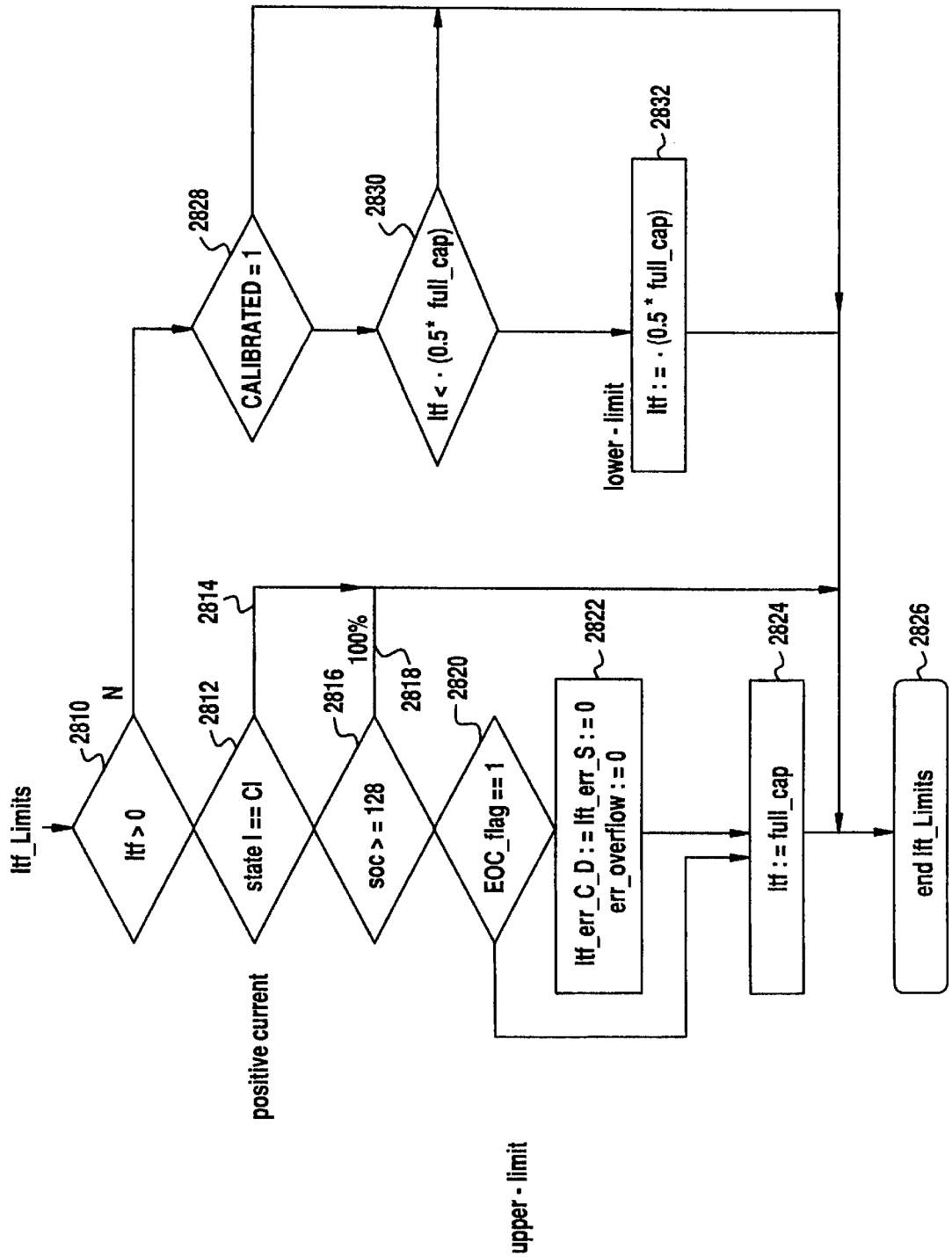

FIG. 28 shows the Itf_Limits routine. Generally, this routine is used to determine whether the calculated value for Itf has reached certain upper or lower limits, and, if so, how to respond. More specifically, at step 2810, the processor determines whether ItF is greater than 0. If ItF is greater than 0, then, the processor checks the state_I flag at 2812 to determine if the battery state is capacity increasing or capacity decreasing.

If the remaining battery capacity value is more than 0, and the battery state is capacity decreasing, then there is no need to determine whether that capacity value has reached its upper or lower limits, and the routine terminates via line 2814. If, however, the remaining battery capacity value is more than 0, but the battery state is capacity increasing, then the processor checks to determine if that capacity value should be reset. First, the processor checks the state of charge of the battery at step 2816. If that state of charge has a value less than 128 which corresponds to 100%, then there is no need to reset the remaining battery capacity value, and the routine terminates via line 2818. If the state of charge is equal to or greater than 128, the processor then checks the end of charge flag at 2820.

If the end of charge flag is set, then at step 2822 the error registers are reset to 0 and the error overflow bit is cleared. If, at step 2820, the end of charge flag is not set, or following step 2822, then the remaining battery capacity value is reset at step 2824 to the nominal full battery capacity, and the routine terminates at 2826.

The routine may, under certain circumstances, reset Itf to a lower limit. More specifically, if at step 2810, the remaining battery capacity value has, for some reason, become less than 0, then the program goes to step 2828 to determine if the calibration flag is set. If this flag is set and if at step 2830, the remaining battery capacity value is less negative than a given negative fraction, such as ½, of the nominal full capacity value as detected at step 2824, then the program, at step 2830, resets the remaining battery capacity value equal to that given negative fraction of the nominal full capacity value.

If the calibration flag is not set at step 2828 or if at step 2832, the remaining battery capacity value is greater than the given negative fraction, of the nominal full capacity value, then the remaining battery capacity value is not reset, and the Itf_limits routine ends.

Figure 29:
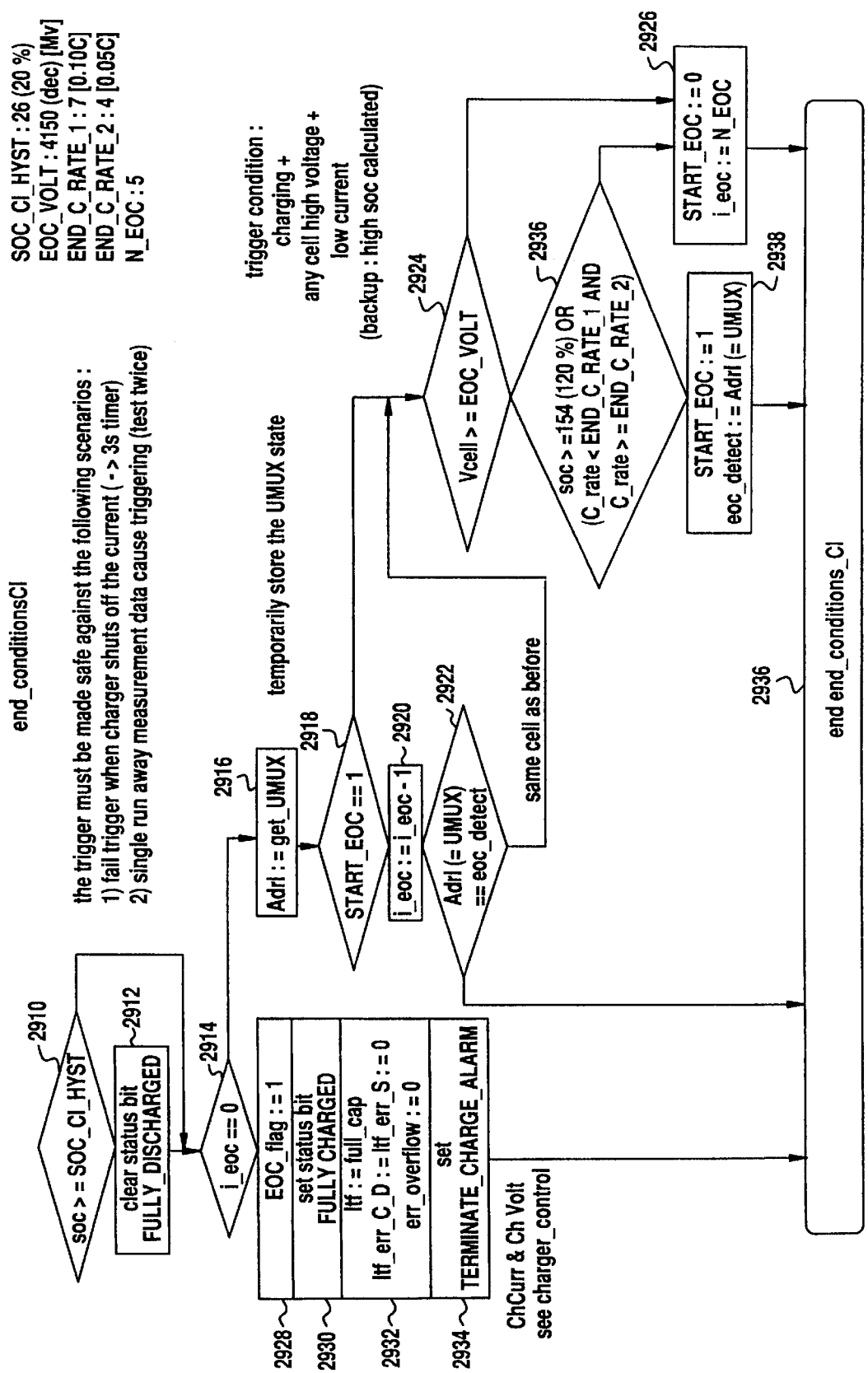

FIG. 29 illustrates the routine, referred to as the end_conditionsCI (capacity increasing) routine, to determine when the battery has reached a condition referred to as end of charging. As discussed above in connection with the capacity calculation routine shown in FIG. 22, this routine is invoked at step 2278 when the battery state capacity increasing. Generally, the battery is considered to have reached this condition when any one of three events occur: (1) during charging, the voltage of any one cell attains an end of charge voltage (as indicated in block 2924), (2) during charging, the charging current of the battery falls below a first given threshold value and is above a second given threshold value (block 2936), and (3) (not shown in FIG. 29) during charging, the average current and present value of current are equal within 50 milliamps. The end of charging routine is also used to set and clear various flags and bits.

With the preferred routine shown in FIG. 29, the processor, first, at step 2910, determines whether the battery state of charge is more than a given value, SOC_CI_HYST, such as 20% of the battery's nominal full charge capacity. If the state of charge is greater than this given value, the FULLY-DISCHARGED status bit is cleared at step 2912. From step 2910 (statement false), or from step 2912, the program then proceeds to block 2914 in which the processor is looking for the condition i_eoc to be equal to 0, which is not a typical condition. This is a timer value which only reaches 0 after the routine has cycled through itself a number of times (e.g. 5). If the condition is false, the processor proceeds through a sequence of tests to determine when end of charge occurs. In this routine the sequence to determine end of charge is performed twice to ensure that a single run away measurement does not cause the triggering. i_eco equals 0 in block 2914 is normally false, so the program normally proceeds down the right branch through blocks 2916–2926 and proceeds vertically down through blocks 2928–2934 only when the end of charge is reached. In block 2916 the multiplexer state is temporarily stored in address 1 to ensure that the end of charge conditions are being tested twice for the same cell. In block 2918 the processor is looking for START_ECO to equal 1. If true at step 2920, the value i_eoc is set to i_eoc −1, which decrements the timer count. Each time the multiplexer state is temporarily stored, so that if all of the end of charge conditions are true, then block 2922 determines whether the stored multiplexer state and the variable eoc_detect are the same to ensure that the same cell has been examined twice to ensure against a single run away measurement.

If the condition in block 2922 is true (same cell as before), the routine proceeds to block 2924, wherein the statement Vcell>=EOC_VOLT (constant in upper right corner) is checked. If false in block 2926, START_EOC is set equal to 0, and i_eoc is set to N_EOC, 5 to reset the counter to count down therefrom.

A typical charge condition which will exist on most operational cycles when the batteries are not fully charged is to proceed consecutively through blocks 2910, 2912, 2914, 2916, 2918, 2920, 2922, 2924, 2926 and then exit the routine.

If the statement in block 2914 is true, an end of charge condition is indicated by the clear i_eoc flag bit therein, and the program proceeds to block 2928, wherein the EOC_flag is set, to block 2930, where the status bit FULLY CHARGED is set, to block 2932 wherein Itf is set to full_cap, and (1) Itf_err_C_D, (2) Itf_err_S, and (3) err_overflow are all reset to 0. In step 2934, the TERMINATE_CHARGE_ALARM is set, and the routine is exited at 2936.

Returning to block 2922, if the statement therein is false, the routine is also exited at 2936.

Returning to block 2924, if Vc>=EOC_VOLT, a constant as indicated in the upper right corner, a fully charged battery is indicated, and the program proceeds to block 2936, wherein either the condition soc>=154 (120%), or the condition C_rate<END_C_RATE_1 and C_RATE>=END_C_RATE2 causes the program to proceed to step 2938, wherein START_EOC is set to 1, and eoc_detect is set to AdrI (=UMUX), and the routine is then exited. If the condition in step 2936 is false, the program proceeds to block 2924 and then exits the routine as discussed above.

Figure 30:
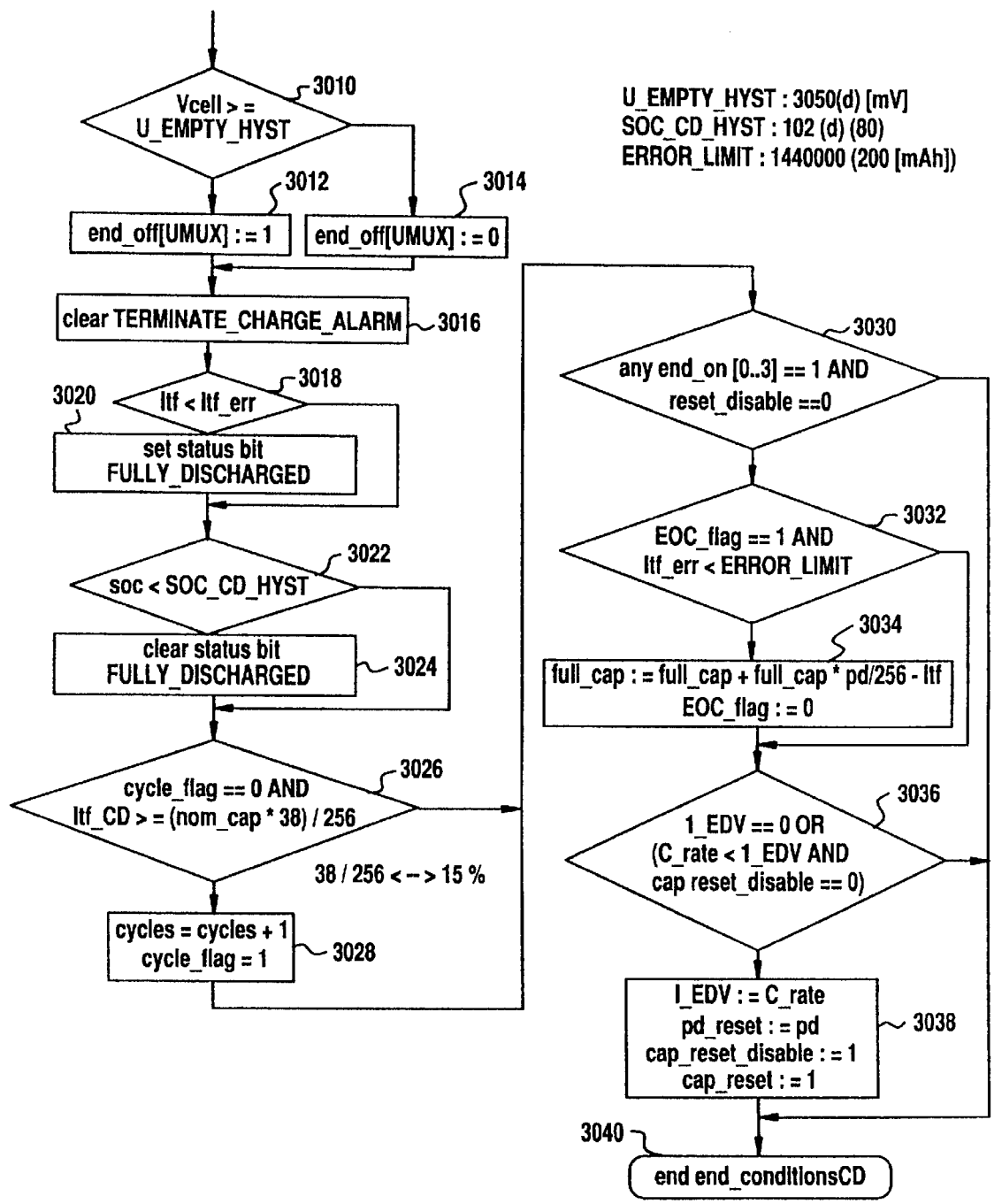

FIG. 30 shows the routine referred to as the end_conditionsCD routine, to determine when the battery has a condition referred to as end of discharging and to perform various functions at that time. As discussed above in connection with the capacity calculation routine shown in FIG. 22, this routine is invoked at step 2280 when the battery state is capacity decreasing. Accordingly, this routine is also used to perform certain functions appropriate when the battery is discharging.

The first step in this routine at 3010 is to determine if the battery voltage is greater than a threshold value, U_EMPTY_HYST. If the battery voltage is greater than this sum, then the end of discharge voltage eod_off [UMUX] variable is set equal to 1 at step 3012; while if the battery voltage is not greater than this sum, then eod_off [UMUX] variable is set equal to 0 at step 3014. In either case the program moves to step 3016, where the TERMINATE_ CHARGE_ALARM is cleared.

After step 3016, the processor determines if the remaining battery capacity value is less than the capacity uncertainty value at step 3018. If this is the case, the FULLY_ DISCHARGED status bit is set at step 3020. From step 3018 (condition false) or step 3020, the processor moves to step 3022, where the state of charge is compared to the state of charge, capacity decreasing hysteresis value. If the state of charge is less than this value, then the FULLY_CHARGED status bit is cleared at step 3024.

After steps 3022 (condition false) and 3024, the processor determines whether the cycle count should be increased. In particular, the processor proceeds to step 3026, where the processor determines whether the flag is clear and whether the present value of Itf_CD (which represents an accumulated value of incremental decreases in battery capacity) is greater than or equal to a given percentage, such as 15%, of nominal full capacity. If both of these conditions are true, the battery is considered to have completed a partial charge-discharge cycle significant enough to count as a cycle; and, at step 3028, the cycle count is increased and the cycle flag is set.

Next, the processor determines whether it is appropriate to recalculate the full capacity value and, if it is, to recalculate that value. At step 3032, the processor tests to determines whether the end of discharge voltage flag is set and the reset disable flag is clear. If one or both of these conditions is not true, the routine terminates. If, however, both of these conditions are true, the processor goes to step 3032.

At this step, the processor determines whether the end of charge flag is set and whether the capacity error value is below a preset limit, represented as ERROR_LIMIT. If both of these conditions are true, then at step 3034, the full capacity value is reset and the end of charge flag is cleared. The full capacity value is reset, or recalculated according to the equation:

$$\text{full\_cap} := \text{full\_cap} + (\text{full\_cap})(\text{pd}/256) - \text{Itf}$$

Thus, with this procedure, the full capacity value is reset by adding to the present full capacity value an adjustment value based on pd, which in turn depends on the discharge rate and temperature of the battery, and then subtracting from that sum the value for remaining battery capacity.

Reducing the full capacity value by the remaining capacity value, Itf, takes into account the aging of the battery. To elaborate, as the battery ages, typically the true full capacity of the battery decreases. Thus, at the end of a discharge cycle, the remaining capacity value will normally overstate the true remaining capacity of the battery. To help keep the nominal full capacity value substantially equal to the true full capacity value of the battery, that nominal full capacity value is decreased by the remaining capacity value when the nominal full capacity value of the battery is recalculated at the end of a discharge cycle.

After step 3034, or after step 3032 if one of the conditions tested therein is not true, the program proceeds to step 3036. At this step the processor determines, first, whether I_EDV is equal to 0, or second, whether the C_rate value is less than the I_EDV value, and that the capacity reset disable flag is clear.

If either of these first and second conditions is satisfied, then, at step 3038, the processor saves the current at the end of discharge condition to the present C rate value, sets the pd_reset value equal to the present value for pd, and sets to 1 both the capacity reset and the capacity reset delay flags, and the routine then terminates at 3040. Also, if neither of the conditions tested at step 3036 are true, then the routine also terminates, skipping step 3038.

FIG. 31 shows a procedure for monitoring and generating alarms relating to the remaining capacity and the remaining operating time of the battery. Generally, the purpose of the remaining capacity alarm is to advise the host device when the battery capacity falls below a threshold value, al_rem_ cap. This notification is made by setting a remaining capacity alarm bit and then transmitting that bit to the host device. This information is useful to the host device because, for example, that device may be able to adjust its own operation to reduce its own power demands to help maintain a minimum power level needed to save the operating state of the host device. Preferably, the above-mentioned threshold value is initially set at manufacture, and for example, this value may be 10% of the desired capacity of the battery. Also, preferably, this threshold value may be adjusted by the host device. This enables that host device to more finely control when it will, for example, switch to a standby or sleep mode.

The remaining time alarm advises the host device when a predicted remaining operating time of the host device falls below a threshold value. This predicted remaining time may be calculated in different ways. The perferred calculation is based upon the averaged discharge rate. Notification that this predicted operating time has fallen below the threshold value also may be made by setting a remaining time alarm bit and transmitting that set bit to the host device. For example, this threshold value may be 10 minutes.

The predicted remaining operating time, based on some average battery discharge rate is determined from the equation given in block 3124.

Preferably, the predicted remaining battery time can be calculated from either the battery current discharge rate or the battery power discharge rate. Also, the uncertainty in the remaining battery capacity may be accounted for by subtracting that uncertainty from the numerators of the two above equations.

The first step, indicated as step 3110, in the alarm control routine is to verify the status of the remaining capacity. Specifically, a determination is made as to whether the AL_REM_CAP value is greater than 0 and that the remaining capacity (less the uncertainty error) is less than the AL_REM_CAP value. If these conditions hold true, the REMAINING_CAPACITY_ALARM bit is set at step 3112. If one or both of these conditions is not true, however, the REMAINING_CAPACITY_ALARM bit is cleared at step 3114. Next, at step 3116 the C_rate based on the one minute rolling average current is calculated, and at step 3118 the residual capacity adjustment factor, pd_avg, is assessed from the look-up table of FIG. 12b as a function of the battery C_rate and the battery temperature.

Then, at step 3120, a determination is made as to whether the battery state is capacity decreasing. If the battery capacity is decreasing, then a determination is made at step 3122 as to whether the AL_REM_TIME alarm threshold value is greater than 0. If so, then the estimated remaining time at the present discharge rate is calculated at step 3124. When at step 3126 the calculated remaining time falls below the AL_REM_TIME threshold value, the program sets the REMAINING_TIME_ALARM bit as indicated at step 3128. If it is determined either that the battery state is not capacity decreasing (step 3120), or that the AL_REM_

TIME is equal to 0 (step 3122), or that the calculated remaining time is equal to or above the AL_REM_TIME threshold value (step 3126), then the program clears the REMAINING_TIME_ALARM bit as indicated at step 3130.

From steps 3128 or 3130, the program moves to step 3132, where the processor determines the condition of the DBOS_OFF flag and the off_line flag. If the former flag is clear, and the latter flag is set, then the processor moves to step 3134, where a number of flags or values are set. In particular, at step 3134 the capacity mode, charger mode and off-line flags are cleared, the DBOS_silent flag is set, and i_message is set equal to N_SILENT. From step 3134, the processor proceeds to step 3136. The program also proceeds to step 3136 immediately from step 3132 if the statement therein is false.

As shown at step 3136, the upper byte of the alarm status register is checked to determine if any of the alarm bits, such as OVER_CHARGED_ALARM, TERMINATE_CHARGE_ALARM, DTEMP_ALARM, OVER_TEMP_ALARM, TERMINATE_DISCHARGE_ALARM, REMAINING_CAPACITY_ALARM, and REMAINING_TIME_ALARM have been set. If so, then a check of the alarm broadcast flag "alarming" is made at step 3138. If the upper byte of the alarm status register indicates no alarm condition, that is no bits are set, then the process will continue at step 3140 and the alarming broadcast flag is cleared and the routine is then exited. As discussed above, the alarming broadcast flag is not set during initialization. However, as long as an alarm condition exists, this flag will be set. If at step 3138, the alarming flag is clear, the process continues to step 3141. At this step, the alarming flag is set, the alarm broadcast timer is set to 0 and the "alarm to host" flag is set, indicating that the alarm will be sent to the external host device, and not a battery charger. If at step 3138, the alarming flag is set, the timer i-alarm is decremented by one in step 3143. The process continues at step 3142, where a determination is made as to whether the alarm broadcast timer has timed out; that is, become equal to 0. If the timer has not timed out, then the alarm control routine is exited. However, if the alarm broadcast timer has timed out, then the process will continue at step 3144. At this step, the address location for the alarm broadcast is set to HOST, and the command code is set to BATTERY, and the data address is set to AL_STATUS_L. This will initiate the transfer of the particular alarm to the host device.

A determination is then made at step 3146 as to whether the alarm to host flag is cleared; that is, equal to 0. If the alarm_to_host flag is clear, then the SlAdr, slave address, is changed, at step 3148, from HOST to CHARGER, and the processor determines at step 3150 whether the alarm should be sent to the charger. If the alarm should be sent, then the send message routine 3152, discussed below is invoked, and the alarm is sent.

If at step 3146, the alarm_to_host flag is set, the processor skips steps 3146 and 3148 and proceeds to step 3152. The SIADr value stays HOST, and at step 3152 the alarm is sent to the host device. After the sent message routine is completed, the processor, at step 3154, resets the alarm timer and toggles the alarm_to_host flag—that is, if the flag was set, it is cleared; and if it was clear, it is set. After this, the routine is exited at 3156.

If at step 3150, the processor determines not to sent an alarm to the charger, the routine skips step 3152 and proceeds directly to step 3154. Also, if at step 3142, the alarm timer has not timed out, the routine is immediately exited.

With the above-described procedure, during the first operation of the alarm control routine, the alarm timer is set to 0 at step 3141, so that the routine proceeds through the steps to send an alarm during the first half, and the alarm_to_host flag is set to one, so that the host receives the first alarm. Then the alarm timer is set to its full value, such as ten seconds, at step 3154.

However, for the next and subsequent operating cycles of the alarm control routine, because the alarming flag is now set, the processor proceeds to step 3143 from step 3138, rather than to step, and decrements the alarm timer. Moreover, until the timer alarm times out, each time that timer is decremented, the routine is exited. During each time period defined by N_ALARM, the alarm to host bit is toggled. In this way, the alarm control routine enable alarm signals to be transmitted alternately to the host device and to a battery charger. In addition, in some instances it would be inappropriate to send alarm signals to the battery charger. This would be detected at step 3150, in which case step 3152 is skipped.

Figure 32:
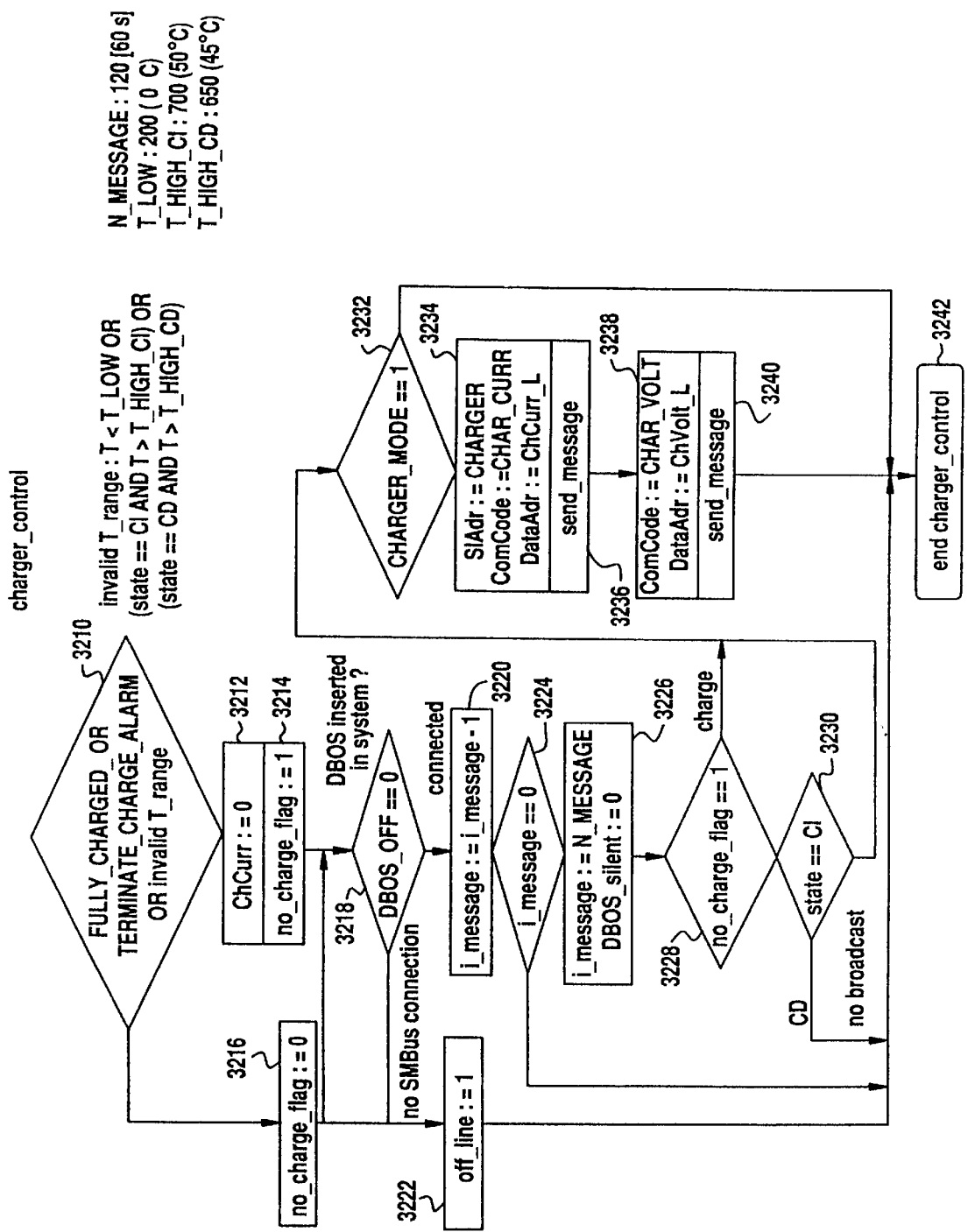

FIG. 32 entitled charger_control is basically a routine which sends instructions to the charger. In block 3210 the routine checks to determine if any bits are set for FULLY_CHARGED or TERMINATE_CHARGE_ALARM or invalid T_range, which are set to prevent further charging of the battery. If any of those flag bits are set, the routine proceeds to block 3212 and sets the charge current (ChCurr) equal to 0, and in block 3214 sets the no_charge_flag equal to 1. Conversely if the conditions in block 3210 are false, the routine proceeds to block 3216 to set the no_charge flag equal to 0. From steps 3214 or 3216, the routine proceeds to step 3218 wherein the program determines if the DBOS battery is plugged into a system, making an SMBus connection. If the bit flag DBOS_OFF is set equal to 0, indicating insertion into a system the routine proceeds to block 3220 and decrements a 60 second timer, i_message—1. If in step 3218 there is no SMBus connection the program proceeds to block 3222 in which a flag bit off_line is set equal to 1, indicating no broadcast, and then ends the routine.

Proceeding from block 3220, the routine proceeds to block 3224 in which the variable i_message is checked to determine if it is equal to 0, indicating a time out of the 60 second timer. If the condition in block 3224 is false there is no broadcast and the routine is ended. If the condition in block 3224 is true the routine proceeds to block 3226 in which the counter is reset to 120 by setting i_message equal to N_MESSAGE. DBOS_silent is also set equal to 0. The routine then proceeds to block 3228 to again determine if the no_charge_flag is set equal to 1. The routine then proceeds to block 3230 in which state is checked as being equal to CI. If state is not equal to CI, indicating that the state is CD, there is no broadcast and the routine is ended.

If the condition in block 3230 is true, or the condition in block 3228 is false, the routine proceeds to block 3232 in which the state of the CHARGER_MODE bit is checked. This is a bit written into the battery by either the charger or host which turns off the broadcast to the charger. If the bit is set to 1 it disables the charger broadcast and the routine is ended. If the condition in step 3232 is true, the routine proceeds to block 3234 in which all of the elements of the message on charging current to be broadcast are specified. The first element is the slave address (Sl Adr) which is specified to be CHARGER. The second element is the command code (Com Code) which is the information of the message, and is specified to be charging current. The third element is the data address (Data Adr) which contains and specifies the charger current upper limit (chCurr__L). At step 3236 the processor invokes the send__message routine as explained herein.

In the next block 3238, the elements of the message on charging voltage to be broadcast are specified. The slave address (Sl Adr) is omitted since it was already specified in block 3234 to be the CHARGER. In this block the command code is specified to be the charging voltage (CHAR__VOLT). The data of the message is specified in the data address (Data Adr) which is the charger voltage upper limit (ChVolt__L). At step 3240, the routine again invokes the send__message routine, and then proceeds to end or exit the routine at step 3242.

Figure 33:
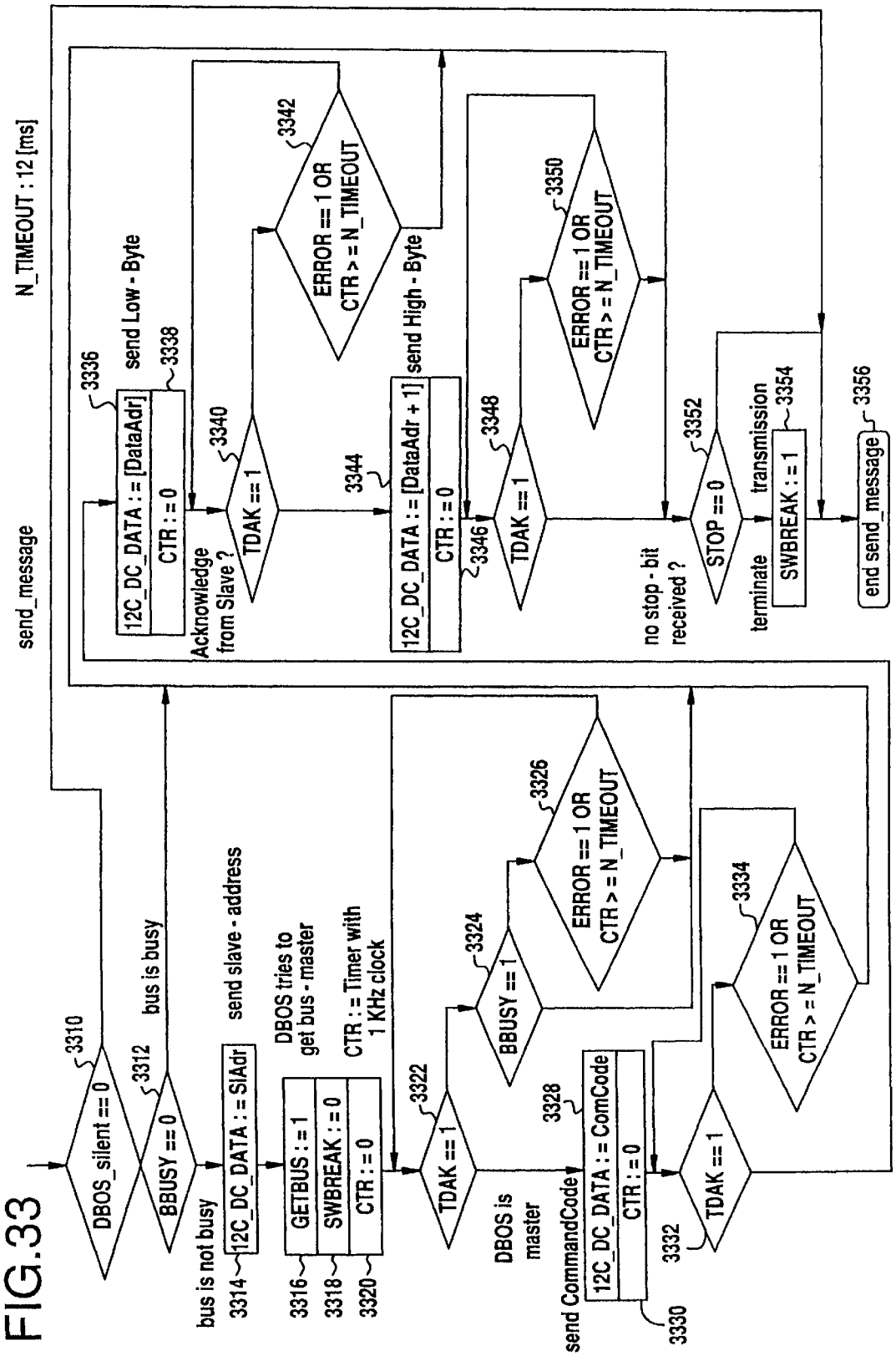

FIG. 33 is the send__message routine, and in general sets the flags in software which are necessary for the smart battery to transmit over the SMBus. In summary in this routine, a message is sent by specifying the message address in block 3314, specifying the command code (information) in block 3328, and specifying the data address in block 3336, and then by incrementing the data address in block 3344 until the entire message is transmitted.

Block 3310 checks to see that the condition DBOS__silent is equal to 0. If this bit is equal to 1 the message cannot be transmitted, and the routine is exited to the right. If the bit in block 3310 is equal to 0, then in block 3312 the routine checks that a bit BBUSY is equal to 0, indicating the bus is not busy. This is a bit flag set in hardware which indicates that the data bus is busy when the flag is equal to 1. If the flag is equal to 0 indicating the bus is not busy, the routine proceeds to block 3314 and sets the I2C__DATA word equal to the slave address (Sl Adr). In step 3316, the routine sets the variable GETBUS equal to 1, indicating that the DBOS is attempting to get the bus-master. This is accomplished by sending a signal such as by pulling the clock line low. The routine then proceeds to step 3318 in which SWBREAK is set equal to 0, and block 3320 in which a counter is set equal to 0. This counter sets a time limit by which the charger or host must acknowledge the attempt by DBOS to get the bus-master. This acknowledgment is accomplished by the charger or host sending a signal, such as by pulling the data line low.

In step 3322, the system checks that TDAK is equal to 1 which is an indication of acknowledgment that the DBOS is the bus master. If the condition of block 3322 is false the routine enters a timing loop, and proceeds to block 3324 in which a bit in hardware is checked to determine if the bus is busy, specifically that BBUSY equals 1. If the condition of block 3324 is false the routine proceeds to block 3326 in which an error bit (ERROR) is checked to determine if it is set to one or whether the count of the counter is greater than N__TIMEOUT, which indicates that the timer loop has timed out. If the condition in block 3326 is false, the routine returns to block 3322, and the loop is cycled through until an acknowledgment is received that DBOS is bus master or the timer times out, or if the condition of block 3324 or block 3326 is are true, the processor proceeds to a latter part of the program.

If the condition of block 3322 is true, indicating that DBOS is bus master, the routine proceeds to block 3328 in which I2C__DATA is set equal to ComCode, thus sending the command code. In block 3330, the counter is reset by setting CTR equal to 0. Block 3328 is a transmission of the command code, and in block 3334, the program looks for an acknowledgment of that transmission, specifically checking that TDAK equals 1. If TDAK equals 0, indicating no acknowledgment, the routine proceeds to block 3334 in which it checks for an error, specifically by ERROR equals 1, or the condition that the counter has timed out, indicated by CTR greater than N__TIMEOUT. The routine continues in this timing loop until after timeout, or the indication of an error, or until a successful acknowledgment is received.

In the latter case, the routine proceeds to step 3336 in which the third part of the message is transmitted, specifically by setting I2C__DATA equal to the data address of the low byte of the message. In block 3338 a counter is reset to 0. In block 3340 the routine looks for a successful acknowledgment, specifically that TDAK equals 1, or if not cycles to the right to block 3342 looking for either an error (ERROR=1) or the counter timeout, greater than N__TIMEOUT. The routine continues in this cycle until it receives a successful acknowledgment or an error is indicated the timer times out.

If a successful acknowledgment is received in block 3340 the routine proceeds to block 3344. The data being transmitted consists of two bytes, a first byte transmitted in block 3336 and a second byte transmitted in block 3344. Blocks 3346, 3348 and 3350 are set up exactly the same cycle as blocks 3338, 3340 and 3342, and therefore their explanations will not be repeated. A successful transmission ends by a bit in hardware (STOP) being set to 1 by the host. This is termed the stop bit and in block 3352, the routine looks to see if the stop-bit was set to 1, and if it was the routine exits to the right and to the end of this routine. If the stop bit is determined to be 0 in block 3352 the routine terminates transmission by setting SWBREAK equal to 1, which is in effect the generation of its own stop bit, and then exits the routine at 3356.

Figure 34:
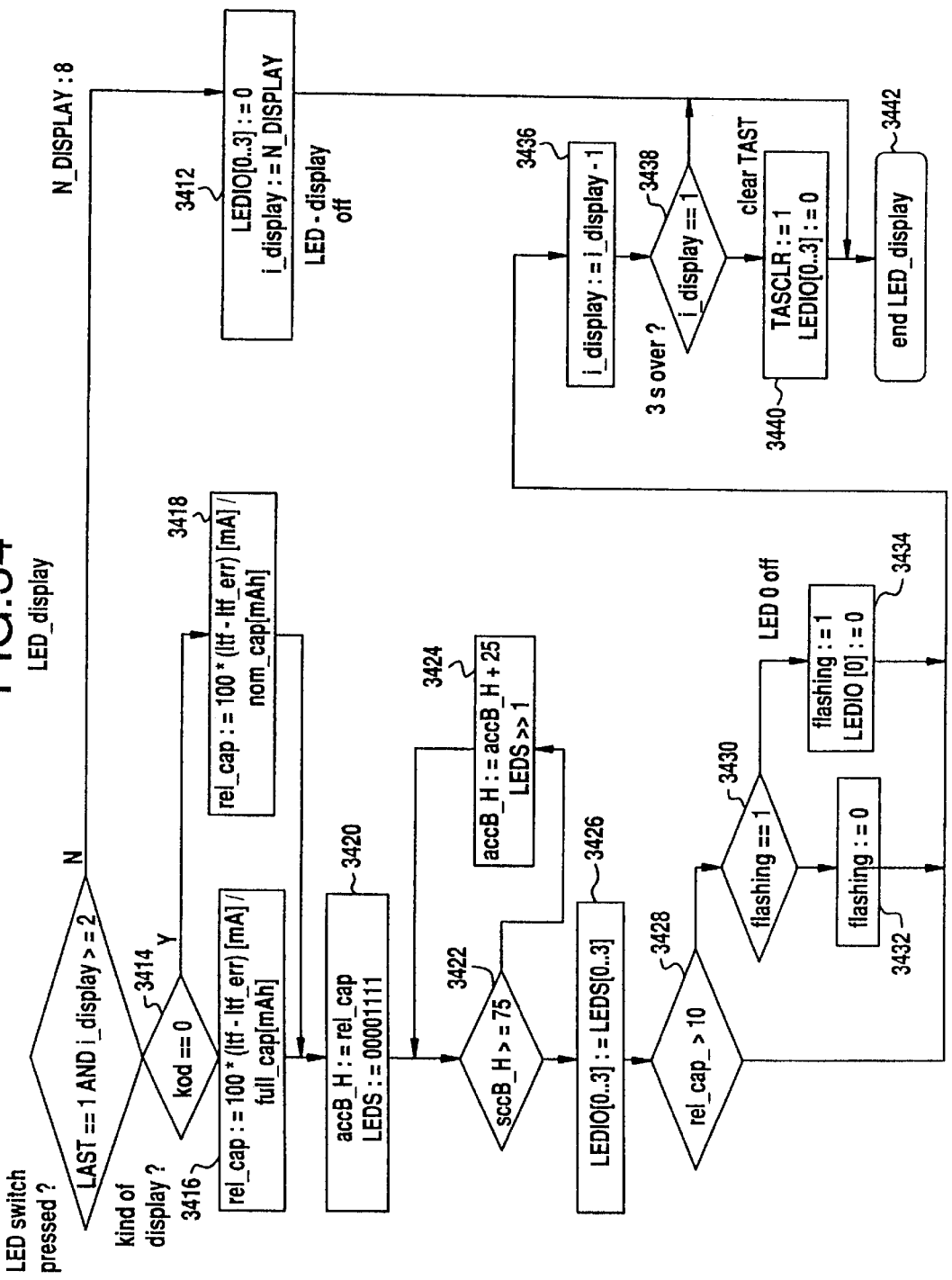

FIG. 34 is a routine entitled LED__display. In step 3410 the routine tests that the LED switch has been pressed, specifically by TAST equals 1, and that the timer of the display is greater than a given limit, specifically that i__display is greater than 2. If these conditions are false, the routine proceeds to the right to block 3412 n which a variable LEDIO (for each of bits 0 to 3) is set to 0, and the display timer is initialized by setting i__display equal to N__DISPLAY. By setting the work LEDIO equal to 0 the LED display is turned off and the routine is exited.

If the conditions of block 3410 are true, the routine proceeds to block 3414 in which the manufacturers data is checked to determine the type of display. If the word in block 3414 (kod) is equal to 1, then in block 3416, the relative capacity (rel__cap) is determined by the numerator indicated in block 3416 being divided by the denominator indicated in block 3416, full__cap, which is the learned or true capacity of the battery. If on the other hand the word kod in block 3414 is equal to 1 the routine proceeds to block 3418 which has a similar calculation to block 3416, but in this case the denominator of the equation is the nominal capacity, nom__cap, which is the designed capacity for the battery. The denominator in block 3418 is the designed capacity of a new battery, whereas the denominator of block 3416 is the true capacity of the battery, which takes into account aging thereof and other factors.

From blocks 3416 and blocks 3418, the routine proceeds to block 3420 wherein the variable accB__H is set equal to the relative capacity, as determined by either block 3416 or 3418, which is to be indicated by the LED display. Next in block 3420, the word LEDS is set to 00001111. This value of the word indicates that all of the LEDS are to be initialized at a state in which all of the LEDS can be turned on. The routine in blocks 3422 and 3424 is an incremental routine in which the word accB__H is first determined in block 3422 to be greater than 75, and if not then in block 3424 the word is incremented by +25. Incrementing this word by +25 shifts the bits of the word LEDS to the right by one bit, such that the word is now 0000111. This results in only three LEDS being capable of being turned on. This routine cycles through blocks 3422 and 3424 until the word is greater than 75, at which time the routine proceeds from block 3422 to block 3426. In block 3426 the work LEDIO (which has bits from 0–3) is set equal to LEDS (which also has bits 0–3) which turns the designated LEDS on.

At block 3428 the relative capacity is checked to be greater than 10%. If the relative capacity is less than 10%, the the LED display is to be cycled on and on in a flashing mode. The routine proceeds to block 3430 in which the word flashing is tested to see if it is 1. If it is 1, the block proceeds to block 3432 in which the word flashing is set equal to 0 resulting in a flashing of the display. If the word flashing is equal to 0 in block 3430, then the routine proceeds to block 3434 in which the word flashing is set equal to 1, and the word LEDIO is set equal to 0. The result of the routine established by blocks 3430, 3432 and 3434 is a flashing of the LED display.

After exiting from blocks 3428 (condition true), 3432, or 3434, the routine proceeds to block 3436 in which the display timer is decremented by 1. The display timer determines how long the LED display is on. Specifically i_display is decremented by 1. In block 3438 the routine tests to determine if the three second timer interval is over. If the word i_display equals 1, the routine proceeds to block 3440 in which the bit TAST (which was determined to be set to 1 in block 3410) is cleared, effectively clearing the button press bit. The work LEDIO is also set equal to 0, turning the LED display off. From blocks 3412, 3438 (condition false) and 3440, the routine is exited at 3442.

Figure 35:
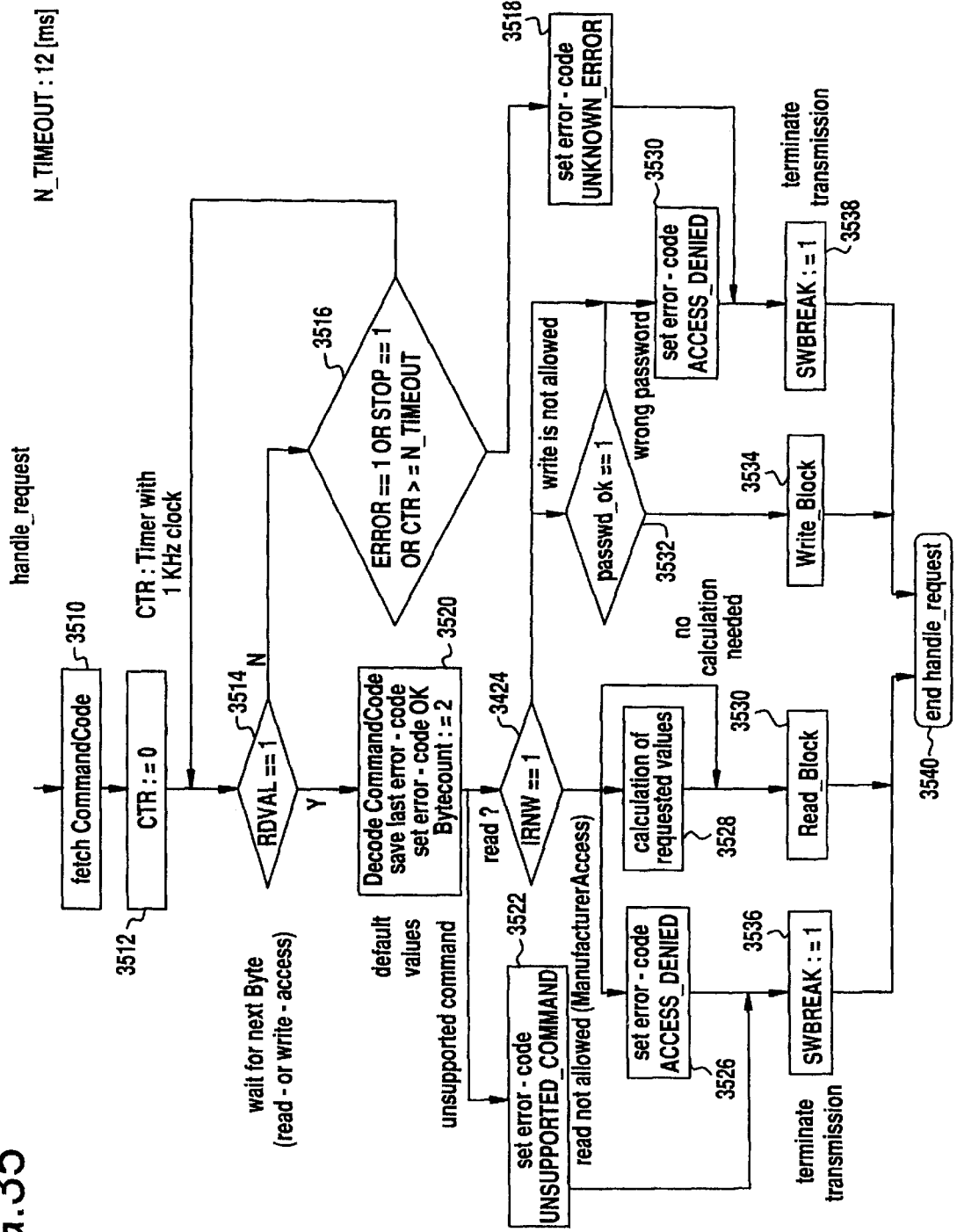

FIG. 35, entitled handle_request, is a routine in which the battery is being requested to supply some type of value to a host. The request is received over the bus, and in step 3510 the request is acted upon by fetching a command code from a specified address in RAM. In block 3512, a timer is initialized by setting the counter, specifically CTR, equal to 0. The routine then waits for the next byte of data in block 3514, specifically by checking that RDVAL (an acknowledgement) is equal to 1. If not, the routine proceeds to block 3516, with the blocks 3514 and 3516 setting up a timing loop which has a 12 millisecond duration. In block 3516 the program checks that ERROR equals 1 or STOP equals 1 or the counter CTR is greater than N_TIMEOUT. If an error is indicated, or the stop bit is set, or the counter times out, the routine proceeds to block 3518 in which an error code is set by setting a bit UNKNOWN_ERROR.

If in block 3514 RDVAL is equal to 1, the routine proceeds to block 3520 in which the command code is decoded, the last error-code is saved, and default values are set, set error-code OK(?) and set the Bytecount equal to 2. At the output of block 3520, there is a hardware read of the decoded command code. Specifically if the decoded command is not supported, the routine proceeds to block 3522 in which the error-code is set, specifically the word UNSUPPORTED_COMMAND.

If the command is supported at the output of 3520, the routine proceeds to block 3524 in which a determination is made as to whether the command is a read command or a write command, specifically whether a bit IRNW equals 1. If so the command is a read command, and the routine performs a further hardware read of the command. If the read is not allowed, such as by a request for a read from the manufacturers access, the routine proceeds to block 3526 in which an error code is set, specifically the word ACCESS_DENIED. If the command is for a value for which no calculation is required, such as the voltage, current or temperature, which are values which are calculated on a regular basis, the routine bypasses block 3528. On the other hand, if the command is for a calculation of a requested value, such as a time remaining value, the routine proceeds to block 3528 in which the requested values are calculated. The processor then proceeds to block 3530 which is the Read_Block routine, as explained in detail herein, and then exits the routine.

If block 3524 indicates that the request was a write request, a hardware read of the request is initially made, and if the write is one that is not allowed, the routine proceeds to block 3530 in which the error-code is set, specifically the word ACCESS_DENIED. If the received write request is allowed, the routine passes to block 3532 in which the password is checked. If the password is incorrect, the routine proceeds to block 3530 and sets the error-code, ACCESS_DENIED. If block 3532 indicates an approved password the routine proceeds to the write block routine at 3544 as explained herein, and the routine is then exited.

From the output of blocks 3522 and 3526, the routine proceeds to block 3536 in which the transmission is terminated by setting SWBREAK equal to 1, which is in effect a self generation of a stop bit. Likewise from the blocks 3518 and 3530, the routine proceeds to block 3538 wherein the transmission is terminated by setting the work SWBREAK equal to 1, and the routine is then exited at 3540.

Figure 36:
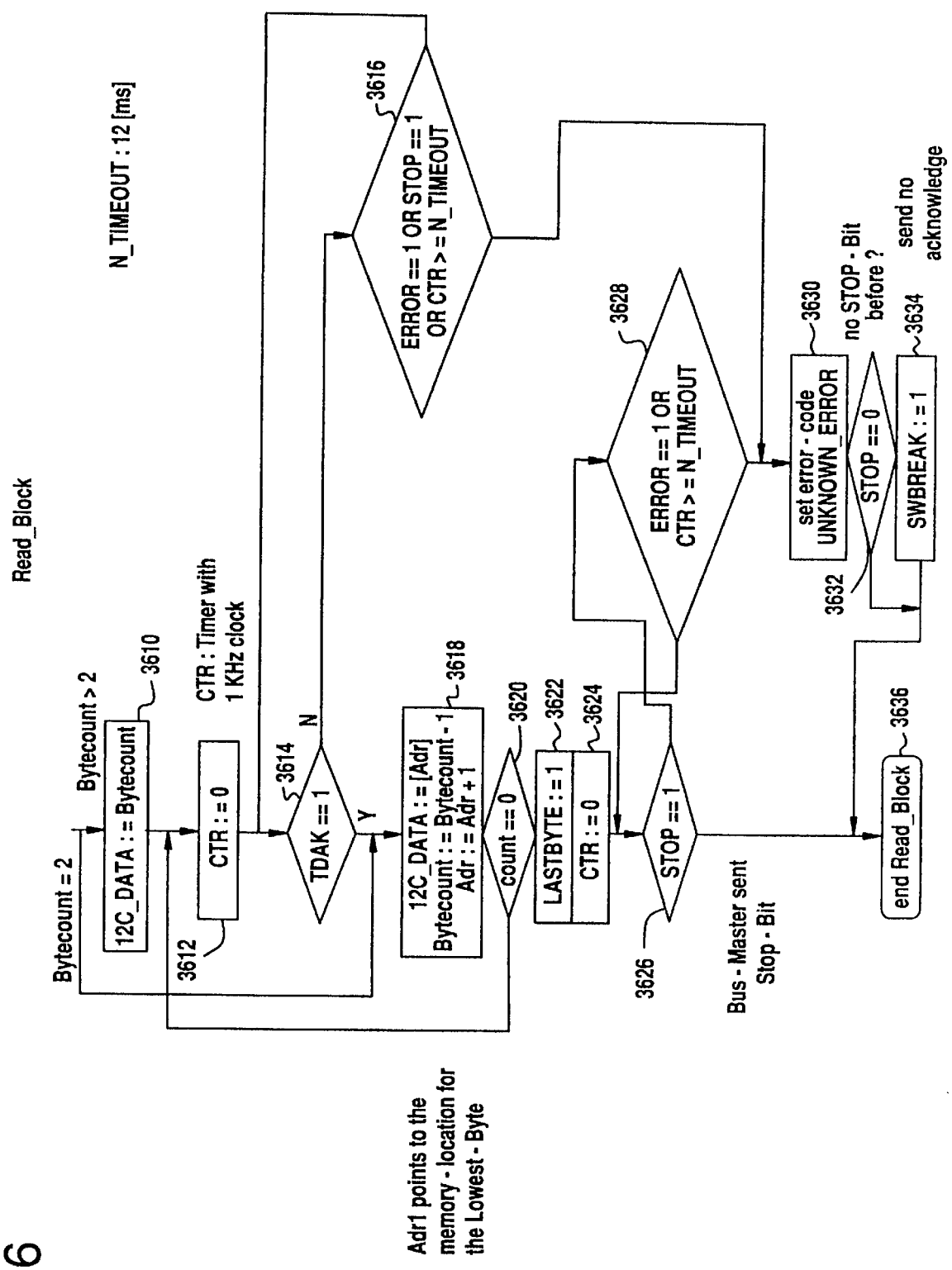

FIG. 36, entitled Read_Block, is initiated by a request for a read operation received over the bus. An initial hardware determination is made as to whether the bytecount is 2 or greater than 2. If the bytecount of the read request is greater than 2, the routine proceeds to block 3610 in which I2C_DATA is set equal to the byte count, which essentially determines the number of bytes over 2. The routine then proceeds to block 3612 in which a timing cycle is initialized by setting a counter equal to 0.

The routine then proceeds to block 3614 in which a determination is made as to whether an acknowledgment of the request has been received, specifically whether the word TDAK equals 1. If not, the routine proceeds to block 3616, which sets up a timing loop giving a specified time for an acknowledgment to be received. In block 3616 the conditions are tested for ERROR equals 1, or STOP equal, 1, or CTR greater than N_TIMEOUT. If none of those conditions are true, the routine proceeds back to the beginning of block 3614, and generally keeps proceeding through the timing loop until one of the conditions is true or the timer times out.

If block 3614 determines that an acknowledgment has been received, the routine proceeds to block 3618 in which I2C_DATA is set equal to a specified address, the byte count is decremented by 1, and the address is incremented by 1. Likewise, if the initial hardware read of the read request indicated that the byte count was equal to 2, the routine proceeds to the beginning of block 3618, and the same commands are executed. From block 3618, the routine proceeds to block 3620 which establishes a byte count loop back to the beginning of block 3612 until the byte count is indicated to be 0 in block 3620.

Then the routine proceeds to block 3622 in which the command is terminated by setting a stop bit, LASTBYTE equal to 1, and a counter is initialized to 0 in block 3624. Blocks 3626 and 3628 establish a timing loop to look for receipt of the stop bit before a timer times out. In block 3626 if STOP equals 0, indicating that the stop bit has not been received, the routine proceeds to block 3628 in which the conditions of an error or counter timeout are checked, specifically ERROR equals 1 or CTR greater than N_TIMEOUT. If neither of these conditions is true, the routine cycles back to the beginning of block 3626 in the timing loop until either ERROR equals 1 or the counter times out.

If either condition occurs, the routine proceeds to block 3630 in which the error code is set, specifically the word UNKNOWN_ERROR. The routine then proceeds to block 3632 in which the receipt of a stop bit is checked by STOP=0. If a stop bit has been received, the processor exits the routine at 3634. If no stop bit has been received in block 3632 the routine proceeds to block 3634 in which it generates its own stop bit by setting SWBREAK equal to 1 and then exits the routine. Likewise, in step 3626 if it is determined that a stop bit has been received, STOP equals 1, then the bus master has transmitted a stop bit, and the routine is exited.

Figure 37:
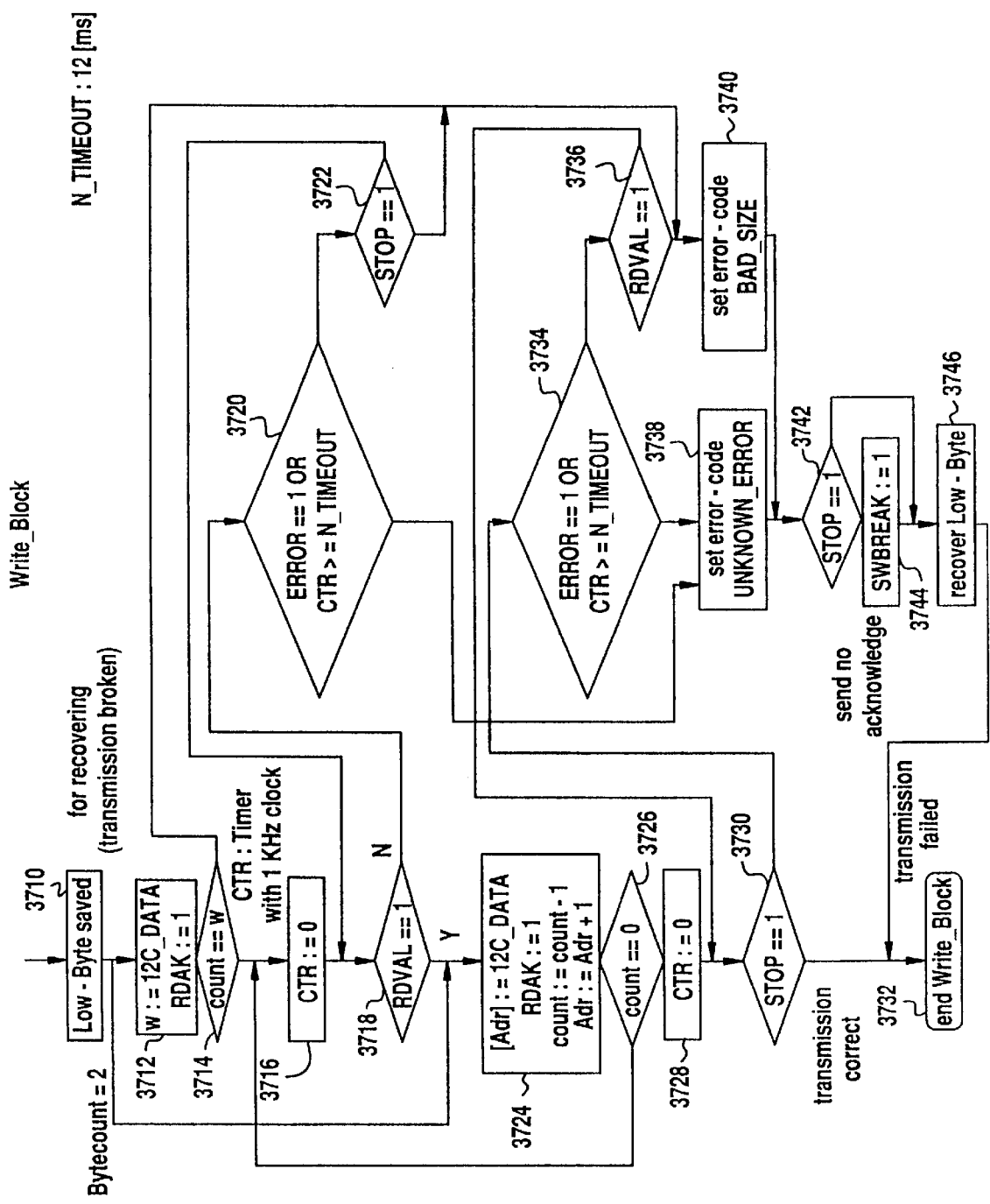

FIG. 37, entitled Write_Block, is a routine to execute a write operation. A request for a write operation is initially received at block 3710 in which the low byte thereof is saved in memory, this being for the purpose for recovering the write operation in the event the transmission is subsequently broken. An initial hardware determination is made as to whether the byte count of the write operation equals 2 bytes or is greater than 2 bytes. If greater 2 bytes the routine proceeds to block 3712, if equal to 2 bytes it proceeds to block 3734.

The routine proceeds to block 3712 in which the write command is written to I2C_DATA and acknowledgment RDAK bit is set equal to 1. The routine then proceeds to block 3714 in which a determination is made as to whether the count equals the byte count w. If the byte count is equal to w, the routine proceeds to block 3716 in which a counter is initialized to 0 to time a time period in which an acknowledgment is received. The routine then proceeds to block 3718 in which a determination is made as to whether an acknowledgment has been received, specifically whether RDVAL equals 1. If an acknowledgment has not been received, the routine proceeds through a timing cycle established by blocks 3720 and 3722. In block 3720 a determination is made as to whether ERROR equals 1 or the state of the counter has timed out by CTR greater than N_TIMEOUT. If neither of those conditions has occurred, the routine proceeds to block 3722 in which a determination is made as to whether STOP has been set equal to 1. If not, the routine proceeds back to block 3718 and keeps cycling through this routine until either the counter times out or either the ERROR or STOP bit is set equal to 1.

Returning to block 3718 if an acknowledgment has been received, the routine proceeds to block 3724. The routine also enters block 3724 from the end of block 3710 if a hardware determination indicates that the byte count of the write requests equals 2 bytes. In block 3724 an address is set equal to I2C_DATA, an acknowledgment is given by setting RDAK equal to 1, a byte count is decremented by setting count equal to count—1, and an address is incremented by setting Adr equal to Adr +1.

Following block 3724 the routine proceeds to block 3726 which determines if the byte counter has reached 0. If not the routine cycles back to the beginning of block 3716 until the byte counter reaches 0. When the count has reached 0 in block 3726 the routine proceeds to block 3728 in which a further timer (for receipt of a stop bit) is initialized by being set to 0. The routine proceeds to block 3730 in which a determination is made as to whether a stop bit has been received.

If a stop bit has been received, STOP equals 1, the transmission is correct, and the routine exits at 3732. If a stop bit has not been received in block 3730 the routine proceeds through a timing cycle with blocks 3734 and 3736. In block 3734 a determination is made as to whether an error bit has been set or the counter has timed out, specifically whether ERROR equals 1 or CTR greater than N_TIMEOUT. If neither of these conditions has occurred the routine proceeds to block 3736 in which a hardware flag RDVAL is checked to determine if it has been set equal to 1. If not, the routine cycles back to the beginning of block 3730 and continues in this routine until the timing cycle times out or ERROR equals 1 or RDVAL equals 1. If one of the conditions in either of blocks 3720 or 3734 is true, the routine proceeds to block 3738 in which an error-code is set, specifically UNKNOWN_ERROR. Likewise, if the condition in block 3714 is false or the conditions of blocks 3722 or 3736 is true, the routine proceeds to block 3740 and error-code is set, specifically BAD_SIZE.

From either of blocks 3738 or 3740 the routine proceeds to block 3742 in which a determination is made as to whether STOP equals 0, indicating that a Stop bit has not be received. If that is so, the routine proceeds to block 3744 in which is generates its own stop bit by setting SWBREAK equal to 1 (send no acknowledgment). From block 3744 and block 3742 (condition false) the routine proceeds to block 3746 in which the low byte initially saved in step 3710 is recovered (the transmission has failed), and the routine is exited at 3732.

Figure 38:
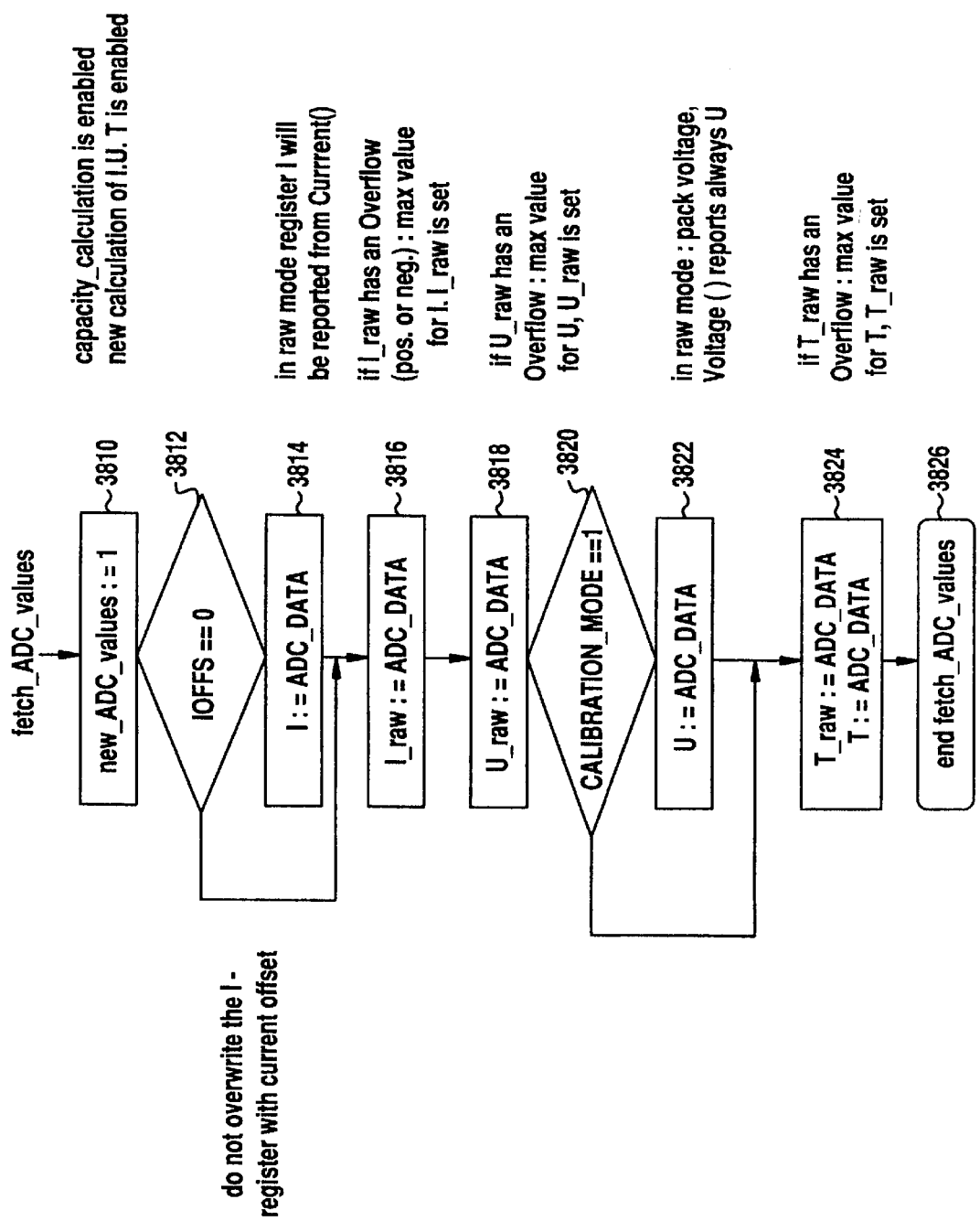

FIG. 38, fetch_ADC_values illustrates a routine to transfer data values from the analog-to-digital converter to the processor. The first step in this routine at 3810 is to set a first variable, new_ADC_values, to 1. By setting new_ADC_values to 1, the processor enables itself to make various subsequent calculations. Next, at step 3812, the processor tests to determine whether the bit flag IOFFS is equal to 0. This bit flag is normally equal to 0, but is set to 1 every 30 seconds when the auto offset calibration mode is active. Then the processor in the next two steps 3814 and 3816 sets two variables, I and I_raw, both equal to ADC_DATA, the value for battery current presently available at the analog-to-digital converter. If a current overflow exists, then the processor skips step 3814 and in step 3816 sets I_raw equal to a predetermined maximum value.

In step 3818 the processor sets a variable, referred to as U_raw, equal to ADC_DATA, the value for battery voltage presently available at the analog-to-digital converter. Next, the processor tests to determine if a voltage overflow condition exists, which is determined by whether the battery voltage value obtained from the analog-to-digital converter exceeds a preset level. If a voltage overflow exists, then the processor sets U_raw to a predefined maximum value. In step 3820, the processor determines if a CALIBRATION_MODE bit is set to 1, and if so proceeds to step 3822 wherein the variable U is set to ADC_DATA, and if not skips step 3822. At step 3824, the processor sets two variables, T_raw and T to ADC_DATA, the battery temperature value presently available at the analog-to-digital converter. The processor also tests to determine whether a temperature overflow condition exists; and if it does, T_raw and T are both set to preset maximum values. After step 3824, the processor ends this fetch_ADC values routine.

Figure 39:
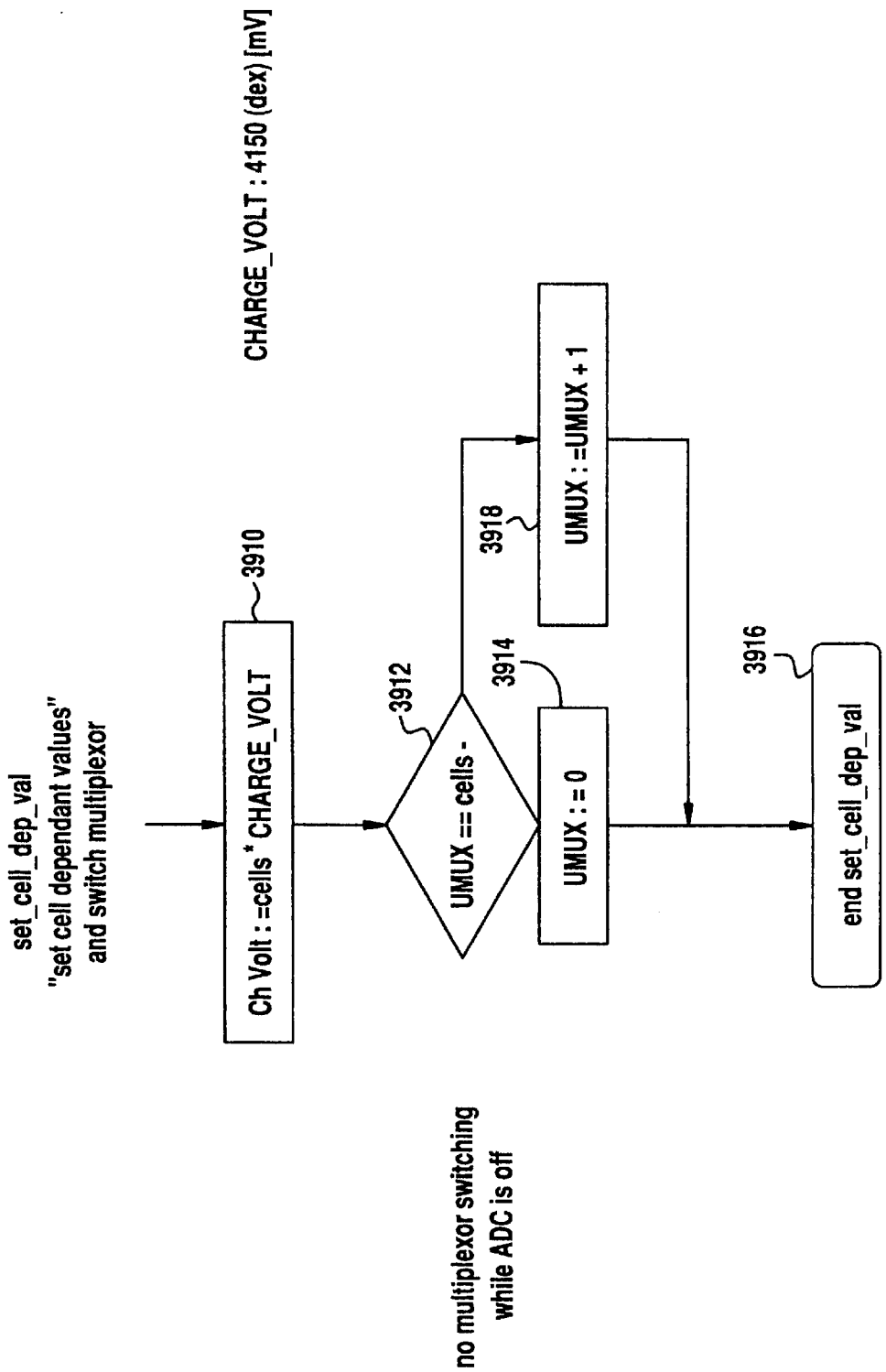

FIG. 39, set_cell_dep_val, shows the routine used by the processor to set various cell dependent values; that is, values that depend on the number of cells in the battery pack. At step 3910, the processor sets a variable Ch Volt equal to cells, the number of cells in the battery pack, times a constant CHARGE_VOLT. At step 3912, the processor determines if a variable UMUX is equal to CELLS-1, the number of cells in the battery pack minus 1. If so, the processor sets a variable UMUX is equal to 0 at step 3914 and then exits the routine at 3916. If the condition at 3912 is not true, the processor increments the variable UMUX by 1 at 3918 and then exits the routine at 3916.

FIGS. 40–62 illustrate a second operating program particularly well suited for battery packs having nickel metal hydride battery cells.

Figure 40:
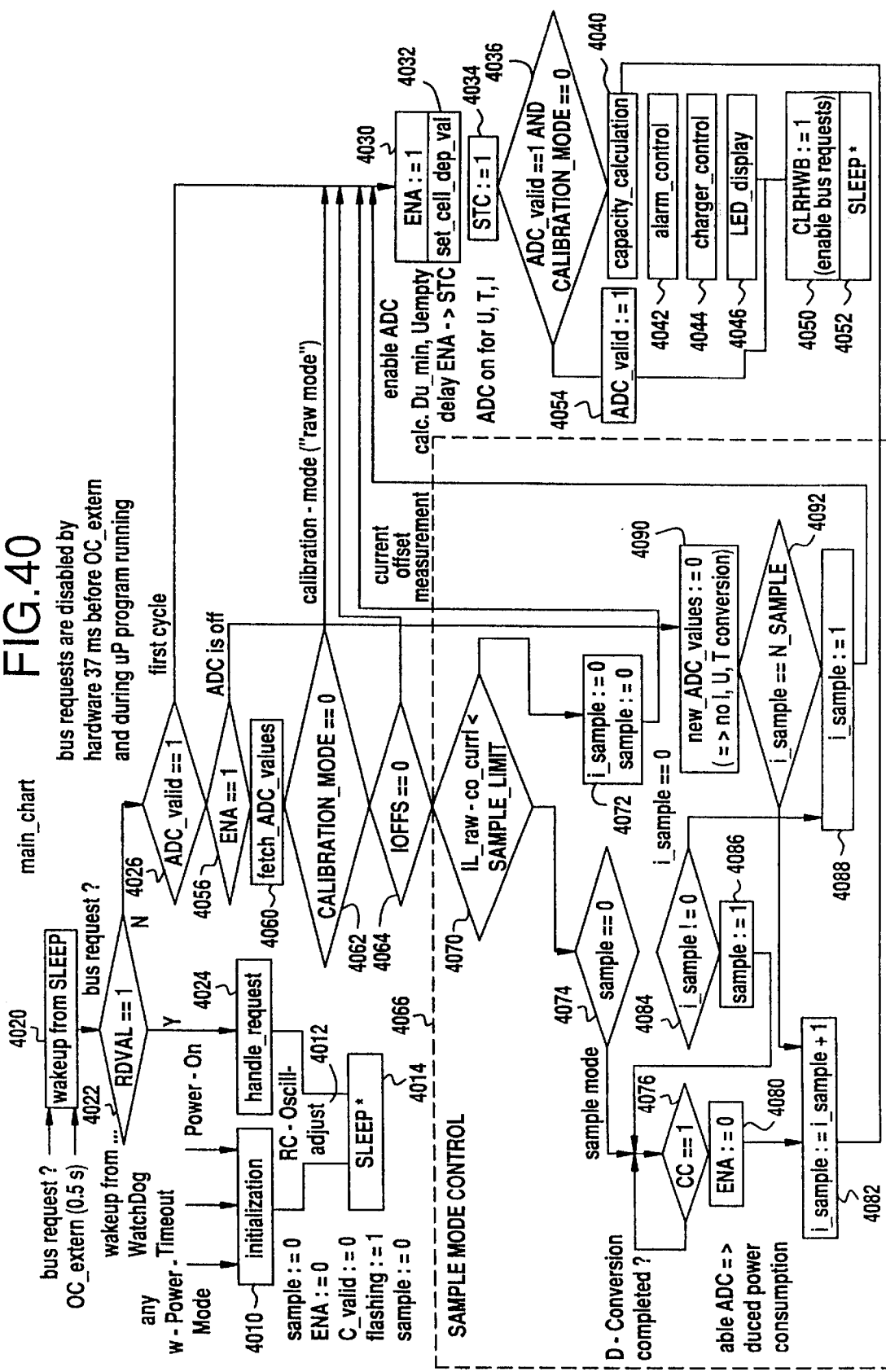
FIG. 40 is a flow chart showing the main operating routine of a program for monitoring and controlling the operation of a battery pack having rechargeable nickel metal hydride battery cells.

With reference to FIG. 40, the first step 4010 of the main operating routine of the Nickel Metal Hydride operating system is an initialization routine. During this routine, discussed in greater detail below, particularly with respect to FIG. 19, a number of variables and bits are set to initial or default values. This initialization routine is itself initiated by the occurrence of any one of a number of signals including a signal from a shelf sleep mode, a signal from a low voltage sleep, a watchdog timeout signal, or a power on reset signal. After the initialization routine is completed, a clock or oscillator adjustment routine, also discussed below, is performed at step 4012, and then the processor enters the sleep mode at 4014. The processor stays in this sleep mode until either the processor receives a wake up signal from the external oscillator, which is normally transmitted to the processor every 500 milliseconds, or the processor receives a bus request signal over data line 4020.

As represented by step 4020 of FIG. 40, the processor wakes up from the sleep mode upon receipt of either of these signals. After waking up, the processor determines which of these signals was received; and this is done by determining, at step 4022, whether a bus request bit, RDVAL, is set—that is, is set equal to 1. If this bit is set, then the received signal was a bus request signal; however, if the bus request bit is not set, then the received signal was a wake up signal. If the bus request bit is set, the processor responds to this request by invoking the handle-request routine at step 4024, and this routine is done as discussed in more detail below. After the processor has responded to the request, the processor reenters the sleep mode at step 4014. If at step 4027, the bus request bit is not set, which indicates that the received signal was a wake up signal, then the processor begins a regular operating cycle, referred to as a duty cycle.

In this duty cycle, at step 4026, the processor checks to determine if this is the first duty cycle since completion of the initialization routine; and in particular, the processor does this by checking to determine if a bit, referred to as ADC_valid bit, is set equal to 1. If this bit is not equal to 1, then the present cycle is the first cycle since initialization was completed; and if this bit is equal to 1, then the present cycle is not the first cycle since the initialization was completed.

If ADC_valid is not equal to 1, then the program proceeds to step 4030, at which a bit, referred to as ENA, is set equal to 1. As explained in greater detail below, when ENA is set equal to 1, the analog-to-digital converter is enabled, allowing the processor to obtain temperature, current and voltage measurements from the A/D converter. After ENA is set equal to 1, a routine, discussed below, is invoked at step 4032 to set various cell dependent values. After this, a bit, STC, is set equal to 1 at step and this is done to start or to enable a conversion of analog signals or values to digital values.

Then, at step 4036, the processor determines, first, whether the bit ADC_valid is set equal to 1, and secondly, whether a bit, CALIBRATION_MODE, is set equal to 0, indicating that the processor is not in a calibration mode. If both of these conditions are true, then the processor proceeds at steps 4040, 4042, 4044, and 4046 sequentially through a capacity calculation routine, an alarm control routine, a charge control routine, and an LED display routine. These four routines are discussed in detail below.

After these four routines are completed, a bit entitled CLRHWB is set equal to 1 at step 4050, and this enables the processor to handle, or respond to, bus requests that are transmitted to the processor over the bus request line. After step 4050, the processor exits the duty_cycle routine and reenters the sleep mode at step 4052.

If, at step 4036, one, or both, of the tested conditions is not true, then the processor skips steps 4040 to 4046 and proceeds to step 4054, at which the bit ADC_valid is set equal to 1. The processor then goes to step 4050, sets CLRHWB equal to 1, and then reenters the sleep mode.

If, at step 4026, the bit ADC_valid is set equal to 1—which means that the present duty cycle is not the first duty cycle after the initialization routine ended—then the routine proceeds to step 4056. At this step, the processor tests to determine whether the analog-to-digital converter is enabled; and specifically, the processor does this by testing to determine if the ENA bit is equal to 1. If this bit is set equal to 1—indicating that the analog-to-digital converter is on—the processor proceeds to step 4060, and a routine, fetch ADC values, discussed in detail below, is performed to transfer various values from the analog-to-digital converter to the processor.

After this is done, the processor, at step 4062, tests to determine whether the processor is in the calibration mode by testing whether the CALIBRATION_MODE bit is equal to 0. If the processor is not in the calibration mode, the processor proceeds to step 4030 and proceeds from there. If, however, at step 4062, the processor is in the calibration mode, the processor proceeds to step 4064.

At step 4064, the processor tests to determine if a bit or flag, referred to as IOFFS, is equal to 0. This bit is used to enable or to disable a current offset measurement procedure, discussed below. If this bit is not equal to 0, the program is in a current offset measurement mode, and the routine goes to step 4030 and proceeds from there as described above; while if the IOFFS bit is equal to 0, the routine begins a group or block of steps 4066.

The steps in block 4066 are performed for Sample Mode Control. When the battery current, charge or discharge, is less than a given value, then the rate at which the analog-to-digital converter converts new analog measurements to digital values is decreased to conserve battery power. Step 4070, and the subsequent steps in block 4066, are performed to determine whether the analog-to-digital converter is operated at a regular frequency—at which, preferably, the analog-to-digital conversions are performed once every 500 milliseconds—or at a lower frequency. The above-mentioned given current value below which the analog-to-digital converter operates at the lower frequency is represented by the variable SAMPLE_LIMIT, and in a preferred embodiment of the invention, is 10 milliamps.

More specifically, at step 4070, the processor determines whether the absolute value of the variable I_raw_co_curr is less than SAMPLE_LIMIT. If I_raw_co_curr is not less than sample_limit, then the processor operates at the regular frequency. Specifically, two bits, i_sample and sample, are set to 0 at step 4072, and the processor then moves to step 4030 and proceeds from there as described above.

If, however, at step 4070, the variable I_raw_co_curr is less than SAMPLE_LIMIT, then the processor proceeds to step 4074. At this step, the processor determines whether the bit sample is equal to 0.

If sample is not equal to 0, then the processor is already in the sample mode and the routine proceeds to step 4076.

At step 4076, the processor tests to determine whether a bit, CC, is equal to 1. As explained in greater detail below, this bit will be set to 1 when the analog-to-digital converter completes the conversion of one set of analog signals to digital data; and step 4076 is repeated until the bit CC becomes equal to 1. When this happens, the processor, first at step 4080, sets ENA to 0, thereby disabling the analog-to-digital converter to reduce power consumption, and secondly at step 4082, increases the variable i_sample by 1. From step 4082, the processor moves onto step 4040 and proceeds from there.

If, at step 4070, sample is equal to 0, the processor proceeds to step 4084, and the processor tests to determine whether the complement of i_sample is equal to 0. If that complement is not equal to 0, then the processor sets i_sample equal to 1 at step 4086, and then moves to step 4080 and proceeds from there. If the complement of i_sample is equal to 0 at step 4084, the processor sets sample equal to 1 at step 4086 and then goes to step 4076 and proceeds from there as described above.

If, at step 4056, the analog-to-digital converter is not enabled—as indicated by ENA not being equal to 1—then the processor moves to step 4090. At this step, the processor sets a bit, new_ADC_values, equal to 0. As discussed below, when this variable is set to 0, the processor does not perform any current, voltage or temperature conversions. At the next step 4092, the processor tests to determine if i_sample is equal to N_SAMPLE. If these two values are equal, the processor resets i_sample to 1 at step 4086, and then proceeds to step 4030. If, in contrast, i_sample is not equal to N_SAMPLE at step 4092, then the processor proceeds to step 4082, wherein i_sample is increased by 1, and the processor then proceeds to step 4040 described above.

With the above-described duty-cycle program, the analog-to-digital converter produces digital data values for battery current, temperature and voltage once every 500 milliseconds. However, in order to conserve battery power if the battery current falls below the predetermined threshold level, these conversions are made at a slower frequency, determined by the variable N_SAMPLE. However, under these circumstances, it should be noted that even when the analog-to-digital converter is making the current, temperature and voltage conversions at a lower frequency, the processor continues to perform the capacity calculations and performs the alarm control, the charger control, and the LED display routines at the frequency, which preferably is once every 500 milliseconds. N_SAMPLE may be set by the manufacturer of the battery pack. Alternatively, the battery operating program may be designed so that N_SAMPLE may be set or varied by the user of the battery pack.

Figure 41:
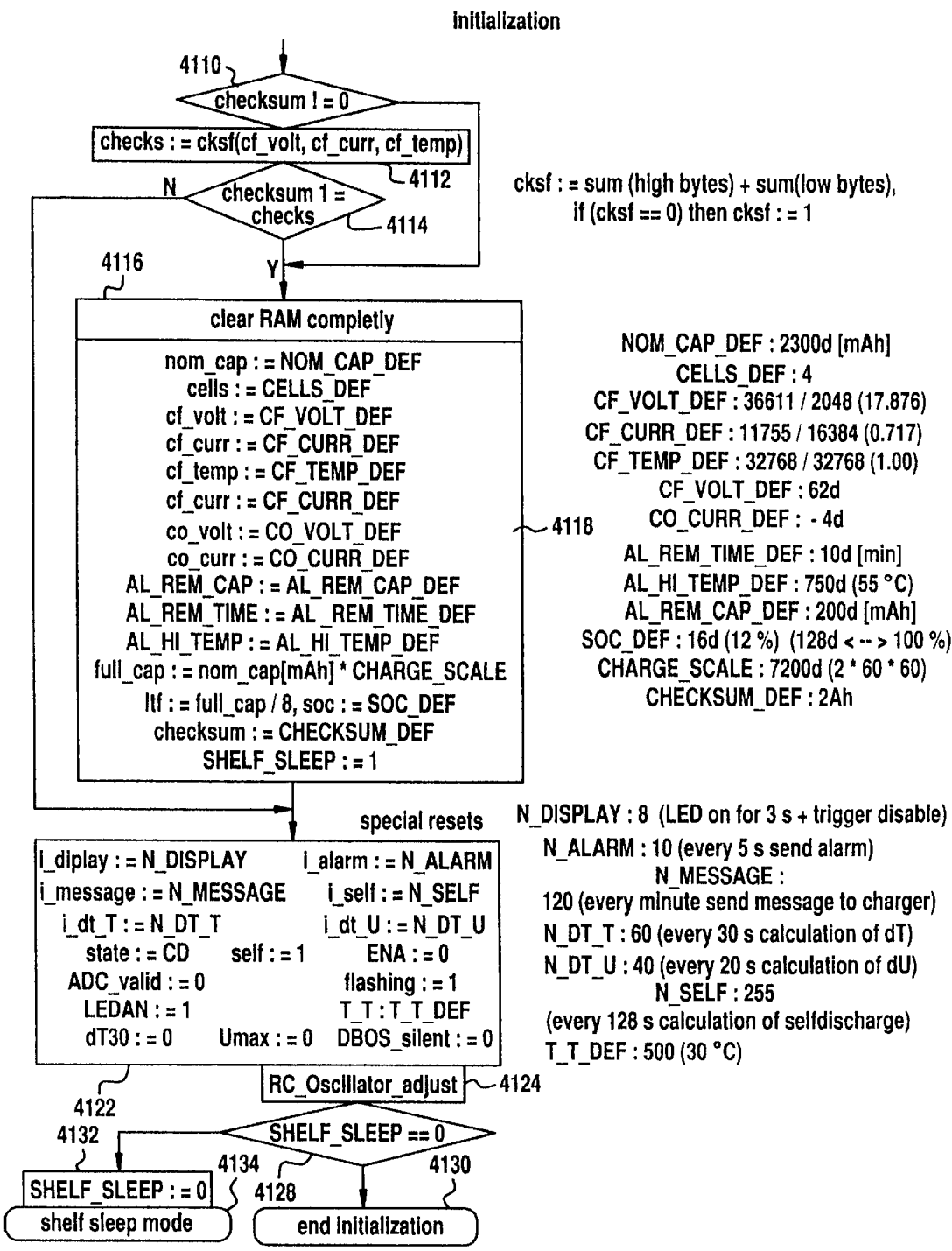
FIG. 41 illustrates an initialization routine of the operating program shown in FIG. 40.

FIG. 41 illustrates the initialization routine. Generally, this routine is used to initialize values used in the program, timers, states, and bit flags at selected times such as when the device wakes up from low voltage sleep, shelf sleep, watchdog time out, or power on from an off state. In addition, the initialization routine makes various checks, checks for RAM data loss, and preferably, in the case of data loss, reinitializes values that had been provided, pr programmed, at manufacture with default values.

At step 4110, the routine determines whether the complement of the value of a bit, referred to as checksum, is equal 0. If this complement is 0, the routine, at step 4112, then sets another variable, referred to as checks, equal to the byte sum of the three parameters used to calibrate the battery voltage (cf_volt), current (cf_curr) and temperature (cf_temp). Then, at step 4114 the routine determines whether the complement of checksum is equal to checks. If these two values are equal, then the routine clears the RAM at step 4116, and at step 4118 sets default values for:

i) a nominal full battery capacity,
ii) the number of battery cells in the battery,
iii) a battery voltage calibration factor,
iv) a battery current calibration factor,
v) a battery temperature calibration factor,
vi) battery voltage
vii) battery current,
viii) the remaining capacity at which a remaining capacity alarm will be generated,
ix) an estimated remaining operating time at which a remaining time alarm will be generated,
x) a temperature at which a high temperature alarm will be generated,
xi) a full charge capacity,
xii) a remaining capacity value,
xiii) a state of charge,
xiv) a checksum value, and
xv) the shelf sleep bit.

If, at step 4110, the complement of checksum is not equal to 0, indicating no checksum value has been written or that a fatal memory loss has occurred, then the processor proceeds directly to step 4116, clears the RAM memory and sets default values for the above-listed items. Also, if, at step 4114, the complement of checksum is not equal to checks, then the checksum test has been passed and the routine proceeds to step 4120, the normal procedure. After step 4118, the processor sets default values for an additional group of variables. In particular, at step 4122, the processor sets default values for:

i) i_display,
ii) i_alarm,
iii) i_message,
iv) i_self,
v) i_dt_T,
vi) i_dt_U,
vii) state,
viii) self,
ix) ENA,
x) ADC_valid,
xi) flashing,
xii) LEDAN,
xiii) T_T,
xiv) dT30,
xv) Umax, and
xvi) DBOS_silent.

After step 4122, an RC_Oscillator_adjust subroutine, discussed below, is invoked at step 4124 to calibrate the on-chip oscillator, and then the processor proceeds to step 4128 at which the processor tests to determine if the bit SHELF-SLEEP is equal to 0. If this bit is equal to 0—indicating that the shelf-sleep mode has not been initiated—then the initialization routine is exited at 4130. If, however, the shelf-sleep bit is set—indicating that the shelf-sleep mode has been initiated—then at step 4132 the bit is cleared, or set equal to 0, and the processor enters the shelf-sleep mode at step 4134.

Figure 42:
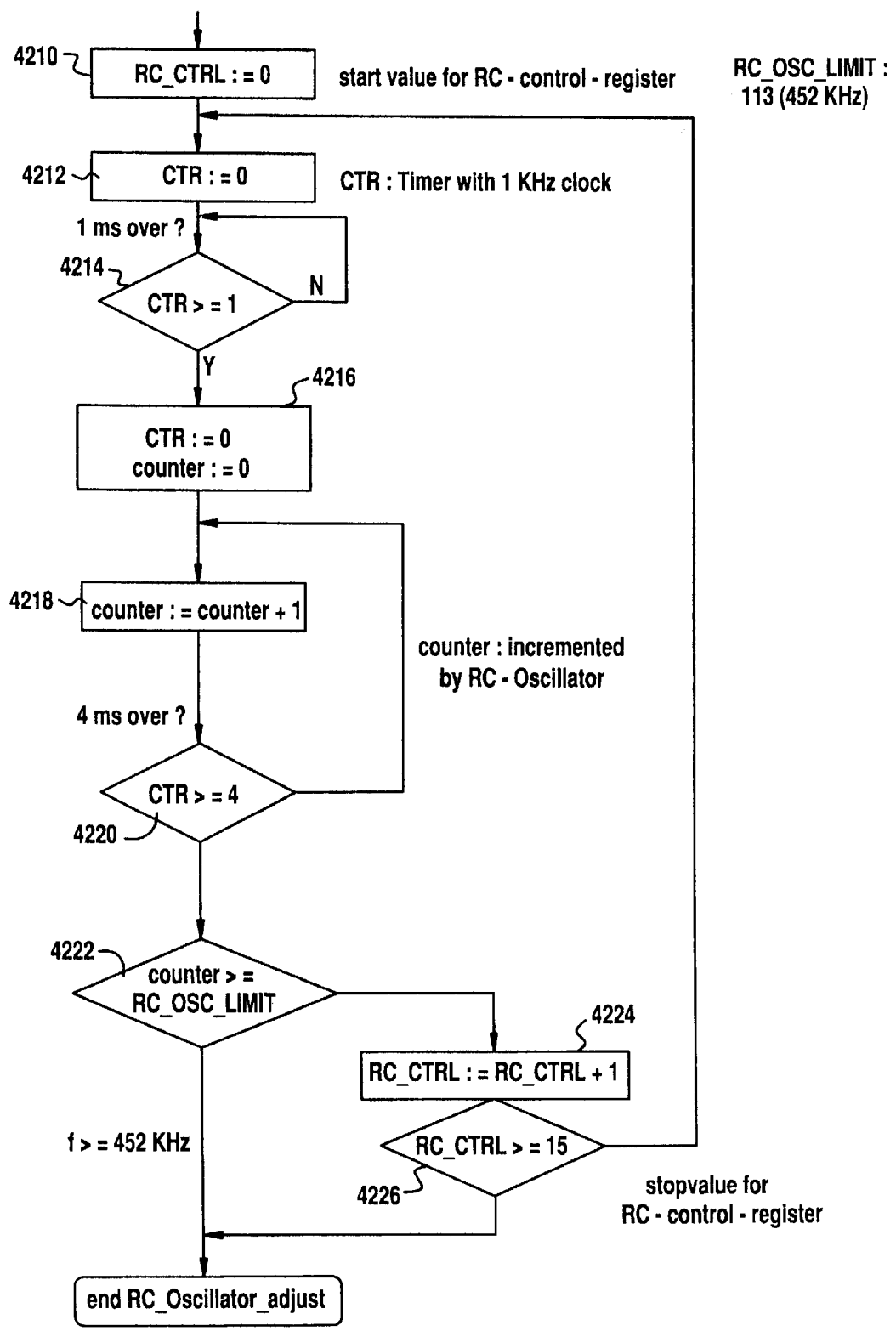
FIG. 42 is as flow chart for a routine used to calibrate an oscillator of the battery pack.

FIG. 42 generally shows the routine used to calibrate the oscillator. As discussed above, this oscillator is physically located on the chip, and preferably the oscillator is comprised of a resistor-capacitor network. Generally, in accordance with this routine, the processor counts the number of clock pulses generated by the oscillator during a given period of time; and if the number of counted pulses exceeds a given value, then the oscillator is adjusted to lower the frequency at which the oscillator generates these clock pulses. Preferably, this test is repeated a number of times until the oscillator is adjusted. In addition, the external oscillator is used to measure the above-mentioned given periods of time.

More specifically, at steps 4210 and 4212, two variables RC_CTRL and CTR are set to 0. RC_CTRL is used to tune the RC-oscillator frequency, and CTR is used to keep track of the length of each test. Each time the processor receives a signal from the external oscillator, CTR is increased by 1. At step 4214, the processor tests to determine if the CTR value indicates that more than 1 millisecond has elapsed since CTR was last set to 0; and this step is repeated until 1 millisecond has elapsed. When this happens, at step 4216, CTR is reset to 0, and another variable, counter, is set to 0. This counter variable is used to count the number of clock pulses generated by the oscillator. Each time the oscillator generates a clock pulse, the counter is increased by 1, as represented by step 4218, and then the processor tests at step 4220 to determine if the CTR value indicates that more than 4 milliseconds have elapsed since CTR was reset. These steps are repeated until 4 milliseconds have elapsed; and then the processor proceeds to step 4222 at which the processor compares counter to a predetermined number, represented as RC_OSC_LIMIT. If counter is less than RC_OCS_LIMIT—which indicates that the oscillator is generating clock signals at too slow of a frequency—then the processor moves to step 4224 and RC_CTRL is increased by 1, increasing the RC-oscillator frequency.

Next, RC_CTRL is compared, at step 4226, to a given value, such as 15. If RC_CTRL is less than or equal to this given value, the routine returns to step 4212 and repeats the previously explained steps. When, however, at step 4226, RC_CTRL is greater than the given value, then from step 4226, the routine is terminated. If, during one of these test periods, counter is equal to or greater than RC_OCS_limit—which indicates that the oscillator is generating clock signals at the correct frequency—then, from step 4222, the routine terminates. Any acceptable procedure may be used to adjust the frequency at which the oscillator generates clock signals; and, for instance, the resistance, the capacitance, or both the resistance and the capacitance of the oscillator, may be varied to change that frequency.

Figure 43:
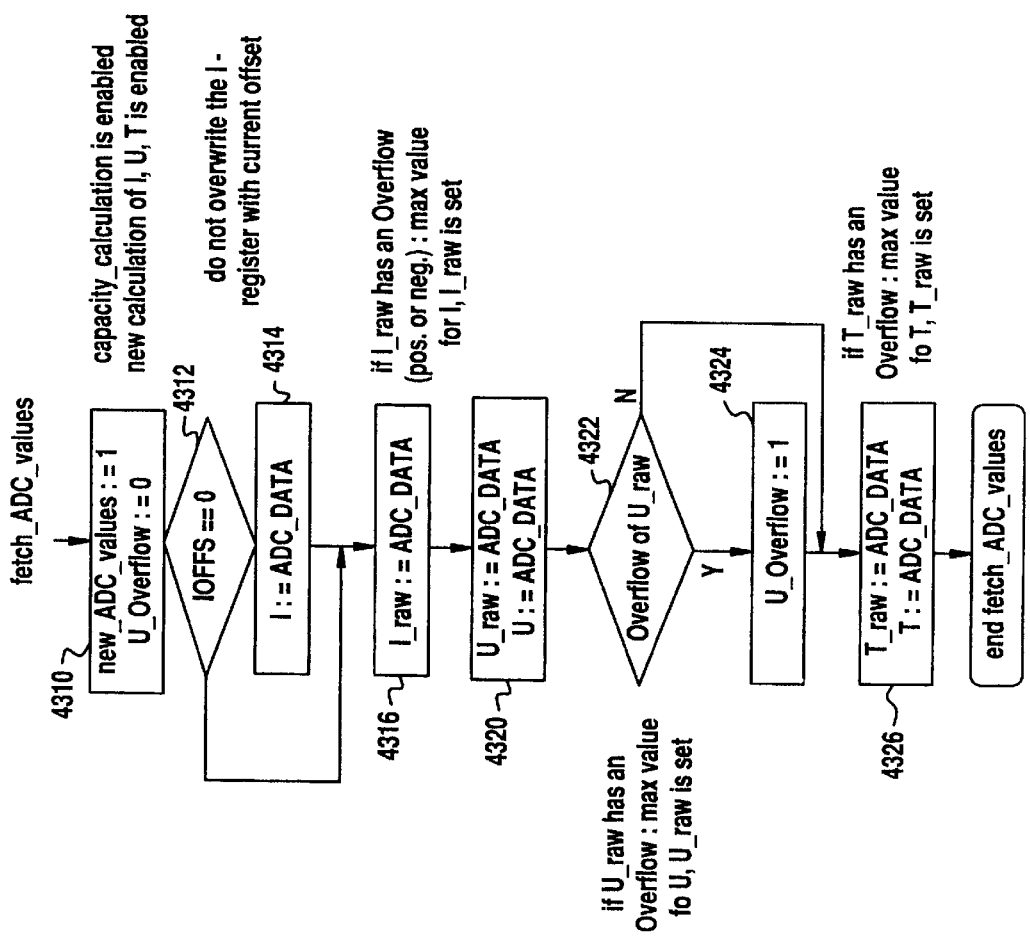
FIG. 43 shows a routine for transferring data values from an analog-to-digital converter to a processor of the battery pack.

FIG. 43 illustrates a routine to transfer data values from the analog-to-digital converter to the processor. The first step 4310 in this routine is to set a first variable, new_ADC_values, to 1 and to set a second variable, U_Overflow to 0. By setting new_ADC_values to 1, the processor enables itself to make various subsequent calculations. Next, at step 4312, the processor tests to determine whether the bit flag IOFFS is equal to 0. This bit flag is normally equal to 0, but is set to 1 every 30 seconds when the auto offset calibration mode is active. Then the processor in the next two steps 4314 and 4316 sets two variables, I and I_raw, both equal to ADC_DATA, the value for battery current presently available at the analog-to-digital converter. If, at step 4312, IOFFS is not equal to zero, then the processor skips step 4314 and proceeds directly to step 4316.

After step 4316 the routine proceeds to step 4320, and the processor sets two variables, referred to as U_raw and U, equal to ADC_DATA, which is the value for battery voltage presently available at the analog-to-digital converter. Next, at the step 4322, the processor tests to determine if a voltage overflow condition exists, which is determined by whether the battery voltage value obtained from the analog-to-digital converter exceeds a preset level. If a voltage overflow exists, then the processor sets U_Overflow to 1 at step 4324. At step 4326, the processor sets two variables, T_raw and T to ADC_DATA, which is the battery temperature value presently available at the analog-to-digital converter. The processor also tests to determine whether a temperature overflow condition exists; and if it does, T_raw and T are both set to preset maximum values. After step 4326, the processor ends this fetch ADC values routine.

Figure 44:
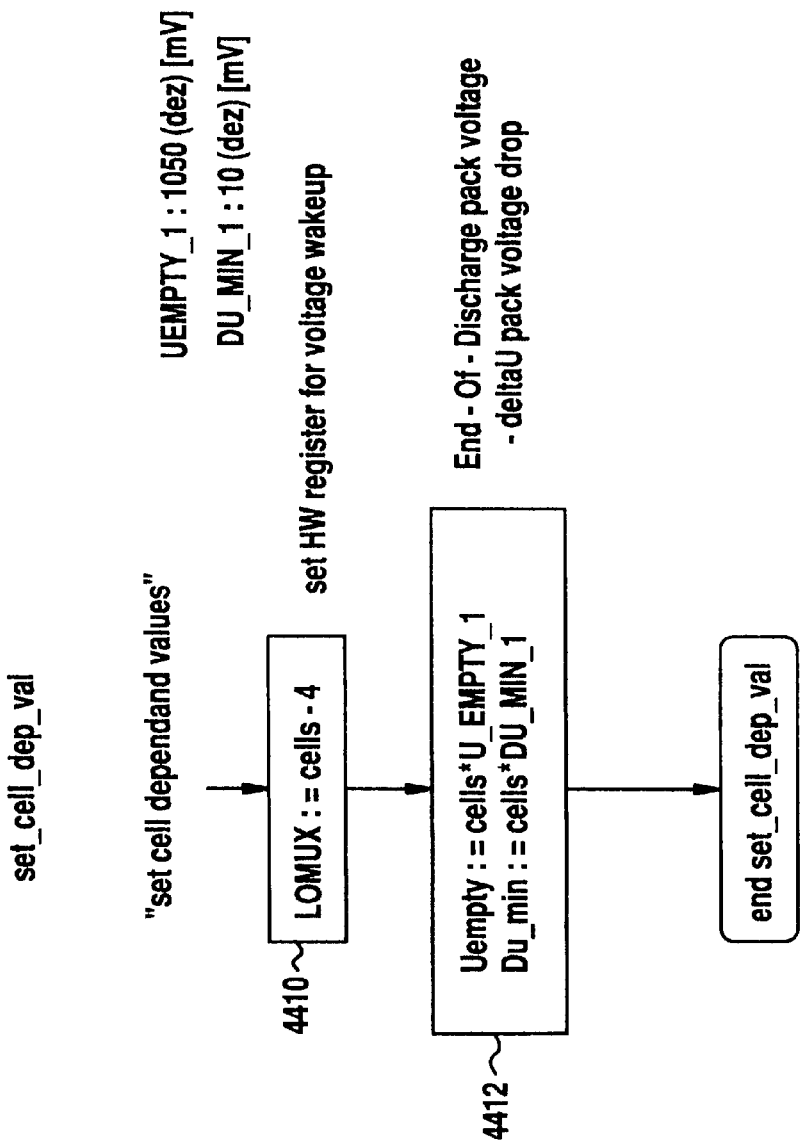
FIG. 44 shows a routine used to determine various values that depend on the number of battery cells in the battery pack.

FIG. 44 shows the routine used by the processor to set various cell dependent values; that is, values that depend on the number of cells in the battery pack. At step 4410, the processor sets a variable LOMUX equal to the number of cells in the battery pack minus 4. As discussed below, LOMUX is used to determine the battery voltage level at which the processor will wake up from the sleep mode. At step 4312, the processor sets a variable U empty equal to the value of U_EMPTY_1 times the number of cells in the battery pack, and sets a variable Du_min equal to the value of Du_MIN_1 times the number of cells in the battery pack. As discussed below, U empty is the end of discharge voltage, and Du_Min is the $\Delta V$ value used to determine end of charging. After these values are set, the processor ends this routine.

Thus, with the above-discussed procedure, the end of discharge voltage and the $\Delta V$ threshold are set by multiplying the number of cells in the battery pack by a per cell value. Preferably, the per cell values, U_EMPTY_1 and Du_MIN_1, are stored in ROM, and the number of cells in the battery pack are written in RAM.

Figure 45:
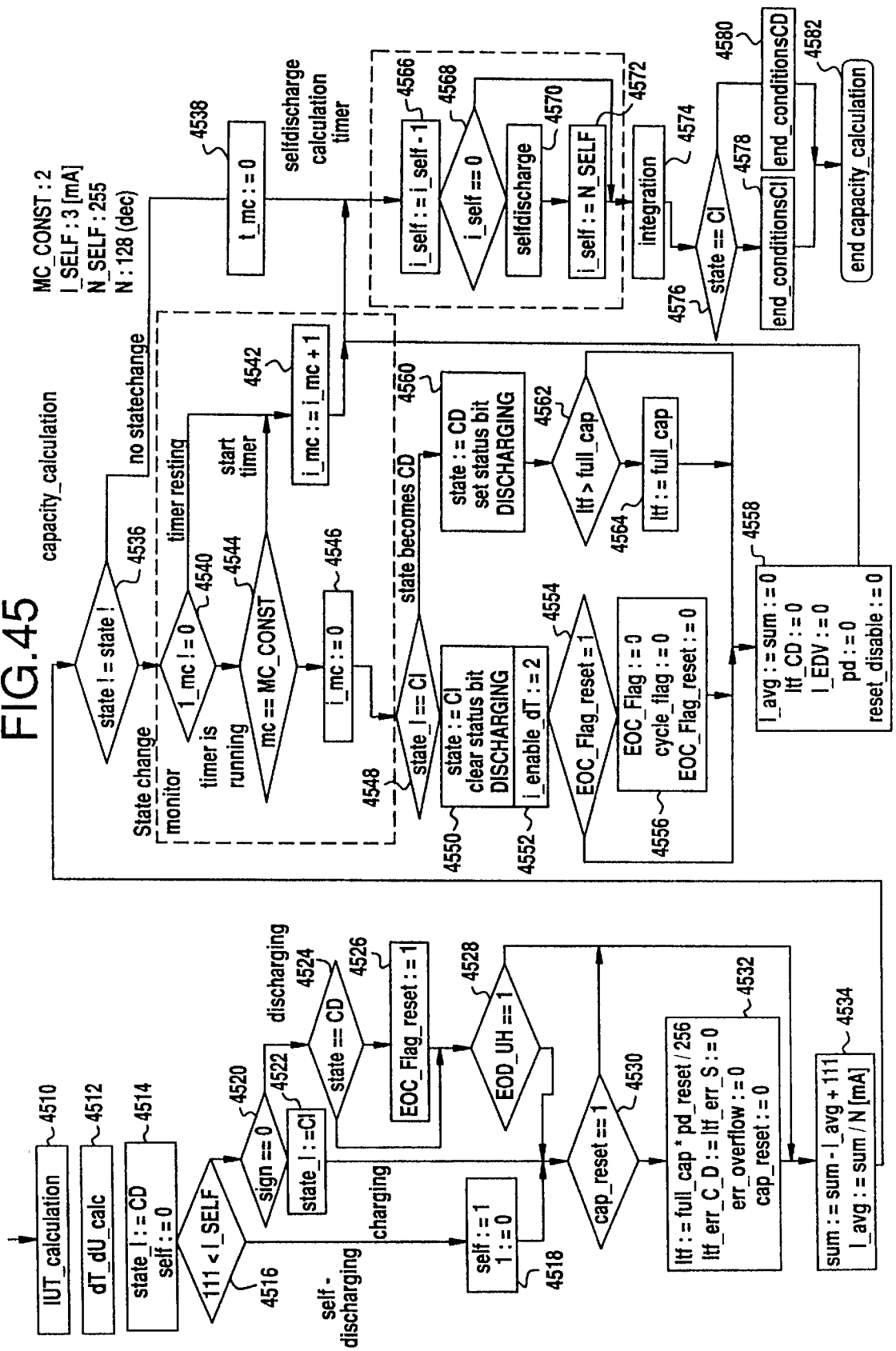
FIG. 45 illustrates a routine for determining the remaining capacity of the battery.

FIG. 45 shows the capacity calculation routine. This routine monitors continuously the capacity of the rechargeable battery, preferably in accordance with the following equation:

$$CAP_{rem} := CAP_{rem} + \Sigma \epsilon_c I_c \Delta t_c - \Sigma I_d \Delta t_d - \Sigma I_s \Delta t_s$$

In this equation, $CAP_{rem}$, is the remaining capacity of the battery at any given time, expressed in milliampere hours (mah). This remaining battery capacity is also represented by the symbol Itf. The terms $\Sigma \epsilon_c I_c \Delta t_c$, $\Sigma I_d \Delta t_d$ and $\Sigma I_s \Delta t_s$ which are discussed in greater detail below, represent, respectively, the sum of the incremental increases in capacity as the battery is being charged, the sum of the continuous decreases in battery capacity during discharging due to measurable current drain, and the sum of predicted decreases in battery capacity due to self discharge. By knowing the remaining battery capacity at all times, the processor is able to provide a host device and a battery charger with important information to help ensure safe and reliable use of the battery and to help prolong battery life.

The first step 4510 in the capacity calculation routine at is to invoke the IUT_calculation routine to calculate the present battery current, voltage and temperature. This latter routine is discussed in greater detail below. Generally, though, this routine converts the raw data values obtained from the analog-to-digital converter and representing battery current, voltage and temperature to data values that can be used in the capacity calculation routine.

Next, the processor at step 4512 invokes a routine, referred to as the dT_dU routine. Generally, the purpose of this routine, also discussed in detail below, is to determine the changes in the battery temperature and the battery voltage since the last time such changes were calculated. After the dT_dU routine is completed, the processor returns to the capacity calculation routine. At step 4514 thereof, the processor sets a first variable, state_I, to a value, represented by CD, which indicates that the battery is in a capacity decreasing mode. Also, a second variable, self, is set equal to 0.

At step 4516, the processor then determines whether the absolute value of the present battery current, I, is below a threshold value, represented as I_SELF, and that, for example, may be 3 mAs. If the absolute value of the current is below I_SELF, then the battery current is considered to be zero. Under the circumstances, when the processor determines changes to the battery capacity, the processor does not take into account battery current per se, however preferably the processor does not take into account power that is consumed by the host device. This power consumption factor is not based on battery current measurements made by battery pack, but instead is determined using data supplied by the host device. To elaborated, when the battery current is between +3 mA and −3 mA, many host devices, which frequently are computers, can indicate to the battery pack that the battery pack is being discharged, even though the battery pack itself cannot measure the battery current. When a host device has determined that it has consumed a given amount of power, such as 1 milliampere hour, the host device may set and transmit to the battery pack processor to decrease the present state of charge of the battery by that given amount.

More specifically, at step 4518, the processor resets self equal to 1, and sets the present value for current, I, to 0. If at 4516 the absolute value of the battery current is greater than 3 mA, then the processor proceeds to step 4520, where the processor checks the bit sign to determine whether the battery is charging or discharging. If sign is equal to 0, which indicates that the battery is charging, then at step 4522 the variable state_I is set to a value, referred to CI, to indicate that the battery is charging. If at step 4520 sign is not equal to 0, which indicates the battery is discharging, then at step 4524 the processor determines if the variable state is equal to CD. If so, then at step 4526 the variable EOC_Flag_reset is set to 1, and at step 4528, the processor determines if all of the bits (0, 1, 2, 3) of the variable eod_off [0.3] are equal to 1. If, however, at step 4524, state is not equal to CD, then the processor skips step 4526 and proceeds directly to step 4528.

The program proceeds from steps 4518 and 4522 and from step 4528 if the tested condition is true, to step 4530, where the routine determines whether a variable, referred to as cap_reset, is equal to one. If cap_reset is equal to one, the processor, at step 4532, calculates a new value for Itf and sets a number of variables to 0. In particular, the processor calculates Itf according to the equation:

$$Itf = full\_cap \times pd\_reset / 256$$

Where full_cap is the present value for estimated full battery capacity, pd_reset is a variable obtained from a look-up table and 256 is a scaling factor. Also, the variables ItF_err_C_D, Itf_err_S, err_overflow and cap_reset are all set or reset to 0.

The processor then proceeds to step 4534 where sum and I_avg are recalculated according to the equation:

$$sum = sum - I\_avg + |I|, \quad I\_avg = sum/N \text{ [mA]}$$

where N is a predetermined number.

If, at either steps 4528 or 4530 the tested statement is false, the processor proceeds directly to step 4534. After step 4534 is completed, the processor proceeds to step 4536 to determine if a state change has occurred. In particular, at step 4536, the processor determines whether the complement of state is equal to state_I. If these two values are equal, a state change may have occurred. A state change will be considered to have occurred if the complement of state is equal to state_I for a predetermined number, such as three, operations of the capacity calculation routine. If at step 4536 the complement of state is not equal to state_I, indicating that no state change has occurred, the program proceeds to step 4538, discussed below.

If at step 4536, the complement of state is equal to state_I, then the processor, at step 4540, determines whether the complement of the value of a timer, t_mc, is equal to 0. If this complement value is not equal to zero (that is, the timer itself is resting or equal to 0), the processor, at step 4542, then increases the value of t_mc by 1. However, if, at step 4540, the complement of timer t_mc is equal to 0 (indicating the timer is running), then the processor goes to step 4544 and compares the value of this timer to a predetermined constant MC_CONST. If these two values are equal (which will be the case after state is equal to state_I, at step 4536, for the predetermined number of consecutive operations of the routine) the processor resets t_mc to 0 at step 4546.

The processor then determines at step 4548 if state_I is equal to CI. If this is the case, then at step 4550 state is set equal to CI and the status bit DISCHARGING is cleared, and then at step 4552 the variable i_enable_dT is set equal to 2. At the next step 4554, the processor tests to determine if the EOC_Flag_reset variable is equal to 1. If this variable is set equal to 1, the processor, at step 4556, sets or resets the variables EOC_Flag, cycle_flag, and EOC_Flag_reset to 0. Then, at step 4558, the processor sets or resets I_avg, sum, Itf_CD, I_EDV, pd, and reset_disable to 0. If, at step 2252, EOC_Flag_reset is not equal to one, then the program skips step 2254 and proceeds directly to step 2256.

Also, if at step 4548, state_I is not equal to CI—which indicates that the battery is in a discharging state—then the program proceeds to step 4560 at which the variable state is set equal to CD, and the status bit DISCHARGING is set. From step 4560, the program proceeds to step 4562, where the processor determines whether Itf is greater than full_cap. If ItF is greater than full_cap, the processor then, at step 4564, resets Itf to be equal to full_cap, and then moves to step 4558. If, however, at step 4562, Itf is not greater than full_cap, the processor skips step 4564 and proceeds directly to step 4558.

After proceeding through the steps 4540–4564 described above to determine if a state change has occurred, the processor then proceeds through a series of steps to determine whether the present value for the self discharge current should be updated and, if so, to update that value. More specifically from each of steps 4538, 4542 and 4558, the processor proceeds to step 4566, where the variable i_self is decreased by one; and then, at step 4568, the processor tests to determine if i_self has reached 0. If i_self has reached 0, the self discharge routine, discussed in detail below, is invoked at step 4572; and after this routine is completed, i_self is reset to a predetermined number, represented by N_self. At step 4574, the processor performs an integration routine, also discussed below. If, at step 4568, i_self has not reached 0, then the processor skips steps 4570 and 4572 and proceeds to step 4574, where the integration routine is invoked. Thus, with the above-described procedure, the self discharge routine is invoked once for every predetermined number of operations of the capacity calculation routine, with that predetermined number being determined by N_SELF.

After the integration routine is completed at step 4574, the processor invokes either a first routine to test for the end of charging conditions or a second routine to test for the end of discharging conditions, depending on whether the battery is charging or discharging. In particular, from step 4574, the program goes to step 4576, which is to determine whether the variable state equals CI. If state equals CI, which indicates that the battery is charging, then at step 4578 the processor invokes the routine to test for the end of charging conditions; and if state does not equal CI, which indicates that the battery is discharging, then at step 4580 the processor invokes the routine to test for the end of discharging conditions. Both of these routines are discussed below, and when the invoked routine is completed the capacity calculation routine is ended, as represented by step 4582.

Figure 46:
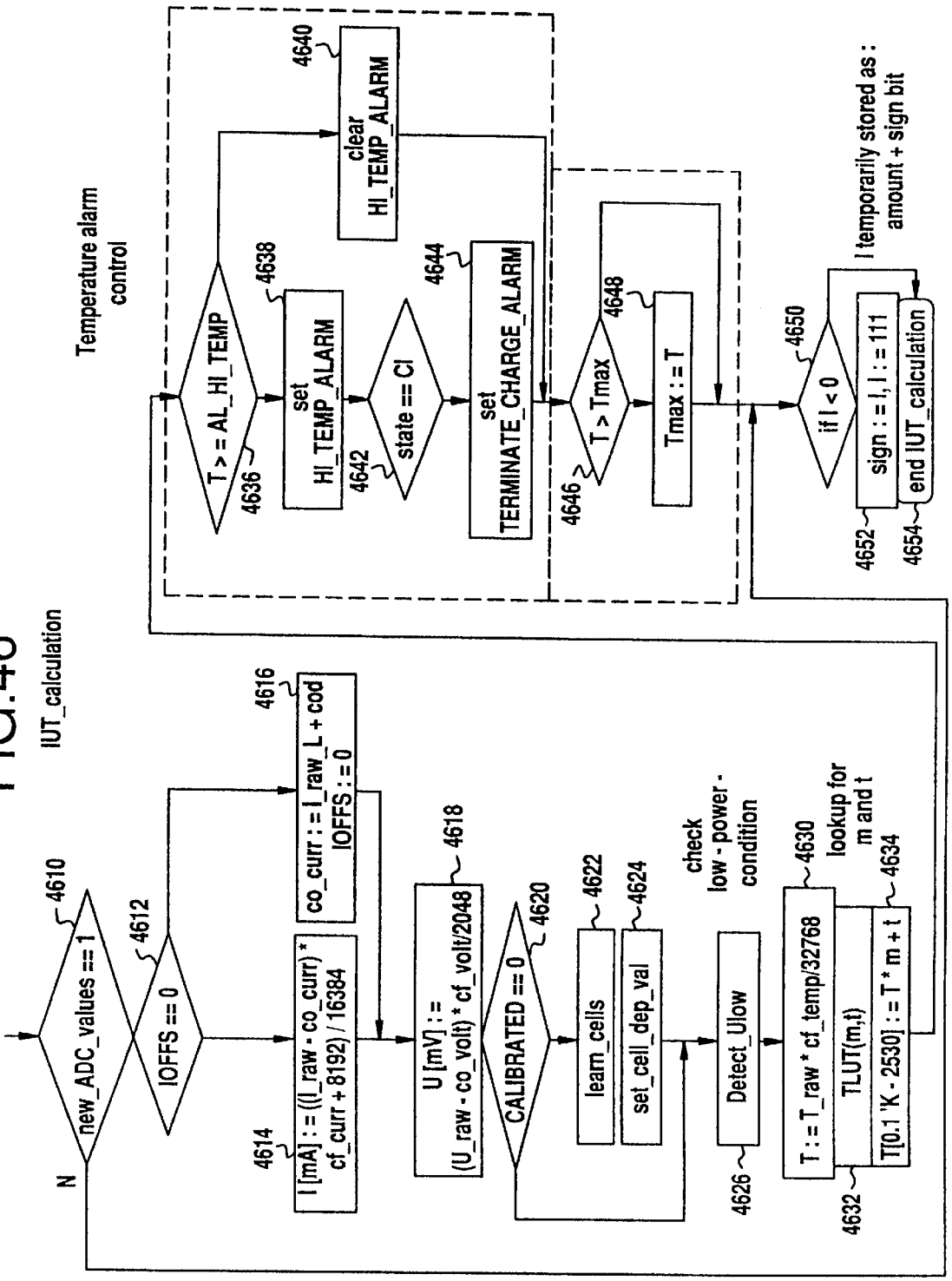
FIG. 46 is a flow chart for a routine used to convert output data of the analog-to-digital converter to data values in preferred units.

FIG. 46 illustrates the routine, referred to as the IUT calculation routine, that converts the output data values of the analog-to-digital converter for battery current, temperature and voltage into the correct numbers for the specific terms or units in which these parameters are preferably expressed. For example, preferably, the battery current, temperature and voltage are expressed in terms of milliamps, millivolts and °C. respectively; and the routine of FIG. 46 converts the output of converter to the numbers that are correct for these units. This routine also determines whether the temperature alarm should be set or cleared, and whether a terminate charge alarm should be set based upon a high temperature condition. In addition, the routine of FIG. 46 invokes other routines, for example, to determine the number of battery cells in the battery pack, to set various values that depend on that number of battery cells, and to check for a low power condition.

As background, the system operates in one of three (3) modes, (i) a run mode, (ii) a sample mode, and (iii) an off mode. In the run mode, the analog-to-digital converter makes a conversion every 500 milliseconds. In the sample mode, the analog-to-digital converter makes a conversion once every 3 minutes. However, in the sample mode, the microprocessor still operates in a 500 millisecond cycle using the last available analog-to-digital conversion. In the off mode, the microprocessor is not operating.

At step 4610 the processor determines whether a bit flag, new_ADC_values, is set to 1, which would indicate that the analog-to-digital converter has completed a conversion and contains new values. This step ensures that the converter is not reconverting values that have been already converted. This step 4610 may be used only in the sample mode, because in the run mode, the tested condition is always true. At step 4612, the processor determines if the bit IOFFS is set to 0, which is a determination as to whether the auto offset calibration procedure should proceed or not. This procedure occurs every 30 seconds.

When an auto offset calibration is not being performed, which is the normal condition, the processor proceeds to step 4614 at which the analog-to-digital converter output for current (I_raw) is converted into units of milliamps and stored as variable I. The values co_curr and cf_curr that are used in this calculation are preferably stored in the manufacturers data area. When the condition in block 4612 is false, the processor proceeds to step 4616 at which I_raw is not converted into units of milliamps, but the value co_curr is updated in the manufacturer's data area, and the auto offset calibration is disabled by setting IOFFS equal to 0. The Auto Offset Correction Procedure discussed above at step 2316 of FIG. 23 may be used at step 4616 of FIG. 46. From steps 4614 and 4616 the routine proceeds to step 4618, at which the analog-to-digital converter output for voltage, U_raw_co_volt, is converted into units of millivolts and stored as the variable U. After this voltage value is calculated, the processor, at step 4620, determines if the bit CALIBRATED is set to zero. If this bit is equal to zero, the at steps 4622, 4624 and 4626 the processor invokes a first routine to learn the number of cells in the battery pack, a second routine to set various cells that depend on the number of cells in the battery pack, and a third routine to determine whether the battery power is below a threshold level. If, however, at step 4620 CALIBRATED is not equal to zero, then the processor skips steps 4622 and 4624 and proceeds directly to step 4626.

After step 4626, the routine goes to step 4630. At this step, T_raw, which is battery temperature output from the analog-to-digital converter, is converted to a value T, which is a voltage representation of the battery temperature. In block 4632, values of m and t are obtained from a lookup table TLUT to obtain interpolation factors for temperature; and at step 4634 T is converted into units of tenths of a degree Kelvin by using these m and t values.

In block 4636, the value of the battery temperature T is compared with AL_HI_TEMP, the alarm limit high temperature. In the event T is greater than the alarm limit high temperature, the processor proceeds to block 4638 where the high temperature alarm safety bit is set to 0. If, however, at step 4636 the battery temperature is lower than the alarm temperature limit, the processor proceeds to block 4640 where the high temperature alarm safety bit is cleared. From step 46388, the processor proceeds to block 4642 to determine if the variable state is set to CI, which would indicate that the battery is in a capacity increasing state. If state is equal to CI, then the processor proceeds to block 4642 where the bit flag TERMINATE CHARGE ALARM is set. If state is not equal to CI, then the processor proceeds to block 4646.

Blocks 4646 and 4648 forma subroutine that determines if the value T is greater than a variable Tmax, and if so sets Tmax equal to T. In this way, this subroutine continuously records the maximum temperature of the battery. The value of the current, I, can be positive or negative, and in block 4650 I is tested to determine if it is negative. If the value of the current, I, is negative, then in block, 4652 that value is divided into a variable bit sign, which if 1 represents a negative current, and an absolute value of I. Block 4654 ends the IUT_calculation routine.

Also, in the IUT calculation routine, if at step 4610 the bit new_ADC_values is not equal to one—which indicates that new values for battery temperature, current and voltage are not to be calculated in this cycle from the raw data values in the analog-to-digital converter, and that the processor will use the present available values for battery temperature, current and voltage in any calculations—then the processor skips most of the IUT calculation routine and proceeds directly from step 4610 to step 4650.

From step 4652 or from step 4650 if the current value is not negative, the IUT calculation routine is ended, as represented by step 4654.

Figure 47:
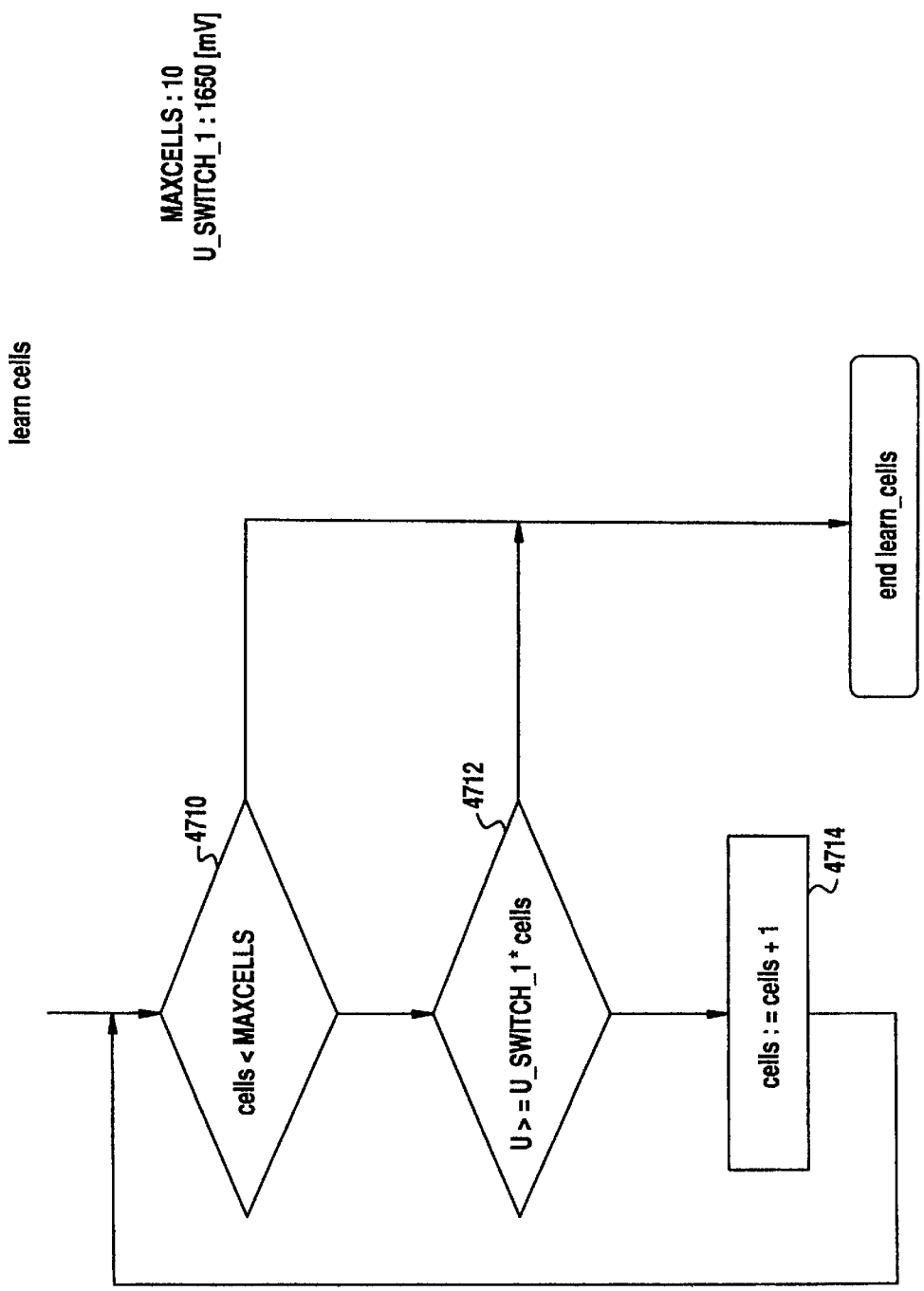
FIG. 47 shows a routine for determining the number of cells in the battery pack.

FIG. 47 shows the routine used to learn the number of cells in the battery pack. Generally, in accordance with this routine, if the voltage of the battery pack is above a level that would be a maximum for a battery pack having a given number of cells, then the processor assumes that the battery pack has at least one more than that given number of cells. The processor continues to count up the number of cells in the battery pack in this way until the battery voltage is reasonable for the present given number of cells. Preferably, the battery is at or near a full charge capacity when this routine is used.

More specifically, at step 4710, the processor tests to determine if the variable cells, which is the present count of the number of cells in the battery pack, is less than a maximum value, MAXCELLS. If the present value of cells is less than MAXCELLS, then, at step 4712, the processor determines whether the battery voltage is greater than or equal to the product of a predetermined value, identified as U_SWITCH 1, and the cells value. If the battery voltage is greater than or equal to that product, then the number of cells is increased by one at step 4714, and the routine returns to step 4710. Steps 4710, 4712 and 4714 are continuously repeated until either cells become equal to or greater than MAXCELLS, or the product of cells and U_SWITCH_1 becomes greater than the battery voltage. When either of these events occur, this routine is ended.

Figure 48:
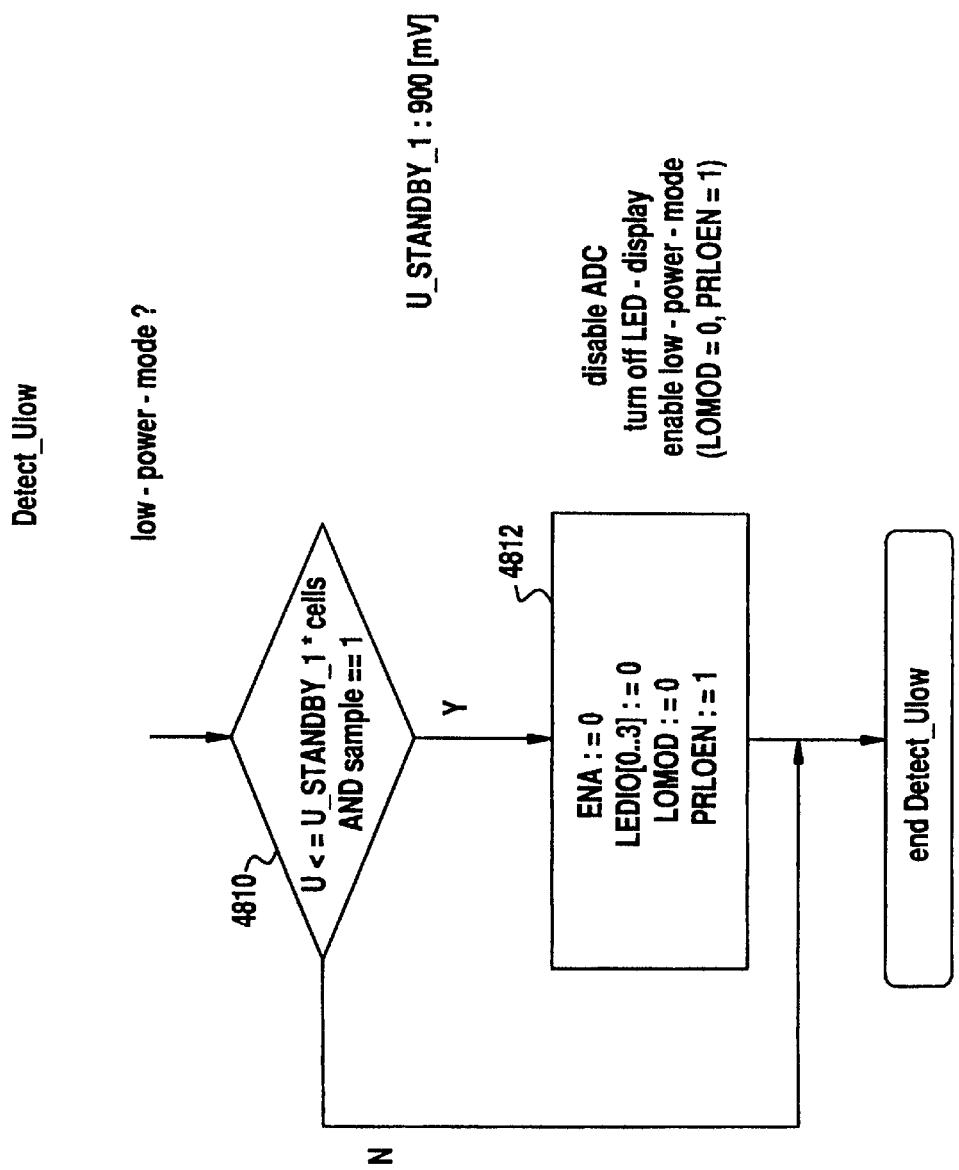
FIG. 48 shows a procedure for determining when the processor of the battery pack enters a low power, or sleep mode.

The routine to determine whether the processor enters the low power, or sleep, mode is illustrated in FIG. 48. Generally, the processor enters this mode when the battery voltage drops below a predetermined level, such as 900 millivolts, in a no load condition. In this mode, all chip functions are turned off, and power is only supplied to maintain the RAM. As discussed above, recovery from the low power sleep mode is made in hardware.

At step 4810, the processor makes two comparisons. First, the processor compares the battery voltage to the product of a value U_STANDBY_1 and the cells value; and second, the processor determines whether sample is equal to 1. If the battery voltage is less than or equal to the above-mentioned product, and sample is equal to 1, then the processor enters the sleep mode. To do this, at step 4812, ENA, LEDIO and LOMOD are all set to zero, and PRLOEN is set equal to 1. The processor then exits this routine. The processor also exits this routine if, at step 4810, sample is not equal to 1 or the battery voltage is greater than the product of cells and U_STANDBY_1.

Figure 49:
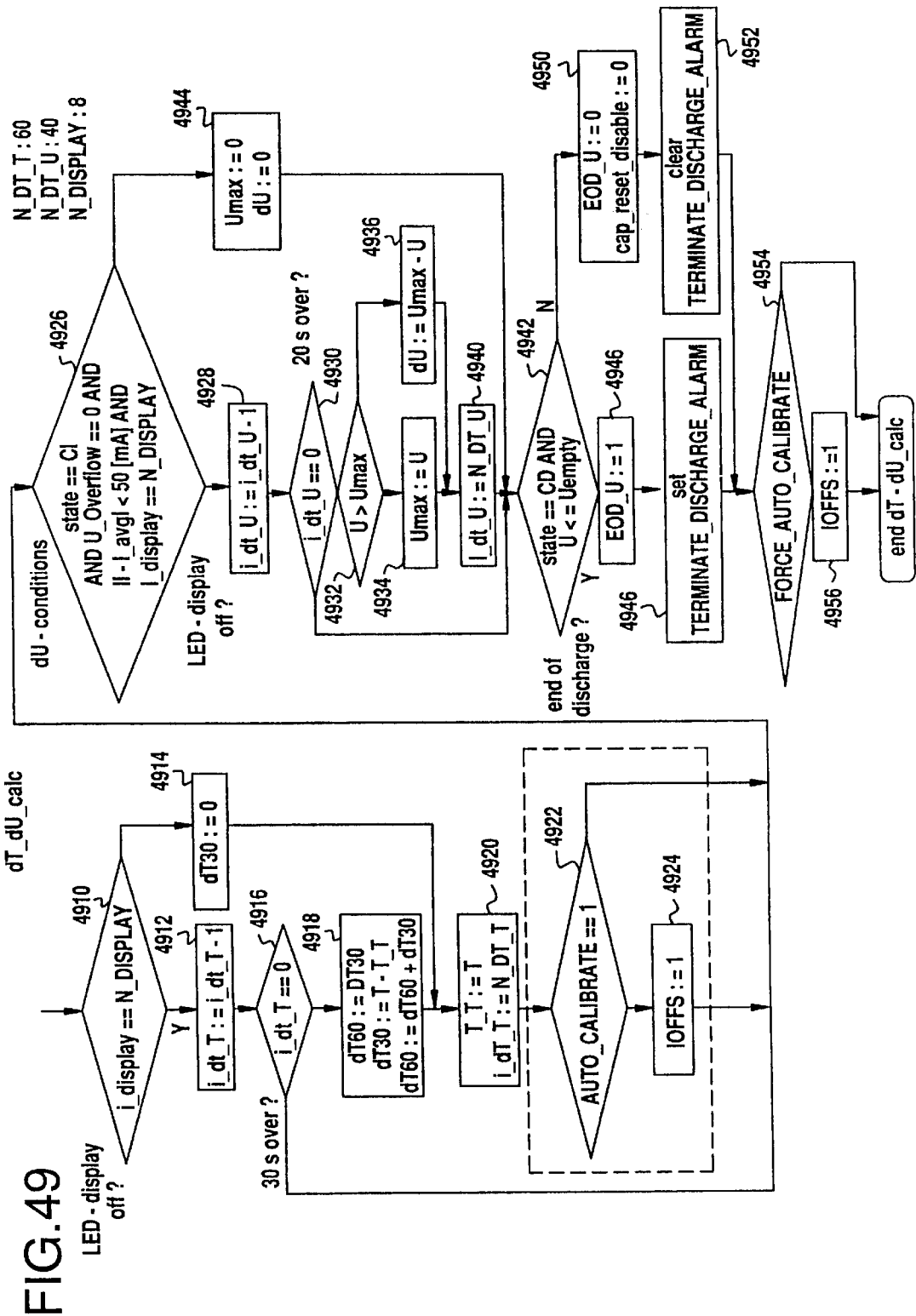
FIG. 49 illustrates a routine for calculating various temperature and voltage values.

FIG. 49 shows the routine to calculate various temperature and voltage changes. A first portion or section of this routine is used to calculate the change in battery temperature over a given period of time. Generally, this temperature change is calculated every 30 seconds based on the change in battery temperature over the preceding minute.

More specifically, at step 4910, the processor determines whether the LED display is on or off, and the processor does this by testing whether I_DISPLAY is equal to N_DISPLAY. If these two values are equal, the LED display is off, and the program goes to step 4912, where the value for I_DT_T is decreased by one. If, at step 4910, I_DISPLAY is equal to N_DISPLAY, the LED display is on, and the program goes to step 4914, where DT 30 is set equal to zero. In effect, at step 4914, the processor overrides the actual battery temperature measurement, since this might be affected by heat from the LED, and sets DT 30 to a value of zero.

From step 4912, the program proceeds to step 4916, where the processor checks to determine if the timer value I_DT_T has timed out, or become equal to zero. If this timer has timed out—which indicates that it is time to calculate DT/DT—then the processor determines both the change in the battery temperature over the last 30 seconds, and the change in the battery temperature over the last minute. The former value is designated as DT 30, and the latter value is designated as DT 60.

To do this, at step 4918, the processor, first, transfers the present value for DT 30 to DT 60. Next, the processor calculates a new value for DT 30 by subtracting the battery temperature 30 seconds ago, T_T, from the present battery temperature, T. Then, the processor determines DT 60 by adding the DT 30 value and the value just previously transferred from DT 30 to DT 60.

From steps 4914 and 4918, the processor goes to step 4920. At this step, the present value for battery temperature, T, is transferred to T_T, thus clearing T for the next battery temperature measurement; and I_DT_T is reset to END_DT_T, thus resetting the timer for calculating the DT values. After step 4920, the processor at step 4922 determines whether the autocalibrate flag is set. If this flag is set—that is, AUTO_CALIBRATE equal to 1—then at step 4922 IOFFS is set equal to 1.

From step 4922, the routine proceeds to step 4924. The routine also goes to step 4924 from step 4912 if the DT timer has not timed out, and from step 4922 if the autocalibrate flag is not set.

Step 4924 and the immediately following steps are done to determine if a DU value should be calculated, and if so, to calculate that DU value.

At step 4926, the processor tests to determines whether a number of conditions are simultaneously met. These conditions are: (i) STATE equals CI, (ii) U_OVERFLOW equals zero, (iii) |I_AVG| is less than a given value such as 50 milliamps, and (iv) I_DISPLAY is equal to N_DISPLAY. Generally, these tests indicate, respectively, that (i) the battery is charging, (ii) a current overflow condition does not exist, (iii) a temporary current aberration does not exist, and (iv) the LED display is off. If all of these conditions exist, the processor decreases the DT_UTIMER by one at step 4928.

After step 4928, the processor, at step 4930 determines of the DT_UTIMER has timed out. If this timer has timed out, the processor, at step 4932, then compares the present battery voltage to the maximum stored battery voltage, UMAX. If U is greater than UMAX, the battery voltage is increasing and UMAX is updated; while if U is not greater than UMAX, the battery voltage is not increasing and ΔV is calculated. Specifically, UMAX is updated at step 4934 by being set equal to U; and ΔV is calculated at step 4936 by being set equal to UMAX—U. After either step 4934 or step 4940, the DU TIMER is reset at step 4940, and the processor then moves on to step 4942.

If, at step 4930, the DU timer has not timed out, the routine proceeds directly to step 4942, skipping over steps 4932–4940. In addition, if at step 4926, one of the conditions for which the processor tests does not exist, then the processor, at step 4944, sets UMAX and DU to zero values, and then the processor moves to step 4942, skipping over steps 4926–4940.

At step 4942, the processor determines if an end of discharge condition has been reached. Specifically, the processor determines if the state of the battery is discharging, and if the battery voltage is less than a predetermined threshold level, represented as UEMPTY.

If both of these conditions exist, the battery is considered to have reached an end of discharge. Under these conditions, the end of discharge flag EODU is set, or set equal to 1, at step 4946, and then the terminate discharge alarm is set at step 4948. If, at step 4942, one of test conditions does not exist, then the battery is considered not to be at an end of discharge. Under these conditions, at step 4950, the end of discharge flag is cleared, or set equal to 0, cap reset disable is set equal to 0; and then at step 4952, the terminate discharge alarm is cleared.

From both steps 4948 and 4952, the processor goes to step 4954 and determines if the force auto calibrate flag is set. If this flag is not set, the routine terminates. If, however, the force auto calibrate flag is set, then IOFFS is set equal to 1 at step 4956, and the routine then ends.

Figure 50:
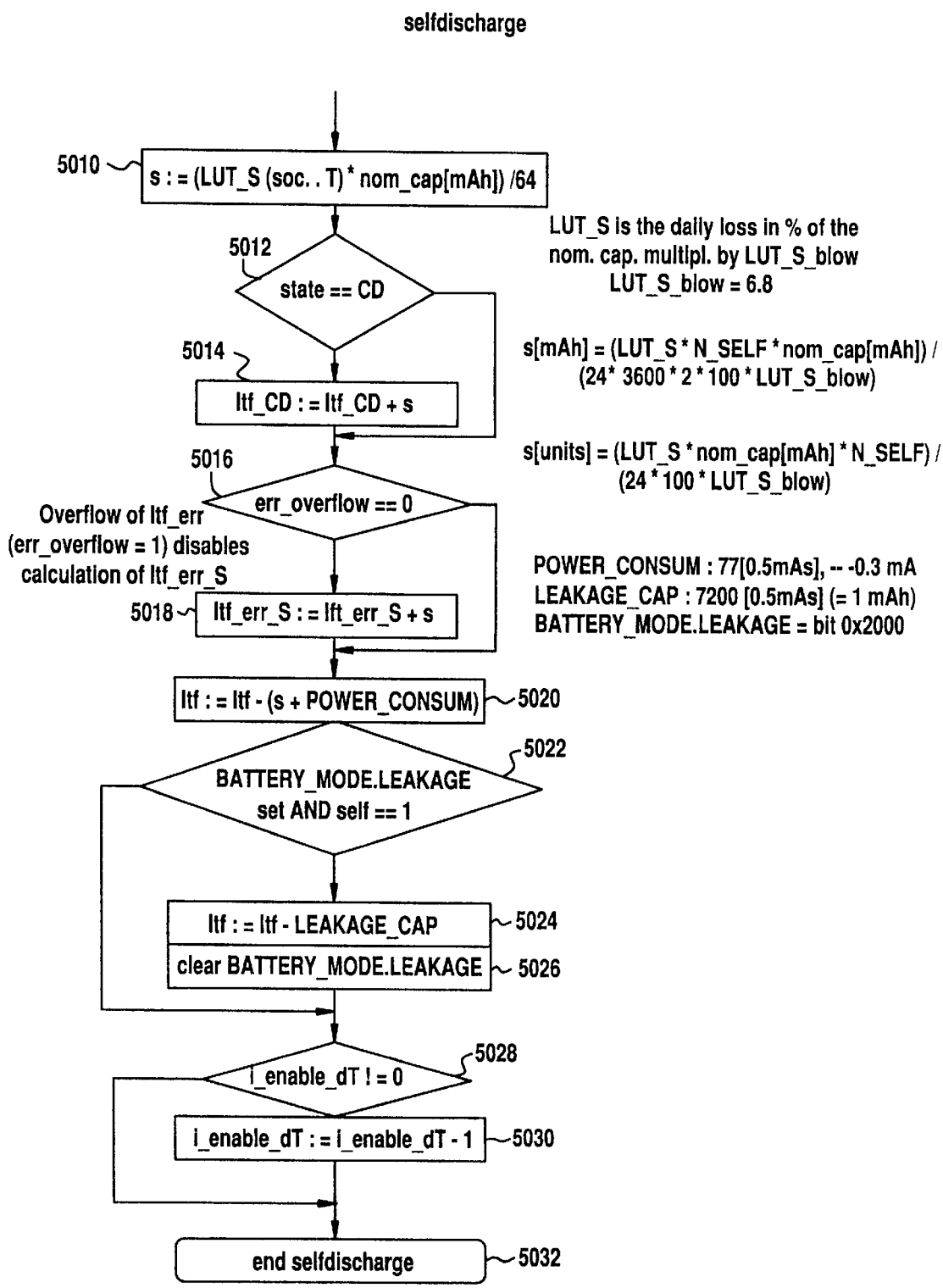
FIG. 50 shows a routine used by the processor to calculate the decrease in battery capacity due to self discharge of the battery cells.

FIG. 50 outlines the routine, referred to as the self-discharge routine, used to calculate the decrease in battery capacity due to self discharge. The first step 5010 in this routine is to determine a value for a variable s that represents a nominal capacity loss. This value is determined by multiplying two other values. The first of these two other values is obtained from a look-up table on the basis of battery state of charge and battery temperature, FIG. 13, and represents a nominal percentage loss of capacity; and the second of these two other values represents the nominal capacity of the battery, as expressed in terms or units suitable for the processor.

After s is calculated, the processor tests at 5012 to determine if the battery is discharging; and, specifically, the battery tests to determine if state equals CD. If the battery is discharging, then Itf_CD is increased by the value of s at step 5014. From step 5014, or from step 5012 if the battery state is not discharging, the processor goes to step 5016 to determine if the error overflow bit, err_overflow, is clear or equal to zero. If this bit is clear—that is, equal to 0—then at step 2618 the S component of the error value, Itf_err_S, is increased by s.

From step 5018, or from step 5016 if the error overflow bit is set, the processor proceeds to step 5020, where the capacity Itf is decreased by the sum of s and the present value for the variable POWER_CONSUM. After step 5020, the processor, at step 5022 determines if the BATTERY_MODE. LEAKAGE bit is set, and if the variable self is equal to one. If both of these conditions are true, then the capacity value is further adjusted at step 5024, and in particular, is decreased by the value of LEAKAGE_CAP. Then, at step 5026 the BATTERY_MODE. LEAKAGE flag is cleared. After step 5026, or after step 5022 if one of the conditions tested thereat is false, the routine moves to step 5028. At this latter step, the routine determines if the complement of i_enable_aT is equal to zero. If this complement value is equal to zero, then at step 530, i_enable_dT itself is decreased by 1, and then the routine ends at 5032. If, however, at step 5028, the complement of i_enable_dT is not equal to zero, the routine skips step 5030 and proceeds directly to the end at 5032.

Figure 51:
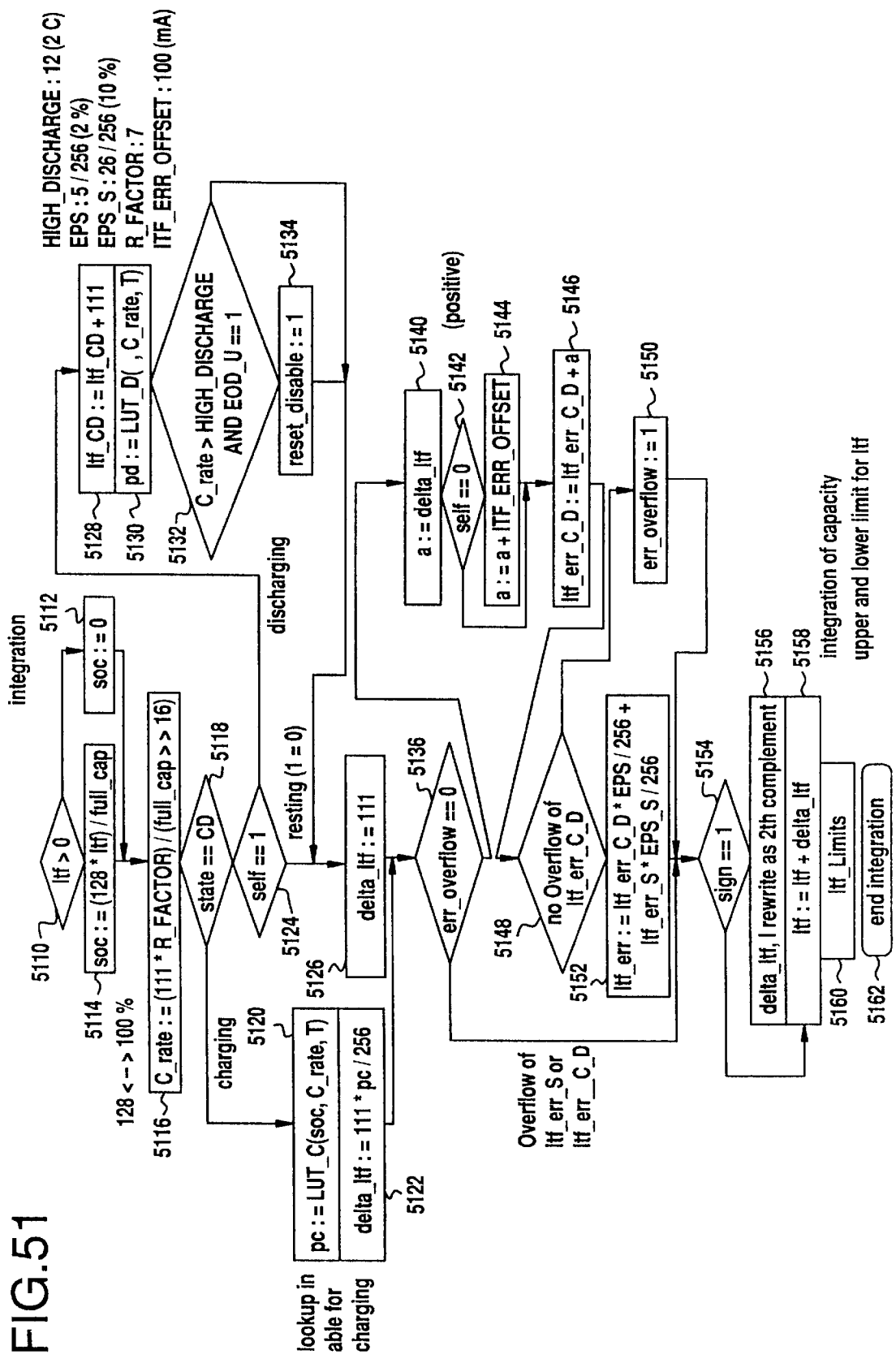
FIG. 51 is a flow chart showing a procedure for calculating changes in the remaining capacity of the battery.

The integration routine is shown in FIG. 51. Generally, this routine is used to determine the change in the battery capacity from the measured current discharged by or conducted to the battery when the battery is, respectively, discharging or charging. This routine also takes into account other factors, such as the decrease in the battery capacity due to self discharging.

This routine uses data from two look-up tables. A first look-up table provides factors used to determine the self discharging rates (FIG. 13b), and these factors also are empirically determined and depend on the battery relative state of charge and the battery temperature. A second look-up table (FIG. 12b) gives the residual capacity of the battery, as a fraction of full battery capacity, after the battery has reached an end of discharge condition. This residual capacity varies as a function of the battery temperature and the battery discharging current rate.

The first step 5110 in the integration routine is to determine whether the present value for remaining battery capacity is greater than 0. If the remaining battery capacity is not greater than 0, then at step 5112 the state of charge is set to 0. If the estimated remaining battery capacity is greater than 0, then the state of charge is calculated at step 5114 as a percentage of full capacity, on a scale such that a numeric value of 128 is the equivalent of 100%. At the next step 5116, the present C_rate is determined, and expressed on a scale such that a value of 64 is the equivalent of 1 C. The C_rate is defined as the rate at which it would take the battery to drain in one hour and is measured in units of reciprocal hours.

A determination is then made at step 5118 as to whether the battery is in a capacity increasing or a capacity decreasing state. If the capacity is increasing, then the battery is being charged, and the integration routine takes into account the efficiency with which the battery converts the charging current to increased capacity. Then, at step 5120, an efficiency factor is obtained from a look-up table, as a function of the battery state of charge, the C rate, and the battery temperature. Then, at step 5122, the increase in capacity for the present time interval, represented by the variable delta_Itf, is calculated by multiplying the battery current by the efficiency factor, pc, and dividing that product by the appropriate scaling factor, which in this case is 256. This delta_Itf is the EcIcAtc term in equation (1).

If at step 5118, it is determined that the battery capacity is decreasing, then the processor determines at step 5124 whether the self discharge flag is set or clear. If this flag is set—that is, equal to one—then the only capacity loss is due to internal battery discharging, and this value is calculated at step 5126 by setting delta_Itf equal to the absolute value for battery current. This delta_Itf term is the $I_s \Delta t_s$ term in equation (1).

If the self discharge flag is clear at step 5124, then the battery is discharging current to operate the host device, and the integration routine takes into account both the capacity loss due to self discharging and the capacity loss due to the current discharged to operate the host device. Steps 5128 and 5130 are performed to calculate the latter capacity loss. In particular, at step 5128, the present value for Itf_CD is increased by the absolute value of the battery current I, and then at step 5130 pd is obtained from a look-up table (FIG. 13b), as a function of the C rate and the battery temperature.

Next, at step 5132 the processor determines, first, if the C rate is greater than a preset value, represented by the variable HIGH_DISCHARGE, and second, if the end of discharge flag, EOD_U, is set high. If both of these conditions are true, then at step 5134 the reset_disable flag is set to 1, and the routine moves to step 5126. If, at step 5132, one of the tested conditions is not true, the routine skips step 5134 and proceeds directly to step 5126.

After delta_Itf is determined either at step 5122 or at step 5126, the processor checks to determine if the error overflow bit is set at step 5136. This bit is clear—that is, is set to 0—if both the self discharge error bit and the capacity decreasing error bit are clear. The error overflow bit is set, however—that is, equal to one—if either of these two error bits is set.

If the error overflow bit is clear at step 5136, the processor, at step 5140, then sets a equal to the present value for delta_Itf. After this, the processor determines at step 5142 if the self discharge flag is clear. If this flag is clear, the value of a is increased at step 5144 by the value of ITF_ERR_OFFSET, and then at step 5146 the value of Itf_err_C_D is increased by this value of a. If, however, at step 5142, the self discharge flag is not set, the program skips step 5144 and then proceeds directly to step 5146.

From step 5146, the processor determines, at step 5148, whether there has been an overflow in the value for Itf_err_C_D. If there has been an overflow, then the error_overflow bit is set at step 5150. If there has not been an overflow, then Itf_err is set at step 5152 to the sum of two numbers. The first of these numbers is Itf_err_C_D, adjusted by a factor, EPS (a constant shown in the upper right corner of FIG. 51) and divided by a scaling factor of 256. The second of these numbers is Itf_err_S, also adjusted by a factor, EPS_S, (a constant as shown in the upper right corner of FIG. 51) and divided by a scaling factor of 256.

From steps 5150 or 5152, the program proceeds to step 5154. The program will also proceed to step 5154 from step 5136 if, at step 5136, the error overflow bit is set. At step 5154, the processor determines whether the battery current is positive or negative, as indicated by the condition of the sign flag. If this sign is set, or equal to one, which indicates the battery is discharging, then at step 5156 the values for delta_Itf and I are rewritten as their respective 2th complement (a well known binary procedure). In effect, this converts delta_Itf and I to negative values. Then, at step 5158 Itf is increased by the value of delta_Itf. If the sign flag is clear, or equal to 0, at step 5154, then the program skips step 5156, and proceeds directly to step 5158.

After Itf is reset at step 5158, then a routine, discussed below, is invoked at step 5160 to determine whether this capacity value has reached upper or lower limits. When this Itf limits routine is completed, the integration routine ends at step 5162.

Figure 52:
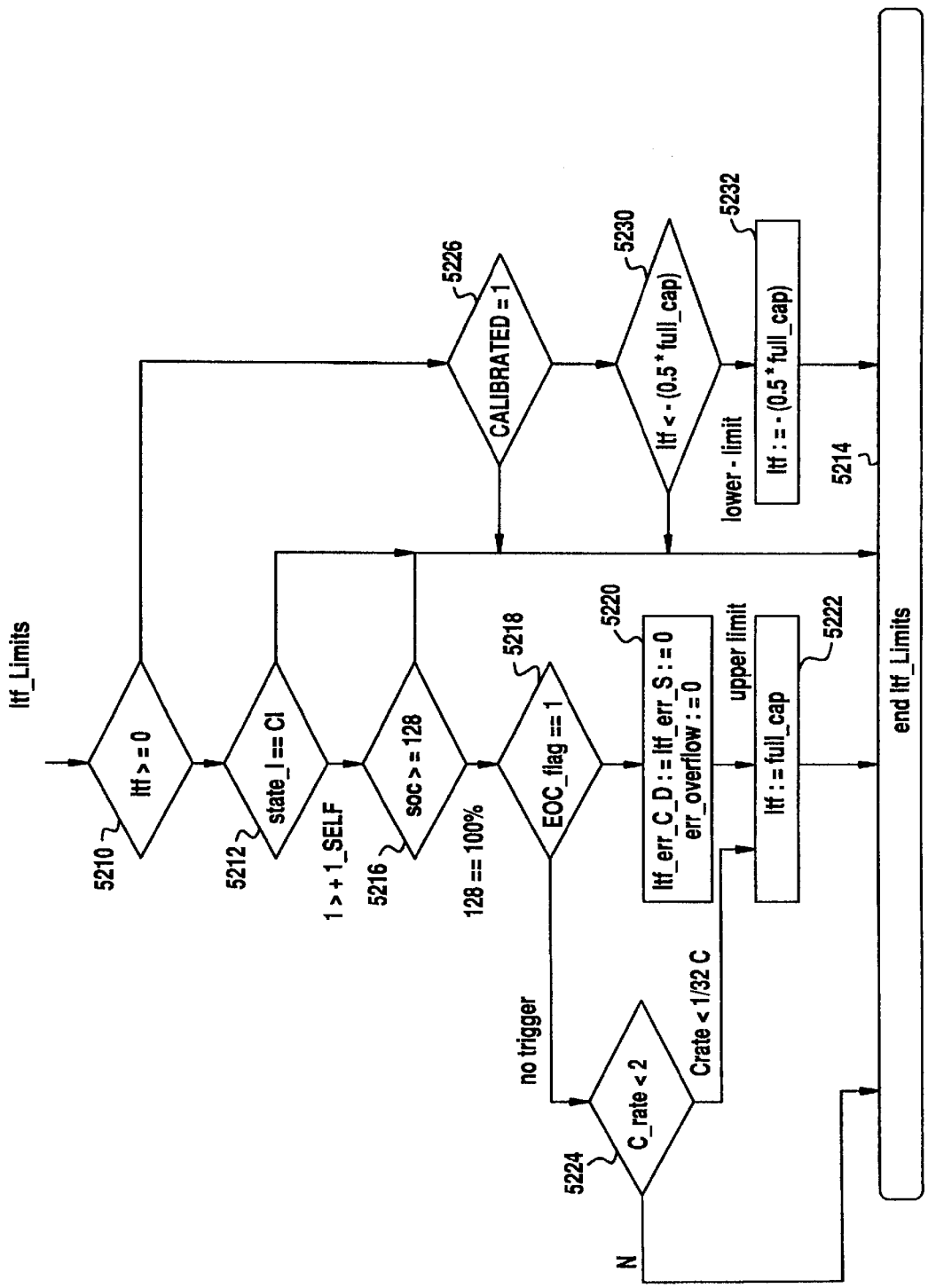
FIG. 52 illustrates a procedure used to determine wheter the remaining battery capacity has reached predefined upper or lower limits.

FIG. 52 shows the above-mentioned Itf limits routine. Generally, this routine is used to determine whether the calculated value for Itf has reached certain upper or lower limits, and, if so, how to respond. More specifically, at step 5210, the processor determines whether ItF is greater than 0. If ItF is greater than 0, then the processor checks the state_I flag at step 5212 to determine if the battery state is capacity increasing or capacity decreasing.

If the remaining battery capacity value is more than 0, and the battery state is capacity decreasing, then there is no need to determine whether that capacity value has reached its upper or lower limits, and the routine terminates as represented by step 5114. If, however, the remaining battery capacity value is more than 0, but the battery state is capacity increasing, then the processor checks to determine if that capacity value should be reset.

First, the processor checks the state of charge of the battery at step 5216. If that state of charge has a value less than 128, which corresponds to 100%, then there is no need to reset the remaining battery capacity value, and the routine terminates. If the state of charge is equal to or greater than 128, the processor then checks the end of charge flag at step 5218.

If the end of charge flag is set, then at step 5220 the error registers are reset to 0 and the error overflow bit is cleared, and at step 5222 the remaining battery capacity value is reset and the routine terminates at step 5214. If at step 5218, the end of charge flag is not set, then the processor at step 5224 checks to determine if the variable C_rate is below a preset value such as two. If this variable is below two, which corresponds to an actual C rate of less than c/32, then the remaining battery capacity value is reset at step 522 to the nominal full battery capacity. If though, at step the value for C_rate is not less than the preset value, then Itf is not adjusted, and the routine ends.

The Itf limits routine may, under certain circumstances, reset Itf to a lower limit. More specifically, if at step 5210, the remaining battery capacity value has, for some reason, become less than 0, then the program goes to step 5226 to determine if the calibration flag is set. If this flag is set and if, at step 5230, the remaining battery capacity value is less negative than a given negative fraction, such as ½, of the nominal full capacity value as determined at step 5222, then the routine, at step 5232, resets the remaining battery capacity value equal to that given negative fraction of the nominal full capacity value.

If the calibration flag is not set at step 5226 or if at step 5230 the remaining battery capacity value is greater than the given negative fraction of the nominal full capacity value, then the remaining battery capacity value is not reset, and the Itf limits routine ends.

Figure 53:
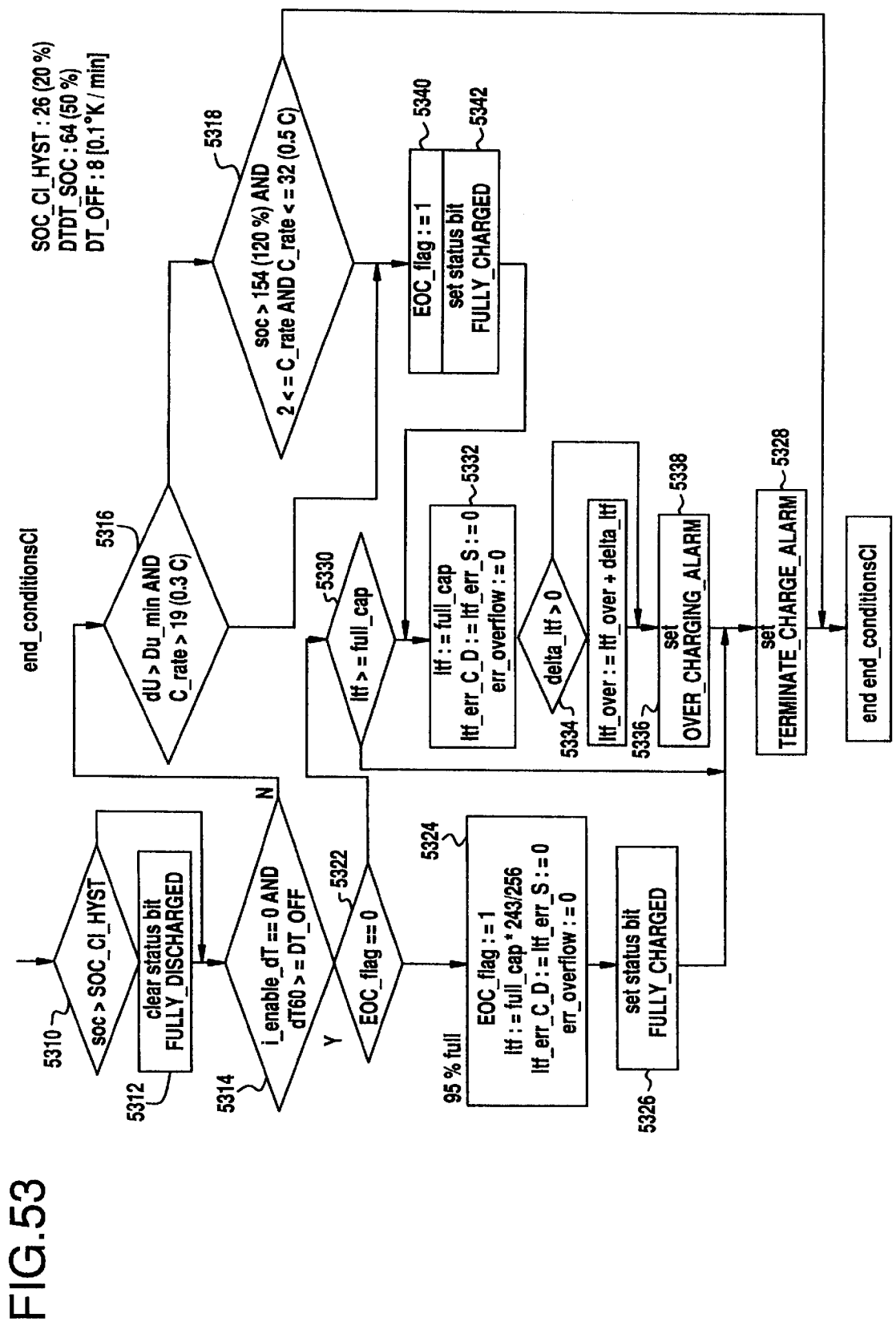
FIG. 53 shows a routine for determining when the battery pack has reached an end of charging.

FIG. 53 illustrates the routine, referred to as the end of capacity increasing routine, to determine when the battery has reached a condition referred to as end of charging. As discussed above in connection with the capacity calculation routine shown in FIG. 45, this routine is invoked at step 4578 when the battery state is capacity increasing. Generally, the battery is considered to have reached this condition when any one of three events occur: (1) during charging, the battery voltage decreases by more than a given amount, ΔV, from the peak battery voltage during charging, (2) during charging, the temperature of the battery increases at a rate that exceed a given rate, ΔT/Δt, and (3) during charging, the state of charge of the battery rises above a given percentage, such as 120%, of the nominal full capacity value. The end of charging routine is also used to set and clear various flags and bits.

With the preferred routine shown in FIG. 53, the processor, first, at step 5310, determines whether the battery state of charge is more than a given value, SOC_CI_HYST, such as 20% of the battery's nominal full charge capacity. If the state of charge is greater than this given value, the FULLY-DISCHARGED status bit is cleared at step 5312. From step 5310 or from step 5312, the routine then determines, in order, whether the ΔT/Δt, ΔV or SOC end of charge conditions have occurred.

More specifically at step 5314 the processor determines if the enable DT bit is clear and if the DT 60 value is greater than a preset amount, represented as DT. If one of these conditions is not true, then the Delta T/ Delta T end of charge condition is considered as not being met, and the program proceeds to step 5316. At this step, the processor determines if the DU value is greater than a preset amount, represented as DU MIN, and the C rate value is greater than a given amount such as 19, which corresponds to an actual C rate of approximately 0.3 C. If one of these two conditions is not true, then the Delta U end of charge condition is considered as not being met, and the program moves to step 5318. At this step, the processor determines if the battery state of charge is more than a given value, such as 120% of nominal full charge, and the value for C rate is within a given range such as 2 to 32 inclusive. If one of these conditions is not true, then the SOC end of charge condition is considered as not being met, and the routine ends.

If the DT/DT end of charge condition is detected at step 5314, the processor, at step 5322 determines if whether the end of charge flag is clear. If this flag is clear, the processor proceeds through steps 5324, 5326 and 5328. At step 5324, the end of charge flag is set, remaining to pass is that equal to a percentage, for instance 95%, of nominal full capacity value, and the error of variables are all set to 0. At step 5326, the fully charged status bit is set, at step 5328 the terminally charged alarm bit is set, and then the program ends.

If the end of charge flag is already set at step 5322, the program proceeds to step 5330 and compares the remaining battery capacity value to the nominal full capacity value. If the former value is greater then or equal to the latter value, than the program goes to step 5332. At this step, the remaining capacity value is set equal to the nominal full capacity value, and the error variables are set to 0. The processor then determines at step 5334, if Delta ITF is greater than 0. If Delta ITF is greater than 0, than at step 5336, a variable ITF is increased by Delta ITF; and then the over-charging alarm and the terminally charged alarms are set at steps 5338 and 5328 respectively, and the routine then ends.

If at step 5334, Delta ITF is not greater than 0 then the program skips to step 5336, and proceeds are set the over-charging alarm and the terminally charge alarm at steps 5338 and 5328. Further, if at steps 5330 the remaining battery capacity value is less than the nominal full capacity value, the program skips to step 5328, where the terminally charge alarm is set and the routine ends.

If the Delta V end of charge condition is detected at 5316, or if the state of end of charge condition is detected at 5318, then the processor proceeds through steps 5340 and 5342, where the end of charge flag and the fully charged status bits are set. From step 5342, the program moves to step 5332 and proceeds from there. Eventually, at step 5328, the terminally charged alarm is set and the routine then terminates.

Figure 54:
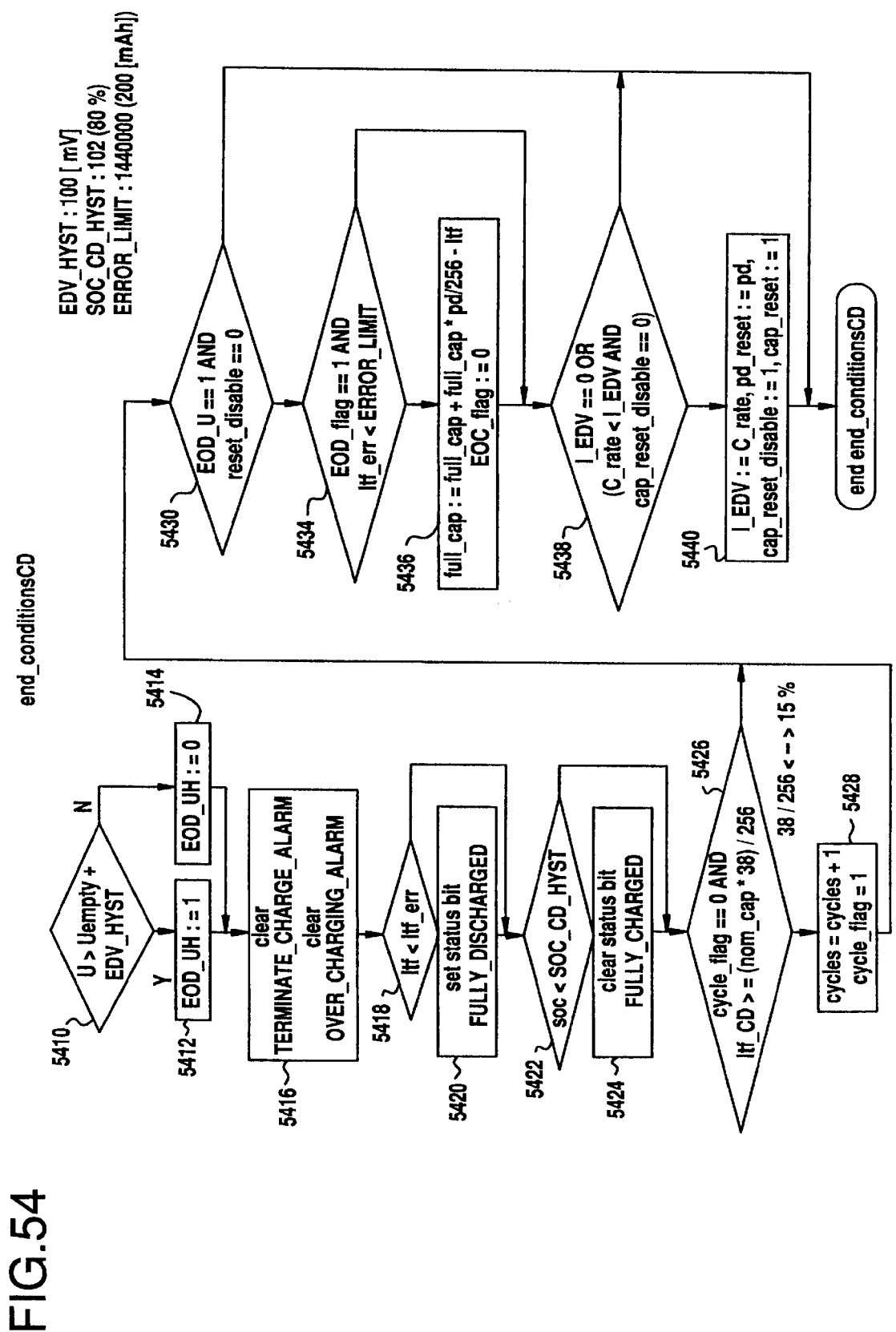
FIG. 54 is a flow chart for a routine for determining when the battery pack has reached an end of discharge.

FIG. 54 shows the routine, referred to as the end of capacity decreasing routine, used to determine when the battery has reached a condition referred to as end of discharging and that performs various functions at that time. As discussed above in connection with the capacity calculation routine shown in FIG. 45, this routine is invoked at step 4680 when the battery state is capacity decreasing. Accordingly, this routine is also used to perform certain functions appropriate when the battery is discharging.

The first step 5410 in this routine is to determine if the battery voltage is greater than a threshold value, U_EMPTY_HYST. If the battery voltage is greater than this value, then the end of discharge voltage flag EOD_UH is set equal to 1 at step 5412; while if the battery voltage is not greater than U_EMPTY_HYST then EOD_UH is set equal to 0 at step 5414. In either case, the routine moves to step 5416, where the TERMINATE_CHARGE_ALARM and the OVER_CHARGEING_ALARM flags are cleared.

After step 5416, the processor determines if the remaining battery capacity value is less than the capacity uncertainty value at step 5418. If this is the case, the FULLY_DISCHARGED status bit is set at step 5420. From step 5418 or step 5420, the processor moves to step 5422, where the state of charge is compared to SOC_CD_HYST. If the state of charge is less than this value, then the FULLY_CHARGED status bit is cleared at step 5424.

After steps 5422 or 5424, the processor determines whether the cycle count should be increased. In particular, the processor proceeds to step 5426, where the processor determines whether the cycle flag is clear and whether the present value of Itf_CD (which represents an accumulated value of incremental decreases in battery capacity) is greater than or equal to a given percentage, such as 15%, of nominal full capacity. If both of these conditions are true, the battery is considered to have completed a partial charge-discharge cycle significant enough to count as a cycle; and, at step 5428, the cycle count is increased and the cycle flag is set.

Next, the processor determines whether it is appropriate to recalculate the full capacity value and, if it is, to recalculate that value. At step 5430, the processor tests to determines whether the end of discharge voltage flag is set and the reset disable flag is clear. If one or both of these conditions is not true, the routine terminates. If, however, both of these conditions are true, the processor goes to step 5434.

At this step, the processor determines whether the end of charge flag is set and whether the capacity error value is below a preset limit, represented as ERROR_LIMIT. If both of these conditions are true, then at step 5436, the full capacity value is reset and the end of charge flag is cleared. The full capacity value is reset, or recalculated, according to the equation:

full_cap:=full_cap+(full_cap)(pd/256)−*Itf*

Thus, with this procedure, the full capacity value is reset by adding to the present full capacity value an adjustment value based on pd, which in turn depends on the discharge rate and temperature of the battery, and then subtracting from that sum the value for remaining battery capacity.

Reducing the full capacity value by the remaining capacity value, Itf, takes into account the aging of the battery. To elaborate, as the battery ages, typically the true full capacity of the battery decreases. Thus, at the end of a discharge cycle, the remaining capacity value will normally overstate the true remaining capacity of the battery. To help keep the nominal full capacity value substantially equal to the true full capacity value of the battery, that nominal full capacity value is decreased by the value for remaining battery capacity value at the time that the nominal full capacity value of the battery is recalculated.

After step 5436, or after step 5434 if one of the conditions tested therein is not true, the program proceeds to step 5438. At this step, the processor whether I_EDV is equal to 0. The second of these determinations is whether (i) the C_rate value is less than the I_EDV value, and (ii) the capacity reset disable flag is clear.

If either of these first and second conditions is satisfied, then, at step 5440, the processor (i) sets to the present C rate value, (ii) sets the pd_reset value equal to the present value for pd, (iii) sets the capacity reset disable flag and (iv) sets the capacity reset flag. The routine then terminates. Also, if neither of the conditions tested at step 5438 are true, then the routine also terminates, skipping step 5449.

FIG. 55 shows a procedure for monitoring and generating alarms relating to the remaining capacity and the remaining operating time of the battery. Generally, the purpose of the remaining capacity alarm routine is to advise the host device when the battery capacity falls below a threshold value, al_rem_cap. This notification is made by setting a remaining capacity alarm bit and then transmitting that bit to the host device. This information is useful to the host device because, for example, that device may be able to adjust its own operation to reduce its own power demands to help maintain a minimum power level needed to save the operating state of the host device. Preferably, the above-mentioned threshold value is initially set at manufacture, and for example, this value may be 10% of the desired capacity of the battery. Also, preferably, this threshold value may be adjusted by the host device. This enables that host device to more finely control when it will, for example, switch to a standby or sleep mode.

More specifically, the remaining time alarm advises the host device when a predicted remaining operating time of the host device falls below a threshold value. This predicted remaining time may be calculated in a number of different ways. In particular, this time value may be calculate based on the present battery discharge rate, or some other discharge rate, such as some averaged discharge rate. The preferred calculation is based upon the averaged discharge rate. Notification that this predicted operating time has fallen below the threshold value also may be made by setting a remaining time alarm bit and transmitting that set bit to the host device. Also, the above-mentioned threshold value may be, for example, 10 minutes.

For example, a predicted remaining operating time, based on the present battery discharge rate may be determined by the equation:

$$+= \frac{\text{full\_Cap} - \text{ltf}}{\text{AT\_RATE}}$$

where AT_RATE is the present battery discharge rate.

Analogously, a predicted remaining operating time, based on some averaged battery discharge rate may be determined by the equation:

$$+= \frac{\text{full\_Cap} - \text{ltf}}{\text{AVG}}$$

where AVG represents that averaged battery discharge rate.

Preferably, the predicted remaining battery time can be calculated from either the battery current discharge rate or the battery power discharge rate. Also, the uncertainty in the remaining battery capacity may be accounted for by subtracting that uncertainty from the numerators of the two above equations.

The first step, indicated as step 5510, in the alarm control routine is to verify the status of the remaining capacity. Specifically, a determination is made as to whether the AL_REM_CAP value is greater than 0 and that the remaining capacity (less the uncertainty error) is less than the AL_REM_CAP value. If these conditions hold true, the REMAINING_CAPACITY_ALARM bit is set at step 5512. If one or both of these conditions is not true, however, the REMAINING_CAPACITY_ALARM bit is cleared at step 5514. Next, at step 5516 the C_rate is calculated based on the one minute rolling average current, and at step 5518 the residual capacity adjustment factor, pd_avg, is assessed from the look-up table of FIG. 12b as a function of the battery C_rate and the battery temperature.

Then, at step 5520, a determination is made as to whether the battery state is capacity decreasing. If the battery capacity is decreasing, then a determination is made at step 5522 as to whether the AL_REM_TIME alarm threshold value is greater than 0. If so, then the estimated remaining time at the present discharge rate is calculated at step 5524. When at step 5526 the calculated remaining time falls below the AL_REM_TIME threshold value, the program sets the REMAINING_TIME_ALARM bit as indicated at step 5528. If it is determined either that the battery state is not capacity decreasing (step 5520), or that the AL_REM_TIME not greater than 0 (step 5222), or that the calculated remaining time is equal to or above the AL_REM_TIME threshold value (step 5226), then the program clears the REMAINING_TIME_ALARM bit as indicated at step 5530.

From steps 5528 or 5530, the program moves to step 5532, where the processor determines the conditions of the DBOS_OFF flag and of the off_line flag. If the former flag is clear and the latter flag is set, then the processor moves to step 5534, where a number of flags or values are set. In particular, at step 5534 the capacity mode, charger mode and off-line flags are cleared, the DBOS_silent flag is set, and i_message is set equal to N_SILENT. From step 5534, the processor proceeds to step 5536. The program also proceeds to step 5536 immediately from step 5532 if the statement therein is false.

As shown at step 5536, the upper byte of the alarm status register is checked to determine if any of the alarm bits, such as OVER_CHARGED_ALARM, TERMINATE_CHARGE_ALARM, DTEMP_ALARM, OVER_TEMP_ALARM, TERMINATE_DISCHARGE_ALARM, REMAINING_CAPACITY_ALARM, and REMAINING_TIME_ALARM have been set. If so, then a check of the alarm broadcast flag "alarming" is made at step 5538. If the upper byte of the alarm status register indicates no alarm condition, that is no bits are set, then the process will continue at step 5540 and the alarming broadcast flag is cleared and the routine is then exited.

As discussed above, the alarming broadcast flag is not set during initialization. However, as long as an alarm condition exists, this flag will be set. If at step 5538, the alarming flag is clear, the process continues to step 5542. At this step, the alarming flag is set, the alarm broadcast timer is set to 0 and the "alarm to host" flag is set, indicating that the alarm will be sent to the external host device, and not a battery charger. If at step 5538, the alarming flag is set, the timer i-alarm is decremented by one in step 5544.

The process then continues at step 5546, where a determination is made as to whether the alarm broadcast timer has timed out; that is, become equal to 0. If the timer has not timed out, then the alarm control routine is exited. However, if the alarm broadcast timer has timed out, then the process will continue at step 5548. At this step, the address location for the alarm broadcast is set to HOST, the command code is set to BATTERY, and the data address is set to AL_STATUS_L. This will initiate the transfer of the particular alarm to the host device.

A determination is then made at step 5550 as to whether the alarm to host flag is cleared; that is, equal to 0. If the alarm_to_host flag is clear, then the SlAdr, slave address, is changed, at step 5552, from HOST to CHARGER, and the processor determines at step 5554 whether the alarm should be sent to the charger. If the alarm should be sent, then the send message routine, discussed below is invoked at step 5556, and the alarm is sent.

If at step 5550, the alarm_to_host flag is set, the processor skips steps 5552 and 5554 and proceeds to step 5556. The SIADr value stays HOST, and at step 3152 the alarm is sent to the host device. After the sent message routine is completed, the processor, at step 5558, resets the alarm timer and toggles the alarm_to_host flag—that is, if the flag was set, it is cleared; and if it was clear, it is set. After this, the routine is exited at 5560.

If at step 5554, the processor determines not to sent an alarm to the charger, the routine skips step 5556 and proceeds directly to step 5558. Also, if at step 5546, the alarm timer has not timed out, the routine is immediately exited.

With the above-described procedure, during the first operation of the alarm control routine, the alarm timer is set to 0 at step 5542, so that the routine proceeds through the steps 5548–5558 to send an alarm during the first half, and the alarm_to_host flag is set to one, so that the host receives the first alarm. Then the alarm timer is set to its full value, such as ten seconds, at step 5558.

However, for the next and subsequent operating cycles of the alarm control routine, because the alarming flag is now set, the processor proceeds to step 5554 from step 55338, rather than to step 5542, and decrements the alarm timer. Moreover, until the timer alarm times out, each time that timer is decremented, the routine is exited. During each time period defined by N_ALARM, the alarm to host bit is toggled. In this way, the alarm control routine enable alarm signals to be transmitted alternately to the host device and to a battery charger. In addition, in some instances it would be inappropriate to send alarm signals to the battery charger. This would be detected at step 5554, in which case step 5556 is skipped.

Figure 56:
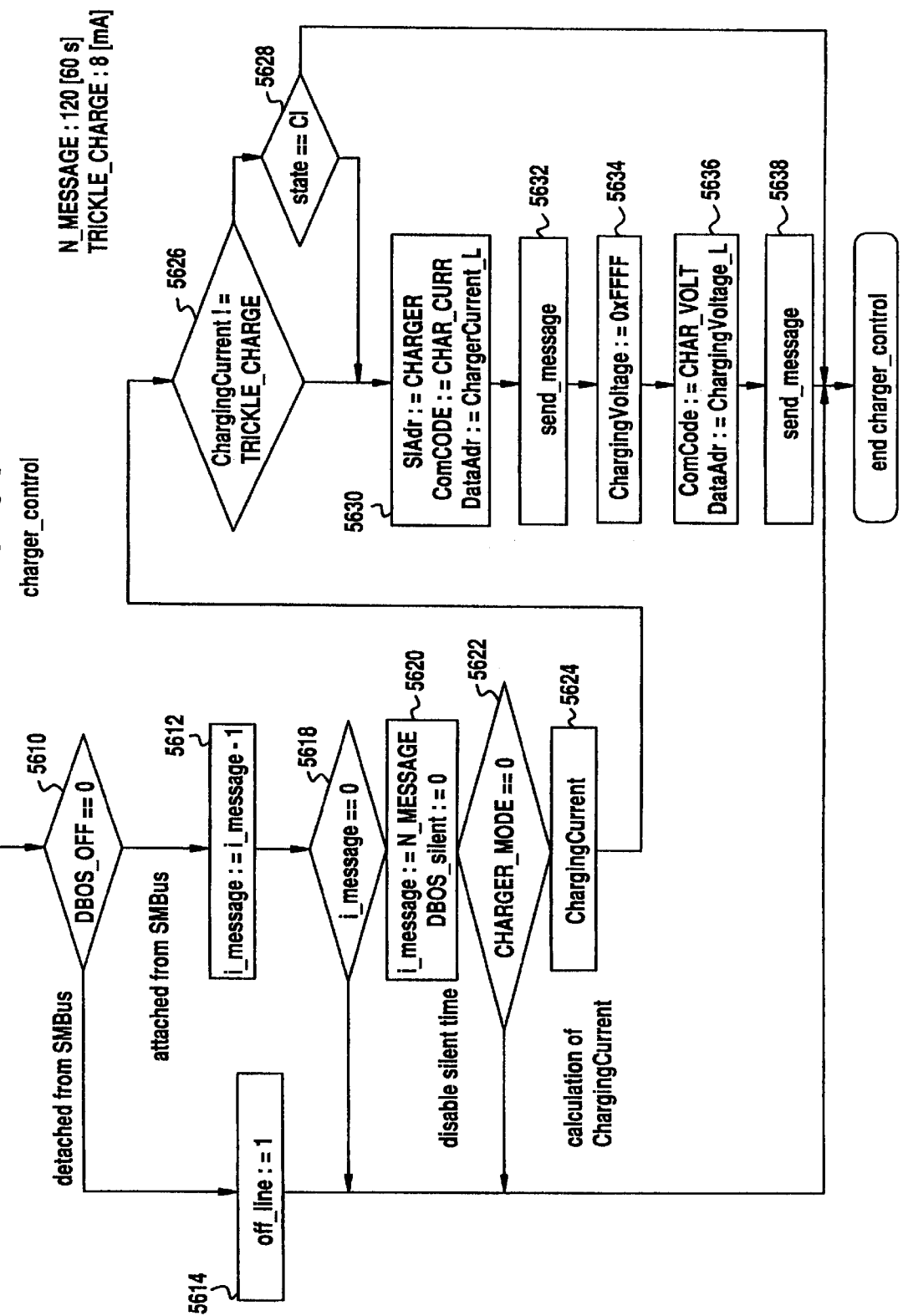
FIG. 56 illustrates a routine for sending instructions to a battery charger.

FIG. 56 entitled charger control, is a routine for sending instructions to a battery charger. At step 5610, the routine determines if the DBOS battery is plugged into the system, making an SMBus connection. If the bit flag DBOS_OFF is set equal to 0, indicating insertion into the system, the routine proceeds to block 5612 and decrements a 60 second timer, i_message—1. If at step 5610 there is no SMBus connection the program proceeds to block 5614 in which a flag bit, off_line, is set equal to 1, indicating no broadcast, and then the routine ends.

Proceeding from block 5612, the routine proceeds to block 5618 in which the variable i_message is checked to determine if it is equal to 0, indicating a time out of the 60 second timer. If the condition in block 5618 is false there is no broadcast and the routine is ended. If the condition in block 5618 is true, the routine proceeds to block 5620 in which the counter is reset to 120 by setting i_message equal to N_MESSAGE. DBOS_silent is also set equal to 0.

The routine then proceeds to block 5622 in which the state of the CHARGER_MODE bit is checked. This is a bit written into the battery by either the charger or host that turns off the broadcast to the charger. If the bit is set to 1, it disables the charger broadcast and the routine is ended. If the condition in step 5622 is true, a charging current routine is invoked at step 5624. After the charging current routine is completed, the processor proceeds to step 5626 of the charger control routine. At step 5626, the processor determines whether the complement of the value of charging current is equal to the value of TRICKLE_CHARGE. If the complement of the value of charging current is equal to TRICKLE_CHARGE, then the processor, at step 5628, determines whether state is equal to CI; and if state is not CI, then the routine ends.

If at step 5626, the complement of charging current is equal to TRICKLE_CHARGE, then the routine moves to step 5630. The routine also proceeds to step 5630 from step 5628 if at this latter step, state is equal to CI. At step 5630, all of the elements of the message on charging current that is to be broadcast are specified. The first element is the slave address (Sl Adr) which is specified to be CHARGER. The second element is the command code (Com Code) which is the information of the message, and is specified to be charging current. The third element is the data address (Data Adr) which contains and specifies the charger current upper limit (chCurr_L). At step 5632 the processor invokes the send message routine, discussed below.

After the send message routine is completed, the processor, at step 5634 of the charger control routine, sets a variable, Charging Voltage, equal to O×FFFF. Then, the elements of the message on charging voltage that is to be broadcast are specified. In particular, at step 5636, the command code is specified to be the charging voltage (CHAR_VOLT); and the data of the message is specified in the data address (Data Adr) which is the charger voltage upper limit (ChVolt_L). The slave address (Sl Adr) is omitted since it was already specified in block 3234 to be the CHARGER. At step 5638, the routine again invokes the send message routine; after the send message routine is completed, the charger control routine itself ends.

Figure 57:
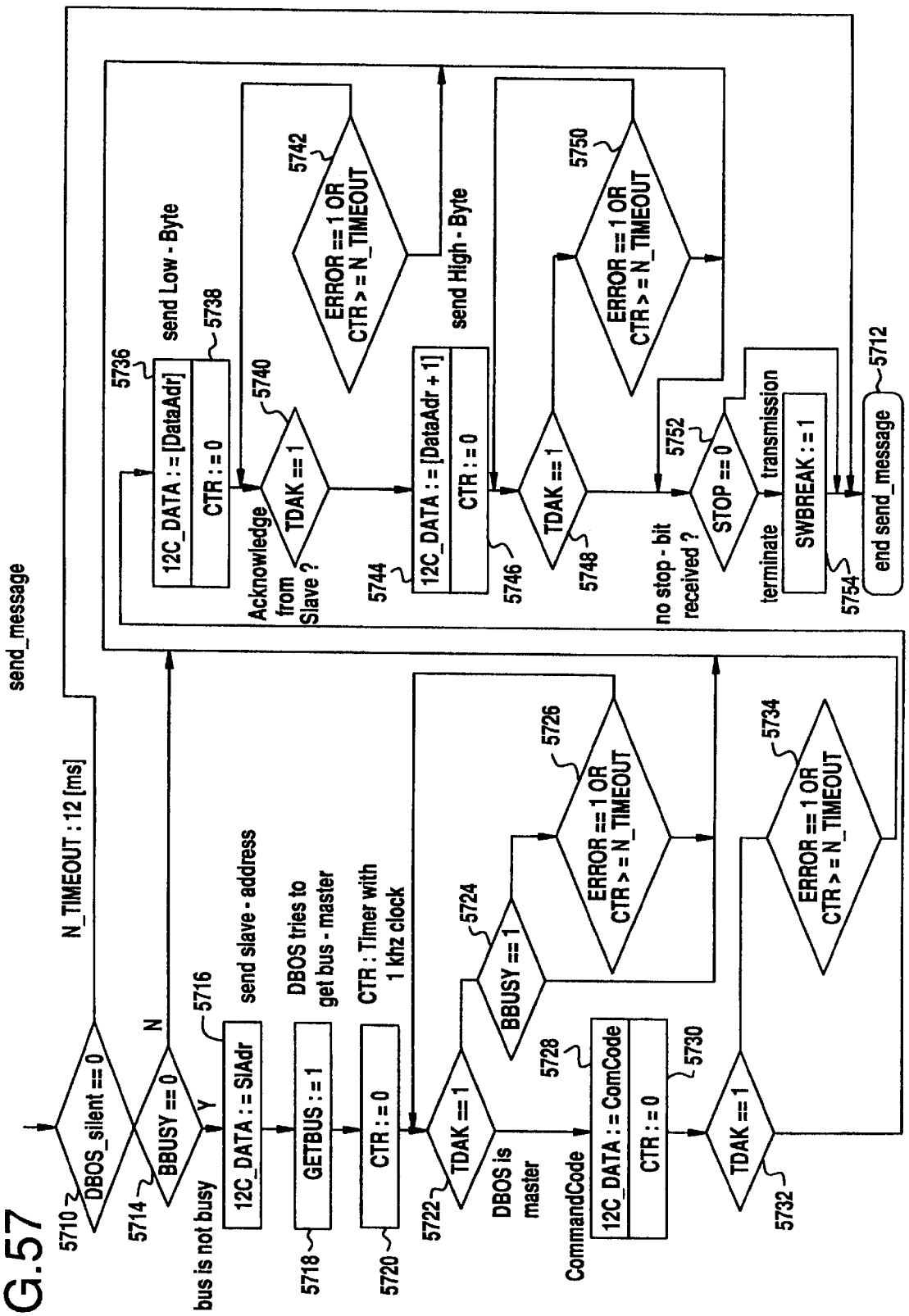
FIG. 57 shows a procedure used by the processor on the battery pack to prepare messages for transmission.

FIG. 57 shows the send message routine; and in general this routine sets the flags in software which are necessary for the battery pack to transmit over the SMBus. Generally, in this routine, a message is sent by specifying the message address in block 5716, specifying the command code (information) in block 5728, and specifying the data address in block 5736, and then by incrementing the data address in block 5744 until the entire message is transmitted.

Block 5710 checks to see that the condition DBOS_silent is equal to 0. If this bit is equal to 1, the message cannot be transmitted, and the routine is exited at step 5712. If the bit in block 5710 is equal to 0, then in block 5717 the routine checks to determine a bit BBUSY is equal to 0, indicating the bus is not busy. This is a bit flag set in hardware which indicates that the data bus is busy when the flag is equal to 1. If the flag is equal to 0 indicating the bus is not busy, the routine proceeds to block 5716 and sets the I2C_DATA word equal to the slave address (Sl Adr). In step 5718, the routine sets the variable GETBUS equal to 1, indicating that the DBOS is attempting to get the bus-master. This is accomplished by sending a signal such as by pulling the clock line low. The routine then proceeds to step in which a counter is set equal to 0. This counter sets a time limit by which the charger or host must acknowledge the attempt by DBOS to get the bus-master. This acknowledgment is accomplished by the charger or host sending a signal, such as by pulling the data line low.

In step 5722, the system checks that TDAK is equal to 1 which is an indication of acknowledgment that the DBOS is the bus master. If the condition of block 5722 is false the routine enters a timing loop, and proceeds to block 5724 in which a bit in hardware is checked to determine if the bus is busy, specifically that BBUSY equals 1. If the condition of block 5724 is false the routine proceeds to block 5726 in which an error bit (ERROR) is checked to determine if it is set to one or whether the count of the counter is greater than N_TIMEOUT, which indicates that the timer loop has timed out. If the condition in block 5726 is false, the routine returns to block 5722, and the loop is cycled through until an acknowledgment is received that DBOS is bus master or the timer times out, or if the condition of block 5524 or block 5526 is are true, the processor proceeds to a latter part of the program.

If the condition of block 5522 is true, indicating that DBOS is bus master, the routine proceeds to block 5528 in which I2C_DATA is set equal to ComCode, thus sending the command code. In block 5530, the counter is reset by setting CTR equal to 0. Block 5528 is a transmission of the command code, and in block 5534, the program looks for an acknowledgment of that transmission, specifically checking that TDAK equals 1. If TDAK equals 0, indicating no acknowledgment, the routine proceeds to block 5534 in which it checks for an error, specifically by ERROR equals 1, or the condition that the counter has timed out, indicated by CTR greater than N_TIMEOUT. The routine continues in this timing loop until after timeout, or the indication of an error, or until a successful acknowledgment is received.

In the latter case, the routine proceeds to step 5736 in which the third part of the message is transmitted, specifically by setting I2C_DATA equal to the data address of the low byte of the message. In block 5740 a counter is reset to 0. In block 5740 the routine looks for a successful acknowledgment, specifically that TDAK equals 1, or, if not, cycles to block 5742, looking for either an error (ERROR=1) or the counter timeout, greater than N_TIMEOUT. The routine continues in this cycle until it receives a successful acknowledgment or an error is indicated the timer times out.

If a successful acknowledgment is received in block 5740 the routine proceeds to block 5744. The data being transmitted consists of two bytes, a first byte transmitted in block 5736 and a second byte transmitted in block 5744. Blocks 5746, 5748 and 5750 are set up exactly the same cycle as blocks 5738, 5740 and 5742, and therefore their explanations will not be repeated. A successful transmission ends by a bit in hardware (STOP) being set to 1 by the host. This is termed the stop bit; and in block 5752, the routine looks to see if the stop-bit was set to 1, and if it was, the routine exits to the right and to the end of this routine. If the stop bit is determined to be 0 in block 5752 the routine terminates transmission by setting SWBREAK equal to 1, which is in effect the generation of its own stop bit, and then exits the routine.

Figure 58:
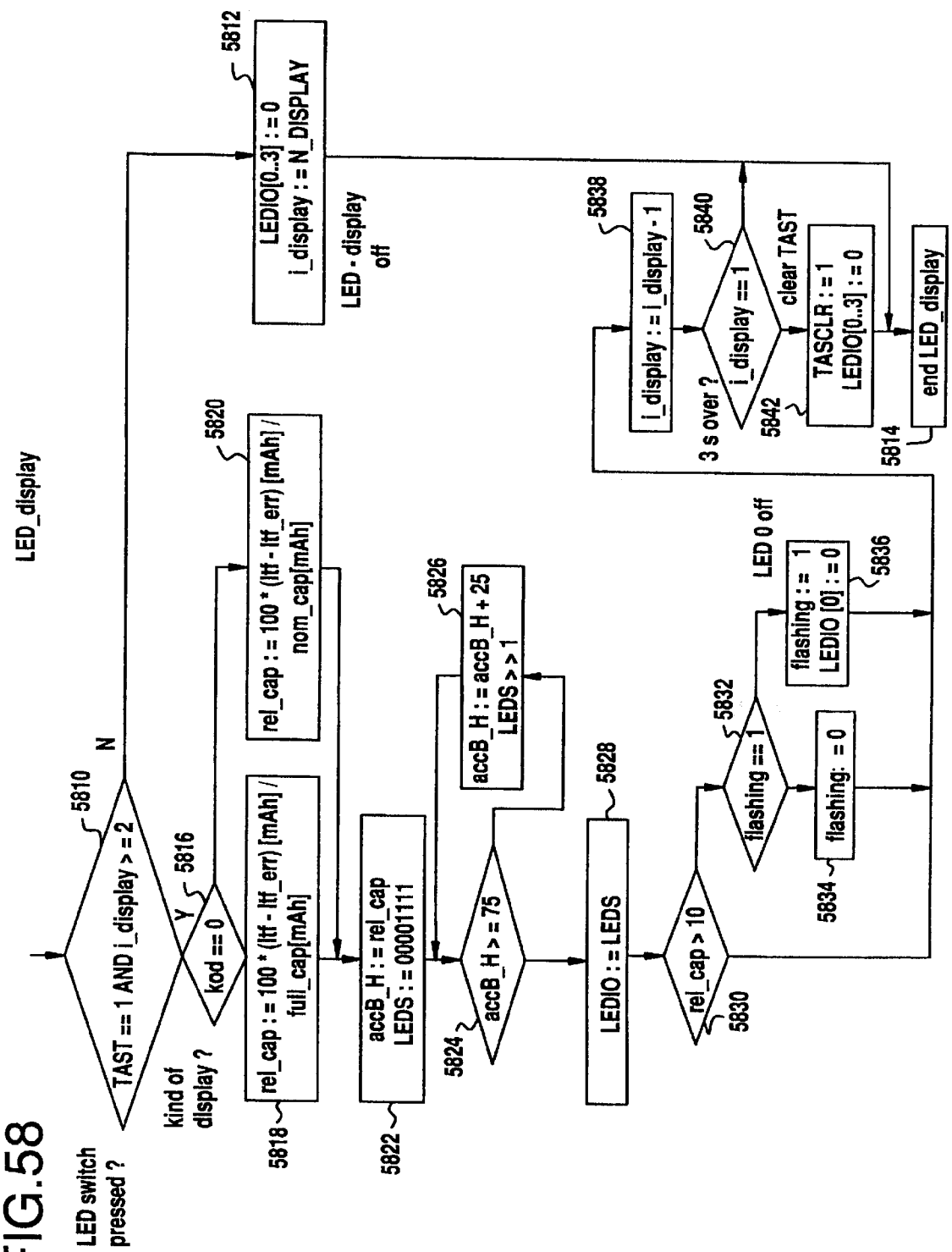
FIG. 58 is a flow chart of a routine used to control an LED display on the battery pack.

FIG. 58 shows a routine, entitled LED display. In step 5810 the routine tests that the LED switch has been pressed, specifically by TAST equals 1, and that the timer of the display is greater than a given limit, specifically that i_display is greater than 2. If these conditions are false, the routine proceeds to the right to block 5812 in which a variable LEDIO (for each of bits 0 to 3) is set to 0, and the display timer is initialized by setting i_display equal to N_DISPLAY. By setting the word LEDIO equal to 0 the LED display is turned off. The routine is then exited at step 5814.

If the conditions of block 3410 are true, the routine proceeds to block 5816 in which the manufacturers data is checked to determine the type of display. If the word in block 5816 (kod) is equal to 1, then in block 5818, the relative capacity (rel_cap) is determined by the numerator indicated in block 5818 being divided by the denominator indicated in block 5818, full_cap, which is the learned or true capacity of the battery. If, on the other hand, the word kod in block 5816 is equal to 1, then the routine proceeds to block 5816 which has a similar calculation to block 5818, but in this case the denominator of the equation is the nominal capacity, nom_cap, which is the designed capacity for the battery. The denominator in block 5820 is the designed capacity of a new battery, whereas the denominator of block 5818 is the true capacity of the battery, which takes into account aging thereof and other factors.

From blocks 5818 and 5820, the routine proceeds to block 5822 wherein the variable accB_H is set equal to the relative capacity, as determined by either block 5818 or 5820, which is to be indicated by the LED display. Also, in block 5822, the word LEDS is set to 00001111. This value of the word indicates that all of the LEDS are to be initialized at a state in which all of the LEDS can be turned on. The routine in blocks 5824 and 5826 is an incremental routine in which the word accB_H is first determined in block 5824 to be greater than 75, and if not then in block 5826 the word is incremented by +25. Incrementing this word by +25 shifts the bits of the word LEDS to the right by one bit, such that the word is now 0000111. This results in only three LEDS being capable of being turned on. This routine cycles through blocks 5824 and 5826 until the word is greater than 75, at which time the routine proceeds from block 5824 to block 5828. In block 5828 the word LEDIO (which has bits from 0–3) is set equal to LEDS (which also has bits 0–3) which turns the designated LEDS on.

At block 5830, the relative capacity is checked to be greater than 10%. If the relative capacity is less than 10%, the LED display is to be cycled on and on in a flashing mode. The routine proceeds to block 5832 in which the word flashing is tested to see if it is 1. If it is 1, the block proceeds to block 5834 in which the word flashing is set equal to 0 resulting in a flashing of the display. If the word flashing is equal to 0 in block 5832, then the routine proceeds to block 5836 in which the word flashing is set equal to 1, and the word LEDIO is set equal to 0. The result of the routine established by blocks 5832, 5834 and 5836 is a flashing of the LED display.

After exiting from blocks 5830 (condition true), 5834, or 5836, the routine proceeds to block 5838 in which the display timer is decremented by 1. The display timer determines how long the LED display is on. Specifically i_display is decremented by 1. In block 5840 the routine tests to determine if the three second timer interval is over. If the word i_display equals 1, the routine proceeds to block 5842 in which the bit TAST (which was determined to be set to 1 in block 5810) is cleared, effectively clearing the button press bit. The work LEDIO is also set equal to 0, turning the LED display off. From blocks 5812, 5840 (condition false) and 5842, the routine is exited at 5814.

Figure 59:
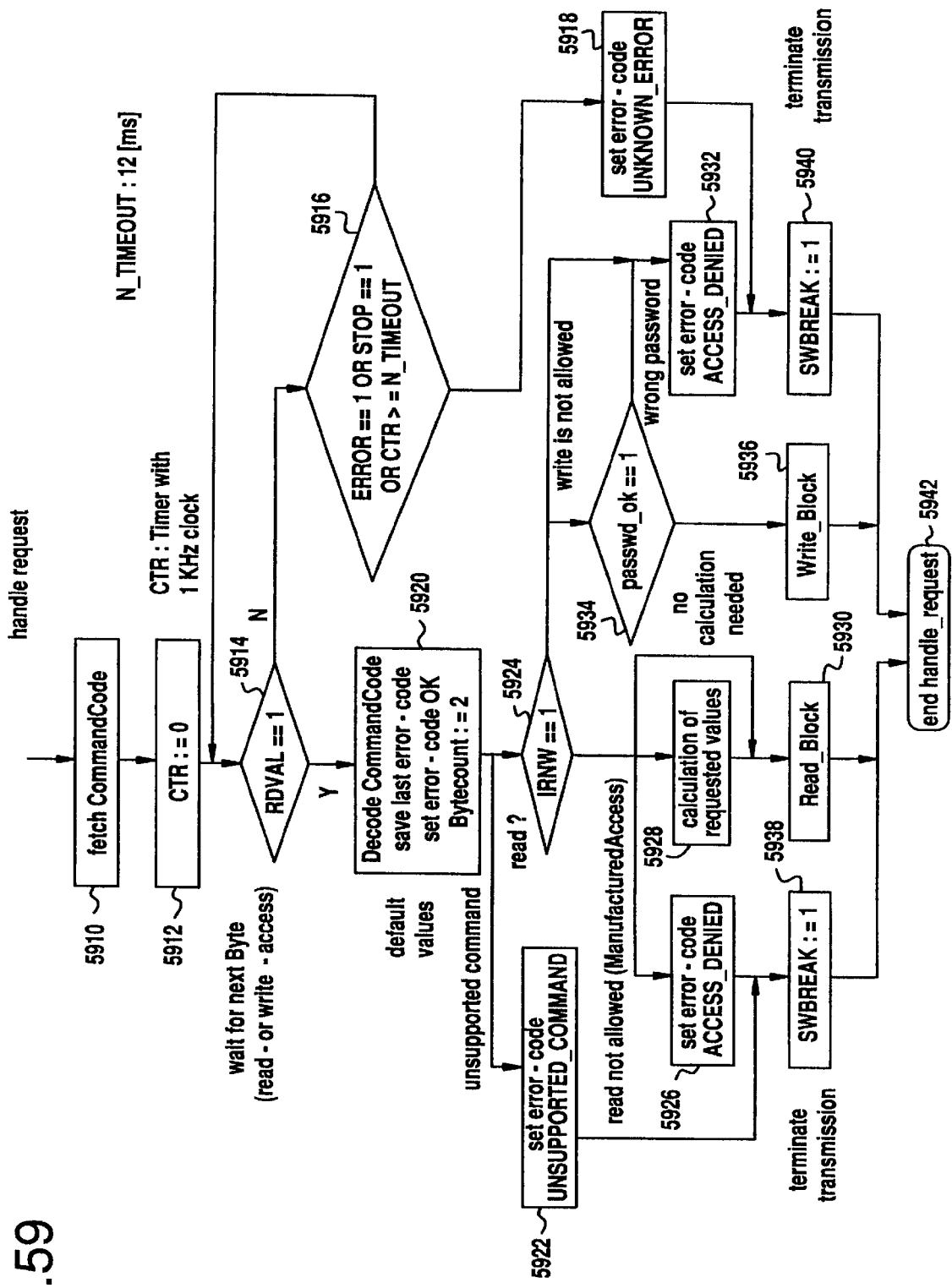
FIG. 59 illustrates a procedure for processing requests received by the processor on the battery pack.

FIG. 59, entitled handle request, is a routine in which the battery is being requested to supply some type of value to a host. The request is received over the bus, and in step 5910 the request is acted upon by fetching a command code from a specified address in RAM. In block 5912, a timer is initialized by setting the counter, specifically CTR, equal to 0. The routine then waits for the next byte of data in block 5914, specifically by checking that RDVAL (an acknowledgment) is equal to 1. If not, the routine proceeds to block 5916, with the blocks 5914 and 5916 setting up a timing loop which has a 12 millisecond duration. In block 5916 the program checks that ERROR equals 1 or STOP equals 1 or the counter CTR is greater than N_TIMEOUT. If an error is indicated, or the stop bit is set, or the counter times out, the routine proceeds to block 5918 in which an error code is set by setting a bit UNKNOWN_ERROR.

If in block 5914 RDVAL is equal to 1, the routine proceeds to block 5920 in which the command code is decoded, the last error-code is saved, and default values are set, set error-code OK(?) and set the Bytecount equal to 2. At the output of block 5920, there is a hardware read of the decoded command code. Specifically if the decoded command is not supported, the routine proceeds to block 5922 in which the error-code is set, specifically the word UNSUPPORTED_COMMAND.

If the command is supported at the output of 5920, the routine proceeds to block 5924 in which a determination is made to whether the command is a read command or a write command, specifically whether a bit IRNW equals 1. If so, the command is a read command, and the routine performs a further hardware read of the command. If the read is not allowed, such as by a request for a read from the manufacturers access, the routine proceeds to block 5926 in which an error code is set, specifically the word ACCESS_DENIED. If the command is for a value for which no calculation is required, such as the voltage, current or temperature, which are values which are calculated on a regular basis, the routine bypasses block 5928. On the other hand, if the command is for a calculation of a requested value, such as a time remaining value, the routine proceeds to block 5928 in which the requested values are calculated. The processor then proceeds to block 5930 which is the Read_Block routine, as explained in detail herein, and then exits the routine.

If block 5924 indicates that the request was a write request, a hardware read of the request is initially made, and if the write is one that is not allowed, the routine proceeds to block 5932 in which the error-code is set, specifically the word ACCESS_DENIED. If the received write request is allowed, the routine passes to block 5934 in which the password is checked. If the password is incorrect, the routine proceeds to block 5934 and sets the error-code, ACCESS_DENIED. If block 5934 indicates an approved password, the routine proceeds to the write block routine at 5936 as explained herein, and the routine is then exited.

From the output of blocks 5922 and 5926, the routine proceeds to block 5938 in which the transmission is terminated by setting SWBREAK equal to 1, which is in effect a self generation of a stop bit. Likewise from the blocks 5918 and 5932, the routine proceeds to block 5940 wherein the transmission is terminated by setting the work SWBREAK equal to 1, and the routine is then exited at 3542.

Figure 60:
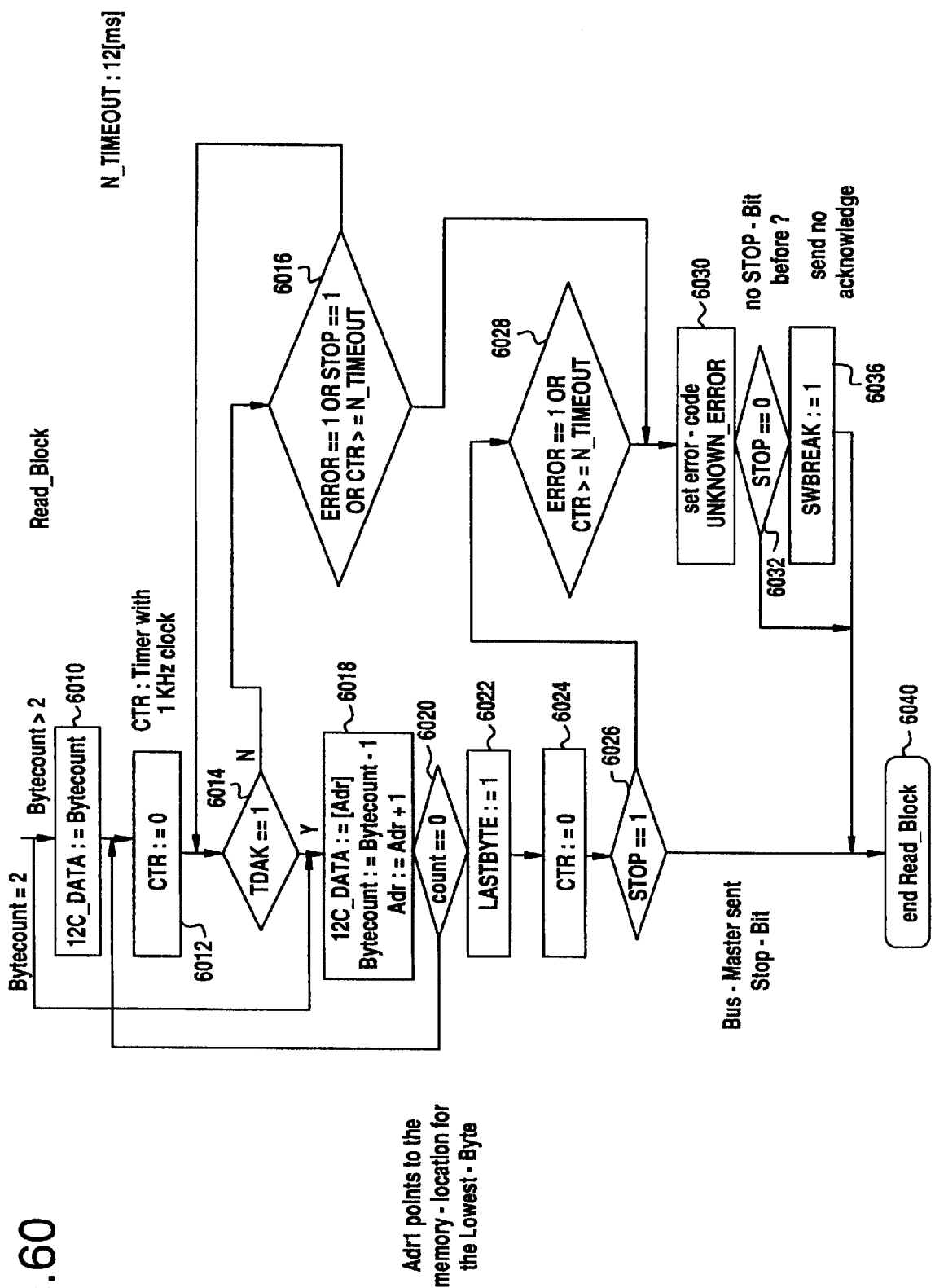
FIG. 60 shows a routine for reading data received by the processor on the battery pack.

FIG. 60, entitled Read Block, is initiated by a request for a read operation received over the bus. An initial hardware determination is made as to whether the bytecount is 2 or greater than 2. If the bytecount of the read request is greater than 2, the routine proceeds to block 6010 in which I2C_DATA is set equal to the byte count, which essentially determines the number of bytes over 2. The routine then proceeds to block 6012 in which a timing cycle is initialized by setting a counter equal to 0.

The routine then proceeds to block 6014 in which a determination is made as to whether an acknowledgment of the request has been received, and specifically whether the word TDAK equals 1. If not, the routine proceeds to block 6016, which sets up a timing loop giving a specified time for an acknowledgment to be received. In block 6016 the conditions are tested for ERROR equals 1, or STOP equal 1, or CTR greater than N_TIMEOUT. If none of those conditions are true, the routine proceeds back to the beginning of block 6014, and generally keeps proceeding through the timing loop until one of the conditions is true or the timer times out.

If block 6014 determines that an acknowledgment has been received, the routine proceeds to block 6018 in which I2C_DATA is set equal to a specified address, the byte count is decremented by 1, and the address is incremented by 1. Likewise, if the initial hardware read of the read request indicated that the byte count was equal to 2, the routine proceeds to the beginning of block 6018, and the same commands are executed. From block 6018, the routine proceeds to block 6020, which establishes a byte count loop back to the beginning of block 6012 until the 1 byte count is indicated to be 0 in block 6020.

Then, the routine proceeds to block 6022 in which the command is terminated by setting a stop bit, LASTBYTE equal to 1, and a counter is initialized to 0 in block 6024. Blocks 6026 and 6028 establish a timing loop to look for receipt of the stop bit before a timer times out. In block 6026 if STOP equals 0, indicating that the stop bit has not been received, the routine proceeds to block 6028 in which the conditions of an error or counter timeout are checked, specifically ERROR equals 1 or CTR greater than N_TIMEOUT. If neither of these conditions is true, the routine cycles back to the beginning of block 6026 in the timing loop until either ERROR equals 1 or the counter times out.

If either condition occurs, the routine proceeds to block 6030 in which the error code is set, specifically the word UNKNOWN_ERROR. The routine then proceeds to block 6032 in which the receipt of a stop bit is checked by STOP=0. If a stop bit has been received, the processor exits the routine at 6034. If no stop bit has been received in block 6032 the routine proceeds to block 6036 in which it generates its own stop bit by setting SWBREAK equal to 1, and then the routine ends. Likewise, in step 3626 if it is determined that a stop bit has been received, STOP equals 1, then the bus master has transmitted a stop bit, and the routine is exited.

Figure 61:
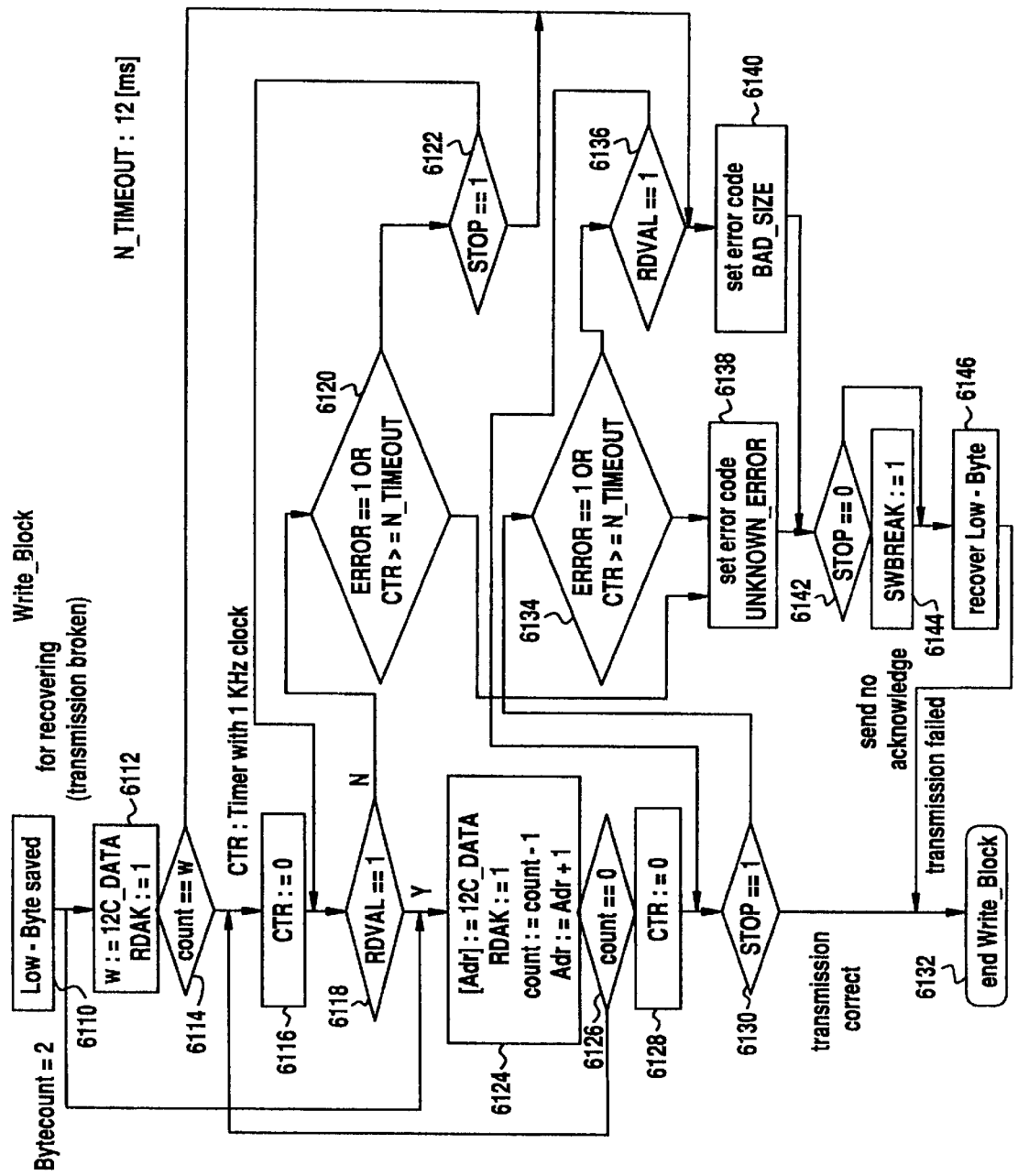
FIG. 61 shows a procedure used by the processor on the battery pack to write messages.

FIG. 61, entitled Write Block, is a routine to execute a write operation. A request for a write operation is initially received at block 6110 in which the low byte thereof is saved in memory, this being for the purpose for recovering the write operation in the event the transmission is subsequently broken. An initial hardware determination is made as to whether the byte count of the write operation equals 2 bytes or is greater than 2 bytes. If greater than 2 bytes, the routine proceeds to block 6112, if equal to 2 bytes, it proceeds to block 6124.

The routine proceeds to block 6112 in which the write command is written to I2C_DATA and acknowledgment RDAK bit is set equal to 1. The routine then proceeds to block 6114 in which a determination is made as to whether the count equals the byte count w. If the byte count is equal to w, the routine proceeds to block 6116 in which a counter is initialized to 0 to time a time period in which an acknowledgment is received. The routine then proceeds to block 6118 in which a determination is made as to whether an acknowledgment has been received, specifically whether RDVAL equals 1. If an acknowledgment has not been received, the routine proceeds through a timing cycle established by blocks 6120 and 6122. In block 6120, a determination is made as to whether ERROR equals 1 or the state of the counter has timed out by CTR greater than N_TIMEOUT. If neither of those conditions has occurred, the routine proceeds to block 6122 in which a determination is made as to whether STOP has been set equal to 1. If not, the routine proceeds back to block 6118 and keeps cycling through this routine until either the counter times out or either the ERROR bit or the STOP bit is set equal to 1.

Returning to block 6118 if an acknowledgment has been received, the routine proceeds to block 6124. The routine also enters block 6124 from the end of block 6110 if a hardware determination indicates that the byte count of the write requests equals 2 bytes. In block 6124 an address is set equal to 12C_DATA, an acknowledgment is given by setting RDAK equal to 1, a byte count is decremented by setting count equal to count—1, and an address is incremented by setting Adr equal to Adr +1.

Following block 6124 the routine proceeds to block 6126 which determines if the byte counter has reached 0. If not the routine cycles back to the beginning of block 6116 until the byte counter reaches 0. When the count has reached 0 in block 6126 the routine proceeds to block 6128, in which a further timer (for receipt of a stop bit) is initialized by being set to 0. The routine proceeds to block 6130 in which a determination is made as to whether a stop bit has been received.

If a stop bit has been received, STOP equals 1, the transmission is correct, and the routine exits at 6132. If a stop bit has not been received in block 6130 the routine proceeds through a timing cycle with blocks 6134 and 6136. In block 6134, a determination is made as to whether an error bit has been set or the counter has timed out, specifically whether ERROR equals 1 or CTR greater than N_TIMEOUT. If neither of these conditions has occurred, the routine proceeds to block 6136 in which a hardware flag RDVAL is checked to determine if it has been set equal to 1. If not, the routine cycles back to the beginning of block 6130 and continues in this routine until the timing cycle times out or ERROR equals 1 or RDVAL equals 1. If one of the conditions in either of blocks 6120 or 6134 is true, the routine proceeds to block 6138 in which an error-code is set, specifically UNKNOWN_ERROR. Likewise, if the condition in block 6114 is false or the conditions of blocks 6122 or 6136 is true, the routine proceeds to block 6140 and error-code is set, specifically BAD_SIZE.

From either of blocks 6138 or 6140 the routine proceeds to block 6142 in which a determination is made as to whether STOP equals 0, indicating that a Stop bit has not be received. If that is so, the routine proceeds to block 6144 in which it generates its own stop bit by setting SWBREAK equal to 1 (send no acknowledgment). From block 6144 and block 6142 (condition false), the routine proceeds to block 6146 in which the low byte initially saved in step 6110 is recovered (the transmission has failed), and the routine is exited at 6132.

FIG. 62 shows the charging current routine, which is used to calculate or to identify the charging current. This routine, is designed to identify the charging current as either a trickle charge or a regular charge, and this identification is made based on various conditions of the battery.

At step 6210, the processor determines whether the battery temperature is above a given level, T_LOW, and whether the fully charged bit is clear. If one or both of these conditions is not true, then the charging current is identified as a trickle charge, as represented by step 6212. If both of the conditions tested at step 6210 are true, though, the routine goes to step 6214, where the processor tests two more conditions. Specifically, at step 6214, the processor determines if the value of state is CI and if the battery temperature is below a second given level, T_HIGH_CI. If both of these conditions are true, the charging current is identified as a regular charging current, as represented by step 6216. If the battery state is CI and the battery is above T_HIGH_CI, then the chagrining current is identified as a trickle charge. If the battery state is not CI and the temperature is below T_HIGH CI, then the routine proceeds to step 6218. At this step, the processor determines whether state is CD and whether the battery temperature is above a third given level, T_HIGH_CD. If either one, or both, of these conditions is not true, the charging current is identified as a trickle charge; while if both of these conditions are true, the charging current is identified as a regular charging current.

I claim:

1. A method for monitoring remaining capacity of a battery pack used to provide power to a host device, the battery pack including a battery and a processor, the method comprising:

establishing a remaining capacity value;

during first defined periods, using a first procedure to update periodically the remaining capacity value, including the steps of
   i) using the battery pack to monitor a battery parameter and to generate data value representing the battery parameter,
   ii) using the processor to process the data values generated by the battery pack to update periodically the remaining capacity value;

during second defined periods, using a second procedure to update periodically the remaining capacity value, including the steps of
   i) transmitting data values from the host, device to the processor, and
   ii) using the processor to process the data values transmitted to the processor from the host device to update periodically the remaining capacity value; and switching between the first procedure and the second procedure under defined conditions.

2. A method according to claim 1, wherein:

the step of transmitting data values from the host device includes the step of transmitting from the host device to the processor power consumed data values representing the amount of power consumed by the host device; and the step of using the processor to process the data values transmitted to the processor includes the step of reducing the remaining capacity value by said power consumed data values.

3. A method according to claim 1, wherein:

the first defined periods are when the monitored parameter is above a threshold value, and the second defined periods are when the monitored parameter is below the threshold value.

4. A method according to claim 3, wherein the monitored battery parameter is the battery current.

5. A battery pack comprising:

terminal means for connecting the battery pack to a battery powered device;

a battery including at least on rechargeable battery cell connected to the terminal means, said battery having
   i) a discharging state for supplying electrical power to the battery powered device, and
   ii) a charging state for receiving electrical power form the terminal means;

a processor for monitoring remaining capacity of the battery, an including
   i) means to establish a remaining capacity value,
   ii) means to use a first procedure during the first periods to update periodically the remaining capacity value, wherein the first procedure includes monitoring a battery parameter, generating data values representing the battery parameter, and using the data values generated by the battery pack to update periodically the reminding capacity value,
   iii) means to use a second procedure during the second periods to update periodically the remaining capacity value, wherein the second procedure includes receiving data values transmitted to the processor from the battery powered device, and using the data values received from the battery powered device to update periodically the remaining capacity value, and
   iv) means to switch the processor between the first procedure and the second procedure under defined conditions.

6. A battery pack according to claim 5, wherein the means to use the second procedure includes means to receive power consumed data values from the battery powered device representing the amount of power consumed by the battery powered device, and to reduce the remaining capacity value by said power consumed data values.

7. A battery pack according to claim 6, wherein:

the means to identify first and second defined periods includes
   i) means to monitor a parameter of the battery, and
   ii) means to determine whether the monitored parameter is below a threshold value;

the first defined periods are when the monitored parameter is above the threshold value; and the second defined periods are when the monitored parameter is below the threshold value.

8. A battery pack according to claim 7, wherein the monitored battery parameter is the battery current.

* * * * *

UNITED STATES PATENT AND TRADEMARK OFFICE
CERTIFICATE OF CORRECTION

PATENT NO.    : 5,955,869
DATED         : September 21, 1999
INVENTOR(S)   : Roland Rathmann It is certified that error appears in the above-identified patent and that said Letters Patent is hereby corrected as shown below:

<u>Title page,</u>
Item [62], Division of application No.:, delete "08/890,665" and insert therefor
-- 08/890,663 --.

Signed and Sealed this

Eighteenth Day of June, 2002

Attest:

Attesting Officer

JAMES E. ROGAN
Director of the United States Patent and Trademark Office